US010388796B2

(12) United States Patent
Yamazaki et al.

(10) Patent No.: US 10,388,796 B2
(45) Date of Patent: Aug. 20, 2019

(54) SEMICONDUCTOR DEVICE AND METHOD FOR MANUFACTURING THE SAME

(71) Applicant: Semiconductor Energy Laboratory Co., Ltd., Atsugi-shi, Kanagawa-ken (JP)

(72) Inventors: Shunpei Yamazaki, Setagaya (JP); Yuta Endo, Atsugi (JP); Yoshiaki Oikawa, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 2 days.

(21) Appl. No.: 15/831,763

(22) Filed: Dec. 5, 2017

(65) Prior Publication Data

US 2018/0166578 A1 Jun. 14, 2018

(30) Foreign Application Priority Data

Dec. 9, 2016 (JP) ................................ 2016-239748
Dec. 9, 2016 (JP) ................................ 2016-239749
(Continued)

(51) Int. Cl.
*H01L 29/786* (2006.01)
*H01L 29/51* (2006.01)
(Continued)

(52) U.S. Cl.
CPC ...... *H01L 29/7869* (2013.01); *H01L 21/0228* (2013.01); *H01L 29/51* (2013.01);
(Continued)

(58) Field of Classification Search
CPC ............... H01L 29/7869; H01L 29/517; H01L 29/66969; H01L 21/0228
(Continued)

(56) References Cited

U.S. PATENT DOCUMENTS 6,541,294 B1 * 4/2003 Yamazaki ......... H01L 21/32136 257/E21.311
6,717,359 B2 4/2004 Kimura
(Continued)

FOREIGN PATENT DOCUMENTS

JP 2002-359193 A 12/2002
JP 2011-124360 A 6/2011
(Continued)

*Primary Examiner* — Tong-Ho Kim
(74) *Attorney, Agent, or Firm* — Robinson Intellectual Property Law Office; Eric J. Robinson

(57) ABSTRACT

A semiconductor device with favorable electrical characteristics is provided. The semiconductor device includes a first conductor over a substrate; a first insulator over the first conductor; an oxide over the first insulator; a second insulator over the oxide; a second conductor over the second insulator; a third insulator over the second conductor; a fourth insulator in contact with a side surface of the second insulator, a side surface of the second conductor, and a side surface of the third insulator; and a fifth insulator in contact with the oxide, the first insulator, and the fourth insulator. The first insulator and the fifth insulator are in contact with each other in a region on the periphery of the side of the oxide. The oxide includes a first region where a channel is formed; a second region adjacent to the first region; a third region adjacent to the second region; and a fourth region adjacent to the third region. The first region has higher resistance than the second region, the third region, and the fourth region and overlaps with the second conductor. The second region has higher resistance than the third region and the fourth region and overlaps with the second conductor. The third region has higher resistance than the fourth region and overlaps with the fourth insulator.

10 Claims, 43 Drawing Sheets

(30) Foreign Application Priority Data

Dec. 26, 2016 (JP) ................................. 2016-251633
Feb. 9, 2017 (JP) ................................. 2017-021880

(51) Int. Cl.
*H01L 21/02* (2006.01)
*H01L 29/66* (2006.01)
*H01L 29/778* (2006.01)
*H01L 29/24* (2006.01)

(52) U.S. Cl.
CPC ............ *H01L 29/517* (2013.01); *H01L 29/66* (2013.01); *H01L 29/66969* (2013.01); *H01L 29/786* (2013.01); *H01L 29/24* (2013.01); *H01L 29/7781* (2013.01); *H01L 29/7782* (2013.01)

(58) Field of Classification Search
USPC .......................................................... 257/637
See application file for complete search history.

(56) References Cited

U.S. PATENT DOCUMENTS

| | | | |
|---|---|---|---|
| 8,547,771 B2 | 10/2013 | Koyama | |
| 8,772,769 B2 | 7/2014 | Yamazaki | |
| 8,796,682 B2 | 8/2014 | Sasagawa et al. | |
| 8,878,177 B2 | 11/2014 | Sasagawa et al. | |
| 9,018,629 B2 | 4/2015 | Tezuka et al. | |
| 9,318,618 B2 | 4/2016 | Endo et al. | |
| 9,397,149 B2 | 7/2016 | Yamazaki et al. | |
| 9,530,894 B2 | 12/2016 | Koezuka et al. | |
| 9,634,150 B2 | 4/2017 | Yamazaki et al. | |
| 9,660,100 B2 | 5/2017 | Okazaki | |
| 9,666,698 B2 | 5/2017 | Yamazaki | |
| 9,685,560 B2 | 6/2017 | Yamazaki et al. | |
| 9,748,403 B2 | 8/2017 | Koezuka et al. | |
| 9,773,919 B2 | 9/2017 | Sasagawa et al. | |
| 9,806,200 B2 | 10/2017 | Shimomura et al. | |
| 2011/0140100 A1 | 6/2011 | Takata et al. | |
| 2012/0119205 A1 | 5/2012 | Taniguchi et al. | |
| 2012/0223310 A1* | 9/2012 | Noda | H01L 21/02554 257/57 |
| 2015/0263141 A1 | 9/2015 | Yamazaki et al. | |
| 2016/0260838 A1 | 9/2016 | Yamazaki | |
| 2016/0300952 A1 | 10/2016 | Toriumi et al. | |
| 2016/0322503 A1 | 11/2016 | Tezuka et al. | |
| 2017/0294541 A1* | 10/2017 | Yamazaki | C01B 33/113 |
| 2018/0122950 A1* | 5/2018 | Yamazaki | H01L 29/7869 |
| 2018/0138212 A1* | 5/2018 | Yamazaki | H01L 21/02274 |

FOREIGN PATENT DOCUMENTS

| | | |
|---|---|---|
| JP | 2011-138934 A | 7/2011 |
| JP | 2012-257187 A | 12/2012 |
| JP | 2018-073995 A | 5/2018 |
| JP | 2018-082102 A | 5/2018 |
| WO | WO-2018/092007 | 5/2018 |

* cited by examiner 260
270
260b
260c
260a
250
460
460b
460a
460c
450
470
272A
A1
A2
A3
A4

286
282
280
A1
A2
A3
A4

252a
252b
452a
452b
265
207
254a
110
120
454a
454b
150
130
266
208
A1
A2
A3
A4

Sample 3A

L/W=0.34/0.22 μm

Ion(Vd=3.3, Vg=3.3V): 1.55E−5 A

S value(Vd=3.3V): 88.2 mV/dec.

Vsh(Vd=3.3V): −0.90 V

Vth(Vd=3.3V): −0.28 V

Sample 3B

L/W=0.44/0.22 μm

Ion(Vd=3.3, Vg=3.3V): 1.04E−5 A

S value(Vd=3.3V): 86.7 mV/dec.

Vsh(Vd=3.3V): −0.58 V

Vth(Vd=3.3V): +0.37 V

Sample 3C

L/W=1.49/0.22 μm

Ion(Vd=3.3, Vg=3.3V): 4.05E−6 A

S value(Vd=3.3V): 76.6 mV/dec.

Vsh(Vd=3.3V): +0.05 V

Vth(Vd=3.3V): +0.84 V

SEMICONDUCTOR DEVICE AND METHOD FOR MANUFACTURING THE SAME

BACKGROUND OF THE INVENTION

1. Field of the Invention

One embodiment of the present invention relates to a semiconductor device and a manufacturing method thereof. Another embodiment of the present invention relates to a semiconductor wafer, a module, and an electronic device.

In this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. A display device (e.g., a liquid crystal display device and a light-emitting display device), a projection device, a lighting device, an electro-optical device, a power storage device, a memory device, a semiconductor circuit, an imaging device, an electronic device, and the like may include a semiconductor device.

Note that one embodiment of the present invention is not limited to the above technical field. One embodiment of the invention disclosed in this specification and the like relates to an object, a method, or a manufacturing method. Furthermore, one embodiment of the present invention relates to a process, a machine, manufacture, or a composition of matter.

2. Description of the Related Art

In recent years, semiconductor devices have been developed to be used mainly for an LSI, a CPU, or a memory. A CPU is an aggregation of semiconductor elements each provided with an electrode which is a connection terminal, which includes a semiconductor integrated circuit (including at least a transistor and a memory) separated from a semiconductor wafer.

A semiconductor circuit (IC chip) of an LSI, a CPU, a memory, or the like is mounted on a circuit board, for example, a printed wiring board, to be used as one of components of a variety of electronic devices.

A technique by which a transistor is formed using a semiconductor thin film formed over a substrate having an insulating surface has been attracting attention. The transistor is applied to a wide range of electronic devices such as an integrated circuit (IC) or an image display device (also simply referred to as a display device). A silicon-based semiconductor material is widely known as a material for a semiconductor thin film applicable to the transistor; in addition, an oxide semiconductor has attracted attention as another material.

It is known that a transistor including an oxide semiconductor has an extremely low leakage current in an off state. For example, a low-power-consumption CPU utilizing a characteristic of low leakage current of the transistor including an oxide semiconductor has been disclosed (see Patent Document 1).

In addition, a technique in which oxide semiconductor layers with different electron affinities (or conduction band minimum states) are stacked to increase the carrier mobility of a transistor is disclosed (see Patent Documents 2 and 3).

In recent years, demand for an integrated circuit in which transistors and the like are integrated with high density has risen with reductions in the size and weight of an electronic device. In addition, the productivity of a semiconductor device including an integrated circuit is required to be improved.

REFERENCE

Patent Document

[Patent Document 1] Japanese Published Patent Application No. 2012-257187

[Patent Document 2] Japanese Published Patent Application No. 2011-124360

[Patent Document 3] Japanese Published Patent Application No. 2011-138934

SUMMARY OF THE INVENTION

An object of one embodiment of the present invention is to provide a semiconductor device having favorable electrical characteristics. Another object of one embodiment of the present invention is to provide a semiconductor device that can be miniaturized or highly integrated. Another object of one embodiment of the present invention is to provide a semiconductor device with high productivity.

Another object of one embodiment of the present invention is to provide a semiconductor device capable of retaining data for a long time. Another object of one embodiment of the present invention is to provide a semiconductor device capable of high-speed data writing. Another object of one embodiment of the present invention is to provide a semiconductor device with high design flexibility. Another object of one embodiment of the present invention is to provide a semiconductor device with low power consumption. Another object of one embodiment of the present invention is to provide a novel semiconductor device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention includes a first conductor over a substrate; a first insulator over the first conductor; an oxide over the first insulator; a second insulator over the oxide; a second conductor over the second insulator; a third insulator over the second conductor; a fourth insulator in contact with a side surface of the second insulator, a side surface of the second conductor, and a side surface of the third insulator; and a fifth insulator in contact with the oxide, the first insulator, and the fourth insulator. The first insulator and the fifth insulator are in contact with each other in a region on the periphery of the side of the oxide. The oxide includes a first region where a channel is formed; a second region adjacent to the first region; a third region adjacent to the second region; and a fourth region adjacent to the third region. The first region has higher resistance than the second region, the third region, and the fourth region and overlaps with the second conductor. The second region has higher resistance than the third region and the fourth region and overlaps with the second conductor. The third region has higher resistance than the fourth region and overlaps with the fourth insulator.

In the above, the oxide may have a surface with a curvature between a side surface and a top surface thereof.

In the above, the radius of curvature of a curved surface of the oxide, which is between the side surface and the top surface, may be greater than or equal to 3 nm and less than or equal to 10 nm.

In the above, the first insulator may be hafnium oxide formed by an atomic layer deposition (ALD) method, the fourth insulator may be aluminum oxide formed by a sputtering method, and the fifth insulator may be aluminum oxide formed by an ALD method.

In the above, the oxide may include In, an element M (M is Al, Ga, Y, or Sn), and Zn.

Another embodiment of the present invention includes a first transistor and a second transistor which are over a substrate. The first transistor includes a first conductor; a first insulator over the first conductor; a first oxide over the first insulator; a second insulator over the first oxide; a second conductor over the second insulator; and a third insulator in contact with a side surface of the second insulator and a side surface of the second conductor. The second transistor includes a third conductor; the first insulator over the third conductor; a second oxide and a third oxide which are over the first insulator; a fourth oxide over the second oxide and the third oxide; a fourth insulator over the fourth oxide; a fourth conductor over the fourth insulator; a fifth insulator in contact with a side surface of the fourth insulator and a side surface of the fourth conductor; and a sixth insulator in contact with the first insulator, the first oxide, the fourth oxide, the third insulator, and the fifth insulator. The first insulator and the sixth insulator are in contact with each other in a region on the periphery of the side of the first oxide and in a region on the periphery of the side of the fourth oxide.

Another embodiment of the present invention includes a first transistor and a second transistor which are over a substrate. The first transistor includes a first conductor; a first insulator over the first conductor; a seventh insulator over the first insulator; a first oxide over the seventh insulator; a second insulator over the first oxide; a second conductor over the second insulator; and a third insulator in contact with a side surface of the second insulator and a side surface of the second conductor. The second transistor includes a third conductor; a first insulator over the third conductor; an eighth insulator and a ninth insulator which are over the first insulator; a second oxide over the eighth insulator; a third oxide over the ninth insulator; a fourth oxide over the first insulator, the second oxide, and the third oxide; a fourth insulator over the fourth oxide; a fourth conductor over the fourth insulator; a fifth insulator in contact with a side surface of the fourth insulator and a side surface of the fourth conductor; and a sixth insulator in contact with the first insulator, the first oxide, the fourth oxide, the third insulator, and the fifth insulator. The first insulator and the sixth insulator are in contact with each other in a region on the periphery of the side of the first oxide and in a region on the periphery of the side of the fourth oxide.

In the above, the first oxide may include a first region where a channel is formed; a second region adjacent to the first region; a third region adjacent to the second region; and a fourth region adjacent to the third region. The first region has higher resistance than the second region, the third region, and the fourth region and overlaps with the second conductor. The second region has higher resistance than the third region and the fourth region and overlaps with the second conductor. The third region has higher resistance than the fourth region and overlaps with the fourth insulator.

In the above, the first oxide, the second oxide, and the third oxide may each have a surface with a curvature between a side surface and a top surface thereof.

In the above, a radius of curvature of a curved surface between the side surface and the top surface of each of the first oxide, the second oxide, and the third oxide may be greater than or equal to 3 nm and less than or equal to 10 nm.

In the above, the first insulator may be hafnium oxide formed by an ALD method, each of the fourth insulator and the fifth insulator may be aluminum oxide formed by a sputtering method, and the sixth insulator may be aluminum oxide formed by an ALD method.

In the above, the first oxide, the second oxide, and the third oxide may each include In, an element M (M is Al, Ga, Y, or Sn), and Zn.

According to one embodiment of the present invention, a semiconductor device having favorable electrical characteristics can be provided. According to one embodiment of the present invention, a semiconductor device that can be miniaturized or highly integrated can be provided. According to one embodiment of the present invention, a semiconductor device with high productivity can be provided.

A semiconductor device capable of retaining data for a long time can be provided. A semiconductor device capable of high-speed data writing can be provided.

A semiconductor device with high design flexibility can be provided. A semiconductor device with low power consumption can be provided. A novel semiconductor device can be provided.

Note that the description of these effects does not preclude the existence of other effects. One embodiment of the present invention does not have to have all the effects listed above. Other effects will be apparent from and can be derived from the description of the specification, the drawings, the claims, and the like.

DETAILED DESCRIPTION OF THE INVENTION

Figure 1A:
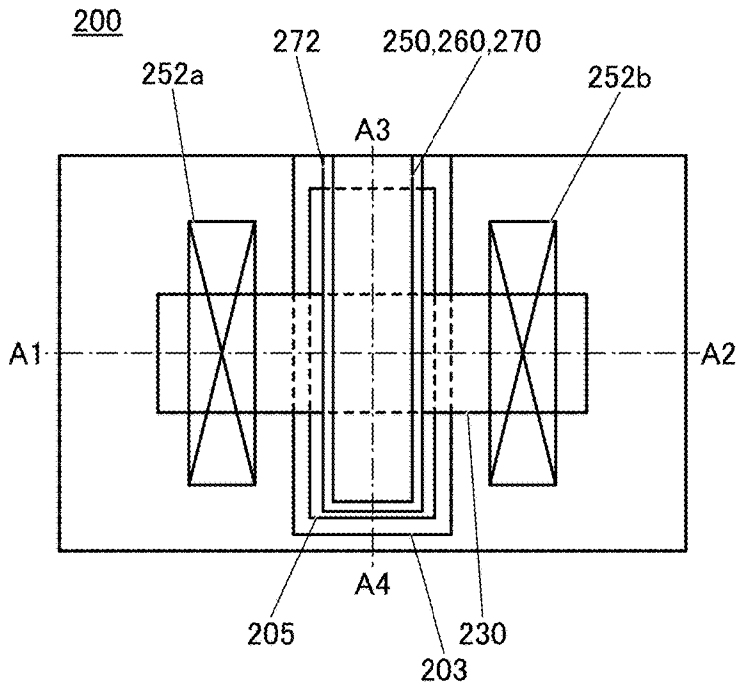
FIGS. 1A to 1C are a top view and cross-sectional views of a semiconductor device of one embodiment of the present invention.

Hereinafter, embodiments will be described with reference to drawings. Note that the embodiments can be implemented with various modes, and it will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, the size, the layer thickness, or the region is not limited to the illustrated scale. Note that the drawings are schematic views showing ideal examples, and embodiments of the present invention are not limited to shapes or values shown in the drawings. For example, in the actual manufacturing process, a layer, a resist mask, or the like might be unintentionally reduced in size by treatment such as etching, which is not illustrated in some cases for easy understanding. In the drawings, the same portions or portions having similar functions are denoted by the same reference numerals in different drawings, and explanation thereof will not be repeated in some cases. Furthermore, the same hatching pattern is applied to portions having similar functions, and the portions are not especially denoted by reference numerals in some cases.

Especially in a top view (also referred to as a "plan view"), a perspective view, or the like, some components might not be illustrated for easy understanding of the invention. In addition, some hidden lines and the like might not be shown.

Note that the ordinal numbers such as "first", "second", and the like in this specification and the like are used for convenience and do not denote the order of steps or the stacking order of layers. Therefore, for example, description can be made even when "first" is replaced with "second" or "third", as appropriate. In addition, the ordinal numbers in this specification and the like are not necessarily the same as those which specify one embodiment of the present invention.

In this specification, terms for describing arrangement, such as "over", "above", "under", and "below", are used for convenience in describing a positional relation between components with reference to drawings. Furthermore, the positional relationship between components is changed as appropriate in accordance with the direction in which each component is described. Thus, there is no limitation on terms used in this specification, and description can be made appropriately depending on the situation.

For example, in this specification and the like, an explicit description “X and Y are connected” means that X and Y are electrically connected, X and Y are functionally connected, and X and Y are directly connected. Accordingly, without being limited to a predetermined connection relationship, for example, a connection relationship shown in drawings or texts, another connection relationship is included in the drawings or the texts.

Here, X and Y each denote an object (e.g., a device, an element, a circuit, a wiring, an electrode, a terminal, a conductive film, or a layer).

Examples of the case where X and Y are directly connected include the case where an element that allows an electrical connection between X and Y (e.g., a switch, a transistor, a capacitor, an inductor, a resistor, a diode, a display element, a light-emitting element, or a load) is not connected between X and Y, and the case where X and Y are connected without the element that allows the electrical connection between X and Y provided therebetween.

For example, in the case where X and Y are electrically connected, one or more elements that allow an electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, the switch is turned on or off to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that allow a functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; or a control circuit) can be connected between X and Y. For example, even when another circuit is interposed between X and Y, X and Y are functionally connected if a signal output from X is transmitted to Y. Note that the case where X and Y are functionally connected includes the case where X and Y are directly connected and the case where X and Y are electrically connected.

In this specification and the like, a transistor is an element having at least three terminals of a gate, a drain, and a source. The transistor has a channel formation region between the drain (a drain terminal, a drain region, or a drain electrode) and the source (a source terminal, a source region, or a source electrode), and current can flow between the source and the drain through the channel formation region. Note that in this specification and the like, a channel formation region refers to a region through which current mainly flows.

Furthermore, functions of a source and a drain might be switched when a transistor of opposite polarity is employed or the direction of current flow is changed in circuit operation, for example. Therefore, the terms “source” and “drain” can be switched in some cases in this specification and the like.

Note that the channel length refers to, for example, the distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a plan view of the transistor. In one transistor, channel lengths in all regions are not necessarily the same. In other words, the channel length of one transistor is not fixed to one value in some cases. Thus, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions are not necessarily the same. In other words, the channel width of one transistor is not fixed to one value in some cases. Thus, in this specification, the channel width is any one of values, the maximum value, the minimum value, or the average value in a region where a channel is formed.

Note that depending on transistor structures, a channel width in a region where a channel is actually formed (hereinafter referred to as an “effective channel width”) is different from a channel width shown in a top view of a transistor (hereinafter referred to as an “apparent channel width”) in some cases. For example, in a transistor having a gate electrode covering the side surface of a semiconductor, an effective channel width is greater than an apparent channel width, and its influence cannot be ignored in some cases. For example, in a miniaturized transistor having a gate electrode covering the side surface of a semiconductor, the proportion of a channel formation region formed in the side surface of a semiconductor is increased. In that case, an effective channel width is greater than an apparent channel width.

In such a case, an effective channel width is difficult to measure in some cases. For example, to estimate an effective channel width from a design value, it is necessary to assume that the shape of a semiconductor is known as an assumption condition. Accordingly, in the case where the shape of a semiconductor is not known accurately, it is difficult to measure an effective channel width accurately.

Thus, in this specification, an apparent channel width is referred to as a surrounded channel width (SCW) in some cases. Furthermore, in this specification, in the case where the term “channel width” is simply used, it may represent a surrounded channel width or an apparent channel width. Alternatively, in this specification, in the case where the term “channel width” is simply used, it may represent an effective channel width. Note that a channel length, a channel width, an effective channel width, an apparent channel width, a surrounded channel width, and the like can be determined by analyzing a cross-sectional TEM image and the like.

Note that an impurity in a semiconductor refers to, for example, elements other than the main components of a semiconductor. For example, an element with a concentration lower than 0.1 atomic % can be regarded as an impurity. When an impurity is contained, the density of states (DOS) in a semiconductor may be increased, or the crystallinity may be decreased. In the case where the semiconductor is an oxide semiconductor, examples of an impurity which changes characteristics of the semiconductor include Group 1 elements, Group 2 elements, Group 13 elements, Group 14 elements, Group 15 elements, and transition metals other than the main components of the oxide semiconductor; there are hydrogen, lithium, sodium, silicon, boron, phosphorus, carbon, and nitrogen, for example. For an oxide semiconductor, water also serves as an impurity in some cases. For an oxide semiconductor, entry of impurities may lead to formation of oxygen vacancies, for example. Furthermore, when the semiconductor is silicon, examples of an impurity which changes the characteristics of the semiconductor include oxygen, Group 1 elements except hydrogen, Group 2 elements, Group 13 elements, and Group 15 elements.

In this specification and the like, a silicon oxynitride film contains more oxygen than nitrogen. A silicon oxynitride film preferably contains, for example, oxygen, nitrogen, silicon, and hydrogen in the ranges of 55 atomic % to 65 atomic % inclusive, 1 atomic % to 20 atomic % inclusive, 25 atomic % to 35 atomic % inclusive, and 0.1 atomic % to 10 atomic % inclusive, respectively. A silicon nitride oxide film contains more nitrogen than oxygen. A silicon nitride oxide film preferably contains nitrogen, oxygen, silicon, and hydrogen in the ranges of 55 atomic % to 65 atomic % inclusive, 1 atomic % to 20 atomic % inclusive, 25 atomic % to 35 atomic % inclusive, and 0.1 atomic % to 10 atomic % inclusive, respectively.

In this specification and the like, the terms "film" and "layer" can be interchanged with each other. For example, the term "conductive layer" can be changed into the term "conductive film" in some cases. Also, the term "insulating film" can be changed into the term "insulating layer" in some cases.

In addition, in this specification and the like, the term "insulator" can be replaced with the term "insulating film" or "insulating layer". Moreover, the term "conductor" can be replaced with the term "conductive film" or "conductive layer". Furthermore, the term "semiconductor" can be replaced with the term "semiconductor film" or "semiconductor layer".

Furthermore, unless otherwise specified, transistors described in this specification and the like are field effect transistors. Unless otherwise specified, transistors described in this specification and the like are n-channel transistors. Thus, unless otherwise specified, the threshold voltage (also referred to as "Vth") is higher than 0 V.

In this specification and the like, the term "parallel" indicates that the angle formed between two straight lines is greater than or equal to −10° and less than or equal to 10°, and accordingly also includes the case where the angle is greater than or equal to −5° and less than or equal to 50. In addition, the term "substantially parallel" indicates that the angle formed between two straight lines is greater than or equal to −30° and less than or equal to 300. The term "perpendicular" indicates that the angle formed between two straight lines is greater than or equal to 800 and less than or equal to 1000, and accordingly also includes the case where the angle is greater than or equal to 850 and less than or equal to 950. In addition, the term "substantially perpendicular" indicates that the angle formed between two straight lines is greater than or equal to 600 and less than or equal to 1200.

In this specification, trigonal and rhombohedral crystal systems are included in a hexagonal crystal system.

Note that in this specification, a barrier film refers to a film having a function of inhibiting the penetration of oxygen and impurities such as water and hydrogen. The barrier film that has conductivity may be referred to as a conductive barrier film.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in an active layer of a transistor is called an oxide semiconductor in some cases. In other words, an OS FET is a transistor including an oxide or an oxide semiconductor.

Embodiment 1

An example of a semiconductor device including a transistor 200 of one embodiment of the present invention is described below.

Structure Example 1 of Semiconductor Device

Figure 1C:
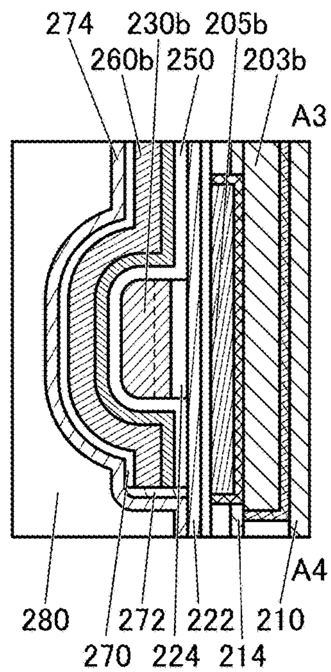
Figure 1B:
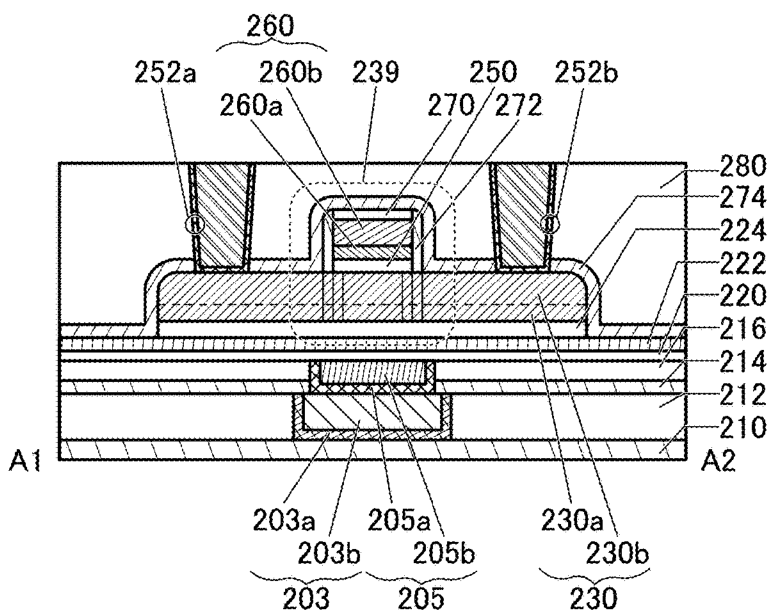

FIGS. 1A to 1C are a top view and cross-sectional views illustrating the transistor 200 of one embodiment of the present invention and the periphery thereof.

FIG. 1A is a top view of the semiconductor device including the transistor 200. FIGS. 1B and 1C are cross-sectional views illustrating the semiconductor device. FIG. 1B is a cross-sectional view taken along dashed-dotted line A1-A2 in FIG. 1A, which corresponds to a cross-sectional view in the channel length direction of the transistor 200. FIG. 1C is a cross-sectional view taken along dashed-dotted line A3-A4 in FIG. 1A, which corresponds to a cross sectional view in the channel width direction of the transistor 200. For simplification of the drawing, some components are not illustrated in the top view in FIG. 1A.

The semiconductor device of one embodiment of the present invention includes the transistor 200 and insulators 210, 212, and 280 that serve as interlayer films. The semiconductor device further includes a conductor 203 (a conductor 203*a* and a conductor 203*b*) serving as wirings and a conductor 252 (a conductor 252*a* and a conductor 252*b*) serving as plugs. The conductor 203 and the conductor 252 are electrically connected to the transistor 200.

A conductor 203 includes a conductor 203*a* that is in contact with an inner wall of an opening of the insulator 212 and a conductor 203*b* positioned inside the conductor 203*a*. Here, the top surface of the conductor 203 can be at substantially the same level as the top surface of the insulator 212. Although the conductors 203*a* and 203*b* are stacked in the transistor 200, the structure of the present invention is not limited to this structure. For example, only the conductor 203*b* may be provided.

The conductor 252 is formed in contact with inner walls of openings in the insulator 280. Here, the top surface of the conductor 252 can be substantially level with the top surface of the insulator 280. Note that although the conductor 252 in the transistor 200 has a single-layer structure, one embodiment of the present invention is not limited thereto. For example, the conductor 252 may have a stacked-layer structure of two or more layers.

[Transistor 200]

As illustrated in FIGS. 1A to 1C, the transistor 200 includes insulators 214 and 216 provided over a substrate (not illustrated); a conductor 205 provided to be embedded in the insulators 214 and 216; an insulator 220 provided over the insulator 216 and the conductor 205; an insulator 222 provided over the insulator 220; an insulator 224 provided over the insulator 222; an oxide 230 (an oxide 230*a* and an oxide 230*b*) provided over the insulator 224; an insulator 250 provided over the oxide 230; a conductor 260 (a conductor 260*a* and a conductor 260*b*) provided over the insulator 250; an insulator 270 provided over the conductor 260; an insulator 272 provided in contact with at least side surfaces of the insulator 250 and the conductor 260; and an insulator 274 provided in contact with the oxide 230 and the insulator 272.

Figure 3A:
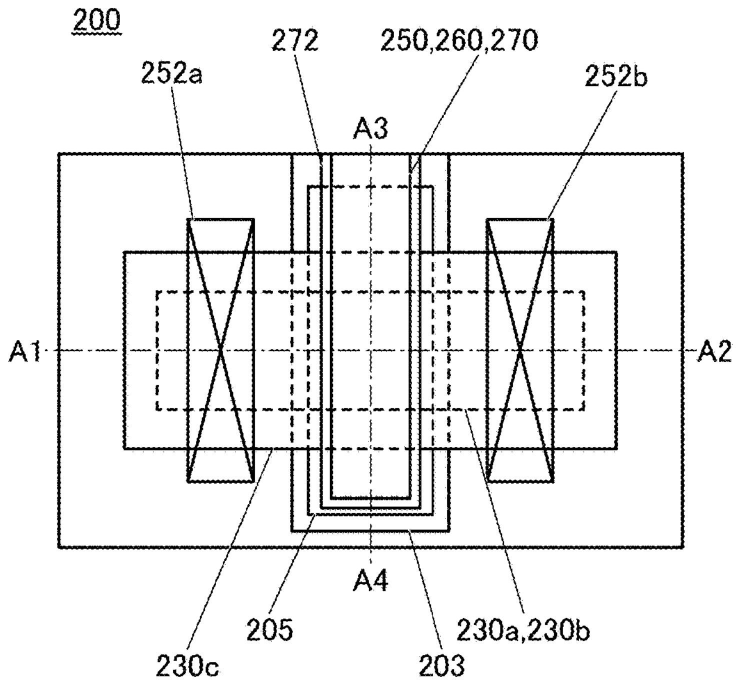
FIGS. 3A to 3C are a top view and cross-sectional views of a semiconductor device of one embodiment of the present invention.
Figure 3C:
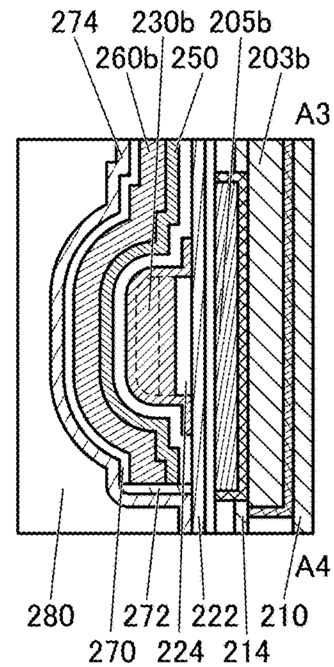
Figure 3B:
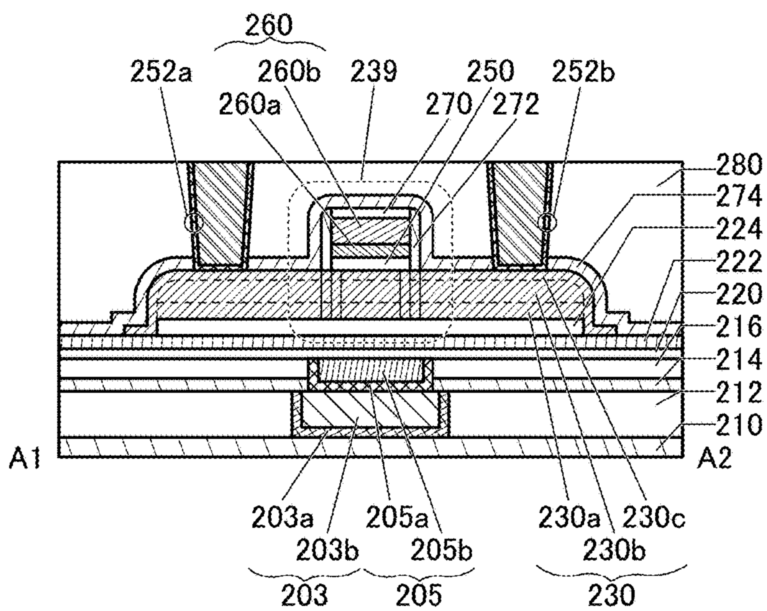
Figure 4A:
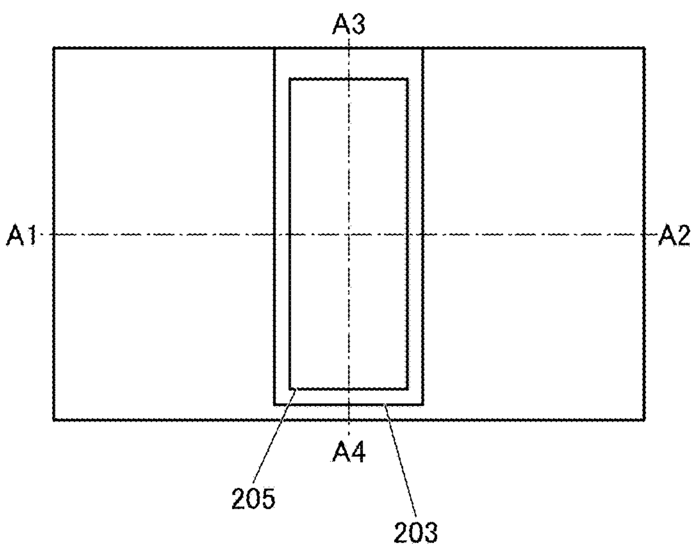
FIGS. 4A to 4C are a top view and cross-sectional views illustrating a method for manufacturing a semiconductor device of one embodiment of the present invention.
Figure 4C:
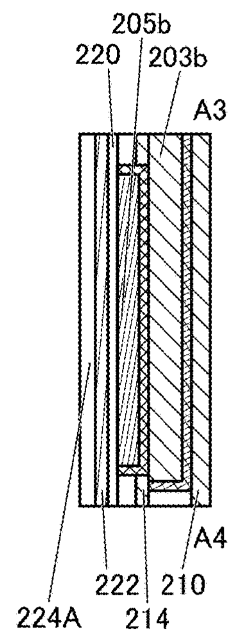
Figure 4B:
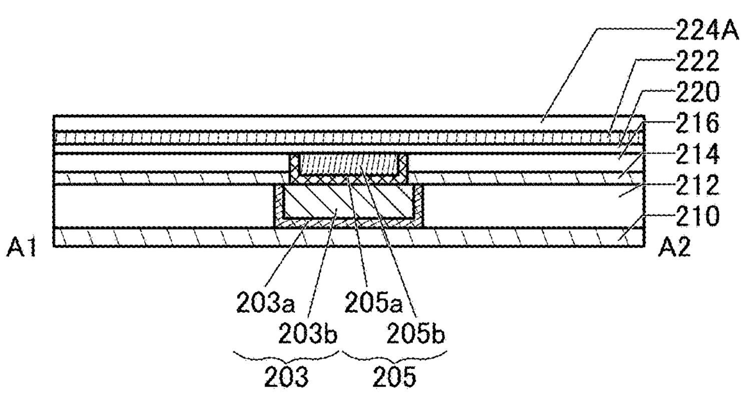

Although the transistor 200 has a structure in which the oxide 230*a* and the oxide 230*b* are stacked, one embodiment of the present invention is not limited to this structure. For example, as illustrated in FIGS. 3A to 3C, the transistor 200 may have a three-layer structure of the oxide 230*a*, the oxide 230*b*, and an oxide 230*c* or may have a stacked-layer structure of three or more layers. Alternatively, the transistor 200 may have a structure in which only the oxide 230*b* is provided as an oxide or only the oxide 230*b* and the oxide 230*c* are provided as an oxide. Although the conductor 260*a* and the conductor 260*b* are stacked in the transistor 200, one embodiment of the present invention is not limited to this structure. For example, a structure in which only the conductor 260*b* is provided may be employed.

Figure 2A:
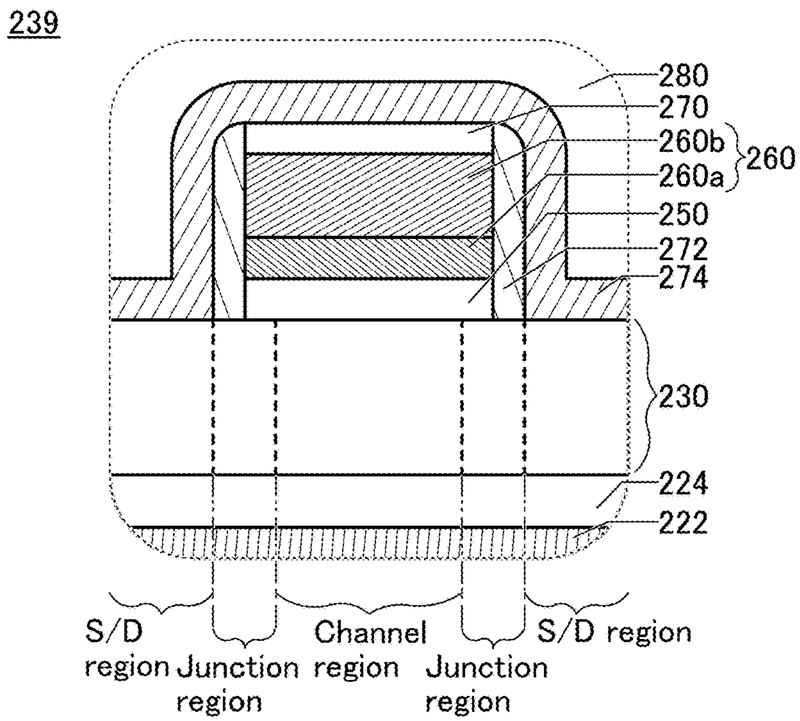
FIGS. 2A and 2B are cross-sectional views of a semiconductor device of one embodiment of the present invention.
Figure 2B:
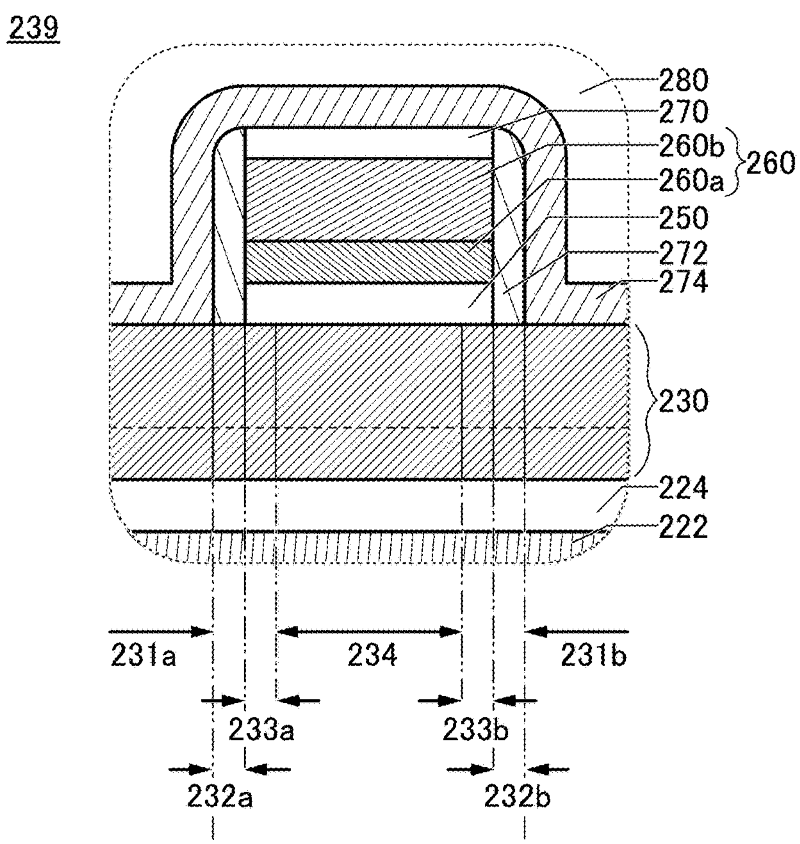

FIGS. 2A and 2B are enlarged views illustrating a region 239 including a channel and the vicinity thereof, which is surrounded by a dashed line in FIG. 1B.

As illustrated in FIG. 2A, the oxide 230 includes a junction region between a region functioning as a channel formation region in the transistor 200 and a region functioning as a source region or a drain region in the transistor 200. The region functioning as the source region or the drain region has a high carrier density and reduced resistance. The region functioning as the channel formation region has a lower carrier density than the region functioning as the source region or the drain region. The junction region has a lower carrier density than the region functioning as the source region or the drain region and has a higher carrier density than the region functioning as the channel formation region. That is, the junction region functions as a junction region between the channel formation region and the source region or the drain region.

The junction region prevents a high-resistance region from being formed between the region functioning as the source region or the drain region and the region functioning as the channel formation region, thereby increasing on-state current of the transistor.

Specifically, as illustrated in FIG. 2B, the oxide 230 includes a region 231 (a region 231*a* and a region 231*b*), a region 232 (a region 232*a* and a region 232*b*), a region 233 (a region 233*a* and a region 233*b*), and a region 234.

The regions 231, 232, and 233 are regions having a high carrier density and reduced resistance. In particular, when the region 231 has a higher carrier density than the other regions, the region 231 functions as the source region and the drain region in some cases. The region 234 has a lower carrier density than the other regions, and thus at least part of the region 234 functions as the channel formation region in some cases.

The regions 232 and 233 are regions provided between the channel formation region and the source and drain regions. The region 233 has a higher carrier density than the region 234 and has a lower carrier density than the regions 232 and 231. The region 232 has a higher carrier density than the regions 234 and 233 and has a lower carrier density than the region 231.

The regions 232 and 233 prevents a high-resistance region from being formed between the region 231 functioning as the source region and drain region and the region 234 where a channel is formed, thereby increasing on-state current of the transistor.

The region 233 sometimes functions as an overlap region (also referred to as an Lov region) which overlaps with the conductor 260 that functions as a gate electrode.

It is preferable that the region 231 be in contact with the insulator 274 and that the concentration of at least one of a metal element such as indium and impurity elements such as hydrogen and nitrogen in the region 231 be higher than that in each of the regions 232, 233, and 234.

The region 232 includes a region overlapping with the insulator 272. The region 232 is provided between the region 231 and the region 233, and the concentration of at least one of a metal element such as indium and impurity elements such as hydrogen and nitrogen in the region 232 is preferably higher than that in each of the regions 233 and 234. On the other hand, the concentration of at least one of a metal element such as indium and impurity elements such as hydrogen and nitrogen in the region 232 is preferably lower than that in the region 231.

The region 233 includes a region overlapping with the conductor 260. The region 233 is provided between the region 232 and the region 234, and the concentration of at least one of a metal element such as indium and impurity elements such as hydrogen and nitrogen in the region 232 is preferably higher than that in the region 234. On the other hand, the concentration of at least one of a metal element such as indium and impurity elements such as hydrogen and nitrogen in the region 233 is preferably lower than that in each of the regions 231 and 234.

The region 234 overlaps with the conductor 260. The region 234 is provided between the region 233*a* and the region 233*b*, and the concentration of at least one of a metal element such as indium and impurity elements such as hydrogen and nitrogen in the region 234 is preferably lower than that in each of the regions 231, 232, and 233.

Note that in the oxide 230, at least part of the region 231 or the region 231 functions as a source region and a drain region in some cases. Moreover, in the oxide 230, at least part of the region 234 functions as a channel formation region in some cases.

In the oxide 230, a boundary between the regions 231, 232, 233, and 234 cannot be observed clearly in some cases. The concentration of at least one of a metal element such as indium and impurity elements such as hydrogen and nitrogen, which is detected in each region, may be gradually changed (such a change is also referred to as gradation) not only between the regions but also in each region. That is, the region closer to the region 234 preferably has a lower concentration of at least one of a metal element such as indium and impurity elements such as hydrogen and nitrogen. The concentration of at least one of impurity elements in the region 232 is lower than that in the region 231, and that in the region 233 is lower than that in the region 232.

Although the regions 231, 232, 233, and 234 are formed in the oxides 230*a* and 230*b* in FIG. 2B, one embodiment of the present invention is not limited thereto, and for example, the regions may be formed at least in the oxide 230*b*. Although boundaries between the regions are indicated substantially perpendicularly to the top surface of the oxide 230 in FIGS. 1A to 1C and FIGS. 2A and 2B, this embodiment is not limited thereto. For example, the region 233 may project to the conductor 260 side in the vicinity of a surface of the oxide 230*b*, or the region 233 may recede to the conductor 252*a* or 252*b* side in the vicinity of the bottom surface of the oxide 230*a*.

In the transistor 200, the oxide 230 is preferably formed using a metal oxide functioning as an oxide semiconductor (hereinafter, the metal oxide is also referred to as an oxide semiconductor). A transistor formed using an oxide semiconductor has an extremely low leakage current (off-state current) in an off state; thus, a semiconductor device with low power consumption can be provided. An oxide semiconductor can be formed by a sputtering method or the like and thus can be used in a transistor included in a highly integrated semiconductor device.

However, the transistor formed using an oxide semiconductor is likely to have its electrical characteristics changed by impurities and oxygen vacancies in the oxide semiconductor; as a result, the reliability is reduced, in some cases. Hydrogen contained in an oxide semiconductor reacts with oxygen bonded to a metal atom to be water, and thus causes an oxygen vacancy, in some cases. Entry of hydrogen into the oxygen vacancy generates an electron serving as a carrier in some cases. Accordingly, a transistor including an oxide semiconductor containing oxygen vacancies is likely to have normally-on characteristics. Thus, it is preferable that oxygen vacancies in the oxide semiconductor be reduced as much as possible.

When oxygen vacancies exist at an interface between the region 234 in the oxide 230 where a channel is formed and the insulator 250 functioning as a gate insulating film, a variation in the electrical characteristics is likely to occur and the reliability is reduced in some cases.

In view of the above, the insulator 250 in contact with the region 234 of the oxide 230 preferably contains oxygen at a higher proportion than oxygen in the stoichiometric composition (also referred to as "excess oxygen"). That is, excess oxygen contained in the insulator 250 is diffused into the region 234, whereby oxygen vacancies in the region 234 can be reduced.

The insulator 272 is preferably provided in contact with the insulator 250. For example, the insulator 272 preferably has a function of suppressing diffusion of oxygen (e.g., oxygen atoms and oxygen molecules). That is, it is preferable that the above oxygen be less likely to pass through the insulator 272. When the insulator 272 has a function of suppressing diffusion of oxygen, oxygen in an excess-oxygen region is not diffused to the insulator 274 side and thus is supplied to the region 234 efficiently. Thus, formation of oxygen vacancies at an interface between the oxide 230 and the insulator 250 can be suppressed, leading to an improvement in the reliability of the transistor 200.

Furthermore, the transistor 200 is preferably covered with an insulator which has a barrier property and prevents entry of impurities such as water and hydrogen. The insulator having a barrier property is formed using an insulating material having a function of suppressing diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom, that is, an insulating material having a barrier property through which the above impurities are less likely to pass. Alternatively, the insulator having a barrier property is preferably formed using an insulating material having a function of suppressing diffusion of oxygen (e.g., oxygen atoms or oxygen molecules), that is, an insulating material having a barrier property through which the above oxygen is less likely to pass. Note that in this specification, a function of suppressing diffusion of impurities or oxygen means a function of suppressing diffusion of any one or all of the above impurities and the above oxygen.

For example, the transistor 200 is provided over the insulator 222. Moreover, the insulator 274 is provided to cover the transistor 200. When the insulator 222 and the insulator 274 are in contact with each other in an outer edge of the transistor 200, the transistor 200 can be surrounded by the insulators having a barrier property. With this structure, impurities such as hydrogen and water can be prevented from entering the transistor 200. In addition, oxygen contained in the insulators 224 and 250 can be prevented from being diffused into an interlayer film from the transistor 200.

The structure of a semiconductor device including the transistor 200 of one embodiment of the present invention is described in detail below.

The conductor 205 functioning as a second gate electrode is provided to overlap with the oxide 230 and the conductor 260. Moreover, the conductor 205 is preferably provided over and in contact with the conductor 203.

The conductor 205 is preferably larger than the region 234 in the oxide 230. It is particularly preferable that the conductor 205 be extended in the channel width direction (the W length direction) beyond the end portion of the region 234 in the oxide 230. That is, it is preferable that the conductor 205 and the conductor 260 overlap with each other with the insulator therebetween to overlap with the side surface of the oxide 230 in the channel width direction.

Here, the conductor 260 functions as a first gate (also referred to as a top gate) electrode in some cases. The conductor 205 functions as a second gate (also referred to a back gate) electrode in some cases. In that case, by changing a potential applied to the conductor 205 independently of a potential applied to the conductor 260, the threshold voltage of the transistor 200 can be controlled. In particular, by applying a negative potential to the conductor 205, the threshold voltage of the transistor 200 can be higher than 0 V, and the off-state current can be reduced. Accordingly, a drain current $I_{cut}$ when a voltage applied to the conductor 260 is 0 V can be reduced. Note that in this specification and the like, $I_{cut}$ is a drain current when a voltage of a gate electrode that controls switching operation of the transistor 200 is 0 V.

As illustrated in FIG. 1A, the conductor 205 is provided to overlap with the oxide 230 and the conductor 260. The conductor 205 is preferably provided to overlap with the conductor 260 also in a region on an outer side than the end portion of the oxide 230 in the channel width direction. That is, the conductor 205 and the conductor 260 preferably overlap with each other with the insulator therebetween on an outer side than the side surface of the oxide 230.

With the above structure, in the case where potentials are applied to the conductor 260 and the conductor 205, an electric field generated from the conductor 260 and an electric field generated from the conductor 205 are connected, so that a closed circuit which covers the channel formation region in the oxide 230 can be formed.

That is, the channel formation region in the region 234 can be electrically surrounded by the electric field of the conductor 260 functioning as the first gate electrode and the electric field of the conductor 205 functioning as the second gate electrode. In this specification, such a transistor structure in which the channel formation region is electrically surrounded by the electric fields of the first gate electrode and the second gate electrode is referred to as a surrounded channel (s-channel) structure.

In the conductor 205, a conductor 205*a* is formed in contact with an inner wall of an opening of the insulators 214 and 216 and a conductor 205*b* is formed on an inner side than the conductor 205*a*. Here, top surfaces of the conductors 205*a* and 205*b* can be at substantially the same level as the top surface of the insulator 216. Although the conductor 205*a* and the conductor 205*b* are stacked in the transistor 200, the structure of the present invention is not limited to this structure. For example, a structure in which only the conductor 205*b* is provided may be employed.

The conductor 203 extends in the channel width direction in a manner similar to that of the conductor 260, and functions as a wiring through which a potential is applied to the conductor 205, that is, the second gate electrode. Here, the conductor 205 is stacked over the conductor 203 functioning as the wiring for the second gate electrode and embedded in the insulators 214 and 216. When the conductor 205 is provided over the conductor 203, a distance between the conductor 203 and the conductor 260 functioning as the first gate electrode and the wiring can be set as appropriate. That is, the insulators 214 and 216 and the like are provided between the conductors 203 and 260, whereby a parasitic capacitance between the conductors 203 and 260 can be reduced, and the withstand voltage can be increased.

The reduction in the parasitic capacitance between the conductor 203 and the conductor 260 can improve the switching speed of the transistor, so that the transistor can have high frequency characteristics. The increase in the withstand voltage between the conductor 203 and the conductor 260 can improve the reliability of the transistor 200. Therefore, the thicknesses of the insulator 214 and the insulator 216 are preferably large. Note that the extending direction of the conductor 203 is not limited to this example; for example, the conductor 203 may extend in the channel length direction of the transistor 200.

The conductors 205*a* and 203*a* are preferably formed using a conductive material having a function of suppressing diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom, that is, a conductive material through which the above impurities are less likely to pass. Alternatively, the conductors 205*a* and 203*a* are preferably formed using a conductive material having a function of suppressing diffusion of oxygen (e.g., oxygen atoms or oxygen molecules), that is, a conductive material through which the above oxygen is less likely to pass.

When the conductors 205*a* and 203*a* have a function of suppressing diffusion of oxygen, the conductivity of the conductors 205*b* and 203*b* can be prevented from being lowered because of oxidation. As a conductive material having a function of suppressing diffusion of oxygen, for example, tantalum, tantalum nitride, ruthenium, ruthenium oxide, or the like is preferably used. Accordingly, the conductors 205*a* and 203*a* may be a single layer or a stacked layer of the above conductive materials. Thus, impurities such as hydrogen and water can be prevented from being diffused to the transistor 200 side of the insulator 210 through the conductors 203 and 205 from the substrate side of the insulator 210.

Furthermore, the conductor 205*b* is preferably formed using a conductive material including tungsten, copper, or aluminum as its main component. Note that the conductor 205*b* is a single layer in the drawing but may have a stacked-layer structure, for example, a stacked layer of titanium, titanium nitride, and any of the above conductive materials.

The conductor 203*b* functions as a wiring and thus is preferably a conductor having higher conductivity than the conductor 205*b*. For example, copper or a conductive material including aluminum as its main component can be used. The conductor 203*b* may have a stacked-layer structure, and for example, a stacked layer of titanium, titanium nitride, and any of the above conductive materials may be used.

It is particularly preferable to use copper for the conductor 203. Copper is preferably used for the wiring and the like because of its small resistance. However, copper is easily diffused. Copper may deteriorate the characteristics of the transistor 200 when diffused into the oxide 230. In view of the above, the insulator 214 is formed using a material such as aluminum oxide or hafnium oxide having low copper-transmitting property, whereby diffusion of copper can be suppressed.

Each of the insulators 210 and 214 preferably functions as a barrier insulating film for preventing impurities such as water and hydrogen from entering the transistor from the substrate side. Accordingly, each of the insulators 210 and 214 is preferably formed using an insulating material having a function of suppressing diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom, that is, an insulating material through which the above impurities are less likely to pass. Alternatively, each of the insulators 210 and 214 is preferably formed using an insulating material having a function of suppressing diffusion of oxygen (e.g., oxygen atoms or oxygen molecules), that is, an insulating material through which the above oxygen is less likely to pass.

For example, it is preferable that aluminum oxide be used for the insulator 210 and that silicon nitride be used for the insulator 214. Thus, impurities such as hydrogen and water can be prevented from being diffused to the transistor side from the insulators 210 and 214. In addition, oxygen contained in the insulator 224 and the like can be prevented from being diffused to the substrate side from the insulators 210 and 214.

Furthermore, with the structure in which the conductor 205 is stacked over the conductor 203, the insulator 214 can be provided between the conductor 203 and the conductor 205. Here, even when a metal that is easily diffused, such as copper, is used as the conductor 203*b*, silicon nitride or the like provided as the insulator 214 can prevent diffusion of the metal to a layer positioned above the insulator 214.

The permittivity of each of the insulators 212, 216, and 280 functioning as an interlayer film is preferably lower than that of the insulator 210 or 214. In the case where a material with a low permittivity is used as an interlayer film, the parasitic capacitance between wirings can be reduced.

For example, the insulators 212, 216, and 280 can be formed to have a single layer or a stacked layer using any of insulators such as silicon oxide, silicon oxynitride, silicon nitride oxide, aluminum oxide, hafnium oxide, tantalum oxide, zirconium oxide, lead zirconate titanate (PZT), strontium titanate ($SrTiO_3$), and $(Ba,Sr)TiO_3$ (BST). Aluminum oxide, bismuth oxide, germanium oxide, niobium oxide, silicon oxide, titanium oxide, tungsten oxide, yttrium oxide, or zirconium oxide may be added to the insulator, for example. The insulator may be subjected to nitriding treatment. A layer of silicon oxide, silicon oxynitride, or silicon nitride may be stacked over the insulator.

The insulators 220, 222, and 224 have a function of a gate insulator.

Here, as the insulator 224 in contact with the oxide 230, an oxide insulator that contains more oxygen than that in the stoichiometric composition is preferably used. That is, an excess-oxygen region is preferably formed in the insulator 224. When such an insulator containing excess oxygen is provided in contact with the oxide 230, oxygen vacancies in the oxide 230 can be reduced, leading to an improvement in reliability.

As the insulator including the excess-oxygen region, specifically, an oxide material that releases part of oxygen by heating is preferably used. An oxide that releases part of oxygen by heating is an oxide film in which the amount of released oxygen converted into oxygen molecules is greater than or equal to $1.0\times10^{18}$ atoms/cm$^3$, preferably greater than or equal to $3.0\times10^{20}$ atoms/cm$^3$ in thermal desorption spectroscopy (TDS) analysis. In the TDS analysis, the film surface temperature is preferably higher than or equal to 100° C. and lower than or equal to 700° C., or higher than or equal to 100° C. and lower than or equal to 400° C.

In the case where the insulator 224 includes an excess-oxygen region, the insulator 222 preferably has a function of suppressing diffusion of oxygen (e.g., oxygen atoms or oxygen molecules). That is, it is preferable that the above oxygen be less likely to pass through the insulator 222.

When the insulator 222 has a function of suppressing diffusion of oxygen, oxygen in the excess-oxygen region is not diffused to the insulator 220 side and thus can be supplied to the oxide 230 efficiently. The conductor 205 can be inhibited from reacting with oxygen in the excess-oxygen region of the insulator 224.

The insulator 222 preferably has a single-layer structure or a stacked-layer structure using an insulator containing what is called a high-k material such as aluminum oxide, hafnium oxide, tantalum oxide, zirconium oxide, lead zirconate titanate (PZT), strontium titanate ($SrTiO_3$), or (Ba, Sr)$TiO_3$ (BST). When a high-k material is used for the insulator functioning as a gate insulator, miniaturization and high integration of the transistor becomes possible. It is particularly preferable to use an insulating material (through which oxygen is unlikely to pass) having a function of suppressing diffusion of impurities such as aluminum oxide and hafnium oxide, oxygen, and the like. The insulator 222 formed of such a material serves as a layer that prevents release of oxygen from the oxide 230 and entry of impurities such as hydrogen from the periphery of the transistor 200.

Alternatively, aluminum oxide, bismuth oxide, germanium oxide, niobium oxide, silicon oxide, titanium oxide, tungsten oxide, yttrium oxide, or zirconium oxide may be added to these insulators, for example. These insulators may be subjected to nitriding treatment. A layer of silicon oxide, silicon oxynitride, or silicon nitride may be stacked over the insulator.

It is preferable that the insulator 220 be thermally stable. Because silicon oxide and silicon oxynitride have thermal stability, combination of silicon oxide or silicon oxynitride with an insulator which is a high-k material allows the stacked-layer structure to be thermally stable and have a high relative permittivity, for example.

Note that the insulators 220, 222, and 224 each may have a stacked-layer structure of two or more layers. In this case, the stacked layers are not necessarily formed of the same material but may be formed of different materials.

The oxide 230 includes the oxide 230*a* and the oxide 230*b* over the oxide 230*a*. The oxide 230 includes the regions 231, 232, 233, and 234. Note that it is preferable that at least part of the region 231 be in contact with the insulator 274 and have a higher concentration of at least one of hydrogen, nitrogen, and a metal element such as indium in the region 231 than the region 234.

When the transistor 200 is turned on, the region 231*a* or 231*b* functions as the source region or the drain region. At least part of the region 234 functions as a channel formation region.

As illustrated in FIGS. 2A and 2B, the oxide 230 preferably includes the regions 233 and 234. With this structure, the transistor 200 can have a high on-state current and a low leakage current (off-state current) in an off state.

When the oxide 230*b* is provided over the oxide 230*a*, impurities can be prevented from being diffused into the oxide 230*b* from the components formed below the oxide 230*a*. Moreover, when the oxide 230*b* is provided under the oxide 230*c* as illustrated in FIGS. 3A to 3C, impurities can be prevented from being diffused into the oxide 230*b* from the components formed above the oxide 230*c*.

The oxide 230 has a curved surface between the side surface and the top surface. That is, an end portion of the side surface and an end portion of the top surface are preferably curved (hereinafter such a curved shape is also referred to as a rounded shape). The radius of curvature of the curved surface at an end portion of the oxide 230*b* is greater than or equal to 3 nm and less than or equal to 10 nm, preferably greater than or equal to 5 nm and less than or equal to 6 nm.

The oxide 230 is preferably formed using a metal oxide functioning as an oxide semiconductor (hereinafter, the metal oxide is also referred to as an oxide semiconductor). For example, the metal oxide to be the region 234 preferably has an energy gap of 2 eV or more, preferably 2.5 eV or more. With the use of a metal oxide having such a wide energy gap, the off-state current of the transistor can be reduced.

Note that in this specification and the like, a metal oxide including nitrogen is also called a metal oxide in some cases. Moreover, a metal oxide including nitrogen may be called a metal oxynitride.

A transistor formed using an oxide semiconductor has an extremely low leakage current in an off state; thus, a semiconductor device with low power consumption can be provided. An oxide semiconductor can be formed by a sputtering method or the like and thus can be used in a transistor included in a highly integrated semiconductor device.

For example, as the oxide 230, a metal oxide such as an In-M-Zn oxide (M is one or a plurality of aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like) is used. In—Ga oxide or In—Zn oxide may be used as the oxide 230.

Here, the region 234 in the oxide 230 is described.

The region 234 preferably has a stacked-layer structure of metal oxides which differ in the atomic ratio of metal elements. Specifically, in the case where the region 234 has the stacked-layer structure of the oxide 230*a* and 230*b*, the atomic ratio of the element M to constituent elements in the metal oxide used as the oxide 230*a* is preferably greater than that in the metal oxide used as the oxide 230*b*. Moreover, the atomic ratio of the element M to In in the metal oxide used as the oxide 230*a* is preferably greater than that in the metal oxide used as the oxide 230*b*. Moreover, the atomic ratio of the element In to M in the metal oxide used as the oxide 230*b* is preferably greater than that in the metal oxide used as the oxide 230*a*. Note that in the case where the oxide 230*c* is provided as illustrated in FIGS. 3A to 3C, the oxide 230*c* can be formed using a metal oxide which can be used for the oxide 230*a* or 230*b*.

Next, the regions 231, 232, and 233 in the oxide 230 are described.

The regions 231, 232, and 233 are low-resistance regions which are obtained by adding a metal atom such as indium or impurities to a metal oxide formed as the oxide 230. Note that each of the regions has higher conductivity than at least the oxide 230*b* in the region 234. For addition of impurities to the regions 231, 232, and 233, for example, a dopant which is at least one of a metal element such as indium and impurities can be added by plasma treatment, an ion implantation method by which an ionized source gas is subjected to mass separation and then added, an ion doping method by which an ionized source gas is added without mass separation, a plasma immersion ion implantation method, or the like.

That is, when the content of a metal element such as indium in the regions 231, 232, and 233 in the oxide 230 is increased, the electron mobility can be increased and the resistance can be decreased.

When the insulator 274 containing impurity elements is formed in contact with the oxide 230, impurities can be added to the regions 231, 232, and 233.

That is, when an element that forms an oxygen vacancy or an element trapped by an oxygen vacancy is added to the regions 231, 232, and 233, the resistances of the regions 231, 232, and 233 are reduced. Typical examples of the element are hydrogen, boron, carbon, nitrogen, fluorine, phosphorus, sulfur, chlorine, titanium, and a rare gas. Typical examples of the rare gas element are helium, neon, argon, krypton, and xenon. Accordingly, the regions 231, 232, and 233 are made to include one or more of the above elements.

Note that the regions 234, 231, 232, and 233 are formed in the oxides 230*a* and 230*b* in FIGS. 1A to 1C and FIGS. 2A and 2B. Without limitation to the structure illustrated in FIGS. 1A to 1C and FIGS. 2A and 2B, for example, the regions may be formed at least in the oxide 230*b*. Although the boundaries between the regions are indicated substantially perpendicularly to the top surface of the oxide 230 in FIGS. 1A to 1C and FIGS. 2A and 2B, this embodiment is not limited thereto. For example, the region 233 may project to the conductor 260 side in the vicinity of the surface of the oxide 230*b*, or the region 233 may recede to the conductor 252*a* or 252*b* side in the vicinity of the bottom surface of the oxide 230*a*.

When the regions 233 and 232 are provided in the transistor 200, high-resistance regions are not formed between the region 231 functioning as the source region and the drain region and the region 234 where a channel is formed, so that the on-state current and the carrier mobility of the transistor can be increased. Moreover, when the transistor 200 includes the region 233, the gate does not overlap with the source region and the drain region in the channel length direction, so that formation of unnecessary capacitance can be suppressed, and the leakage current in an off state can be reduced.

Thus, by appropriately selecting the areas of the region 231*a* and the region 231*b*, a transistor having electrical characteristics necessary for the circuit design can be easily provided.

The insulator 250 functions as a gate insulating film. The insulator 250 is preferably provided in contact with the top surface of the oxide 230*b*. The insulator 250 is preferably formed using an insulator from which oxygen is released by heating. The insulator 250 is an oxide film of which the amount of released oxygen converted into oxygen molecules is greater than or equal to $1.0\times10^{18}$ atoms/cm$^3$, preferably greater than or equal to $3.0\times10^{20}$ atoms/cm$^3$ in thermal desorption spectroscopy (TDS) analysis, for example. Note that the temperature of the film surface in the TDS analysis is preferably higher than or equal to 100° C. and lower than or equal to 700° C., or higher than or equal to 100° C. and lower than or equal to 500° C.

When as the insulator 250, an insulator from which oxygen is released by heating is provided in contact with the top surface of the oxide 230*b*, oxygen can be efficiently supplied to the region 234 of the oxide 230*b*. Furthermore, like the insulator 224, the concentration of impurities such as water and hydrogen in the insulator 250 is preferably lowered. The thickness of the insulator 250 is preferably greater than or equal to 1 nm and less than or equal to 20 nm.

The conductor 260 functioning as the first gate electrode includes the conductor 260*a* and the conductor 260*b* over the conductor 260*a*. The conductor 260*a* is preferably formed using a conductive oxide. For example, the metal oxide that can be used as the oxide 230*a* or 230*b* can be used. In particular, an In—Ga—Zn-based oxide with an atomic ratio of In:Ga:Zn=4:2:3 to 4.1 or in the neighborhood thereof, which has high conductivity, is preferably used. When the conductor 260*a* is formed using such a material, oxygen can be prevented from entering the conductor 260*b*, and an increase in electric resistance value of the conductor 260*b* due to oxidation can be prevented.

When such a conductive oxide is formed by a sputtering method, oxygen can be added to the insulator 250, so that oxygen can be supplied to the metal oxide 230*b*. Thus, oxygen vacancies in the region 234 of the oxide 230 can be reduced.

The conductor 260*b* can be formed using a metal such as tungsten, for example. As the conductor 260*b*, a conductor that can add impurities such as nitrogen to the conductor 260*a* to improve the conductivity of the conductor 260*a* may be used. For example, titanium nitride or the like is preferably used for the conductor 260*b*. Alternatively, the conductor 260*b* may be a stack including a metal nitride such as titanium nitride and a metal such as tungsten thereover.

In the case where the conductor 205 extends in the channel width direction beyond the end portion of the oxide 230 as illustrated in FIG. 1C, the conductor 260 preferably overlaps with the conductor 205 with the insulator 250 therebetween. That is, a stacked-layer structure of the conductor 205, the insulator 250, and the conductor 260 is preferably formed outside the side surface of the oxide 230.

With the above structure, in the case where potentials are applied to the conductor 260 and the conductor 205, an electric field generated from the conductor 260 and an electric field generated from the conductor 205 are connected, so that a closed circuit which covers the channel formation region in the oxide 230 can be formed.

That is, the channel formation region in the region 234 can be electrically surrounded by the electric field of the conductor 260 functioning as the first gate electrode and the electric field of the conductor 205 functioning as the second gate electrode.

The insulator 270 functioning as a hard mask may be provided over the conductor 260*b*. By provision of the insulator 270, the conductor 260 can be processed to have a side surface that is substantially perpendicular. Specifically, an angle formed by the side surface of the conductor 260 and a surface of the substrate can be greater than or equal to 750 and less than or equal to 1000, preferably greater than or equal to 800 and less than or equal to 950. When the conductor is processed into such a shape, the insulator 272 that is subsequently formed can be formed into a desired shape.

The insulator 272 functioning as a barrier film is provided in contact with the side surface of the insulator 250, the side surface of the conductor 260, and the side surface of the insulator 270.

Here, the insulator 272 is preferably formed using an insulating material that has a function of inhibiting the penetration of oxygen and impurities such as water and hydrogen. For example, aluminum oxide or hafnium oxide is preferably used. In this manner, oxygen in the insulator 250 can be prevented from diffusing outward. In addition, impurities such as hydrogen and water can be prevented from entering the oxide 230 through the side of the insulator 250 or the like.

By provision of the insulator 272, the top surface and the side surface of the conductor 260 and the side surface of the insulator 250 can be covered with an insulator having a function of inhibiting the penetration of oxygen and impurities such as water and hydrogen. This can prevent entry of impurities such as water and hydrogen into the oxide 230 through the conductor 260 and the insulator 250. Thus, the insulator 272 functions as a side barrier for protecting the side surfaces of the gate electrode and the gate insulating film.

In the case where the transistor is miniaturized and has a channel length of approximately greater than or equal to 10 nm and less than or equal to 30 nm, impurity elements contained in the structure bodies provided in the vicinity of the transistor 200 might be diffused, and the regions 231*a* and 231*b* might be electrically connected to each other.

In view of the above, when the insulator 272 is formed as described in this embodiment, impurities such as hydrogen and water can be prevented from entering the insulator 250 and the conductor 260, and oxygen in the insulator 250 can be prevented from being diffused to the outside. Accordingly, when a first gate voltage is 0 V, the source region and the drain region can be prevented from being electrically connected to each other.

The insulator 274 is provided to cover the insulator 270, the insulator 272, the oxide 230, and the insulator 224. Here, the insulator 274 is provided in contact with top surfaces of the insulators 270 and 272 and the side surface of the insulator 272.

Moreover, the insulator 274 is preferably formed using an insulating material having a function of inhibiting the penetration of impurities such as water and hydrogen and oxygen. For example, as the insulator 274, silicon nitride, silicon nitride oxide, silicon oxynitride, aluminum nitride, aluminum nitride oxide, or the like is preferably used. When the insulator 274 is formed using any of the above materials, entry of oxygen through the insulator 274 to be supplied to oxygen vacancies in the regions 231*a* and 231*b*, which decreases the carrier density, can be prevented. Furthermore, impurities such as water and hydrogen can be prevented from passing through the insulator 274 and excessively enlarging the region 231*a* and the region 231*b* to the region 234 side.

Note that in the case where the regions 231, 232, and 233 are provided with formation of the insulator 274, the insulator 274 preferably includes at least one of hydrogen and nitrogen. When an insulator including impurities such as hydrogen and nitrogen is used as the insulator 274, impurities such as hydrogen and nitrogen are added to the oxide 230, so that the regions 231, 232, and 233 can be formed in the oxide 230.

The insulator 280 functioning as interlayer film is preferably provided over the insulator 274. Like the insulator 224 or the like, the concentration of impurities such as water and hydrogen in the insulator 280 is preferably lowered. Note that an insulator similar to the insulator 210 may be provided over the insulator 280.

The conductors 252*a* and 252*b* are provided in openings formed in the insulators 280 and 274. The conductors 252*a* and 252*b* are provided to face each other with the conductor 260 therebetween. Note that top surfaces of the conductors 252*a* and 252*b* may be at the same level as the top surface of the insulator 280.

Here, the conductor 252*a* is in contact with the region 231*a* functioning as one of a source region and a drain region of the transistor 200, and the conductor 252*b* is in contact with the region 231*b* functioning as the other of the source region and the drain region of the transistor 200. Therefore, the conductor 252*a* can function as one of a source electrode and a drain electrode, and the conductor 252*b* can function as the other of the source electrode and the drain electrode. Because the region 231*a* and the region 231*b* are reduced in resistance, the contact resistance between the conductor 252*a* and the region 231*a* and the contact resistance between the conductor 252*b* and the region 231*b* are reduced, leading to a large on-state current of the transistor 200.

Note that the conductor 252*a* is formed in contact with an inner wall of the opening in the insulators 280 and 274. At least part of the region 231*a* of the oxide 230 is positioned at the bottom of the opening, and thus the conductor 252*a* is in contact with the region 231*a*. Similarly, the conductor 252*b* is formed in contact with an inner wall of the opening in the insulators 280 and 274. At least part of the region 231*b* of the oxide 230 is positioned at the bottom of the opening, and thus the conductor 252*b* is in contact with the region 231*b*.

The conductor 252*a* (the conductor 252*b*) is in contact with at least the top surface of the oxide 230. It is preferable that the conductor 252*a* (the conductor 252*b*) be in contact with the top surface and the side surface of the oxide 230. It is particularly preferable that one or both of the side surface of the conductor 252*a* (the conductor 252*b*) on the A3 side and the side surface of the conductor 252*a* (the conductor 252*b*) on the A4 side, which intersect with the channel width direction of the oxide 230, be in contact with the side surface of the oxide 230. The conductor 252*a* (the conductor 252*b*) may be in contact with the side surface of the oxide 230 on the A1 side (the A2 side) in the direction intersecting with the channel length direction. When the conductor 252*a* (the conductor 252*b*) is in contact with not only the top surface of the oxide 230 but also the side surface of the oxide 230, the area where the conductor 252*a* (the conductor 252*b*) and the oxide 230 are in contact with each other can be increased without an increase in the area of the top surface of the contact portion, so that the contact resistance between the conductor 252*a* (the conductor 252*b*) and the oxide 230 can be reduced. Accordingly, miniaturization of the source electrode and the drain electrode of the transistor can be achieved and, in addition, the on-state current can be increased.

The conductor 252*a* and the conductor 252*b* are preferably formed using a conductive material including tungsten, copper, or aluminum as its main component. Although not shown, the conductor 252*a* and the conductor 252*b* may have a stacked-layer structure, and for example, a stacked layer of titanium, titanium nitride, and any of the above conductive materials may be used.

In the case where the conductor 252 has a stacked-layer structure, a conductive material having a function of inhibiting the penetration of impurities such as water and hydrogen is preferably used for a conductor in contact with the insulators 274 and 280, as in the conductor 205*a* or the like. For example, tantalum, tantalum nitride, titanium, titanium nitride, ruthenium, ruthenium oxide, or the like is preferably used. The conductive material having a function of inhibiting the penetration of impurities such as water and hydrogen may be used for forming a single layer or a stacked layer. When the conductive material is used, impurities such as hydrogen and water can be prevented from entering the oxide 230 through the conductors 252*a* and 252*b* from a layer above the insulator 280.

Although not illustrated, a conductor functioning as a wiring may be provided in contact with the top surfaces of the conductors 252*a* and 252*b*. A conductive material containing tungsten, copper, or aluminum as its main component is preferably used for the conductor serving as a wiring. The conductor may have a stacked-layer structure, and for example, a stacked layer of titanium, titanium nitride, and any of the above conductive materials. Note that like the conductor 203 or the like, the conductor may be formed to be embedded in an opening provided in an insulator.

<Material for Semiconductor Device>

Materials that can be used for a semiconductor device are described below.

<<Substrate>>

As a substrate over which the transistor 200 is formed, for example, an insulator substrate, a semiconductor substrate, or a conductor substrate may be used. As the insulator substrate, a glass substrate, a quartz substrate, a sapphire substrate, a stabilized zirconia substrate (e.g., an yttria-stabilized zirconia substrate), or a resin substrate is used, for example. As the semiconductor substrate, a semiconductor substrate of silicon, germanium, or the like, or a compound semiconductor substrate of silicon carbide, silicon germanium, gallium arsenide, indium phosphide, zinc oxide, or gallium oxide can be used, for example. A semiconductor substrate in which an insulator region is provided in the above semiconductor substrate, e.g., a silicon on insulator (SOI) substrate or the like is used. As the conductor substrate, a graphite substrate, a metal substrate, an alloy substrate, a conductive resin substrate, or the like is used. A substrate including a metal nitride, a substrate including a metal oxide, or the like is used. An insulator substrate provided with a conductor or a semiconductor, a semiconductor substrate provided with a conductor or an insulator, a conductor substrate provided with a semiconductor or an insulator, or the like is used. Alternatively, any of these substrates over which an element is provided may be used. As the element provided over the substrate, a capacitor, a resistor, a switching element, a light-emitting element, a memory element, or the like is used.

Alternatively, a flexible substrate may be used as the substrate. As a method for providing a transistor over a flexible substrate, there is a method in which the transistor is formed over a non-flexible substrate and then the transistor is separated and transferred to the substrate which is a flexible substrate. In that case, a separation layer is preferably provided between the non-flexible substrate and the transistor. The substrate may have elasticity. The substrate may have a property of returning to its original shape when bending or pulling is stopped. Alternatively, the substrate may have a property of not returning to its original shape. The substrate has a region with a thickness of, for example, greater than or equal to 5 μm and less than or equal to 700 μm, preferably greater than or equal to 10 μm and less than or equal to 500 μm, further preferably greater than or equal to 15 μm and less than or equal to 300 μm. When the substrate has a small thickness, the weight of the semiconductor device including the transistor can be reduced. When the substrate has a small thickness, even in the case of using glass or the like, the substrate may have elasticity or a property of returning to its original shape when bending or pulling is stopped. Therefore, an impact applied to the semiconductor device over the substrate due to dropping or the like can be reduced. That is, a durable semiconductor device can be provided.

For the substrate which is a flexible substrate, metal, an alloy, resin, glass, or fiber thereof can be used, for example. As the substrate, a sheet, a film, or a foil containing a fiber may be used. The flexible substrate preferably has a lower coefficient of linear expansion because deformation due to an environment is suppressed. The flexible substrate is formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, and acrylic. In particular, aramid is preferably used for the flexible substrate because of its low coefficient of linear expansion.

<<Insulator>>

Examples of an insulator include an insulating oxide, an insulating nitride, an insulating oxynitride, an insulating nitride oxide, an insulating metal oxide, an insulating metal oxynitride, and an insulating metal nitride oxide.

When a high-k material having a high relative permittivity is used for the insulator functioning as the gate insulator, miniaturization and high integration of the transistor can be achieved. In contrast, when a material having a low relative permittivity is used for the insulator functioning as an interlayer film, the parasitic capacitance between wirings can be reduced. Accordingly, a material is preferably selected depending on the function of an insulator.

As the insulator having a high relative permittivity, gallium oxide, hafnium oxide, zirconium oxide, an oxide containing aluminum and hafnium, an oxynitride containing aluminum and hafnium, an oxide containing silicon and hafnium, an oxynitride containing silicon and hafnium, a nitride containing silicon and hafnium, or the like can be given.

As the insulator having a low relative permittivity, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like can be given.

In particular, silicon oxide and silicon oxynitride are thermally stable. Accordingly, a stacked-layer structure which is thermally stable and has a low relative permittivity can be obtained by combination with a resin, for example. Examples of the resin include polyester, polyolefin, polyamide (e.g., nylon or aramid), polyimide, polycarbonate, and acrylic. Furthermore, combination of silicon oxide or silicon oxynitride with an insulator with a high relative permittivity allows the stacked-layer structure to be thermally stable and have a high relative permittivity, for example.

Note that when the transistor including an oxide semiconductor is surrounded by an insulator that has a function of inhibiting the penetration of oxygen and impurities such as hydrogen, the electrical characteristics of the transistor can be stabilized.

The insulator that has a function of inhibiting the penetration of oxygen and impurities such as hydrogen can have, for example, a single-layer structure or a stacked-layer structure of an insulator including boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. Specifically, as the insulator having a function of inhibiting the penetration of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide, silicon nitride oxide, silicon nitride, or the like can be used.

For example, an insulator that has a function of inhibiting the penetration of oxygen and impurities such as hydrogen may be used as each of the insulators 222, 214, and 210. Note that the insulators 222, 214, and 210 preferably contain aluminum oxide, hafnium oxide, or the like.

For example, the insulators 212, 216, 220, 224, and 250 may be formed using a single layer or a stacked layer of an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. Specifically, the insulators 212, 216, 220, 224, and 250 preferably contain silicon oxide, silicon oxynitride, or silicon nitride.

For example, when aluminum oxide, gallium oxide, or hafnium oxide in each of the insulators 224 and 250 functioning as a gate insulator is in contact with the oxide 230, entry of silicon included in silicon oxide or silicon oxynitride into the oxide 230 can be suppressed. When silicon oxide or silicon oxynitride in each of the insulators 224 and 250 is in contact with the oxide 230, for example, trap centers might be formed at the interface between aluminum oxide, gallium oxide, or hafnium oxide and silicon oxide or silicon oxynitride. The trap centers can shift the threshold voltage of the transistor in the positive direction by trapping electrons in some cases.

The insulator 212, the insulator 216, and the insulator 280 preferably include an insulator with a low relative permittivity. For example, the insulator 212, the insulator 216, and the insulator 280 preferably include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Alternatively, each of the insulator 212, the insulator 216, and the insulator 280 preferably has a stacked-layer structure of a resin and one of the following materials: silicon oxide, silicon oxynitride, silicon nitride oxide, silicon nitride, silicon oxide to which fluorine is added, silicon oxide to which carbon is added, silicon oxide to which carbon and nitrogen are added, and porous silicon oxide. When silicon oxide or silicon oxynitride, which is thermally stable, is combined with resin, the stacked-layer structure can have thermal stability and low relative permittivity. Examples of the resin include polyester, polyolefin, polyamide (e.g., nylon or aramid), polyimide, polycarbonate, and acrylic.

As the insulators 270 and 272, an insulator having a function of inhibiting the penetration of impurities such as hydrogen and oxygen may be used. For the insulator 270 and the insulator 272, a metal oxide such as aluminum oxide, hafnium oxide, magnesium oxide, gallium oxide, germanium oxide, yttrium oxide, zirconium oxide, lanthanum oxide, neodymium oxide, or tantalum oxide; silicon nitride oxide; silicon nitride; or the like may be used, for example.

<<Conductor>>

The conductors can be formed using a material containing one or more metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like. Alternatively, a semiconductor having a high electric conductivity typified by polycrystalline silicon including an impurity element such as phosphorus, or silicide such as nickel silicide may be used.

A stack of a plurality of conductive layers formed with the above materials may be used. For example, a stacked-layer structure formed using a combination of a material including any of the metal elements listed above and a conductive material including oxygen may be used. Alternatively, a stacked-layer structure formed using a combination of a material including any of the metal elements listed above and a conductive material including nitrogen may be used. Alternatively, a stacked-layer structure formed using a combination of a material including any of the metal elements listed above, a conductive material including oxygen, and a conductive material including nitrogen may be used.

When oxide is used for the channel formation region of the transistor, a stacked-layer structure formed using a material containing the above-described metal element and a conductive material containing oxygen is preferably used for the conductor functioning as the gate electrode. In this case, the conductive material containing oxygen is preferably formed on the channel formation region side. In that case, the conductive material including oxygen is preferably provided on the channel formation region side so that oxygen released from the conductive material is easily supplied to the channel formation region.

It is particularly preferable to use a conductive material containing oxygen and a metal element contained in the metal oxide forming a channel for the conductor functioning as the gate electrode. A conductive material containing the above metal element and nitrogen may be used. For example, a conductive material containing nitrogen such as titanium nitride or tantalum nitride may be used. Indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may be used. By using such a material, hydrogen contained in the metal oxide forming a channel can be captured in some cases. Alternatively, hydrogen entering from an external insulator or the like can be captured in some cases.

The conductors 260*a*, 260*b*, 203*a*, 203*b*, 205*a*, 205*b*, 252*a*, and 252*b* can be each formed using a material containing one or more metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like. Alternatively, a semiconductor having a high electric conductivity typified by polycrystalline silicon including an impurity element such as phosphorus, or silicide such as nickel silicide may be used.

<<Metal Oxide>>

The oxide 230 is preferably formed using a metal oxide functioning as an oxide semiconductor (hereinafter, the metal oxide is also referred to as an oxide semiconductor).

A metal oxide that can be used as the oxide 230 of one embodiment of the present invention is described below.

An oxide semiconductor preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, or the like may be contained.

Here, the case where the oxide semiconductor is an In-M-Zn oxide that contains indium, an element M, and zinc is considered. The element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, and magnesium. Note that two or more of the above elements may be used in combination as the element M.

Note that in this specification and the like, a metal oxide including nitrogen is also called a metal oxide in some cases. Moreover, a metal oxide including nitrogen may be called a metal oxynitride.

[Composition of Metal Oxide]

Described below is the composition of a cloud-aligned composite oxide semiconductor (CAC-OS) applicable to a transistor disclosed in one embodiment of the present invention.

In this specification and the like, "c-axis aligned crystal (CAAC)" or "cloud-aligned composite (CAC)" might be stated. Note that CAAC refers to an example of a crystal structure, and CAC refers to an example of a function or a material composition.

A CAC-OS or a CAC metal oxide has a conducting function in a part of the material and has an insulating function in another part of the material; as a whole, the CAC-OS or the CAC metal oxide has a function of a semiconductor. In the case where the CAC-OS or the CAC metal oxide is used in an active layer of a transistor, the conducting function is to allow electrons (or holes) serving as carriers to flow, and the insulating function is to not allow electrons serving as carriers to flow. By the complementary action of the conducting function and the insulating function, the CAC-OS or the CAC metal oxide can have a switching function (on/off function). In the CAC-OS or the CAC metal oxide, separation of the functions can maximize each function.

The CAC-OS or the CAC metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. The conductive regions are observed to be coupled in a cloud-like manner with their boundaries blurred, in some cases.

Furthermore, in the CAC-OS or the CAC metal oxide, the conductive regions and the insulating regions each have a size of greater than or equal to 0.5 nm and less than or equal to 10 nm, preferably greater than or equal to 0.5 nm and less than or equal to 3 nm and are dispersed in the material, in some cases.

The CAC-OS or the CAC metal oxide includes components having different bandgaps. For example, the CAC-OS or the CAC metal oxide contains a component having a wide gap due to the insulating region and a component having a narrow gap due to the conductive region. In the case of such a composition, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS or the CAC metal oxide is used in a channel formation region of a transistor, high current drive capability in the on state of the transistor, that is, high on-state current and high field-effect mobility, can be obtained.

In other words, the CAC-OS or the CAC metal oxide can be called a matrix composite or a metal matrix composite.

<Structure of Metal Oxide>

An oxide semiconductor is classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

The CAAC-OS has c-axis alignment, its nanocrystals are connected in the a-b plane direction, and its crystal structure has distortion. Note that distortion refers to a portion where the direction of a lattice arrangement changes between a region with a uniform lattice arrangement and another region with a uniform lattice arrangement in a region where the nanocrystals are connected.

The shape of the nanocrystal is basically a hexagon but is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of distortion in the CAAC-OS. That is, a lattice arrangement is distorted and thus formation of a grain boundary is inhibited. This is probably because the CAAC-OS can tolerate distortion owing to a low density of oxygen atom arrangement in the a-b plane direction, a change in interatomic bond distance by substitution of a metal element, and the like.

The CAAC-OS tends to have a layered crystal structure (also referred to as a stacked-layer structure) in which a layer containing indium and oxygen (hereinafter, In layer) and a layer containing the element M, zinc, and oxygen (hereinafter, (M, Zn) layer) are stacked. Note that indium and the element M can be replaced with each other, and when the element M of the (M, Zn) layer is replaced by indium, the layer can also be referred to as an (In, M, Zn) layer. When indium of the In layer is replaced by the element M, the layer can also be referred to as an (In, M) layer.

The CAAC-OS is an oxide semiconductor with high crystallinity. By contrast, in the CAAC-OS, a reduction in electron mobility due to the grain boundary is less likely to occur because a clear grain boundary cannot be observed. Entry of impurities, formation of defects, or the like might decrease the crystallinity of an oxide semiconductor. This means that the CAAC-OS has small amounts of impurities and defects (e.g., oxygen vacancies). Thus, an oxide semiconductor including a CAAC-OS is physically stable. Therefore, the oxide semiconductor including a CAAC-OS is resistant to heat and has high reliability.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different nanocrystals in the nc-OS. Thus, the orientation of the whole film is not observed. Accordingly, in some cases, the nc-OS cannot be distinguished from an a-like OS or an amorphous oxide semiconductor, depending on an analysis method.

The a-like OS has a structure intermediate between those of the nc-OS and the amorphous oxide semiconductor. The a-like OS has a void or a low-density region. That is, the a-like OS has low crystallinity as compared with the nc-OS and the CAAC-OS.

An oxide semiconductor can have any of various structures which show various different properties. Two or more of the amorphous oxide semiconductor, the polycrystalline oxide semiconductor, the a-like OS, the nc-OS, and the CAAC-OS may be included in an oxide semiconductor of one embodiment of the present invention.

[Transistor Containing Oxide Semiconductor]

Next, the case where the oxide semiconductor is used for a transistor will be described.

When the oxide semiconductor is used in a transistor, the transistor can have high field-effect mobility. In addition, the transistor can have high reliability.

Moreover, an oxide semiconductor with low carrier density is preferably used for the transistor. In order to reduce the carrier density of the oxide semiconductor film, the concentration of impurities in the oxide semiconductor film is reduced so that the density of defect states can be reduced. In this specification and the like, a state with a low impurity concentration and a low density of defect states is referred to as a highly purified intrinsic or substantially highly purified intrinsic state. The oxide semiconductor has, for example, a carrier density lower than $8\times10^{11}/cm^3$, preferably lower than $1\times10^{11}/cm^3$, and further preferably lower than $1\times10^{10}/cm^3$, and higher than or equal to $1\times10^{-9}/cm^3$.

A highly purified intrinsic or substantially highly purified intrinsic oxide semiconductor film has a low density of defect states and accordingly has a low density of trap states in some cases.

Charges trapped by the trap states in the oxide semiconductor takes a long time to be released and may behave like fixed charges. Thus, a transistor whose channel formation region is formed in the oxide semiconductor having a high density of trap states has unstable electrical characteristics in some cases.

In order to obtain stable electrical characteristics of the transistor, it is effective to reduce the concentration of impurities in the oxide semiconductor. In addition, in order to reduce the concentration of impurities in the oxide semiconductor, the concentration of impurities in a film that is adjacent to the oxide semiconductor is preferably reduced. As examples of the impurities, hydrogen, nitrogen, alkali metal, alkaline earth metal, iron, nickel, silicon, and the like are given.

[Impurity]

Here, the influence of impurities in the oxide semiconductor is described.

When silicon or carbon that is one of Group 14 elements is contained in the oxide, defect states are formed. Thus, the concentration of silicon or carbon (the concentration is measured by SIMS) in the oxide semiconductor and the concentration of silicon or carbon in the vicinity of an interface with the oxide semiconductor (the concentration is measured by SIMS) is set to be lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated, in some cases. Thus, a transistor including an oxide semiconductor that contains an alkali metal or an alkaline earth metal is likely to be normally-on. Therefore, it is preferable to reduce the concentration of an alkali metal or an alkaline earth metal in the oxide semiconductor. Specifically, the concentration of alkali metal or alkaline earth metal in the oxide semiconductor, which is measured by SIMS, is lower than or equal to $1\times10^{18}$ atoms/cm$^3$, preferably lower than or equal to $2\times10^{16}$ atoms/cm$^3$.

When the oxide semiconductor contains nitrogen, the oxide semiconductor easily becomes n-type by generation of electrons serving as carriers and an increase of carrier density. Thus, a transistor whose semiconductor includes an oxide semiconductor that contains nitrogen is likely to be normally-on. For this reason, nitrogen in the oxide semiconductor is preferably reduced as much as possible; for example, the concentration of nitrogen in the oxide semiconductor measured by SIMS is set to lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, and still further preferably lower than or equal to $5\times10^{17}$ atoms/cm$^3$.

Hydrogen contained in an oxide semiconductor reacts with oxygen bonded to a metal atom to be water, and thus causes an oxygen vacancy, in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor including an oxide semiconductor that contains hydrogen is likely to be normally-on. For this reason, hydrogen in the oxide semiconductor is preferably reduced as much as possible. Specifically, the hydrogen concentration of the oxide semiconductor measured by SIMS is lower than $1\times10^{20}$ atoms/cm$^3$, preferably lower than $1\times10^{19}$ atoms/cm$^3$, further preferably lower than $5\times10^{18}$ atoms/cm$^3$, and still further preferably lower than $1\times10^{18}$ atoms/cm$^3$.

When an oxide semiconductor with sufficiently reduced impurity concentration is used for a channel formation region in a transistor, the transistor can have stable electrical characteristics.

Structure Example 2 of Semiconductor Device

An example of a semiconductor device including the transistor 200 of one embodiment of the present invention is described below with reference to FIGS. 3A to 3C.

FIG. 3A is a top view illustrating a semiconductor device including the transistor 200. FIGS. 3B and 3C are cross-sectional views illustrating the semiconductor device. FIG. 3B is a cross-sectional view of a portion indicated by a dashed-dotted line A1-A2 in FIG. 3A, illustrating a cross section of the transistor 200 in the channel length direction. FIG. 3C is a cross-sectional view of a portion indicated by a dashed-dotted line A3-A4 in FIG. 3A, illustrating a cross section of the transistor 200 in the channel width direction. Note that for simplification of the drawing, some components are not illustrated in the top view in FIG. 3A.

Note that in the semiconductor device illustrated in FIGS. 3A to 3C, components having the same functions as the components included in the semiconductor device described in <Structure example 1 of semiconductor device> are denoted by the same reference numerals.

A structure of the transistor 200 is described with reference to FIGS. 3A to 3C below. Note that also in this section, the materials described in detail in <Structure example 1 of semiconductor device> can be used as materials of the transistor 200.

[Transistor 200]

As illustrated in FIGS. 3A to 3C, the transistor 200 differs from the semiconductor device described in <Structure example 1 of semiconductor device> at least in the shape of the oxide 230.

Specifically, as illustrated in FIGS. 3A to 3C, the oxide 230 in the semiconductor device has a three-layer structure of the oxide 230*a*, the oxide 230*b*, and an oxide 230*c*. When the oxide 230*b* is provided under the oxide 230*c* as illustrated in FIGS. 3A to 3C, impurities can be prevented from being diffused into the oxide 230*b* from the components formed above the oxide 230*c*. Note that in the case where the oxide 230*c* is provided as illustrated in FIGS. 3A to 3C, the oxide 230*c* can be formed using a metal oxide which can be used for the oxide 230*a* or 230*b*.

Note that an oxide film to be the oxide 230*c* may be formed under conditions similar to those of an oxide film to be the oxide 230*a* or those of an oxide film to be the oxide 230*b*. Alternatively, these conditions may be combined for formation of the oxide film to be the oxide 230*c*.

In this embodiment, the oxide film to be the oxide 230*c* is formed using a target with an atomic ratio of In:Ga:Zn=4:2:4.1 by a sputtering method. The proportion of oxygen contained in a sputtering gas for the oxide film may be 70% or higher, preferably 80% or higher, further preferably 100%.

Note that by appropriate selection of film formation conditions and an atomic ratio, the above oxide film is preferably formed to have characteristics required for the oxide 230.

The oxide 230*c* is preferably provided to cover the oxides 230*a* and 230*b*. That is, the oxide 230*b* is surrounded by the oxides 230*a* and 230*c*. With this structure, in the region 234, impurities can be prevented from entering the oxide 230*b* where a channel is formed.

The side surface of the oxide 230*a* and the side surface of the oxide 230*b* are preferably provided to be aligned. Moreover, the oxide 230*c* is preferably formed to cover the oxides 230*a* and 230*b*. For example, the oxide 230*c* is formed in contact with the side surface of the oxide 230*a* and the top surface and the side surface of the oxide 230*b*, and the side surface of the insulator 224. When the oxide 230*c* is seen from the top surface, the side surface of the oxide 230*c* is positioned outside the side surfaces of the oxides 230*a* and 230*b*. With this structure, when the transistor 200 is electrically connected to the conductor 252, electrical conduction is made through the oxide 230*c* over the insulator 224, so that a favorable ohmic contact can be obtained.

In the case where the oxides 230*a* and 230*c* are provided, the energy of the conduction band minimum of each of the oxides 230*a* and 230*c* is preferably higher than the energy of the conduction band minimum in a region of the oxide 230*b* where the energy of the conduction band minimum is low. In other words, the electron affinity of each of the oxides 230*a* and 230*c* is preferably smaller than the electron affinity of the region of the oxide 230*b* where the energy of the conduction band minimum is low.

Here, the energy level of the conduction band minimum is gradually varied in the oxides 230*a*, 230*b*, and 230*c*. In other words, the energy level of the conduction band minimum is continuously varied or continuously connected. To vary the energy level gradually, the density of defect states in a mixed layer formed at the interface between the oxides 230*a* and 230*b* and the interface between the oxides 230*b* and 230*c* is decreased.

Specifically, when the oxides 230*a* and 230*b* or the oxides 230*b* and 230*c* contain the same element (as a main component) in addition to oxygen, a mixed layer with a low density of defect states can be formed. For example, in the case where the oxide 230*b* is an In—Ga—Zn oxide, it is preferable to use an In—Ga—Zn oxide, a Ga—Zn oxide, gallium oxide, or the like as each of the oxides 230*a* and 230*c*.

At this time, a narrow-gap portion formed in the oxide 230*b* serves as a main carrier path. Since the density of defect states at the interface between the oxides 230*a* and 230*b* and the interface between the oxides 230*b* and 230*c* can be made low, the influence of interface scattering on carrier conduction is small, and high on-state current can be obtained.

Modification Example of Semiconductor Device

Hereinafter, a modification example of the transistor described in this embodiment is described with reference to FIGS. 13A to 13C.

Figure 13A:
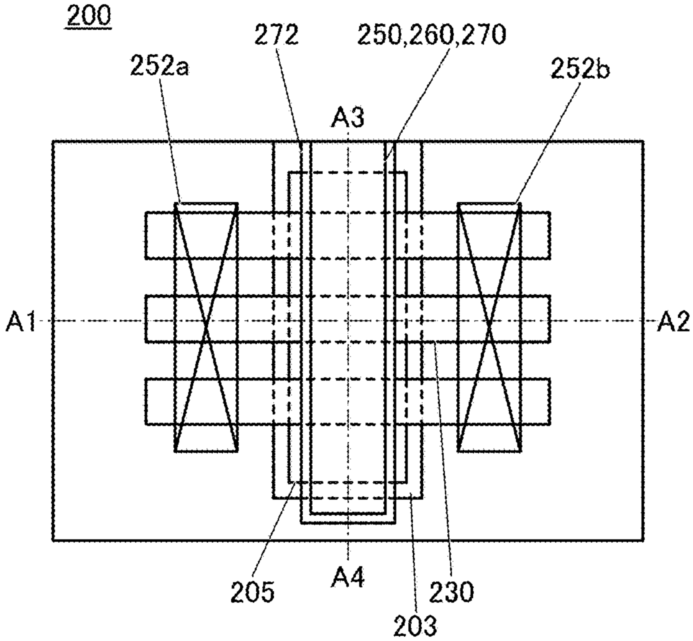
FIGS. 13A to 13C are a top view and cross-sectional views of a semiconductor device of one embodiment of the present invention.
Figure 13C:
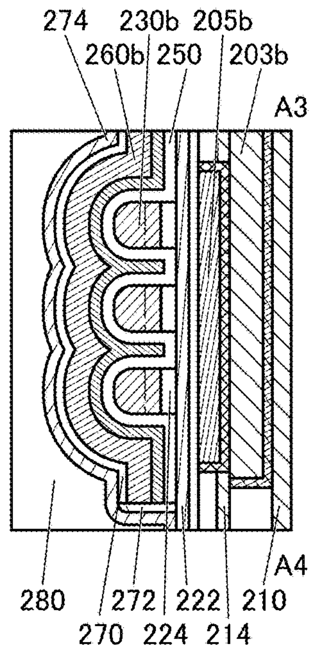
Figure 13B:
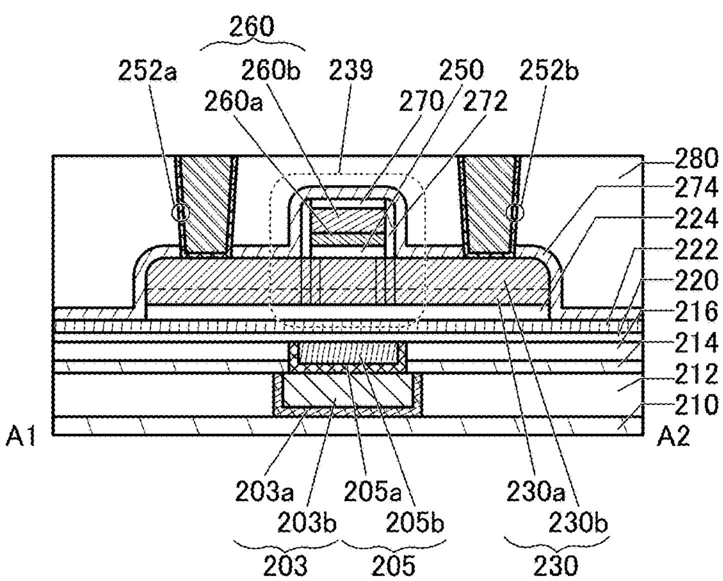

FIG. 13A is a top view of a semiconductor device including the transistor 200. FIG. 13B is a cross-sectional view taken along the dashed-dotted line A1-A2 in FIG. 13A, which corresponds to a cross-sectional view in the channel length direction of the transistor 200. FIG. 13C is a cross-sectional view taken along the dashed-dotted line A3-A4 in FIG. 13A, which corresponds to a cross-sectional view in the channel width direction of the transistor 200. Note that for simplification of the drawing, some components are not illustrated in the top view in FIG. 13A.

The transistor 200 differs from the transistor 200 in FIGS. 1A to 1C in that the transistor has a plurality of channel formation regions for one gate electrode. Owing to the plurality of channel formation regions, the transistor 200 can have a large on-state current. Furthermore, each channel formation region is surrounded by the gate electrode, in other words, an s-channel structure is employed; thus, a large on-state current can be obtained in each channel formation region. Although the transistor in FIGS. 3A to 3C includes three channel formation regions, the number of the channel formation regions is not limited to three. The description of the transistor 200 illustrated in FIGS. 1A to 1C can be referred to for the other components.

<Method 1 for Manufacturing Semiconductor Device>

Next, a method for manufacturing a semiconductor device including the transistor 200 of one embodiment of the present invention is described with reference to FIGS. 4A to 4C to FIGS. 12A to 12C. FIG. 4A, FIG. 5A, FIG. 6A, FIG. 7A, FIG. 8A, FIG. 9A, FIG. 10A, FIG. 11A, and FIG. 12A are top views. FIG. 4B, FIG. 5B, FIG. 6B, FIG. 7B, FIG. 8B, FIG. 9B, FIG. 10B, FIG. 11B, and FIG. 12B are cross-sectional views taken along the dashed-dotted lines A1-A2 in FIG. 4A, FIG. 5A, FIG. 6A, FIG. 7A, FIG. 8A, FIG. 9A, FIG. 10A, FIG. 11A, and FIG. 12A. FIG. 4C, FIG. 5C, FIG. 6C, FIG. 7C, FIG. 8C, FIG. 9C, FIG. 10C, FIG. 11C, and FIG. 12C are cross-sectional views taken along the dashed-dotted lines A3-A4 in FIG. 4A, FIG. 5A, FIG. 6A, FIG. 7A, FIG. 8A, FIG. 9A, FIG. 10A, FIG. 11A, and FIG. 12A.

First, a substrate (not illustrated) is prepared, and the insulator 210 is formed over the substrate. The insulator 210 can be formed by a sputtering method, a chemical vapor deposition (CVD) method, a molecular beam epitaxy (MBE) method, a pulsed laser deposition (PLD) method, an ALD method, or the like.

Note that CVD methods can be classified into a plasma enhanced CVD (PECVD) method using plasma, a thermal CVD (TCVD) method using heat, a photo CVD method using light, and the like. Moreover, the CVD methods can be classified into a metal CVD (MCVD) method and a metal organic CVD (MOCVD) method depending on a source gas.

By using the PECVD method, a high-quality film can be formed at a relatively low temperature. Furthermore, a thermal CVD method does not use plasma and thus causes less plasma damage to an object. For example, a wiring, an electrode, an element (e.g., transistor or capacitor), or the like included in a semiconductor device might be charged up by receiving charges from plasma. In that case, accumulated charges might break the wiring, electrode, element, or the like included in the semiconductor device. By contrast, when a thermal CVD method not using plasma is employed, such plasma damage is not caused and the yield of the semiconductor device can be increased. A thermal CVD method does not cause plasma damage during deposition, so that a film with few defects can be obtained.

An ALD method also causes less plasma damage to an object. An ALD method does not cause plasma damage during deposition, so that a film with few defects can be obtained.

Unlike in a deposition method in which particles ejected from a target or the like are deposited, in a CVD method and an ALD method, a film is formed by reaction at a surface of an object. Thus, a CVD method and an ALD method enable favorable step coverage almost regardless of the shape of an object. In particular, an ALD method enables excellent step coverage and excellent thickness uniformity and can be favorably used for covering a surface of an opening with a high aspect ratio, for example. On the other hand, an ALD method has a relatively low deposition rate; thus, it is sometimes preferable to combine an ALD method with another deposition method with a high deposition rate such as a CVD method.

When a CVD method or an ALD method is used, composition of a film to be formed can be controlled with a flow rate ratio of the source gases. For example, by a CVD method or an ALD method, a film with a certain composition can be formed depending on a flow rate ratio of the source gases. Moreover, with a CVD method or an ALD method, by changing the flow rate ratio of the source gases while forming the film, a film whose composition is continuously changed can be formed. In the case where the film is formed while changing the flow rate ratio of the source gases, as compared to the case where the film is formed using a plurality of deposition chambers, time taken for the film formation can be reduced because time taken for transfer and pressure adjustment is omitted. Thus, semiconductor devices can be manufactured with improved productivity in some cases.

In this embodiment, aluminum oxide is formed as the insulator 210 by a sputtering method. The insulator 210 may have a multilayer structure. For example, the multilayer structure may be formed in such a manner that an aluminum oxide is formed by a sputtering method and an aluminum oxide is formed over the aluminum oxide by an ALD method. Alternatively, the multilayer structure may be formed in such a manner that an aluminum oxide is formed by an ALD method and an aluminum oxide is formed over the aluminum oxide by a sputtering method.

Then, the insulator 212 is formed over the insulator 210. The insulator 212 can be formed by a sputtering method, a CVD method, an MBE method, a PLD method, an ALD method, or the like. In this embodiment, as the insulator 212, silicon oxide is formed by a CVD method.

Then, openings are formed in the insulator 212 to reach the insulator 210.

Examples of the openings include grooves and slits. A region where the opening is formed may be referred to as an opening portion. The opening can be formed by wet etching; however, dry etching is suitable for microfabrication. The insulator 210 is preferably an insulator that serves as an etching stopper film used in forming the groove by etching the insulator 212. For example, in the case where a silicon oxide film is used as the insulator 212 in which the groove is to be formed, the insulator 210 is preferably formed using a silicon nitride film, an aluminum oxide film, or a hafnium oxide film.

After formation of the openings, a conductive film to be the conductor 203*a* is formed. The conductive film preferably includes a conductor that has a function of inhibiting the penetration of oxygen. For example, tantalum nitride, tungsten nitride, or titanium nitride can be used. Alternatively, a stacked-layer film formed using the conductor and tantalum, tungsten, titanium, molybdenum, aluminum, copper, or a molybdenum-tungsten alloy can be used. The conductive film to be the conductor 203*a* can be formed by a sputtering method, a CVD method, an MBE method, a PLD method, an ALD method, or the like.

In this embodiment, as the conductive film to be the conductor 203*a*, tantalum nitride or a stacked film of tantalum nitride and titanium nitride formed over the tantalum nitride is formed by a sputtering method. Even when a metal that is easily diffused, such as copper, is used for the conductor 203*b* to be described later, the use of such a metal nitride as the conductor 203*a* can prevent the metal from being diffused to the outside of the conductor 203*a*.

Next, a conductive film to be the conductor 203*b* is formed over the conductive film to be the conductor 203*a*. The conductive film can be formed by a sputtering method, a CVD method, an MBE method, a PLD method, an ALD method, or the like. In this embodiment, as the conductive film to be the conductor 203*b*, a low-resistant conductive material such as copper is formed.

Next, by CMP treatment, the conductive film to be the conductor 203*a* and the conductive film to be the conductor 203*b* are partly removed to expose the insulator 212. As a result, the conductive film to be the conductor 203*a* and the conductive film to be the conductor 203*b* remain only in the openings. Thus, the conductor 203 including the conductors 203*a* and 203*b*, which has a flat top surface, can be formed (see FIGS. 4A to 4C). Note that the insulator 212 is partly removed by the CMP treatment in some cases.

Next, the insulator 214 is formed over the conductor 203. The insulator 214 can be formed by a sputtering method, a CVD method, an MBE method, a PLD method, an ALD method, or the like. In this embodiment, as the insulator 214, silicon nitride is formed by a CVD method. Even when metal that is likely to be diffused, such as copper, is used for the conductor 203*b*, the use of an insulator through which copper is less likely to pass, such as silicon nitride, as the insulator 214 can prevent the metal from being diffused into the layers above the insulator 214.

Next, the insulator 216 is formed over the insulator 214. The insulator 216 can be formed by a sputtering method, a CVD method, an MBE method, a PLD method, an ALD method, or the like. In this embodiment, silicon oxide is formed as the insulator 216 by a CVD method.

Next, openings reaching the conductor 203 are formed in the insulators 214 and 216. The openings can be formed by wet etching; however, dry etching is suitable for microfabrication.

After formation of the openings, a conductive film to be the conductor 205*a* is formed. The conductive film to be the conductor 205*a* preferably includes a conductive material that has a function of inhibiting the penetration of oxygen. For example, tantalum nitride, tungsten nitride, or titanium nitride can be used. Alternatively, a stacked-layer film of the conductor and tantalum, tungsten, titanium, molybdenum, aluminum, copper, or a molybdenum-tungsten alloy can be used. The conductive film to be the conductor 205*a* can be formed by a sputtering method, a CVD method, an MBE method, a PLD method, an ALD method, or the like.

In this embodiment, tantalum nitride is formed as a conductive film to be the conductor 205*a* by a sputtering method.

Next, a conductive film to be the conductor 205*b* is formed over the conductive film to be the conductor 205*a*. The conductive film can be formed by a sputtering method, a CVD method, an MBE method, a PLD method, an ALD method, or the like.

In this embodiment, as the conductive film to be the conductor 205*b*, titanium nitride is formed by a CVD method and tungsten is formed by a CVD method over the titanium nitride.

Next, by CMP treatment, the conductive film to be the conductor 205*a* and the conductive film to be the conductor 205*b* are partly removed to expose the insulator 216. As a result, the conductive film to be the conductor 205*a* and the conductive film to be the conductor 205*b* remain only in the openings. Thus, the conductor 205 including the conductors 205*a* and 205*b*, which has a flat top surface, can be formed (see FIGS. 4A to 4C). Note that the insulator 216 is partly removed by the CMP treatment in some cases.

Next, the insulator 220 is formed over the insulator 216 and the conductor 205. The insulator 220 can be formed by a sputtering method, a CVD method, an MBE method, a PLD method, an ALD method, or the like.

Then, the insulator 222 is formed over the insulator 220. The insulator 222 can be formed by a sputtering method, a CVD method, an MBE method, a PLD method, an ALD method, or the like.

It is particularly preferable that hafnium oxide be formed as the insulator 222 by an ALD method. Hafnium oxide formed by an ALD method has a barrier property against oxygen, hydrogen, and water. When the insulator 222 has a barrier property against hydrogen and water, hydrogen and water contained in structure bodies provided around the transistor 200 are not diffused into the transistor 200, and generation of oxygen vacancies in the oxide 230 can be inhibited.

Then, an insulating film 224A is formed over the insulator 222. The insulating film 224A can be formed by a sputtering method, a CVD method, an MBE method, a PLD method, an ALD method, or the like (see FIGS. 4A to 4C).

Subsequently, heat treatment is preferably performed. The heat treatment can be performed at a temperature higher than or equal to 250° C. and lower than or equal to 650° C., preferably higher than or equal to 300° C. and lower than or equal to 500° C., further preferably higher than or equal to 320° C. and lower than or equal to 450° C. The heat treatment is performed in a nitrogen atmosphere, an inert gas atmosphere, or an atmosphere containing an oxidizing gas at 10 ppm or more, 1% or more, or 10% or more. The heat treatment may be performed under a reduced pressure. Alternatively, the heat treatment may be performed in such a manner that heat treatment is performed in a nitrogen atmosphere or an inert gas atmosphere, and then another heat treatment is performed in an atmosphere containing an oxidizing gas at 10 ppm or more, 1% or more, or 10% or more in order to compensate for released oxygen.

By the above heat treatment, impurities such as hydrogen and water included in the insulating film 224A can be removed, for example.

Alternatively, in the heat treatment, plasma treatment using oxygen may be performed under a reduced pressure. The plasma treatment using oxygen is preferably performed using an apparatus including a power source for generating high-density plasma using microwaves, for example. Alternatively, a power source for applying a radio frequency (RF) to a substrate side may be provided. The use of high-density plasma enables high-density oxygen radicals to be produced, and application of the RF to the substrate side allows oxygen radicals generated by the high-density plasma to be efficiently introduced into the insulating film 224A. Alternatively, after plasma treatment using an inert gas with the apparatus, plasma treatment using oxygen in order to compensate for released oxygen may be performed. Note that the heat treatment is not necessarily performed in some cases.

This heat treatment can also be performed after the formation of the insulator 220 and after the formation of the insulator 222. Although the heat treatment can be performed under the conditions for the heat treatment, heat treatment after the formation of the insulator 220 is preferably performed in an atmosphere containing nitrogen.

In this embodiment, the heat treatment is performed in a nitrogen atmosphere at 400° C. for one hour after formation of the insulating film 224A.

Figure 5A:
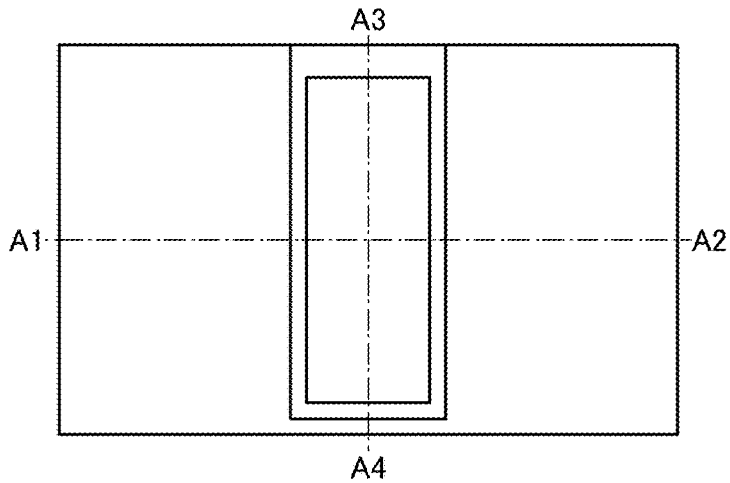
FIGS. 5A to 5C are a top view and cross-sectional views illustrating a method for manufacturing a semiconductor device of one embodiment of the present invention.
Figure 5C:
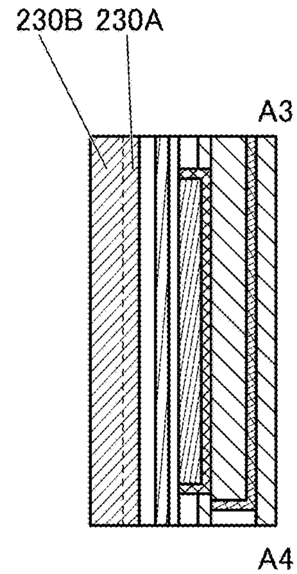
Figure 5B:
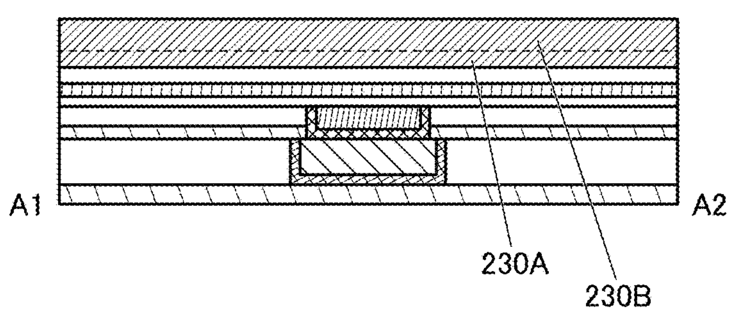

Next, an oxide film 230A to be the oxide 230*a*, and an oxide film 230B to be the oxide 230*b* are sequentially formed over the insulating film 224A (see FIGS. 5A to 5C). Note that the oxide films are preferably formed successively without exposure to the air. When the oxide films are formed without exposure to the air, impurities or moisture from the air can be prevented from being attached to the oxide films 230A and 230B, so that an interface between the oxide films 230A and 230B and the vicinity of the interface can be kept clean.

The oxide films 230A and 230B can be formed by a sputtering method, a CVD method, an MBE method, a PLD method, an ALD method, or the like.

In the case where the oxide films 230A and 230B are formed by a sputtering method, for example, oxygen or a mixed gas of oxygen and a rare gas is used as a sputtering gas. By increasing the proportion of oxygen in the sputtering gas, the amount of excess oxygen in the oxide films to be formed can be increased. In the case where the above oxide films are formed by a sputtering method, the above In-M-Zn oxide target can be used.

In particular, when the oxide film 230A is formed, part of oxygen contained in the sputtering gas is supplied to the insulating film 224A in some cases. Note that the proportion of oxygen in the sputtering gas for formation of the oxide film 230A is preferably 70% or higher, further preferably 80% or higher, and still further preferably 100%.

In the case where the oxide film 230B is formed by a sputtering method, when the proportion of oxygen in the sputtering gas is higher than or equal to 1% and lower than or equal to 30%, preferably higher than or equal to 5% and lower than or equal to 20%, an oxygen-deficient oxide semiconductor is formed. A transistor including an oxygen-deficient oxide semiconductor can have relatively high field-effect mobility.

In this embodiment, the oxide film 230A is formed using a target with an atomic ratio of In:Ga:Zn=1:3:4 by a sputtering method. The oxide film 230B is formed using a target with an atomic ratio of In:Ga:Zn=4:2:4.1 by a sputtering method. Note that each of the oxide films is preferably formed by appropriate selection of film formation conditions and an atomic ratio to have characteristics required for the oxide 230.

Next, heat treatment may be performed. For the heat treatment, the conditions for the heat treatment can be used. By the heat treatment, impurities such as hydrogen and water contained in the oxide films 230A and 230B can be removed, for example. In this embodiment, treatment is performed in a nitrogen atmosphere at 400° C. for one hour, and successively another treatment is performed in an oxygen atmosphere at 400° C. for one hour.

Figure 6A:
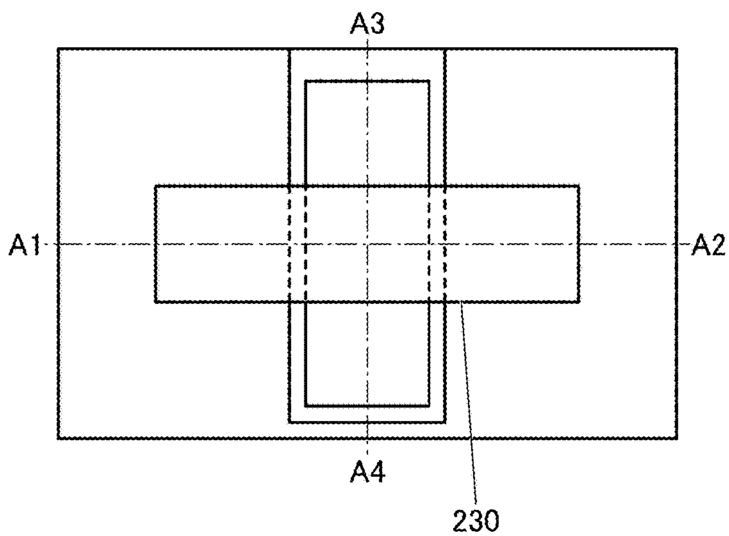
FIGS. 6A to 6C are a top view and cross-sectional views illustrating a method for manufacturing a semiconductor device of one embodiment of the present invention.
Figure 6C:
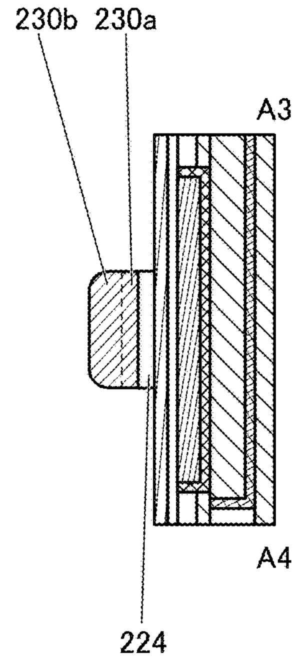
Figure 6B:
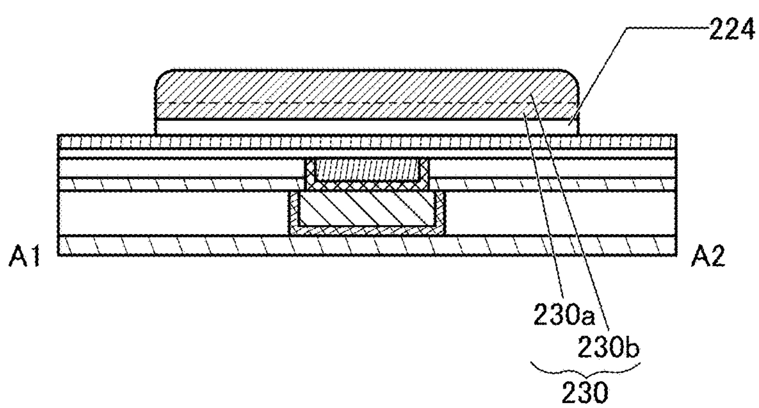

Next, the insulating film 224A, the oxide film 230A, and the oxide film 230B are processed into island shapes to form the insulator 224, the oxide 230*a*, and the oxide 230*b* (see FIGS. 6A to 6C). In this step, the insulator 222 can be used as an etching stopper film, for example.

Note that in the above step, the insulating film 224A is not necessarily processed into island shapes. The insulating film 224A may be subjected to half-etching, in which case the insulator 224 remains under the oxide 230*c* to be formed in a later step. Note that the insulating film 224A can be processed into island shapes when an insulating film 272A is processed in a later step.

The oxide 230 is formed to at least partly overlap with the conductor 205. It is preferable that the side surface of the oxide 230 be substantially perpendicular to the insulator 222, in which case a smaller area and higher density are achieved when the plurality of transistors 200 is provided. Note that an angle formed by the side surface of the oxide 230 and the top surface of the insulator 222 may be an acute angle. In that case, the angle formed by the side surface of the oxide 230 and the top surface of the insulator 222 is preferably larger.

The oxide 230 has a curved surface between the side surface and the top surface. That is, an end portion of the side surface and an end portion of the top surface are preferably curved (hereinafter such a curved shape is also referred to as a rounded shape). A radius of curvature of the curved surface at the end portion of the oxide 230*b* is greater than or equal to 3 nm and less than or equal to 10 nm, preferably greater than or equal to 5 nm and less than or equal to 6 nm.

Note that when the end portions are not angular, the coverage with films formed later in the film formation process can be improved.

Note that the oxide films may be processed by a lithography method. The processing can be performed by a dry etching method or a wet etching method. A dry etching method is suitable for microfabrication.

In the lithography method, first, a resist is exposed to light through a mask. Next, a region exposed to light is removed or left using a developing solution, so that a resist mask is formed. Then, etching through the resist mask is conducted. As a result, a conductor, a semiconductor, an insulator, or the like can be processed in to a desired shape. The resist mask is formed by, for example, exposure of the resist to light using KrF excimer laser light, ArF excimer laser light, extreme ultraviolet (EUV) light, or the like. Alternatively, a liquid immersion technique may be employed in which a portion between a substrate and a projection lens is filled with liquid (e.g., water) to perform light exposure. An electron beam or an ion beam may be used instead of the above-mentioned light. Note that a mask is not necessary in the case of using an electron beam or an ion beam. To remove the resist mask, dry etching treatment such as ashing or wet etching treatment can be used. Alternatively, wet etching treatment can be performed after dry etching treatment. Further alternatively, dry etching treatment can be performed after wet etching treatment.

A hard mask formed of an insulator or a conductor may be used instead of the resist mask. In the case where a hard mask is used, a hard mask with a desired shape can be formed in the following manner: an insulating film or a conductive film that is the material of the hard mask is formed over the oxide film 230B, a resist mask is formed thereover, and then the material of the hard mask is etched. The etching of the oxide films 230A and 230B may be performed after or without removal of the resist mask. In the latter case, the resist mask may be removed during the etching. The hard mask may be removed by etching after the etching of the oxide films. The hard mask does not need to be removed in the case where the material of the hard mask does not affect the following process or can be utilized in the following process.

As a dry etching apparatus, a capacitively coupled plasma (CCP) etching apparatus including parallel plate type electrodes can be used. The capacitively coupled plasma etching apparatus including the parallel plate type electrodes may have a structure in which a high-frequency power source is applied to one of the parallel plate type electrodes. Alternatively, the capacitively coupled plasma etching apparatus may have a structure in which different high-frequency power sources are applied to one of the parallel plate type electrodes. Alternatively, the capacitively coupled plasma etching apparatus may have a structure in which high-frequency power sources with the same frequency are applied to the parallel plate type electrodes. Alternatively, the capacitively coupled plasma etching apparatus may have a structure in which high-frequency power sources with different frequencies are applied to the parallel plate type electrodes. Alternatively, a dry etching apparatus including a high-density plasma source can be used. As the dry etching apparatus including a high-density plasma source, an inductively coupled plasma (ICP) etching apparatus can be used, for example.

In some cases, the treatment such as dry etching causes the attachment or diffusion of impurities due to an etching gas or the like to a surface or an inside of the oxide 230*a*, the oxide 230*b*, or the like. Examples of the impurities include fluorine and chlorine.

In order to remove the impurities, cleaning is performed. As the cleaning, any of wet cleaning using a cleaning solution or the like, plasma treatment using plasma, cleaning by heat treatment, and the like can be performed by itself or in appropriate combination.

The wet cleaning may be performed using an aqueous solution in which oxalic acid, phosphoric acid, hydrofluoric acid, or the like is diluted with carbonated water or pure water. Alternatively, ultrasonic cleaning using pure water or carbonated water may be performed. In this embodiment, ultrasonic cleaning using pure water or carbonated water is performed.

Next, heat treatment may be performed. For the heat treatment, the conditions for the above heat treatment can be used.

Figure 7A:
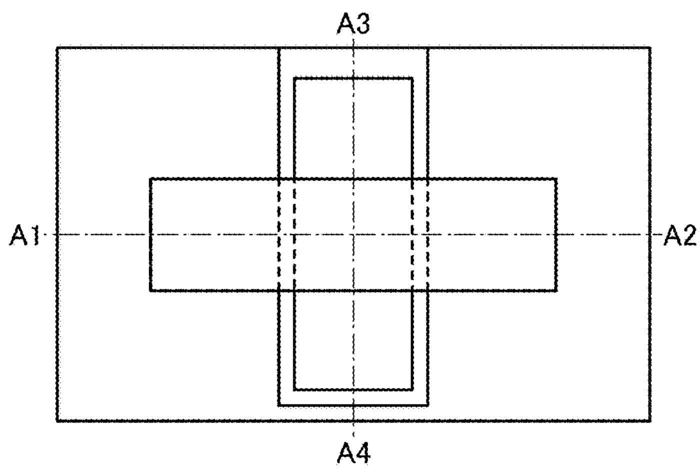
FIGS. 7A to 7C are a top view and cross-sectional views illustrating a method for manufacturing a semiconductor device of one embodiment of the present invention.
Figure 7C:
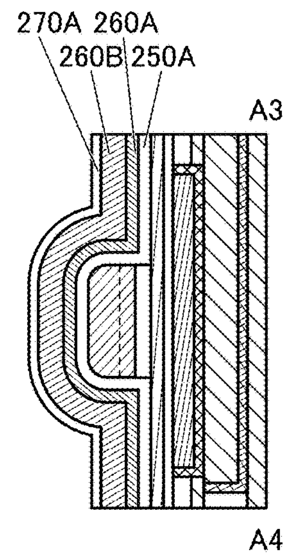
Figure 7B:
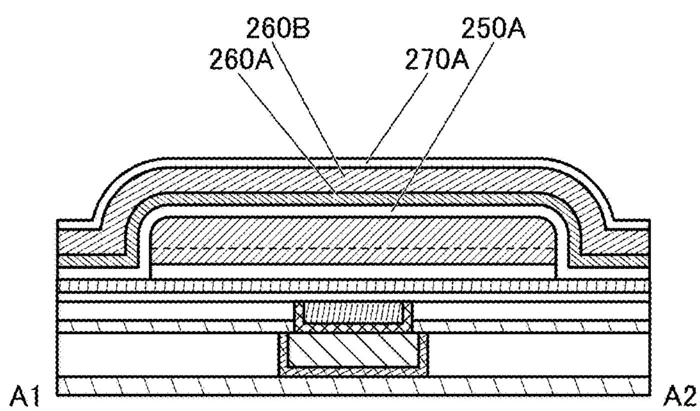
Figure 8A:
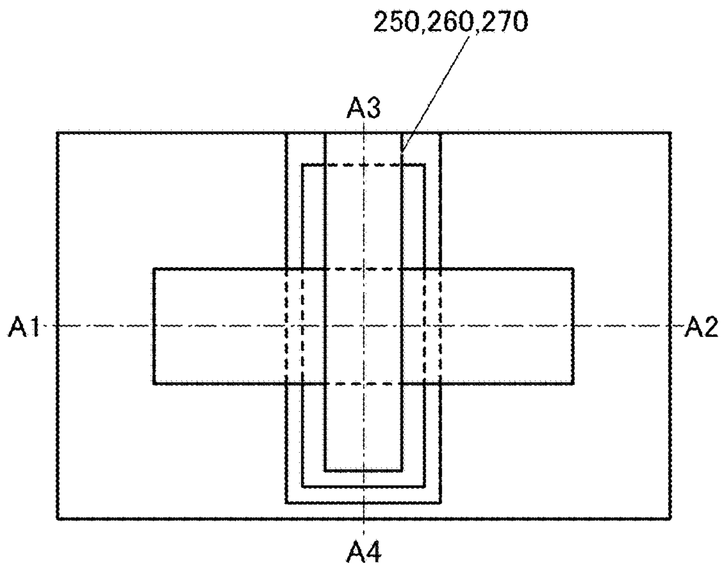
FIGS. 8A to 8C are a top view and cross-sectional views illustrating a method for manufacturing a semiconductor device of one embodiment of the present invention.
Figure 8C:
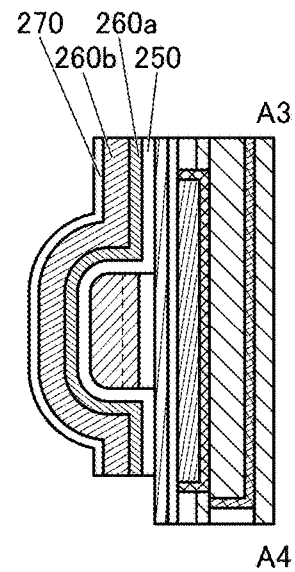
Figure 8B:
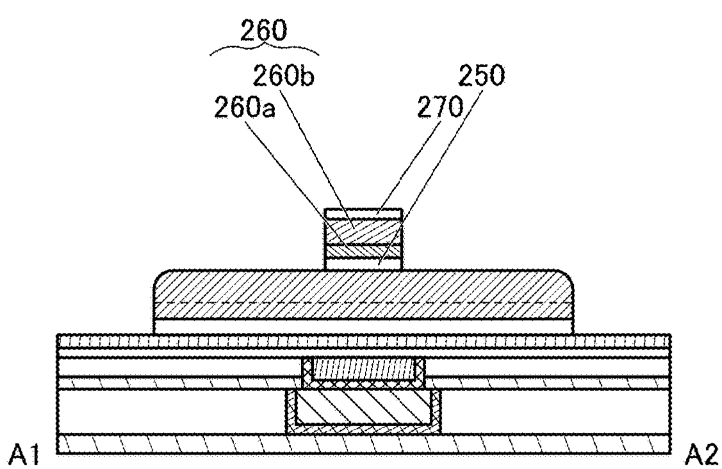

Next, an insulating film 250A, a conductive film 260A, a conductive film 260B, and an insulating film 270A are formed in this order over the insulator 222 and the oxide 230 (see FIGS. 7A to 7C).

The insulating film 250A can be formed by a sputtering method, a CVD method, an MBE method, a PLD method, an ALD method, or the like.

Note that oxygen is excited by microwaves to generate high-density oxygen plasma, and the insulating film 250A is exposed to the oxygen plasma, whereby oxygen can be supplied to the insulating film 250A and the oxide 230.

Furthermore, heat treatment may be performed. For the heat treatment, the conditions for the above heat treatment can be used. The heat treatment can reduce the moisture concentration and the hydrogen concentration in the insulating film 250A.

The conductive film 260A can be formed by a sputtering method, a CVD method, an MBE method, a PLD method, an ALD method, or the like. Here, when an oxide semiconductor that can be used as the oxide 230 is subjected to treatment for reducing resistance, for example, the oxide semiconductor becomes a conductive oxide. Accordingly, an oxide that can be used as the oxide 230 may be formed as the conductive film 260A and the resistance of the oxide may be reduced in a later step. Note that when an oxide that can be used as the oxide 230 is formed as the conductive film 260A in an atmosphere containing oxygen by a sputtering method, oxygen can be added to the insulator 250. When oxygen is added to the insulator 250, the added oxygen can be supplied to the oxide 230 through the insulator 250.

The conductive film 260B can be formed by a sputtering method, a CVD method, an MBE method, a PLD method, an ALD method, or the like. In the case where an oxide semiconductor that can be used as the oxide 230 is used for the conductive film 260A, the conductive film 260B is formed by a sputtering method, whereby the conductive film 260A can have reduced electric resistance and become a conductor. Such a conductor can be called an oxide conductor (OC) electrode. A conductor may be further formed over the conductor over the OC electrode by a sputtering method or the like.

Subsequently, heat treatment can be performed. For the heat treatment, the conditions for the above heat treatment can be used. Note that the heat treatment is not necessarily performed in some cases. In this embodiment, the heat treatment is performed in a nitrogen atmosphere at 400° C. for one hour.

The insulating film 270A can be formed by a sputtering method, a CVD method, an MBE method, a PLD method, an ALD method, or the like. Here, the thickness of the insulating film 270A is preferably larger than that of the insulating film 272A to be formed in a later step. In that case, when the insulator 272 is formed in the following process, the insulator 270 can remain easily over the conductor 260.

Next, the insulating film 270A is etched to form the insulator 270. Next, using the insulator 270 as a mask, the insulating film 250A, the conductive film 260A, and the conductive film 260B are etched to form the insulator 250 and the conductor 260 (the conductors 260*a* and 260*b*) (see FIGS. 8A to 8C). The insulator 250, the conductor 260*a*, the conductor 260*b*, and the insulator 270 are formed to at least partly overlap with the conductor 205 and the oxide 230.

The side surface of the insulator 250, the side surface of the conductor 260*a*, the side surface of the conductor 260*b*, and the side surface of the insulator 270 preferably form the same surface.

It is preferable that the same surface formed by the side surface of the insulator 250, the side surface of the conductor 260*a*, the side surface of the conductor 260*b*, and the side surface of the insulator 270 be substantially perpendicular to the substrate. That is, in a cross section, an angle between the top surface of the oxide 230 and the side surfaces of the insulator 250, the conductor 260*a*, the conductor 260*b*, and the insulator 270 is preferably an acute angle and larger. Note that in the cross section, the angle formed by the side surfaces of the insulator 250, the conductor 260*a*, the conductor 260*b*, and the insulator 270 and the top surface of the oxide 230 may be an acute angle. In that case, the angle formed by the top surface of the oxide 230 and the side surfaces of the insulator 250, the conductor 260*a*, the conductor 260*b*, and the insulator 270 is preferably larger.

Note that although not illustrated, in order to make the side surface of the insulator 250, the side surface of the conductor 260*a*, the side surface of the conductor 260*b*, and the side surface of the insulator 270 substantially perpendicular to the substrate, a hard mask may be formed over the insulating film 270A, and the insulating film 270A, the conductive film 260B, the conductive film 260A, and the insulating film 250A may be processed using the hard mask. After the processing, the following process may be performed without removal of the hard mask. The hard mask can also function as a hard mask used in a step of adding a dopant, which is to be performed later.

Note that an upper portion of the oxide 230 in a region not overlapping with the insulator 250 may be etched by the above etching. In that case, the oxide 230 may be thicker in the region overlapping with the insulator 250 than in the region not overlapping with the insulator 250.

Next, the insulating film 272A is formed to cover the insulator 222, the insulator 224, the oxide 230, the insulator 250, the conductor 260, and the insulator 270. The insulating film 272A is preferably formed with a sputtering apparatus. When the sputtering method is used, an excess-oxygen region can be easily formed in each of the insulator 250 in contact with the insulating film 272A and the insulator 224.

Here, during deposition by a sputtering method, ions and sputtered particles exist between a target and a substrate. For example, a potential $E_0$ is supplied to the target, to which a power source is connected. A potential $E_1$ such as a ground potential is supplied to the substrate. Note that the substrate may be electrically floating. In addition, there is a region at a potential $E_2$ between the target and the substrate. The potential relationship is $E_2>E_1>E_0$.

The ions in plasma are accelerated by a potential difference ($E_2-E_0$) and collide with the target; accordingly, the sputtered particles are ejected from the target. These sputtered particles are attached to a deposition surface and deposited thereover; as a result, a film is formed. Some ions recoil by the target and might, as recoil ions, pass through the formed film and be taken into the insulator 224 and the insulator 250 in contact with a formation surface. The ions in the plasma are accelerated by a potential difference ($E_2-E_1$) and collide with the deposition surface. At that time, some ions reach the inside of the insulators 250 and 224. When the ions are taken into the insulators 250 and 224, a region into which the ions are taken is formed in the insulators 250 and 224. That is, an excess-oxygen region is formed in the insulators 250 and 224 in the case where the ions include oxygen.

Introduction of excess oxygen to the insulators 250 and 224 can form an excess-oxygen region. The excess oxygen in the insulators 250 and 224 is supplied to the oxide 230 and can fill oxygen vacancies in the oxide 230.

Accordingly, when the insulator 272A is formed in an oxygen gas atmosphere with a sputtering apparatus, oxygen can be introduced into the insulators 250 and 224 while the insulator 272A is formed. When aluminum oxide having a barrier property is used for the insulator 272A, for example, excess oxygen introduced into the insulator 250 can be effectively sealed.

The insulating film 272A may be formed by an ALD method. When an ALD method is used, the insulating film 272A having good coverage with respect to the side surfaces of the insulator 250, the conductor 260, and the insulator 270 can be formed.

Next, in the oxide 230, the regions 231, 232, 233, and 234 are formed. The regions 231, 232, and 233 are low-resistance regions which are obtained by adding a metal atom such as indium or impurities to a metal oxide formed as the oxide 230. Note that each of the regions has higher conductivity than at least the oxide 230*b* in the region 234.

Figure 9A:
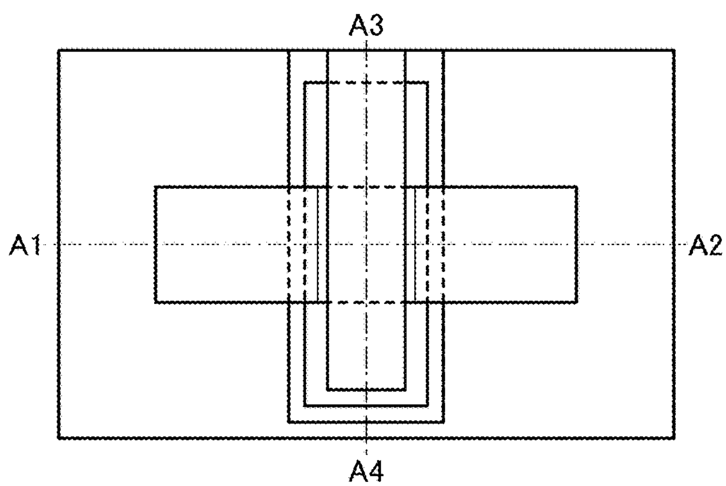
FIGS. 9A to 9C are a top view and cross-sectional views illustrating a method for manufacturing a semiconductor device of one embodiment of the present invention.
Figure 9C:
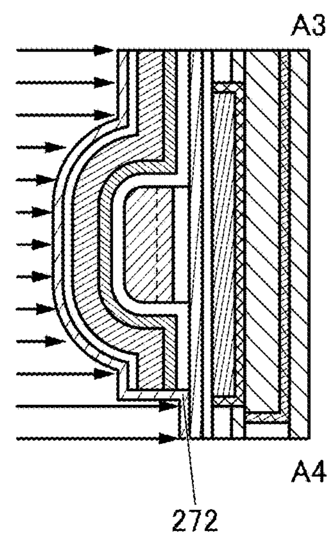
Figure 9B:
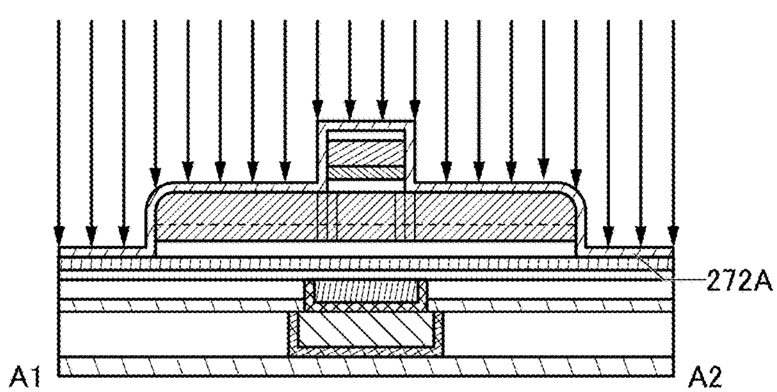

In order to add impurities to the regions 231, 232, and 233, a dopant which is at least one of a metal element such as indium and impurities is added through the insulating film 272A, for example (see FIGS. 9A to 9C. Note that arrows in FIGS. 9B and 9C indicate addition of a dopant).

For the addition of the dopant, an ion implantation method by which an ionized source gas is subjected to mass separation and then added, an ion doping method by which an ionized source gas is added without mass separation, a plasma immersion ion implantation method, or the like can be used. In the case of performing mass separation, ion species to be added and its concentration can be controlled properly. On the other hand, in the case of not performing mass separation, ions at a high concentration can be added in a short time. Alternatively, an ion doping method in which atomic or molecular clusters are generated and ionized may be employed. Instead of the term "dopant," the term "ion," "donor," "acceptor," "impurity," "element," or the like may be used.

A dopant may be added by plasma treatment. In this case, the plasma treatment is performed with a plasma CVD apparatus, a dry etching apparatus, or an ashing apparatus, so that a dopant can be added to the oxide 230.

Here, when the indium content in the oxide 230 is increased, the carrier density is increased and the resistance can be decreased. Accordingly, as a dopant, a metal element that improves the carrier density of the oxide 230, such as indium, can be used.

That is, when the content of a metal element such as indium in the regions 231, 232, and 233 in the oxide 230 is increased, the electron mobility can be increased and the resistance can be decreased.

Accordingly, the atomic ratio of indium to the element M at least in the region 231 is larger than the atomic ratio of indium to the element Min the region 234.

As the dopant, the element forming an oxygen vacancy, the element trapped by an oxygen vacancy, or the like may be used. Typical examples of the element are hydrogen, boron, carbon, nitrogen, fluorine, phosphorus, sulfur, chlorine, titanium, and a rare gas. Typical examples of the rare gas element are helium, neon, argon, krypton, and xenon.

Here, the insulating film 272A is provided to cover the oxide 230, the insulator 250, the conductor 260, and the insulator 270. Accordingly, in the direction perpendicular to the top surface of the oxide 230, the thickness of the insulating film 272A is different between a region on the periphery of the side of the insulator 250, the conductor 260, and the insulator 270 and a region other than the above region. That is, the thickness of the insulating film 272A in the region on the periphery of the side of the insulator 250, the conductor 260, and the insulator 270 is larger than that in the region other than the above region. That is, when a dopant is added through the insulating film 272A, the regions 231, 232, and 233 can be provided in a self-aligned manner, even in a minute transistor whose channel length is approximately 10 nm to 30 nm. The region 233 may be formed in such a manner that the dopants in the regions 231 and 232 are diffused in a step of heat treatment to be performed in a later step, for example.

When the regions 233 and 232 are provided in the transistor 200, high-resistance regions are not formed between the region 231 functioning as the source region and the drain region and the region 234 where a channel is formed, so that the on-state current and the carrier mobility of the transistor can be increased. Moreover, when the transistor 200 includes the region 233, the gate does not overlap with the source region and the drain region in the channel length direction, so that formation of unnecessary capacitance can be suppressed, and the leakage current in an off state can be reduced.

Thus, by appropriately selecting the areas of the region 231*a* and the region 231*b*, a transistor having electrical characteristics necessary for the circuit design can be easily provided.

Figure 10A:
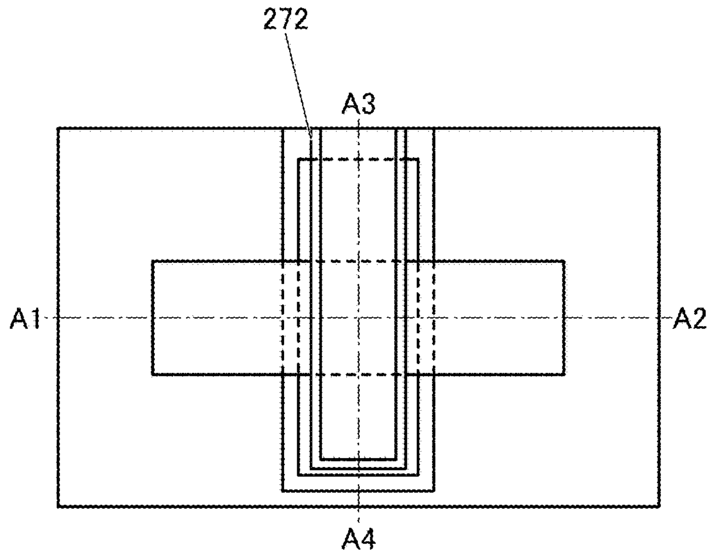
FIGS. 10A to 10C are a top view and cross-sectional views illustrating a method for manufacturing a semiconductor device of one embodiment of the present invention.
Figure 10C:
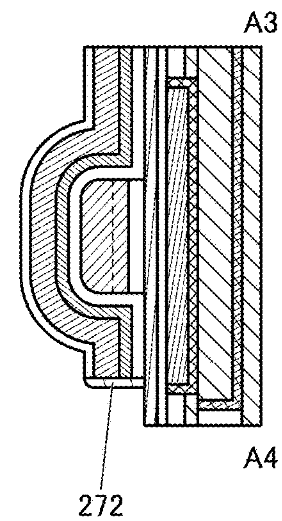
Figure 10B:
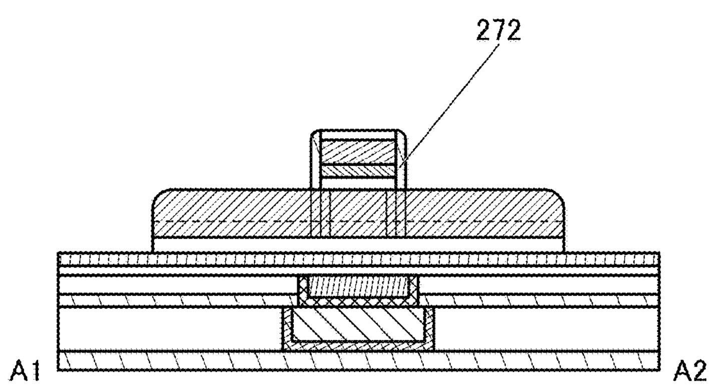

Next, the insulating film 272A is subjected to anisotropic etching, whereby the insulator 272 is formed in contact with side surfaces of the insulator 250, the conductor 260, and the insulator 270 (see FIGS. 10A to 10C). Dry etching is preferably performed as the anisotropic etching. In this manner, the insulating film in a region on a plane substantially parallel to the substrate can be removed, so that the insulator 272 can be formed in a self-aligned manner.

Here, the thickness of the insulator 270 is made larger than that of the insulating film 272A, so that the insulator 270 and the insulator 272 can be left even when portions of the insulating film 272A that are over the insulator 270 are removed. The height of a structure body composed of the insulator 250, the conductor 260, and the insulator 270 is larger than that of the oxide 230, whereby the insulating film 272A on the side surface of the oxide 230 can be removed. Furthermore, when the end portion of the oxide 230 has a rounded shape, time taken to remove the insulating film 272A formed in contact with the side surface of the oxide 230 can be shortened, leading to easy formation of the insulator 272.

Although not illustrated, the insulating film 272A may remain also on the side surface of the oxide 230. In that case, coverage with an interlayer film or the like to be formed in a later step can be improved. When the insulator remains on the side surface of the oxide 230, entry of impurities such as water and hydrogen into the oxide 230 and outward diffusion of oxygen in the oxide 230 can be prevented in some cases.

When the insulator 274 containing elements serving as impurities is formed and the regions 231*a* 231*b* are formed in the oxide 230 in a later step, the remaining structure body of the insulating film 272A in contact with the side surface of the oxide 230 prevents a decrease in the resistance of an interface region between the insulator 224 and the oxide 230. Consequently, generation of leakage current can be suppressed. Moreover, even in the case where a dopant is added such that the concentration of indium has a peak in the oxide 230*a* when indium is added to the oxide 230, generation of leakage current through the oxide 230*a* can be suppressed.

Note that the anisotropic etching may be performed before the addition of a dopant. In this case, the dopant is added to the oxide 230 without through the insulating film 272A.

Subsequently, heat treatment can be performed. For the heat treatment, the conditions for the above heat treatment can be used. The heat treatment allows diffusion of the added dopant into the region 233 in the oxide 230, resulting in an increase in on-state current.

Figure 11A:
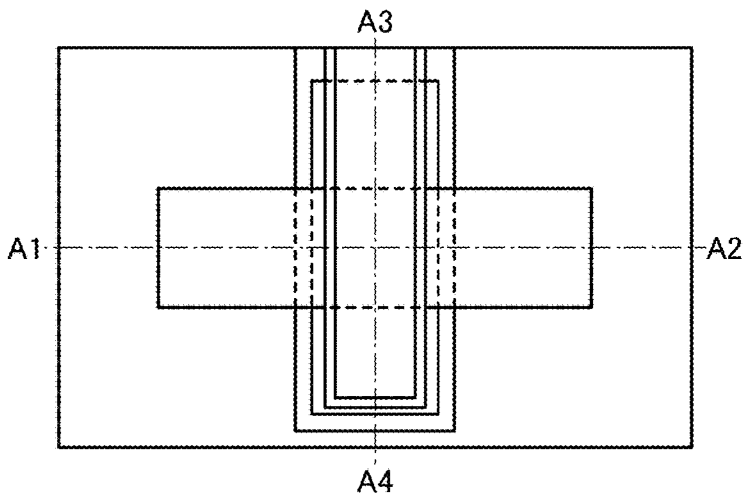
FIGS. 11A to 11C are a top view and cross-sectional views illustrating a method for manufacturing a semiconductor device of one embodiment of the present invention.
Figure 11B:
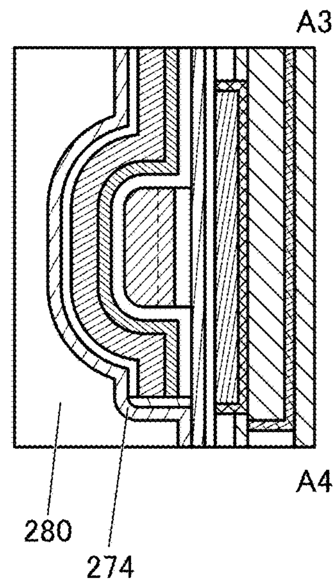
Figure 11C:
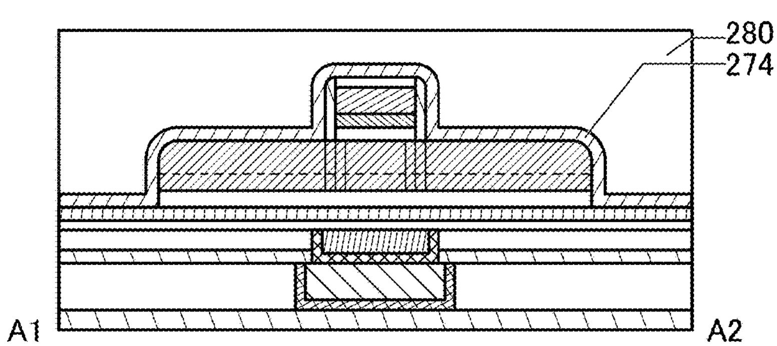
Figure 12A:
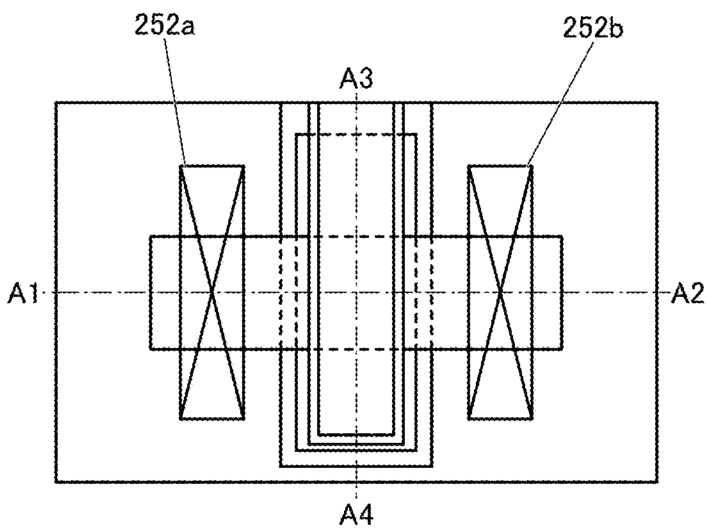
FIGS. 12A to 12C are a top view and cross-sectional views illustrating a method for manufacturing a semiconductor device of one embodiment of the present invention.
Figure 12C:
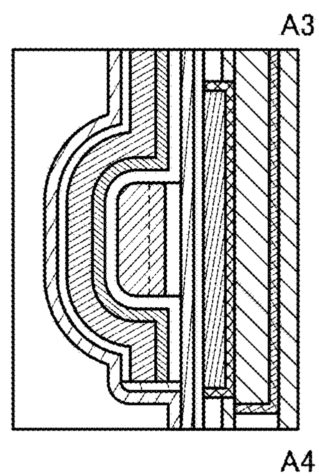
Figure 12B:
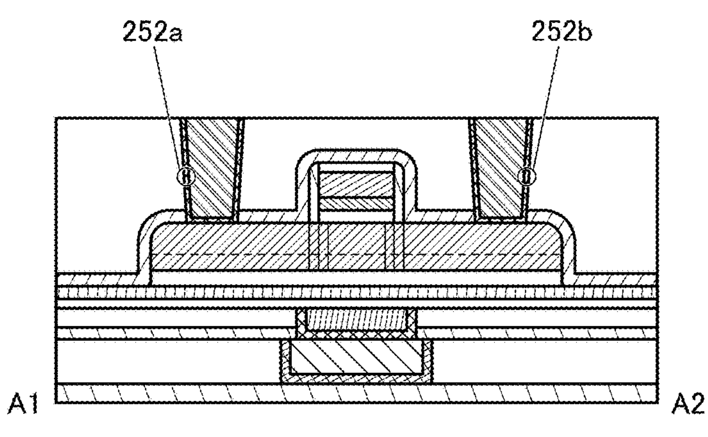

Next, the insulator 274 is formed to cover the insulator 224, the oxide 230, the insulator 272, and the insulator 270 (see FIGS. 11A to 11C).

For example, as the insulator 274, aluminum oxide is preferably formed by an ALD method. Aluminum oxide formed by an ALD method has good coverage and is a dense film. In addition, the insulator 274 preferably has a barrier property against oxygen, hydrogen, and water. When the insulator 274 has a barrier property against hydrogen and water, hydrogen and water contained in the structure bodies provided around the transistor 200 are not diffused into the transistor 200, and generation of oxygen vacancies in the oxide 230 can be inhibited.

Here, the insulator 274 is preferably in contact with the insulator 222 at an outer edge of the transistor 200. With this structure, the transistor 200 can be surrounded with the insulator having a barrier property. With this structure, impurities such as hydrogen and water can be prevented from entering the transistor 200. In addition, oxygen contained in the insulators 224 and 250 can be prevented from diffusing into the interlayer film from the transistor 200.

When such an insulator 274 is provided over the regions 231*a* and 231*b*, the carrier density can be prevented from being changed by entry of oxygen or impurities such as excess water and hydrogen into the regions 231*a* and 231*b*.

When the insulator 274 containing elements serving as impurities is formed in contact with the oxide 230, impurities can be added to the regions 231, 232, and 233.

In the case where the insulator 274 containing elements serving as impurities is formed in contact with the oxide 230, impurity elements such as hydrogen and nitrogen, which are contained in a film formation atmosphere of the insulator 274, are added to the regions 231*a* and 231*b*. Oxygen vacancies are formed because of the added impurity elements, and the impurity elements enter the oxygen vacancies, thereby increasing the carrier density and reducing resistance mainly in a region of the oxide 230 which is in contact with the insulator 274. The impurities are diffused also into the regions 232 and 233 that are not in contact with the insulator 274 at this time, whereby the resistances are reduced.

Therefore, the region 231*a* and the region 231*b* preferably have a higher concentration of at least one of hydrogen and nitrogen than the region 234. The concentration of hydrogen or nitrogen can be measured by secondary ion mass spectrometry (SIMS) or the like. Here, the concentration of hydrogen or nitrogen in the middle of the region of the oxide 230*b* that overlaps with the insulator 250 (e.g., a portion in the metal oxide 230*b* which is located equidistant from both side surfaces in the channel length direction of the insulator 250) is measured as the concentration of hydrogen or nitrogen in the region 234.

The regions 231, 232, and 233 are reduced in resistance when an element forming an oxygen vacancy or an element trapped by an oxygen vacancy is added thereto. Typical examples of the element are hydrogen, boron, carbon, nitrogen, fluorine, phosphorus, sulfur, chlorine, titanium, and a rare gas. Typical examples of the rare gas element are helium, neon, argon, krypton, and xenon. Accordingly, the regions 231, 232, and 233 are made to include one or more of the above elements.

The insulator 274 containing elements serving as impurities can be formed by a sputtering method, a CVD method, an MBE method, a PLD method, an ALD method, or the like.

The insulator 274 containing elements serving as impurities is preferably formed in an atmosphere containing at least one of nitrogen and hydrogen. In that case, oxygen vacancies are formed mainly in the region of the oxides 230*b* and 230*c* not overlapping with the insulator 250 and the oxygen vacancies and impurity elements such as nitrogen and hydrogen are bonded to each other, leading to an increase in carrier density. In this manner, the regions 231*a* and 231*b* with reduced resistance can be formed. For the insulator 274, for example, silicon nitride, silicon nitride oxide, or silicon oxynitride can be formed by a CVD method. In this embodiment, silicon nitride oxide is used for the insulator 274.

Accordingly, in the method for manufacturing a semiconductor device described in this embodiment, a source region and a drain region can be formed in a self-aligned manner owing to the formation of the insulator 274, even in a minute transistor whose channel length is approximately 10 nm to 30 nm. Thus, minute or highly integrated semiconductor devices can be manufactured with high yield.

Here, when the top surface of the conductor 260 is covered with the insulator 270 and the side surfaces of the conductor 260 and the insulator 250 are covered with the insulator 272, impurity elements such as nitrogen and hydrogen can be prevented from entering the conductor 260 and the insulator 250. Thus, impurity elements such as nitrogen and hydrogen can be prevented from entering the region 234 functioning as the channel formation region of the transistor 200 through the conductor 260 and the insulator 250. Accordingly, the transistor 200 having favorable electrical characteristics can be provided.

Note that although the regions 231, 232, 233, and 234 are formed by the addition of a dopant or the reduction in the resistance by the formation of the insulator 274 in the above, this embodiment is not limited thereto. For example, the regions may be formed through both of the addition of a dopant and the reduction in the resistance by the formation of the insulator 274. Alternatively, plasma treatment may be performed.

For example, plasma treatment may be performed on the oxide 230 using the insulator 250, the conductor 260, the insulator 272, and the insulator 270 as a mask. The plasma treatment is performed in an atmosphere containing the above-described element forming oxygen vacancies or an element trapped by oxygen vacancies, for example. The plasma treatment may be performed using an argon gas and a nitrogen gas, for example.

Then, an insulating film to be the insulator 280 is formed over the insulator 274. The insulating film to be the insulator 280 can be formed by a sputtering method, a CVD method, an MBE method, a PLD method, an ALD method, or the like. Alternatively, the insulating film to be the insulator 280 can be formed by a spin coating method, a dipping method, a droplet discharging method (such as an ink-jet method), a printing method (such as screen printing or offset printing), a doctor knife method, a roll coater method, a curtain coater method, or the like. In this embodiment, silicon oxynitride is used for the insulating film.

Next, the insulating film to be the insulator 280 is partly removed to form the insulator 280 (see FIGS. 11A to 11C).

The insulator 280 is preferably formed to have a flat top surface. For example, the insulator 280 may have a flat top surface right after the formation of the insulating film to be the insulator 280. Alternatively, the insulator 280 may be planarized by removing the insulator or the like from the top surface after the deposition so that the top surface becomes parallel to a reference surface such as a rear surface of the substrate. Such treatment is referred to as planarization treatment. As the planarization treatment, for example, chemical mechanical polishing (CMP) treatment, dry etching treatment, or the like can be performed. In this embodiment, CMP treatment is used as planarization treatment. Note that the top surface of the insulator 280 does not necessarily have planarity.

Next, an opening reaching the region 231*a* of the oxide 230 and an opening reaching the region 231*b* of the oxide 230 are formed in the insulator 280 and the insulator 274. The openings may be formed by a lithography method. Note that in order that the conductors 252*a* and 252*b* are provided in contact with the side surface of the oxide 230, the openings are formed to reach the oxide 230 such that the side surface of the oxide 230 is exposed in the openings.

Next, a conductive film to be the conductor 252*a* and the conductor 252*b* is formed. The conductive film can be formed by a sputtering method, a CVD method, an MBE method, a PLD method, an ALD method, or the like.

Next, the conductive film to be the conductors 252*a* and 252*b* is partly removed by CMP treatment to expose the insulator 280. As a result, the conductive film remains only in the openings, so that the conductors 252*a* and 252*b* having flat top surfaces can be formed (see FIGS. 12A to 12C).

Through the above process, the semiconductor device including the transistor 200 can be manufactured. By the method for manufacturing a semiconductor device which is described in this embodiment and is illustrated in FIGS. 2A and 2B to FIGS. 12A to 12C, the transistor 200 can be formed.

According to one embodiment of the present invention, a semiconductor device that can be miniaturized or highly integrated can be provided. Alternatively, according to one embodiment of the present invention, a semiconductor device with favorable electrical characteristics can be provided. Alternatively, according to one embodiment of the present invention, a semiconductor device with low off-state current can be provided. Alternatively, according to one embodiment of the present invention, a transistor with high on-state current can be provided. Alternatively, according to one embodiment of the present invention, a semiconductor device with high reliability can be provided. Alternatively, according to one embodiment of the present invention, a semiconductor device with low power consumption can be provided. Alternatively, according to one embodiment of the present invention, a semiconductor device with high productivity can be provided.

As described above, the structures, methods, and the like described in this embodiment can be combined with any of the structures, methods, and the like described in the other embodiments as appropriate.

Embodiment 2

In this embodiment, embodiments of semiconductor devices are described with reference to FIG. 14 and FIG. 15.

[Memory Device 1]

Figure 14:
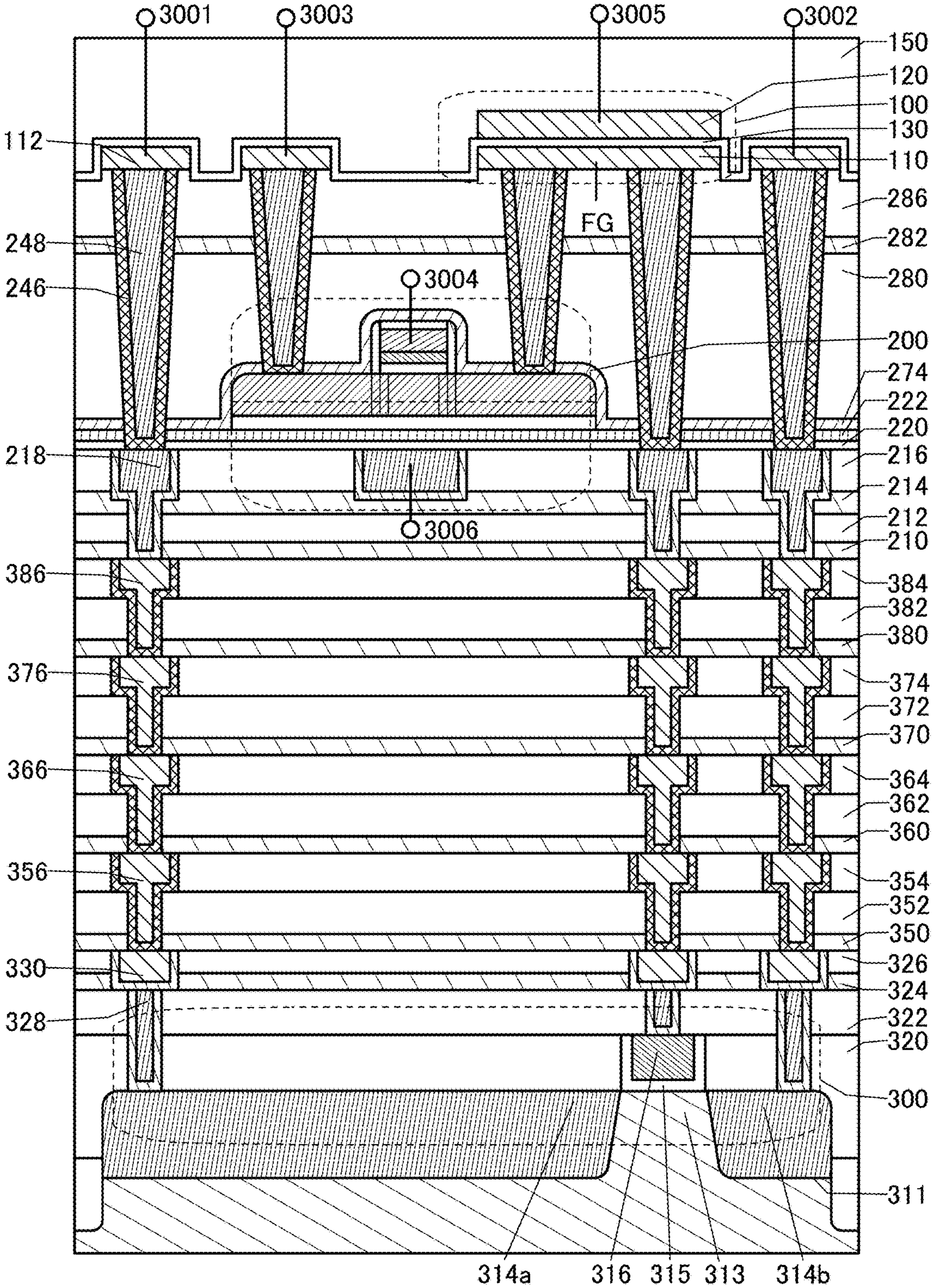
FIG. 14 is a cross-sectional view illustrating a structure of a memory device of one embodiment of the present invention.

A semiconductor device illustrated in FIG. 14 includes a transistor 300, a transistor 200, and a capacitor 100.

The transistor 200 is a transistor in which a channel is formed in a semiconductor layer containing an oxide semiconductor. Since the off-state current of the transistor 200 is low, a memory device including the transistor can retain stored data for a long time. In other words, such a memory device does not require refresh operation or has an extremely low frequency of the refresh operation, which leads to a sufficient reduction in power consumption of the memory device.

In FIG. 14, a wiring 3001 is electrically connected to a source of the transistor 300. A wiring 3002 is electrically connected to a drain of the transistor 300. A wiring 3003 is electrically connected to one of a source and a drain of the transistor 200. A wiring 3004 is electrically connected to a first gate of the transistor 200. A wiring 3006 is electrically connected to a second gate of the transistor 200. A gate of the transistor 300 and the other of the source and the drain of the transistor 200 are electrically connected to one electrode of the capacitor 100. A wiring 3005 is electrically connected to the other electrode of the capacitor 100.

The semiconductor device illustrated in FIG. 14 has a feature that the potential of the gate of the transistor 300 can be retained and thus enables writing, retaining, and reading of data as follows.

Writing and retaining of data are described. First, the potential of the wiring 3004 is set to a potential at which the transistor 200 is turned on, so that the transistor 200 is turned on. Accordingly, the potential of the wiring 3003 is supplied to a node FG where the gate of the transistor 300 and the one electrode of the capacitor 100 are electrically connected to each other. That is, a predetermined charge is supplied to the gate of the transistor 300 (writing). Here, one of two kinds of charges providing different potential levels (hereinafter referred to as a low-level charge and a high-level charge) is supplied. After that, the potential of the wiring 3004 is set to a potential at which the transistor 200 is turned off, so that the transistor 200 is turned off. Thus, the charge is retained in the node FG (retaining).

In the case where the off-state current of the transistor 200 is low, the charge of the node FG is retained for a long time.

Next, reading of data is described. An appropriate potential (reading potential) is supplied to the wiring 3005 while a predetermined potential (constant potential) is supplied to the wiring 3001, whereby the potential of the wiring 3002 varies depending on the amount of charge retained in the node FG. This is because in the case of using an n-channel transistor as the transistor 300, an apparent threshold voltage $V_{th\_H}$ at the time when a high-level charge is given to the gate of the transistor 300 is lower than an apparent threshold voltage $V_{th\_L}$ at the time when a low-level charge is given to the gate of the transistor 300. Here, an apparent threshold voltage refers to the potential of the wiring 3005 which is needed to turn on the transistor 300. Thus, the potential of the wiring 3005 is set to a potential $V_0$ which is between $V_{th\_H}$ and $V_{th\_L}$, whereby the charge supplied to the node FG can be determined. For example, in the case where a high-level charge is supplied to the node FG in writing and the potential of the wiring 3005 becomes $V_0$ ($>V_{th\_H}$), the transistor 300 is turned on. Meanwhile, in the case where a low-level charge is supplied to the node FG in writing, even when the potential of the wiring 3005 becomes $V_0$ ($<V_{th\_L}$), the transistor 300 remains off. Thus, the data retained in the node FG can be read by determining the potential of the wiring 3002.

<Structure of Memory Device 1>

The semiconductor device of one embodiment of the present invention includes the transistor 300, the transistor 200, and the capacitor 100 as illustrated in FIG. 14. The transistor 200 is provided above the transistor 300, and the capacitor 100 is provided above the transistor 300 and the transistor 200.

The transistor 300 is provided in and on a substrate 311 and includes a conductor 316, an insulator 315, a semiconductor region 313 that is a part of the substrate 311, and low-resistance regions 314*a* and 314*b* functioning as a source region and a drain region.

The transistor 300 is either a p-channel transistor or an n-channel transistor.

It is preferable that a channel formation region of the semiconductor region 313, a region in the vicinity thereof, the low-resistance regions 314*a* and 314*b* functioning as a source region and a drain region, and the like contain a semiconductor such as a silicon-based semiconductor, further preferably single crystal silicon. Alternatively, a material including germanium (Ge), silicon germanium (SiGe), gallium arsenide (GaAs), gallium aluminum arsenide (GaAlAs), or the like may be contained. Silicon whose effective mass is controlled by applying stress to the crystal lattice and thereby changing the lattice spacing may be contained. Alternatively, the transistor 300 may be a high-electron-mobility transistor (HEMT) with GaAs and GaAlAs, or the like.

The low-resistance regions 314*a* and 314*b* contain an element which imparts n-type conductivity, such as arsenic or phosphorus, or an element which imparts p-type conductivity, such as boron, in addition to a semiconductor material used for the semiconductor region 313.

The conductor 316 functioning as a gate electrode can be formed using a semiconductor material such as silicon containing an element which imparts n-type conductivity, such as arsenic or phosphorus, or an element which imparts p-type conductivity, such as boron, or a conductive material such as a metal material, an alloy material, or a metal oxide material.

Note that a work function of a conductor is determined by a material of the conductor, whereby the threshold voltage can be adjusted. Specifically, it is preferable to use titanium nitride, tantalum nitride, or the like as the conductor. Furthermore, in order to ensure the conductivity and embeddability of the conductor, it is preferable to use a stacked layer of metal materials such as tungsten and aluminum as the conductor. In particular, tungsten is preferable in terms of heat resistance.

Note that the transistor 300 illustrated in FIG. 14 is only an example and the structure of the transistor 300 is not limited to that illustrated therein; an appropriate transistor may be used in accordance with a circuit configuration or a driving method.

An insulator 320, an insulator 322, an insulator 324, and an insulator 326 are stacked in this order to cover the transistor 300.

The insulator 320, the insulator 322, the insulator 324, and the insulator 326 can be formed using, for example, silicon oxide, silicon oxynitride, silicon nitride oxide, silicon nitride, aluminum oxide, aluminum oxynitride, aluminum nitride oxide, aluminum nitride, or the like.

The insulator 322 may function as a planarization film for eliminating a level difference caused by the transistor 300 or the like underlying the insulator 322. For example, the top surface of the insulator 322 may be planarized by planarization treatment using a chemical mechanical polishing (CMP) method or the like to increase the level of planarity.

The insulator 324 is preferably formed using a film having a barrier property that prevents impurities and hydrogen from diffusing from the substrate 311, the transistor 300, or the like into a region where the transistor 200 is formed.

As an example of the film having a hydrogen barrier property, silicon nitride formed by a CVD method can be given. The diffusion of hydrogen to a semiconductor element including an oxide semiconductor, such as the transistor 200, degrades the characteristics of the semiconductor element in some cases. Therefore, a film that prevents hydrogen diffusion is preferably provided between the transistor 200 and the transistor 300. Specifically, the film that prevents hydrogen diffusion is a film from which hydrogen is less likely to be released.

The amount of released hydrogen can be measured by thermal desorption spectroscopy (TDS), for example. The amount of hydrogen released from the insulator 324 that is converted into hydrogen molecules per unit area of the insulator 324 is less than or equal to $10\times10^{15}$ atoms/cm$^2$, preferably less than or equal to $5\times10^{15}$ atoms/cm$^2$ in the TDS analysis in the range of 50° C. to 500° C., for example.

Note that the permittivity of the insulator 326 is preferably lower than that of the insulator 324. For example, the relative permittivity of the insulator 326 is preferably lower than 4, further preferably lower than 3. For example, the relative permittivity of the insulator 326 is preferably 0.7 times or less that of the insulator 324, further preferably 0.6 times or less that of the insulator 324. In the case where a material with a low permittivity is used as an interlayer film, the parasitic capacitance between wirings can be reduced.

A conductor 328, a conductor 330, and the like that are electrically connected to the capacitor 100 or the transistor 200 are provided in the insulator 320, the insulator 322, the insulator 324, and the insulator 326. Note that the conductor 328 and the conductor 330 each function as a plug or a wiring. A plurality of structures of conductors functioning as plugs or wirings are collectively denoted by the same reference numeral in some cases. Furthermore, in this specification and the like, a wiring and a plug electrically connected to the wiring may be a single component. That is, part of a conductor functions as a wiring and part of the conductor functions as a plug in some cases.

As a material of each of plugs and wirings (e.g., the conductor 328 and the conductor 330), a conductive material such as a metal material, an alloy material, a metal nitride material, or a metal oxide material can be used in a single-layer structure or a stacked-layer structure. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, in FIG. 14, an insulator 350, an insulator 352, and an insulator 354 are stacked in this order. Furthermore, a conductor 356 is formed in the insulator 350, the insulator 352, and the insulator 354. The conductor 356 functions as a plug or a wiring. Note that the conductor 356 can be formed using a material similar to those used for forming the conductor 328 and the conductor 330.

Note that for example, the insulator 350 is preferably formed using an insulator having a hydrogen barrier property, like the insulator 324. Furthermore, the conductor 356 preferably includes a conductor having a hydrogen barrier property. The conductor having a hydrogen barrier property is formed particularly in an opening of the insulator 350 having a hydrogen barrier property. In such a structure, the transistor 300 and the transistor 200 can be separated by a barrier layer, so that the diffusion of hydrogen from the transistor 300 to the transistor 200 can be prevented.

Note that as the conductor having a hydrogen barrier property, tantalum nitride may be used, for example. By stacking tantalum nitride and tungsten, which has high conductivity, the diffusion of hydrogen from the transistor 300 can be prevented while the conductivity of a wiring is ensured. In this case, a tantalum nitride layer having a hydrogen barrier property is preferably in contact with the insulator 350 having a hydrogen barrier property.

A wiring layer may be provided over the insulator 350 and the conductor 356. For example, in FIG. 14, an insulator 360, an insulator 362, and an insulator 364 are stacked in this order. Furthermore, a conductor 366 is formed in the insulator 360, the insulator 362, and the insulator 364. The conductor 366 functions as a plug or a wiring. Note that the conductor 366 can be formed using a material similar to those for the conductor 328 and the conductor 330.

Note that for example, the insulator 360 is preferably formed using an insulator having a hydrogen barrier property, like the insulator 324. Furthermore, the conductor 366 preferably includes a conductor having a hydrogen barrier property. The conductor having a hydrogen barrier property is formed particularly in an opening in the insulator 360 having a hydrogen barrier property. With this structure, the transistor 300 and the transistor 200 can be separated by a barrier layer, and hydrogen diffusion from the transistor 300 to the transistor 200 can be inhibited.

A wiring layer may be provided over the insulator 364 and the conductor 366. For example, in FIG. 14, an insulator 370, an insulator 372, and an insulator 374 are stacked in this order. Furthermore, a conductor 376 is formed in the insulator 370, the insulator 372, and the insulator 374. The conductor 376 functions as a plug or a wiring. Note that the conductor 376 can be formed using a material similar to those for the conductor 328 and the conductor 330.

Note that for example, the insulator 370 is preferably formed using an insulator having a hydrogen barrier property, like the insulator 324. Furthermore, the conductor 376 preferably includes a conductor having a hydrogen barrier property. The conductor having a hydrogen barrier property is formed particularly in an opening in the insulator 370 having a hydrogen barrier property. With this structure, the transistor 300 and the transistor 200 can be separated by a barrier layer, and hydrogen diffusion from the transistor 300 to the transistor 200 can be inhibited.

A wiring layer may be provided over the insulator 374 and the conductor 376. For example, in FIG. 14, an insulator 380, an insulator 382, and an insulator 384 are stacked in this order. Furthermore, a conductor 386 is formed in the insulator 380, the insulator 382, and the insulator 384. The conductor 386 functions as a plug or a wiring. Note that the conductor 386 can be formed using a material similar to those for the conductor 328 and the conductor 330.

Note that for example, the insulator 380 is preferably formed using an insulator having a hydrogen barrier property, like the insulator 324. Furthermore, the conductor 386 preferably includes a conductor having a hydrogen barrier property. The conductor having a hydrogen barrier property is formed particularly in an opening in the insulator 380 having a hydrogen barrier property. With this structure, the transistor 300 and the transistor 200 can be separated by a barrier layer, and hydrogen diffusion from the transistor 300 to the transistor 200 can be inhibited.

An insulator 210, an insulator 212, an insulator 214, and an insulator 216 are stacked in this order over the insulator 384. A material having a barrier property against oxygen and hydrogen is preferably used for any of the insulator 210, the insulator 212, the insulator 214, and the insulator 216.

The insulators 210 and 214 are preferably formed using, for example, a film having a barrier property that prevents hydrogen and impurities from diffusing from the substrate 311, a region where the transistor 300 is formed, or the like to a region where the transistor 200 is formed. Therefore, the insulators 210 and 214 can be formed using a material similar to that for the insulator 324.

As an example of the film having a hydrogen barrier property, silicon nitride formed by a CVD method can be given. The diffusion of hydrogen to a semiconductor element including an oxide semiconductor, such as the transistor 200, degrades the characteristics of the semiconductor element in some cases. Therefore, a film that prevents hydrogen diffusion is preferably provided between the transistor 200 and the transistor 300. Specifically, the film that prevents hydrogen diffusion is a film from which hydrogen is less likely to be released.

As the film having a hydrogen barrier property, for example, as each of the insulators 210 and 214, a metal oxide such as aluminum oxide, hafnium oxide, or tantalum oxide is preferably used.

In particular, aluminum oxide has an excellent blocking effect that prevents permeation of oxygen and impurities such as hydrogen and moisture, which cause a change in the electrical characteristics of the transistor. Accordingly, the use of aluminum oxide can prevent entry of impurities such as hydrogen and moisture into the transistor 200 in and after a manufacturing process of the transistor. In addition, release of oxygen from the oxide in the transistor 200 can be prevented. Therefore, aluminum oxide is suitably used as a protective film for the transistor 200.

For example, the insulators 212 and 216 can be formed using a material similar to that for the insulator 320. In the case where interlayer films are formed of a material with a relatively low permittivity, the parasitic capacitance between wirings can be reduced. For example, a silicon oxide film, a silicon oxynitride film, or the like can be used for the insulators 212 and 216.

A conductor 218, a conductor included in the transistor 200 (conductor 205), and the like are provided in the insulators 210, 212, 214, and 216. Note that the conductor 218 functions as a plug or a wiring that is electrically connected to the capacitor 100 or the transistor 300. The conductor 218 can be formed using a material similar to those for the conductors 328 and 330.

In particular, part of the conductor 218 which is in contact with the insulators 210 and 214 is preferably a conductor with a barrier property against oxygen, hydrogen, and water. In such a structure, the transistor 300 and the transistor 200 can be completely separated by the layer with a barrier property against oxygen, hydrogen, and water. As a result, the diffusion of hydrogen from the transistor 300 to the transistor 200 can be prevented.

The transistor 200 is provided over the insulator 216. Note that the structure of the transistor included in the semiconductor device described in the above embodiment can be used as the structure of the transistor 200. Note that the transistor 200 illustrated in FIG. 14 is just an example and the structure of the transistor 200 is not limited to that illustrated therein; an appropriate transistor may be used in accordance with a circuit configuration or a driving method.

The insulator 280 is provided over the transistor 200.

The insulator 282 is provided over the insulator 280. A material having a barrier property against oxygen and hydrogen is preferably used for the insulator 282. Thus, the insulator 282 can be formed using a material similar to that for the insulator 214. As the insulator 282, a metal oxide such as aluminum oxide, hafnium oxide, or tantalum oxide is preferably used, for example.

In particular, aluminum oxide has an excellent blocking effect that prevents permeation of oxygen and impurities such as hydrogen and moisture, which cause a change in the electrical characteristics of the transistor. Accordingly, the use of aluminum oxide can prevent entry of impurities such as hydrogen and moisture into the transistor 200 in and after a manufacturing process of the transistor. In addition, release of oxygen from the oxide in the transistor 200 can be prevented. Therefore, aluminum oxide is suitably used as a protective film for the transistor 200.

The insulator 286 is provided over the insulator 282. The insulator 286 can be formed using a material similar to that for the insulator 320. In the case where a material with a relatively low permittivity is used for an interlayer film, the parasitic capacitance between wirings can be reduced. For example, a silicon oxide film, a silicon oxynitride film, or the like can be used for the insulator 286.

The conductors 246, the conductors 248, and the like are provided in the insulators 220, 222, 280, 282, and 286.

The conductors 246 and 248 function as plugs or wirings that are electrically connected to the capacitor 100, the transistor 200, or the transistor 300. The conductors 246 and 248 can be formed using a material similar to those used for forming the conductors 328 and 330.

The capacitor 100 is provided above the transistor 200. The capacitor 100 includes a conductor 110, a conductor 120, and an insulator 130.

A conductor 112 may be provided over the conductors 246 and 248. Note that the conductor 112 functions as a plug or a wiring that is electrically connected to the capacitor 100, the transistor 200, or the transistor 300. The conductor 110 functions as the one electrode of the capacitor 100. The conductor 112 and the conductor 110 can be formed at the same time.

The conductor 112 and the conductor 110 can be formed using a metal film containing an element selected from molybdenum, titanium, tantalum, tungsten, aluminum, copper, chromium, neodymium, and scandium; a metal nitride film containing any of the above elements as its component (e.g., a tantalum nitride film, a titanium nitride film, a molybdenum nitride film, or a tungsten nitride film); or the like. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

The conductor 112 and the conductor 110 each have a single-layer structure in FIG. 14; however, one embodiment of the present invention is not limited thereto, and a stacked-layer structure of two or more layers may be used. For example, between a conductor having a barrier property and a conductor having high conductivity, a conductor which is highly adhesive to the conductor having a barrier property and the conductor having high conductivity may be formed.

As a dielectric of the capacitor 100, the insulator 130 is provided over the conductors 112 and 110. The insulator 130 can be formed to have a single-layer structure or a stacked-layer structure using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or the like.

For example, a material with high dielectric strength, such as silicon oxynitride, is preferably used for the insulator 130. In the capacitor 100 having the structure, the dielectric strength can be increased and the electrostatic breakdown of the capacitor 100 can be prevented because of the insulator 130.

Over the insulator 130, the conductor 120 is provided to overlap with the conductor 110. Note that the conductor 120 can be formed using a conductive material such as a metal material, an alloy material, or a metal oxide material. It is preferable to use a high-melting-point material which has both heat resistance and conductivity, such as tungsten or molybdenum, and it is particularly preferable to use tungsten. In the case where the conductor 120 is formed concurrently with another component such as a conductor, Cu (copper), Al (aluminum), or the like, which is a low-resistance metal material, may be used.

An insulator 150 is provided over the conductor 120 and the insulator 130. The insulator 150 can be formed using a material similar to that for the insulator 320. The insulator 150 may function as a planarization film that covers a roughness thereunder.

The above is the description of the structure example. With the use of the structure, a change in electrical characteristics can be prevented and reliability can be improved in a semiconductor device including a transistor including an oxide semiconductor. A transistor including an oxide semiconductor with a high on-state current can be provided. A transistor including an oxide semiconductor with a low off-state current can be provided. A semiconductor device with low power consumption can be provided.

Modification Example of Memory Device 1

Figure 15:
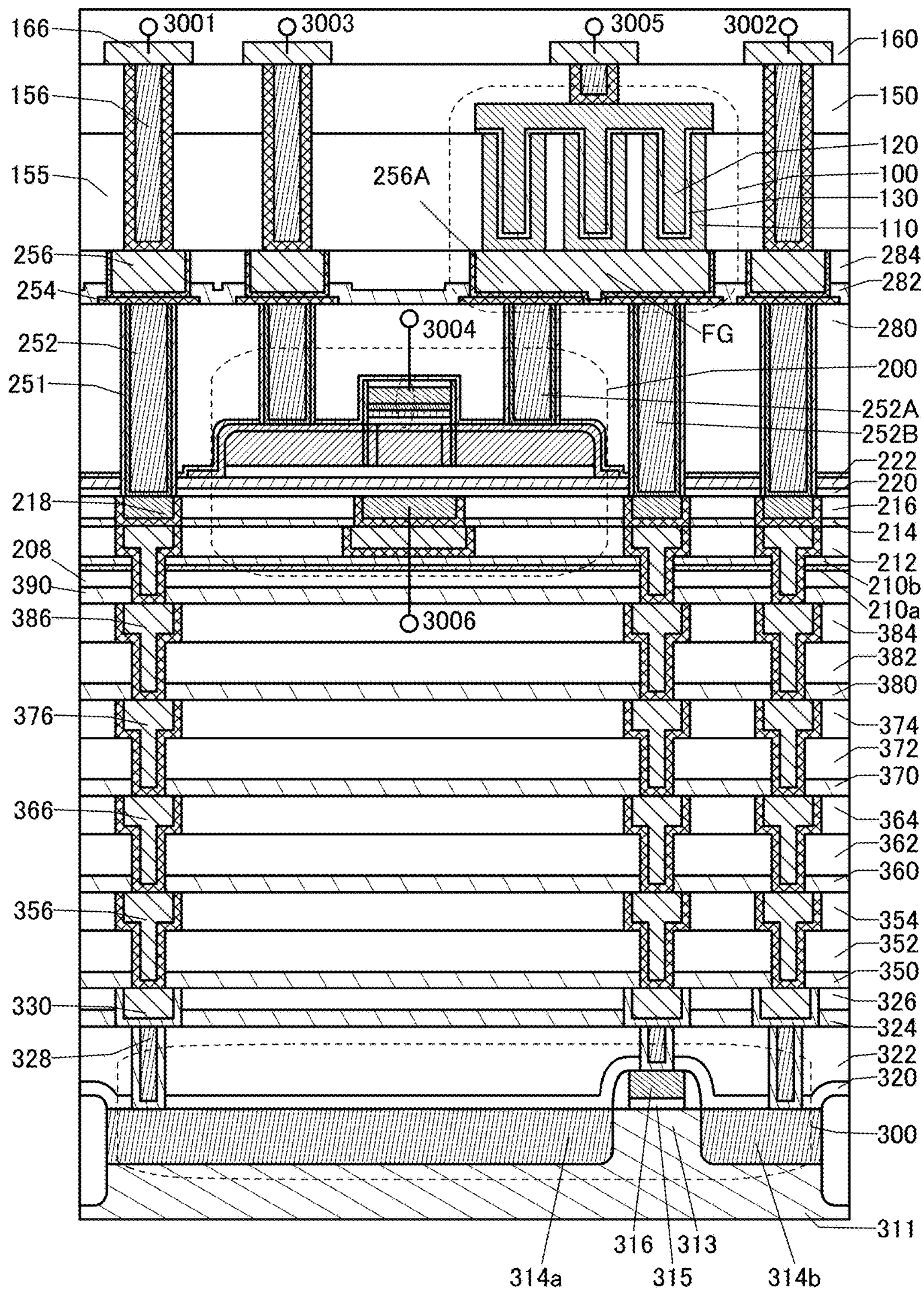
FIG. 15 is a cross-sectional view of a semiconductor device of one embodiment of the present invention.

FIG. 15 illustrates another modification example of this embodiment. FIG. 15 is different from FIG. 14 in the structure of the transistor 300, the structures of wirings including an insulator 251, the conductor 252, a conductor 254, and a conductor 256, and the structure of the capacitor 100.

The transistor 300 illustrated in FIG. 15 is provided in and on a substrate 311 and includes a conductor 316, an insulator 315, a semiconductor region 313 that is a part of the substrate 311, and low-resistance regions 314*a* and 314*b* functioning as source and drain regions. The transistor 300 is either a p-channel transistor or an n-channel transistor.

[Formation Method of Openings, Wirings, and the Like]

As illustrated in FIG. 15, the transistor 200 is covered with the insulator 280, and openings are formed in the insulator 280 and the insulator 274 to reach the oxide 230. Although the openings are formed to expose the oxide 230*c* in this embodiment, one embodiment of the present invention is not limited thereto. The openings may be formed by removing part of the oxide 230*c* so that the oxide 230*b* is exposed.

The openings are formed such that the angle formed by the side surface of the opening and a surface of the substrate is a substantially right angle. Specifically, the angle formed by the side surface of the opening and the surface of the substrate is greater than or equal to 750 and less than or equal to 1000, preferably greater than or equal to 800 and less than or equal to 950. The insulator 280 can be processed by a lithography method. Although dry etching, wet etching, or the like can be employed for the formation of the openings, dry etching, which allows anisotropic etching, is preferably employed for the formation of the openings with the above shape.

Note that a hard mask formed of an insulator or a conductor may be used instead of a resist mask. In the case where a hard mask is used, a hard mask with a desired shape can be formed in the following manner: an insulating film or a conductive film that is a material of the hard mask is formed over the insulator 280, a resist mask is formed thereover, and then the material of the hard mask is etched. The etching of the insulator 280 and the insulator 274 may be performed after or without removal of the resist mask. In the latter case, the resist mask may be removed during the etching. The hard mask may be removed by etching after the etching of the oxide film. The hard mask does not necessarily removed in the case where the material of the hard mask does not affect the following process or can be utilized in the following process.

A film to be the insulator 251 is formed in the openings and to cover the insulator 280. The film to be the insulator 251 is preferably formed on the side walls of the openings formed substantially perpendicularly to the surface of the substrate by an ALD method, which enables good coverage. The film to be the insulator 251 is preferably formed using an insulating material that has a function of inhibiting the penetration of oxygen and impurities such as water and hydrogen, and is preferably formed using aluminum oxide or hafnium oxide, for example. Providing the film to be the insulator 251 on the side surfaces of the openings can inhibit entry of impurities such as water and hydrogen into the insulator 280 in the following process or after fabrication of the device.

Next, the film to be the insulator 251 is subjected to anisotropic etching to remove portions of the film to be the insulator 251 that are on the top surface of the insulator 280 and the bottom surfaces of the openings, so that the insulator 251 is formed on the side surfaces of the openings. Note that insulators formed on the side surfaces of the openings in the insulator 280, in particular, insulators formed at the same time in the process may be collectively referred to as the insulator 251.

Subsequently, conductors are formed in the openings. The conductors can be formed in the following manner: a conductive film is formed in the openings and to cover the insulator 280, and a portion of the conductive film that is over the insulator 280 is removed by polishing using a CMP method, for example. The conductive film can be formed by an ALD method, a CVD method, a sputtering method, a plating method, or the like. In this embodiment, a conductive film made of titanium nitride is formed, a conductive film made of tungsten is formed thereover, and then, polishing is performed by a CMP method, so that the conductor 252 is formed. Note that the conductors formed in the openings in the insulator 280 may be collectively referred to as the conductor 252 in this specification.

In the case where a material used for the conductor 252 is easily oxidized and thus the resistance value might increase owing to the oxidation, that is, the conductivity might decrease owing to the oxidation, the oxidation in the following process needs to be prevented. Thus, the conductor 254 is formed to cover the conductor 252 in this embodiment. The conductor 254 can be formed in such a manner that a conductive film is formed to cover the conductor 252 and the insulator 280 and is processed such that the conductor 252 is not exposed. In this embodiment, tantalum nitride is used for the conductor 254 in order to prevent oxidation of tungsten and titanium nitride used for the conductor 252.

Note that the conductor 254 may be provided individually for each conductor provided in the opening, that is, for each opening, or may be formed to include patterns of conductors of wirings and the like formed in the following process. The former case has the following advantage: the area of an exposed portion of the insulator 280 after the formation of the conductor 254 is large, and the area of a portion where the insulator 282 to be described later and the insulator 280 are in contact with each other is large. In the latter case, one conductor 254 covers the plurality of openings and is electrically connected to the conductors formed in the openings. In addition, the conductor 254 serves as an etching stopper when depressions corresponding to the patterns of the conductors are formed by etching an insulator in the following process; in terms of this, the latter case is advantageous. The latter case is advantageous also in the case where the distance between the openings is short and thus division of the conductor 254 is difficult. The formation method of the conductor 254 can be selected depending on the dimension of the conductor 254 and the distance (space) between the conductors 254, and the above formation methods can be used in combination as appropriate to manufacture one device.

Next, the insulator 282 is formed to cover the insulator 280 and the conductor 254. It is preferred that formation of the insulator 282 allow oxygen to be supplied to the insulator 280, and in this embodiment, aluminum oxide is formed as the insulator 282 by a sputtering method. The conductor 252 is covered with the conductor 254; thus, oxidation due to the formation of the insulator 282 is inhibited.

When the insulator 282 is formed over the insulator 280, oxygen is preferably supplied to the insulator 280. In particular, in the case of using an oxide semiconductor in the transistor 200, providing an insulator supplied with oxygen in an interlayer film or the like in the vicinity of the transistor 200 allows oxygen vacancies in the oxide 230 included in the transistor 200 to be reduced, resulting in improvement in reliability. The insulator 280 covering the transistor 200 may function as a planarization film that covers a roughness thereunder.

An insulator 284 is formed over the insulator 282. The insulator 284 can be formed using silicon oxynitride, silicon oxide, silicon nitride oxide, or silicon nitride by a CVD method or a sputtering method, for example.

Depressions are formed in the insulator 282 and the insulator 284. Although dry etching or wet etching can be employed for the formation of the depressions, dry etching is preferably employed in terms of microfabrication or anisotropic etching. In forming the depressions, the insulator 282 and the insulator 284 are processed to expose the conductor 254 and/or the insulator 280.

Note that the depressions may be formed only over the conductor 254 as described above, or may be formed above the conductor 254 and the insulator 280 such that the depressions extend beyond the conductor 254.

Then, the conductor 256 is formed in the depressions. The conductor can be formed in the following manner: a conductive film is formed in the openings and to cover the insulator 284, and a portion of the conductive film that is over the insulator 284 is removed by polishing using a CMP method, for example. The conductive film can be formed by an ALD method, a CVD method, a sputtering method, a plating method, or the like. In this embodiment, a conductive film made of tantalum nitride is formed by a sputtering method, a conductive film made of ruthenium is formed thereover by a CVD method, a conductive film made of copper is formed thereover by a plating method, and then, polishing is performed by a CMP method, so that the conductor 256 is formed. Though the above steps, the semiconductor device illustrated in FIG. 15 is obtained. Note that formation of the conductive films is not limited to the above. The conductive film made of ruthenium may be formed before the conductive film made of tantalum nitride is formed. Furthermore, in forming the conductive film made of copper, copper may be formed by a plating method using the conductive film made of ruthenium as a seed layer, or copper serving as a seed layer may be formed by a sputtering method and then copper may be further formed by a plating method.

The conductor 256 formed in such a manner can function as a wiring. The conductor 256 is electrically connected to a different structure body such as the transistor 200 through the conductor 254 and the conductor 252 to form various circuits.

The insulator 251 is provided on the side surfaces of the openings formed in the insulator 280 so that entry of impurities such as water and hydrogen into the insulator 280 can be inhibited; consequently, deterioration in the characteristics, in particular, the long-term characteristics of the semiconductor device can be inhibited, and the reliability is improved. Furthermore, in forming the insulator 282 so that oxygen is supplied to the insulator 280, the conductor 254 for inhibition of oxidation of the conductors formed to be embedded in the insulator 280 is provided; thus, increase in the resistance value of the conductor and the resistance value of a connection portion between the conductor and the wiring can be prevented, and a semiconductor device with improved characteristics such as an operation frequency and an on-state current can be manufactured.

In the capacitor 100 illustrated in FIG. 15, the conductor 110, the insulator 130, and the conductor 120 overlap with each other in the openings formed in the insulator 155; thus, the conductor 110, the insulator 130, and the conductor 120 preferably have favorable coverage. For this reason, the conductor 110, the insulator 130, and the conductor 120 are preferably formed by a method with which a film having favorable step coverage can be formed, such as a CVD method or an ALD method.

The capacitor 100 is formed along the shapes of the openings formed in the insulator 155; thus, the capacitance can be increased as the openings become deeper. Furthermore, the capacitance can be increased as the number of the openings becomes larger. With the capacitor 100 having such a structure, the capacitance can be increased without increasing the area of the top surface of the capacitor 100.

The structures, methods, and the like described in this embodiment can be combined with any of the structures, methods, and the like described in the other embodiments as appropriate.

Embodiment 3

An example of a semiconductor device including the capacitor 100 and the transistor 200 of embodiments of the present invention and a transistor 400 is described below.

Structure Example of Semiconductor Device

Figures 16A, 16B:
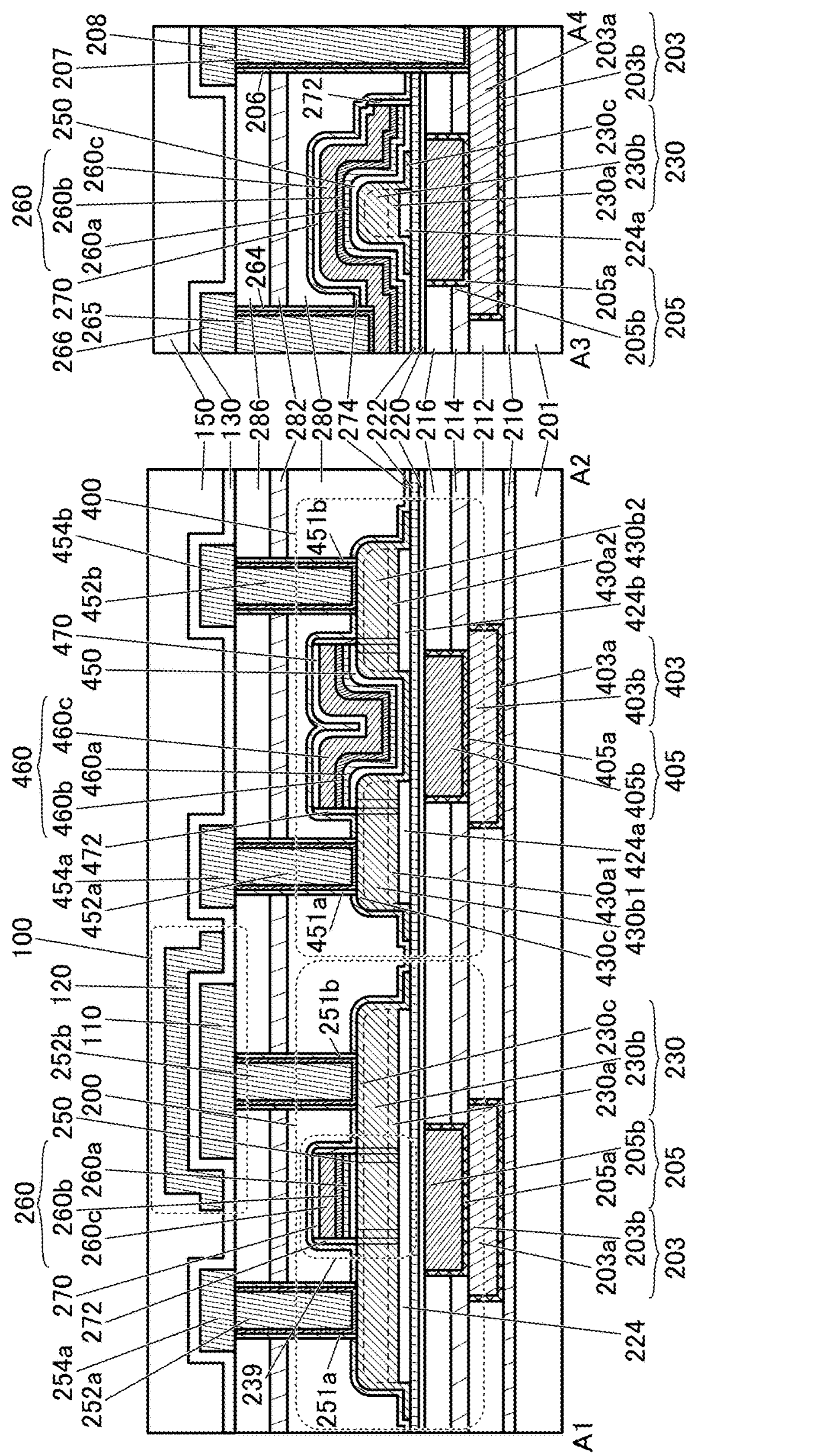
FIGS. 16A and 16B are cross-sectional views illustrating a semiconductor device of one embodiment of the present invention.
Figure 17:
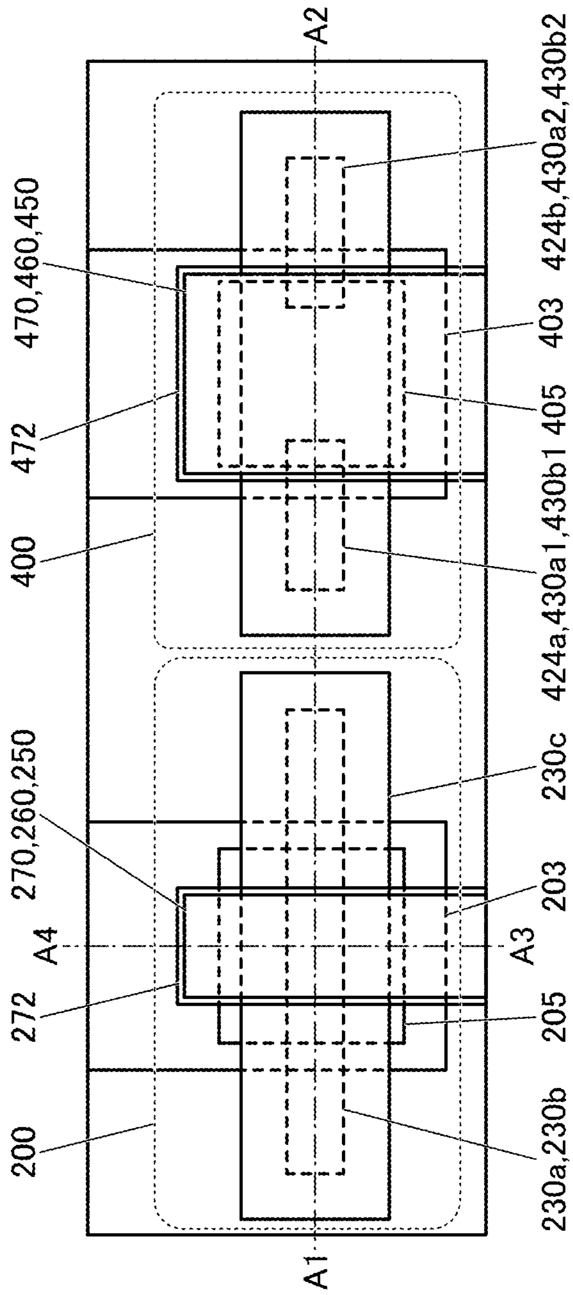
FIG. 17 is a top view of a semiconductor device of one embodiment of the present invention.

FIGS. 16A and 16B are cross-sectional views illustrating the transistor 200 of one embodiment of the present invention and the transistor 400 and the periphery thereof, and FIG. 17 is a top view of the semiconductor device. Note that for simplification of the drawing, some components are not illustrated in the top view of FIG. 17.

FIG. 16A is a cross-sectional view taken along dashed-dotted line A1-A2 in FIG. 17, which corresponds to a cross-sectional view in the channel length direction of the transistor 200 and the transistor 400. FIG. 16B is a cross-sectional view taken along dashed-dotted line A3-A4 in FIG. 17, which corresponds to a cross-sectional view in the channel width direction of the transistor 200.

The transistors 200 and 400 formed over a substrate 201 have different structures. For example, the transistor 400 may have a smaller drain current $I_{cut}$ than the transistor 200 when a back gate voltage and a top gate voltage are each 0 V. In this specification and the like, $I_{cut}$ refers to a drain current when the voltage of a gate that controls the switching operation of a transistor is 0 V. The transistor 400 is a switching element capable of controlling the potential of a back gate of the transistor 200. Therefore, a charge at a node connected to the back gate of the transistor 200 can be prevented from being lost by making the node have a desired potential and then turning off the transistor 400.

The structure of each of the transistor 200 and the transistor 400 is described below with reference to FIGS. 16A and 16B and FIG. 17. Note that for materials for the transistor 200 and the transistor 400, <Materials for semiconductor device> in the above embodiment can be referred to.

[Transistor 200]

The transistor 200 described in the above embodiment can be used as the transistor 200. Note that for the transistor 200 in FIGS. 16A and 16B, the description of the transistor in <Modification example of semiconductor device> can be referred to.

[Transistor 400]

Next, the transistor 400, which has electrical characteristics different from those of the transistor 200, is described. The transistor 400 can be formed in parallel with the transistor 200, and is preferably formed in the same layer as the transistor 200. By being formed in parallel with the transistor 200, the transistor 400 can be formed without increasing a manufacturing step.

As illustrated in FIG. 16A, the transistor 400 includes an insulator 214 and an insulator 216 over the substrate 201; a conductor 405 embedded in the insulator 214 and the insulator 216; an insulator 220 over the insulator 216 and the conductor 405; an insulator 222 over the insulator 220; an insulator 424*a* and an insulator 424*b* over the insulator 222; an oxide 430*a*1 over the insulator 424*a*; an oxide 430*a*2 over the insulator 424*b*; an oxide 430*b*1 in contact with the top surface of the oxide 430*al*; an oxide 430*b*2 in contact with the top surface of the oxide 430*a*2; an oxide 430*c* in contact with the top surface of the insulator 222, side surfaces of the oxide 430*a*1 and the oxide 430*a*2, the top surfaces and side surfaces of the oxide 430*b*1 and the oxide 430*b*2; an insulator 450 over the oxide 430*c*; a conductor 460*a* over the insulator 450; a conductor 460*b* over the conductor 460*a*; a conductor 460*c* over the conductor 460*b*; an insulator 470 over the conductor 460*c*; an insulator 472 in contact with side surfaces of the insulator 450, the conductor 460*a*, the conductor 460*b*, the conductor 460*c*, and the insulator 470; and the insulator 274 in contact with the top surface of the oxide 430*c* and a side surface of the insulator 472. Here, as illustrated in FIG. 17, the top surface of the insulator 472 is preferably substantially aligned with the top surface of the insulator 470. Furthermore, the insulator 274 is preferably provided to cover the insulator 470, the conductor 460, the insulator 472, and the oxide 430. It is preferable that when the substrate is seen perpendicularly from above, the position of the side surface of the insulator 450 is substantially the same as the positions of the side surfaces of the insulator 470, the conductor 460*a*, the conductor 460*b*, and the conductor 460*c*.

Although the insulator 424*a* and the insulator 424*b* are formed as different structures in FIGS. 16A and 16B, one continuous insulator 424 may be provided instead of the insulator 424*a* and the insulator 424*b*. In that case, the insulator 424 is preferably provided to overlap with the oxide 430. That is, the oxide 430 is provided to overlap with the insulator 424. The insulator 424 includes a first region in contact with the oxide 430*c* and a second region in contact with the oxide 430*a*1 and the oxide 430*a*2. In the insulator 424, the thickness of the first region is smaller than that of the second region.

In the following description, the oxide 430*a*1, the oxide 430*a*2, the oxide 430*b*1, the oxide 430*b*2, and the oxide 430*c* are collectively referred to as the oxide 430 in some cases. Although the conductor 460*a*, the conductor 460*b*, and the conductor 460*c* are stacked in the transistor 400, the structure of the present invention is not limited to this structure. For example, only the conductor 460*b* may be provided.

Here, the conductors, the insulators, and the oxides included in the transistor 400 can be formed in the same process as the conductors, the insulators, and the oxides included in the transistor 200 that is in the same layer as the transistor 400. That is, the conductor 403 (the conductor 403*a* and the conductor 403*b*) corresponds to the conductor 203 (the conductor 203*a* and the conductor 203*b*); the oxide 430 (the oxide 430*al*, the oxide 430*a*2, the oxide 430*b*1, the oxide 430*b*2, and the oxide 430*c*) corresponds to the oxide 230 (the oxide 230*a*, the oxide 230*b*, and the oxide 230*c*); the insulator 450 corresponds to the insulator 250; the conductor 460 (the conductor 460*a*, the conductor 460*b*, and the conductor 460*c*) corresponds to the conductor 260 (the conductor 260*a*, the conductor 260*b*, and the conductor 260*c*); the insulator 470 corresponds to the insulator 270; and the insulator 472 corresponds to the insulator 272. Therefore, the conductors, the insulators, and the oxides included in the transistor 400 can be formed with the same materials as those for the transistor 200, and the description of the transistor 200 can be referred to for the conductors, the insulators, and the oxides in the transistor 400.

Furthermore, the transistor 400 may include the insulator 212 over the insulator 210 and the conductor 403 embedded in the insulator 212. Here, the conductor 403 includes a conductor 403*a* that is in contact with an inner wall of an opening of the insulator 212 and a conductor 403*b* that is positioned inward from the conductor 403*a*. The conductor 403 (the conductor 403*a* and the conductor 403*b*) corresponds to the conductor 203 (the conductor 203*a* and the conductor 203*b*), and can be formed using the same material as that for the conductor 203. Thus, the description of the conductor 203 can be referred to for the conductor 403.

A conductor 452*a* and a conductor 452*b* are provided in openings formed in the insulator 280 and the insulator 274. The conductor 452*a* and the conductor 452*b* are preferably provided to face each other with the conductor 460 therebetween. The conductor 452*a* and the conductor 452*b* correspond to the conductor 252*a* and the conductor 252*b*, and can be formed using the same material as that for the conductor 252*a* and the conductor 252*b*. Thus, the description of the conductor 252*a* and the conductor 252*b* can be referred to for the conductor 452*a* and the conductor 452*b*.

A conductor 454*a* is preferably provided in contact with the top surface of the conductor 452*a*, and a conductor 454*b* is preferably provided in contact with the top surface of the conductor 452*b*. The conductor 454*a* and the conductor 454*b* correspond to the conductor 110, and can be formed using the same material as that for the conductor 110. Thus, the description of the conductor 110 can be referred to for the conductor 454*a* and the conductor 454*b*.

The oxide 430*c* is preferably formed to cover the oxide 430*al*, the oxide 430*b*1, the oxide 430*a*2, and the oxide 430*b*2. A side surface of the oxide 430*a*1 and a side surface of the oxide 430*b*1 are preferably substantially aligned with each other, and a side surface of the oxide 430*a*2 and a side surface of the oxide 430*b*2 are preferably substantially aligned with each other. For example, the oxide 430*c* is formed in contact with the side surfaces of the insulator 424*a* and the insulator 424*b*, the side surfaces of the oxide 430*a*1 and the oxide 430*a*2, the top and side surfaces of the oxide 430*b*1 and the oxide 430*b*2, and part of the top surface of the insulator 222. Here, when the oxide 430*c* is seen from above, the side surface of the oxide 430*c* is positioned outward from the side surfaces of the oxide 430*a*1 and the oxide 430*b*1 and the side surfaces of the oxide 430*a*2 and the oxide 430*b*2.

The oxides 430*a*1 and 430*b*1 and the oxides 430*a*2 and 430*b*2 are oppositely disposed with the conductor 405, the oxide 430*c*, the insulator 450, and the conductor 460 therebetween.

Furthermore, curved surfaces are provided between the side surface of the oxide 430*b*1 and the top surface of the oxide 430*b*1 and between the side surface of the oxide 430*b*2 and the top surface of the oxide 430*b*2. That is, the end portion of the side surface and the end portion of the top surface are preferably curved (hereinafter such a shape is also referred to as a rounded shape). The radius of curvature of the curved surface of each of the end portions of the oxide 430*b*1 and the oxide 430*b*2 is preferably greater than or equal to 3 nm and less than or equal to 10 nm, further preferably greater than or equal to 5 nm and less than or equal to 6 nm.

The oxide 430 includes a region in contact with the insulator 274. The resistance of the region and its vicinity is lowered in a manner similar to that of the region 231, the region 232, and the region 233 in the transistor 200. Accordingly, the oxide 430*a*1, the oxide 430*b*1, and part of the oxide 430*c* can function as one of a source region and a drain region of the transistor 400, and the oxide 430*a*2, the oxide 430*b*2, and the other part of the oxide 430*c* can function as the other of the source region and the drain region of the transistor 400.

A region of the oxide 430*c* sandwiched between a stacked body of the oxides 430*a*1 and 430*b*1 and a stacked body of the oxides 430*a*2 and 430*b*2 functions as a channel formation region. Here, the distance between the stacked body of the oxides 430*a*1 and 430*b*1 and the stacked body of the oxides 430*a*2 and 430*b*2 is preferably long. For example, the distance is preferably longer than the length in the channel length direction of the conductor 260 of the transistor 200. Thus, the off-state current of the transistor 400 can be reduced.

The oxide 430*c* of the transistor 400 can be formed with the same material as that for the oxide 230*c* of the transistor 200. That is, as the oxide 430*c*, the metal oxide that can be used as the oxide 230*a* or the oxide 230*b* can be used. For example, in the case where an In—Ga—Zn oxide is used as the oxide 430*c*, the atomic ratio of In to Ga and Zn can be 1:3:2, 4:2:3, 1:1:1, or 1:3:4.

A transistor including the oxide 430*c* and a transistor including the oxide 230*b* preferably have different electrical characteristics. For this reason, for example, the oxide 430*c* and the oxide 230*b* are preferably different in any of a material of the oxide, the content ratio of elements in the oxide, the thickness of the oxide, and the width and the length of a channel formation region formed in the oxide.

The case in which the metal oxide that can be used as the oxide 230*a* is used as the oxide 430*c* is described below. For example, a metal oxide in which the atomic proportion of In is relatively low and which has a relatively high insulating property is preferably used as the oxide 430*c*. In the oxide 430*c* formed of the metal oxide, the atomic ratio of the element M to constituent elements can be larger than that in the oxide 230*b*. In addition, in the oxide 430*c*, the atomic ratio of the element M to In can be larger than that in the oxide 230*b*. Thus, the threshold voltage of the transistor 400 can be higher than 0 V, the off-state current can be reduced, and $I_{cut}$ can be noticeably reduced.

In the oxide 430*c* serving as a channel formation region of the transistor 400, oxygen vacancies and impurities such as water and hydrogen are preferably reduced as in the oxide 230*c* of the transistor 200, or the like. In that case, the threshold voltage of the transistor 400 can be higher than 0 V, the off-state current can be reduced, and $I_{cut}$ can be noticeably reduced.

The threshold voltage of the transistor 400 including the oxide 430*c* is preferably higher than that of the transistor 200 in which a negative potential is not applied to the back gate. In order to make the threshold voltage of the transistor 400 higher than that of the transistor 200, for example, it is preferable that a metal oxide having a relatively higher atomic proportion of In than the metal oxide used for the oxide 230*a* and the oxide 430*c* be used as the oxide 230*b* in the transistor 200.

Furthermore, the distance between the oxides 430*a*1 and 430*b*1 and the oxides 430*a*2 and 430*b*2 is preferably longer than the width of the region 234 of the transistor 200. In that case, the channel length of the transistor 400 can be longer than that of the transistor 200; thus, the threshold voltage of the transistor 400 can be higher than that of the transistor 200 in which a negative potential is not applied to the back gate. The channel formation region in the transistor 400 is formed in the oxide 430*c*, whereas the channel formation region in the transistor 200 is formed in the oxide 230*a*, the oxide 230*b*, and the oxide 230*c*. Accordingly, the thickness of the oxide 430 in the channel formation region in the transistor 400 can be smaller than that of the oxide 230 in the channel formation region in the transistor 200. Therefore, the threshold voltage of the transistor 400 can be higher than that of the transistor 200 in which a negative potential is not applied to the back gate.

[Capacitor 100]

The capacitor 100 may be provided over the transistor 200 and the transistor 400. In this embodiment, an example in which the capacitor 100 is formed using the conductor 110 electrically connected to the transistor 200 is described.

An insulator 130 is preferably provided over the conductor 110, the conductor 454*a*, and the conductor 454*b*. The insulator 130 may be, for example, a single layer or a stacked layer using aluminum oxide or silicon oxynitride.

Moreover, a conductor 120 is preferably provided over the insulator 130 to at least partly overlap with the conductor 110. Like the conductor 110 or the like, the conductor 120 is preferably formed with a conductive material containing tungsten, copper, or aluminum as its main component. Although not illustrated, the conductor 120 may have a stacked-layer structure, and for example, may be a stacked layer of titanium, titanium nitride, and the above-described conductive material. Note that, like the conductor 203 or the like, the conductor 120 may be embedded in an opening formed in an insulator.

The conductor 110 functions as one electrode of the capacitor 100, and the conductor 120 functions as the other electrode of the capacitor 100. The insulator 130 functions as a dielectric of the capacitor 100.

An insulator 150 is preferably provided over the insulator 130 and the conductor 120. An insulator that can be used as the insulator 280 may be used as the insulator 150.

[Circuit Diagram of Semiconductor Device]

Figure 24A:
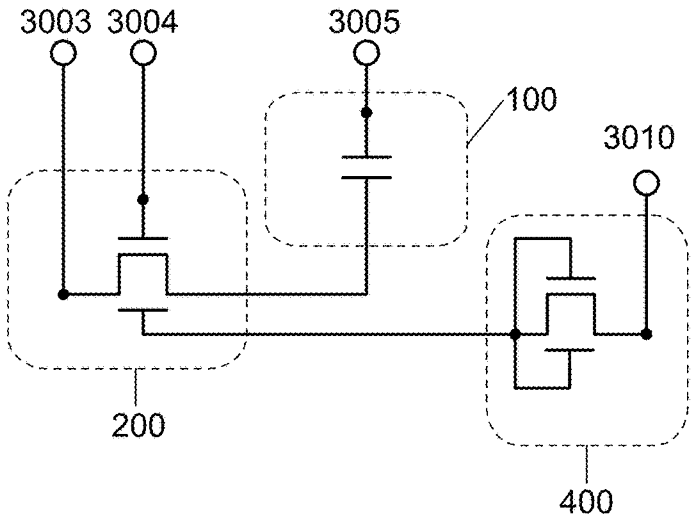
FIGS. 24A and 24B are a circuit diagram and a cross-sectional view of a memory device of one embodiment of the present invention.
Figure 24B:
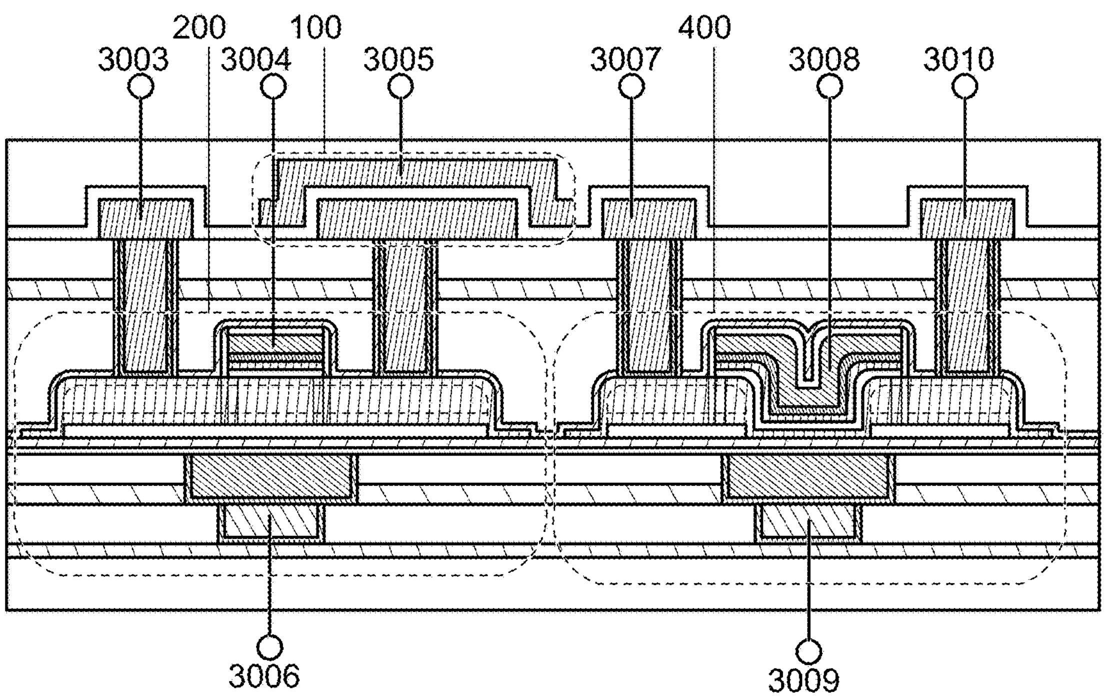

FIG. 24A is a circuit diagram showing an example of the connection relation of the transistor 200, the transistor 400, and the capacitor 100 in the semiconductor device described in this embodiment. FIG. 24B is a cross-sectional view, which corresponds to FIG. 16A, of wirings 3003 to 3010 and the like in FIG. 24A.

As illustrated in FIGS. 24A and 24B, in the transistor 200, the gate is electrically connected to the wiring 3004, one of the source and the drain is electrically connected to the wiring 3003, and the other of the source and the drain is electrically connected to one electrode of the capacitor 100. The other electrode of the capacitor 100 is electrically connected to the wiring 3005. The drain of the transistor 400 is electrically connected to the wiring 3010. As illustrated in FIG. 24B, the back gate of the transistor 200 and the source, a top gate, and the back gate of the transistor 400 are electrically connected through the wiring 3006, the wiring 3007, the wiring 3008, and the wiring 3009.

The on/off state of the transistor 200 can be controlled by application of a potential to the wiring 3004. When the transistor 200 is on to apply a potential to the wiring 3003, charges can be supplied to the capacitor 100 through the transistor 200. At this time, by making the transistor 200 off, the charges supplied to the capacitor 100 can be held. By application of a given potential to the wiring 3005, the potential of a connection portion between the transistor 200 and the capacitor 100 can be controlled by capacitive coupling. For example, when a ground potential is applied to the wiring 3005, the charges are held easily. Furthermore, by application of a negative potential to the wiring 3010, the negative potential is applied to the back gate of the transistor 200 through the transistor 400, whereby the threshold voltage of the transistor 200 can be higher than 0 V, the off-state current can be reduced, and $I_{cut}$ can be noticeably reduced.

With a structure in which the top gate and the back gate of the transistor 400 are diode-connected to the source, and the source of the transistor 400 and the back gate of the transistor 200 are connected, the back-gate voltage of the transistor 200 can be controlled by the wiring 3010. When the negative potential of the back gate of the transistor 200 is held, the voltage between the top gate and the source of the transistor 400 and the voltage between the back gate and the source of the transistor 400 are each 0 V. Since the $I_{cut}$ of the transistor 400 is extremely small and the threshold voltage of the transistor 400 is significantly higher than that of the transistor 200, the structure allows the negative potential of the back gate of the transistor 200 to be held for a long time without supply of power to the transistor 400.

Moreover, the negative potential of the back gate of the transistor 200 is held, in which case $I_{cut}$ of the transistor 200 can be noticeably reduced even without supply of power to the transistor 200. In other words, the charges can be held in the capacitor 100 for a long time even without supply of power to the transistor 200 and the transistor 400. For example, with use of the semiconductor device as a memory element, data can be held for a long time without power supply. Therefore, a memory device with a low refresh frequency or a memory device that does not need refresh operation can be provided.

Note that the connection relation of the transistor 200, the transistor 400, and the capacitor 100 is not limited to that illustrated in FIGS. 24A and 24B. The connection relation can be modified as appropriate in accordance with a necessary circuit configuration.

<Method for Manufacturing Semiconductor Device>

Next, a method for manufacturing a semiconductor device including the transistor 200 of one embodiment of the present invention is described with reference to FIGS. 18A to 18D to FIGS. 23A to 23D. FIG. 18A, FIG. 19A, FIG. 20A, FIG. 21A, FIG. 22A, and FIG. 23A are cross-sectional views taken along the dashed-dotted line A1-A2 in FIG. 17. FIG. 18B, FIG. 19B, FIG. 20B, FIG. 21B, FIG. 22B, and FIG. 23B are cross-sectional views taken along the dashed-dotted line A3-A4 in FIG. 17.

First, the substrate 201 is prepared, and the insulator 210 is formed over the substrate 201. The insulator 210 can be formed by a sputtering method, a CVD method, an MBE method, a PLD method, an ALD method, or the like.

CVD methods can be classified into a PECVD method using plasma, a TCVD method using heat, a photo CVD method using light, and the like. Moreover, the CVD methods can be classified into a metal CVD (MCVD) method and a metal organic CVD (MOCVD) method depending on a source gas.

By a plasma CVD method, a high-quality film can be formed at a relatively low temperature. A thermal CVD method does not use plasma and thus causes less plasma damage to an object. For example, a wiring, an electrode, an element (e.g., transistor or capacitor), or the like included in a semiconductor device might be charged up by receiving charges from plasma. In that case, accumulated charges might break the wiring, electrode, element, or the like included in the semiconductor device. By contrast, when a thermal CVD method not using plasma is employed, such plasma damage is not caused and the yield of the semiconductor device can be increased. A thermal CVD method does not cause plasma damage during deposition, so that a film with few defects can be obtained.

An ALD method also causes less plasma damage to an object. An ALD method does not cause plasma damage during deposition, so that a film with few defects can be obtained.

Unlike in a deposition method in which particles ejected from a target or the like are deposited, in a CVD method and an ALD method, a film is formed by reaction at a surface of an object. Thus, a CVD method and an ALD method enable favorable step coverage almost regardless of the shape of an object. In particular, an ALD method enables excellent step coverage and excellent thickness uniformity and can be favorably used to cover a surface of an opening with a high aspect ratio, for example. On the other hand, an ALD method has a relatively low deposition rate; thus, it is sometimes preferable to use an ALD method in combination with another deposition method with a high deposition rate, such as a CVD method.

When a CVD method or an ALD method is used, the composition of a film to be formed can be controlled with the flow rate ratio of source gases. For example, by a CVD method or an ALD method, a film with a certain composition can be formed depending on the flow rate ratio of source gases. Moreover, with a CVD method or an ALD method, by changing the flow rate ratio of source gases while forming a film, a film whose composition is continuously changed can be formed. In the case where a film is formed while changing the flow rate ratio of source gases, as compared to the case where a film is formed using a plurality of deposition chambers, time taken for the film formation can be reduced because time taken for transfer and pressure adjustment is omitted. Thus, semiconductor devices can be manufactured with improved productivity.

In this embodiment, aluminum oxide is formed as the insulator 210 by a sputtering method. The insulator 210 may have a multilayer structure. For example, the multilayer structure may be formed in such a manner that aluminum oxide is formed by a sputtering method and aluminum oxide is formed over the aluminum oxide by an ALD method. Alternatively, the multilayer structure may be formed in such a manner that aluminum oxide is formed by an ALD method and aluminum oxide is formed over the aluminum oxide by a sputtering method.

Then, the insulator 212 is formed over the insulator 210. The insulator 212 can be formed by a sputtering method, a CVD method, an MBE method, a PLD method, an ALD method, or the like. In this embodiment, as the insulator 212, silicon oxide is formed by a CVD method.

Then, openings are formed in the insulator 212 to reach the insulator 210. Examples of the openings include grooves and slits. A region where the opening is formed may be referred to as an opening portion. The opening can be formed by wet etching; however, dry etching is suitable for microfabrication. The insulator 210 is preferably an insulator that serves as an etching stopper film used in forming the groove by etching the insulator 212. For example, in the case where a silicon oxide film is used as the insulator 212 in which the groove is to be formed, the insulator 210 is preferably formed using a silicon nitride film, an aluminum oxide film, or a hafnium oxide film.

After formation of the openings, a conductive film to be the conductor 203*a* and the conductor 403*a* is formed. The conductive film preferably includes a conductor that has a function of inhibiting the penetration of oxygen. For example, tantalum nitride, tungsten nitride, or titanium nitride can be used. Alternatively, a stacked-layer film formed using the conductor and tantalum, tungsten, titanium, molybdenum, aluminum, copper, or a molybdenum-tungsten alloy can be used. The conductive film to be the conductor 203*a* and the conductor 403*a* can be formed by a sputtering method, a CVD method, an MBE method, a PLD method, an ALD method, or the like.

In this embodiment, as the conductive film to be the conductor 203*a* and the conductor 403*a*, tantalum nitride or a stacked film of tantalum nitride and titanium nitride formed over the tantalum nitride is formed by a sputtering method. Even when a metal that is easily diffused, such as copper, is used for the conductor 203*b* and the conductor 403*b* to be described later, the use of such a metal nitride as the conductor 203*a* can prevent the metal from being diffused to the outside of the conductor 203*a* and the conductor 403*a*.

Next, a conductive film to be the conductor 203*b* and the conductor 403*b* is formed over the conductive film to be the conductor 203*a* and the conductor 403*a*. The conductive film can be formed by a sputtering method, a CVD method, an MBE method, a PLD method, an ALD method, or the like. In this embodiment, as the conductive film to be the conductor 203*b* and the conductor 403*b*, a low-resistant conductive material such as copper is formed.

Next, by CMP treatment, the conductive film to be the conductor 203*a* and the conductor 403*a* and the conductive film to be the conductor 203*b* and the conductor 403*b* are partly removed to expose the insulator 212. As a result, the conductive film to be the conductor 203*a* and the conductor 403*a* and the conductive film to be the conductor 203*b* and the conductor 403*b* remain only in the openings. Thus, the conductor 203 including the conductors 203*a* and 203*b* and the conductor 403 including the conductors 403*a* and 403*b*, each of which has a flat top surface, can be formed. Note that the insulator 212 is partly removed by the CMP treatment in some cases.

Next, the insulator 214 is formed over the conductor 203 and the conductor 403. The insulator 214 can be formed by a sputtering method, a CVD method, an MBE method, a PLD method, an ALD method, or the like. In this embodiment, as the insulator 214, silicon nitride is formed by a CVD method. Even when metal that is likely to be diffused, such as copper, is used for the conductor 203*b*, the use of an insulator through which copper is less likely to pass, such as silicon nitride, as the insulator 214 can prevent the metal from being diffused into the layers above the insulator 214.

Next, the insulator 216 is formed over the insulator 214. The insulator 216 can be formed by a sputtering method, a CVD method, an MBE method, a PLD method, an ALD method, or the like. In this embodiment, the insulator 216 is formed using silicon oxide by a CVD method.

Next, openings reaching the conductor 203 and the conductor 403 are formed in the insulators 214 and 216. The openings can be formed by wet etching; however, dry etching is suitable for microfabrication.

After formation of the openings, a conductive film to be the conductor 205*a* and the conductor 405*a* is formed. The conductive film to be the conductor 205*a* and the conductor 405*a* preferably includes a conductive material that has a function of inhibiting the penetration of oxygen. For example, tantalum nitride, tungsten nitride, or titanium nitride can be used. Alternatively, a stacked-layer film of the conductor and tantalum, tungsten, titanium, molybdenum, aluminum, copper, or a molybdenum-tungsten alloy can be used. The conductive film to be the conductor 205*a* and the conductor 405*a* can be formed by a sputtering method, a CVD method, an MBE method, a PLD method, an ALD method, or the like.

In this embodiment, tantalum nitride is formed by a sputtering method for the conductive film to be the conductor 205*a* and the conductor 405*a*.

Next, a conductive film to be the conductor 205*b* and the conductor 405*b* is formed over the conductive film to be the conductor 205*a* and the conductor 405*a*. The conductive film to be the conductor 205*b* and the conductor 405*b* can be formed by a sputtering method, a CVD method, an MBE method, a PLD method, an ALD method, or the like.

In this embodiment, as the conductive film to be the conductor 205*b* and the conductor 405*b*, titanium nitride is formed by a CVD method and tungsten is formed by a CVD method over the titanium nitride.

Next, by CMP treatment, the conductive film to be the conductor 205*a* and the conductor 405*a* and the conductive film to be the conductor 205*b* and the conductor 405*b* are partly removed to expose the insulator 216. As a result, the conductive film to be the conductor 205*a* and the conductor 405*a* and the conductive film to be the conductor 205*b* and the conductor 405*b* remain only in the openings. Thus, the conductor 205 including the conductors 205*a* and 205*b* and the conductor 405 including the conductors 405*a* and 405*b*, each of which has a flat top surface, can be formed. Note that the insulator 216 is partly removed by the CMP treatment in some cases.

Next, the insulator 220 is formed over the insulator 216 and the conductor 205. The insulator 220 can be formed by a sputtering method, a CVD method, an MBE method, a PLD method, an ALD method, or the like.

Then, the insulator 222 is formed over the insulator 220. The insulator 222 can be formed by a sputtering method, a CVD method, an MBE method, a PLD method, an ALD method, or the like.

It is particularly preferable that hafnium oxide be formed as the insulator 222 by an ALD method. Hafnium oxide formed by an ALD method has a barrier property against oxygen, hydrogen, and water. When the insulator 222 has a barrier property against hydrogen and water, hydrogen and water contained in a structure body provided around the transistor 200 are not diffused into the transistor 200, and generation of oxygen vacancies in the oxide 230 can be inhibited.

Subsequently, an insulating film to be the insulator 224, the insulator 424*a*, and the insulator 424*b* is formed over the insulator 222. The insulating film to be the insulator 224, the insulator 424*a*, and the insulator 424*b* can be formed by a sputtering method, a CVD method, an MBE method, a PLD method, an ALD method, or the like.

After that, heat treatment is preferably performed. The heat treatment can be performed at a temperature higher than or equal to 250° C. and lower than or equal to 650° C., preferably higher than or equal to 300° C. and lower than or equal to 500° C., further preferably higher than or equal to 320° C. and lower than or equal to 450° C. The heat treatment is performed in a nitrogen atmosphere, an inert gas atmosphere, or an atmosphere containing an oxidizing gas at 10 ppm or more, 1% or more, or 10% or more. The heat treatment may be performed under a reduced pressure. Alternatively, the heat treatment may be performed in such a manner that heat treatment is performed in a nitrogen atmosphere or an inert gas atmosphere, and then another heat treatment is performed in an atmosphere containing an oxidizing gas at 10 ppm or more, 1% or more, or 10% or more in order to compensate for released oxygen.

By the above heat treatment, impurities such as hydrogen and water included in the insulating film to be the insulator 224, the insulator 424*a*, and the insulator 424*b* can be removed, for example.

In the heat treatment, plasma treatment using oxygen may be performed under a reduced pressure. The plasma treatment using oxygen is preferably performed using an apparatus including a power source for generating high-density plasma using microwaves, for example. Alternatively, a power source for applying a radio frequency (RF) to the substrate side may be provided. The use of high-density plasma enables high-density oxygen radicals to be produced, and application of the RF to the substrate side allows oxygen radicals generated by the high-density plasma to be efficiently introduced into the insulating film to be the insulator 224, the insulator 424*a*, and the insulator 424*b*. Alternatively, after plasma treatment using an inert gas is performed with the apparatus, plasma treatment using oxygen may be performed in order to compensate for released oxygen. Note that the heat treatment is not necessary in some cases.

Alternatively, the heat treatment can be performed after the formation of the insulator 220 and after the formation of the insulator 222. Although each heat treatment can be performed under the conditions for the above heat treatment, the heat treatment after the formation of the insulator 220 is preferably performed in an atmosphere containing nitrogen.

In this embodiment, the heat treatment is performed in a nitrogen atmosphere at 400° C. for one hour after formation of the insulating film to be the insulator 224, the insulator 424*a*, and the insulator 424*b*.

Then, an oxide film to be the oxide 230*a*, the oxide 430*a*1, and the oxide 430*a*2 and an oxide film to be oxide 230*b*, the oxide 430*b*1, and the oxide 430*b*2 are formed in this order over the insulating film to be the insulator 224, the insulator 424*a*, and the insulator 424*b* (see FIGS. 20A to 20D). Note that it is preferable to form the oxide films successively without exposure to the air. In that case, impurities and moisture in the air can be prevented from being attached onto the oxide film to be the oxide 230*a*, the oxide 430*a*1, and the oxide 430*a*2 and the oxide film to be the oxide 230*b*, the oxide 430*b*1, and the oxide 430*b*2, and the interface between the oxide film to be the oxide 230*a*, the oxide 430*a*1, and the oxide 430*a*2 and the oxide film to be the oxide 230*b*, the oxide 430*b*1, and the oxide 430*b*2 and the vicinity of the interface can be kept clean.

The oxide film to be the oxide 230*a*, the oxide 430*a*1, and the oxide 430*a*2 and the oxide film to be the oxide 230*b*, the oxide 430*b*1, and the oxide 430*b*2 can be formed by a sputtering method, a CVD method, an MBE method, a PLD method, an ALD method, or the like.

In the case where the oxide film to be the oxide 230*a*, the oxide 430*a*1, and the oxide 430*a*2 and the oxide film to be the oxide 230*b*, the oxide 430*b*1, and the oxide 430*b*2 are formed by a sputtering method, for example, oxygen or a mixed gas of oxygen and a rare gas is used as a sputtering gas. When the proportion of oxygen in the sputtering gas is increased, the amount of excess oxygen in the oxide films to be formed can be increased. In the case where the oxide films are formed by a sputtering method, the above-described In-M-Zn oxide target can be used.

In particular, part of oxygen contained in the sputtering gas is supplied to the insulating film to be the insulator 224, the insulator 424*a*, and the insulator 424*b* in some cases at the formation of the oxide film to be the oxide 230*a*, the oxide 430*a*1, and the oxide 430*a*2. Note that the proportion of oxygen contained in the sputtering gas for the oxide film to be the oxide 230*a*, the oxide 430*a*1, and the oxide 430*a*2 is 70% or higher, preferably 80% or higher, and further preferably 100%.

In the case where the oxide film to be the oxide 230*b*, the oxide 430*b*1, and the oxide 430*b*2 is formed by a sputtering method, when the proportion of oxygen in the sputtering gas is higher than or equal to 1% and lower than or equal to 30%, preferably higher than or equal to 5% and lower than or equal to 20%, an oxygen-deficient oxide semiconductor is formed. A transistor including an oxygen-deficient oxide semiconductor can have relatively high field-effect mobility.

In this embodiment, the oxide film to be the oxide 230*a*, the oxide 430*a*1, and the oxide 430*a*2 is formed using a target with an atomic ratio of In:Ga:Zn=1:3:4 by a sputtering method. The oxide film to be the oxide 230*b*, the oxide 430*b*1, and the oxide 430*b*2 is formed using a target with an atomic ratio of In:Ga:Zn=4:2:4.1 by a sputtering method. Note that each of the oxide films is preferably formed in accordance with characteristics required for the oxide 230, by appropriate selection of film formation conditions and an atomic ratio.

After that, heat treatment may be performed. For the heat treatment, the conditions for the above heat treatment can be used. By the heat treatment, impurities such as water and hydrogen contained in the oxide film to be the oxide 230*a*, the oxide 430*a*1, and the oxide 430*a*2 and the oxide film to be the oxide 230*b*, the oxide 430*b*1, and the oxide 430*b*2 can be removed, for example. In this embodiment, the heat treatment is performed in such a manner that treatment at 400° C. in a nitrogen atmosphere for one hour and treatment at 400° C. in an oxygen atmosphere for one hour are successively performed.

Figures 18A, 18B, 18C, 18D:
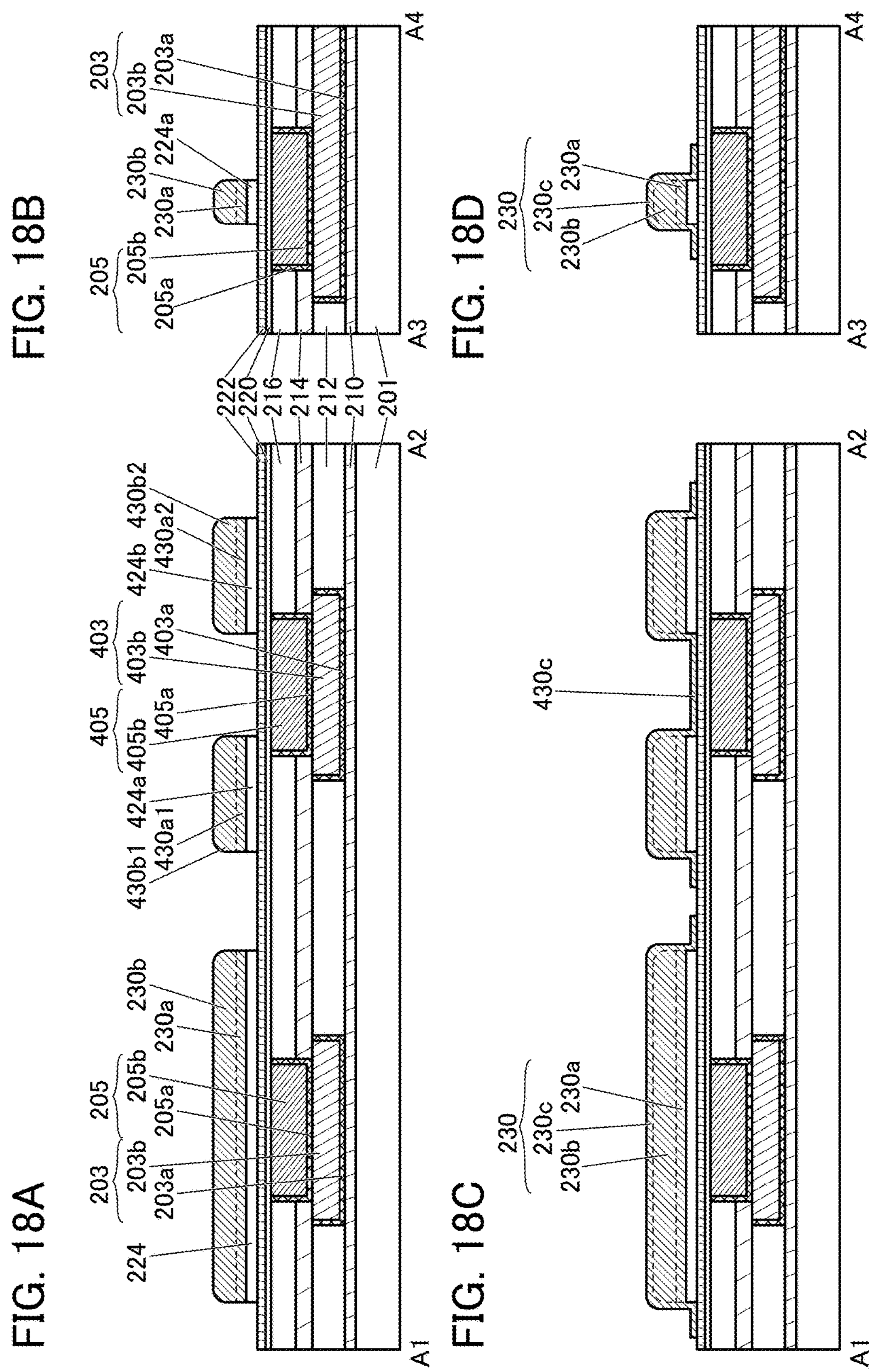
FIGS. 18A to 18D are cross-sectional views illustrating a method for manufacturing a semiconductor device of one embodiment of the present invention.

Next, the insulating film to be the insulator 224, the insulator 424*a*, and the insulator 424*b*, the oxide film to be the oxide 230*a*, the oxide 430*a*1, and the oxide 430*a*2, and the oxide film to be the oxide 230*b*, the oxide 430*b*1, and the oxide 430*b*2 are processed into island shapes to form a stacked-layer structure of the insulator 224, the oxide 230*a*, and the oxide 230*b*, a stacked-layer structure of the insulator 424*a*, the oxide 430*a*1, and the oxide 430*b*1, and a stacked-layer structure of the insulator 424*b*, the oxide 430*a*2, and the oxide 430*b*2 (see FIGS. 18A and 18B). In this step, the insulator 222 can be used as an etching stopper film, for example.

Here, the insulating film to be the insulator 224, the insulator 424*a*, and the insulator 424*b* is not necessarily processed into island shapes. The insulating film to be the insulator 224, the insulator 424*a*, and the insulator 424*b* may be subjected to half etching, in which case the insulator 224 also remains under the oxide 230*c* to be formed in later steps. In addition, the insulator 424 (one continuous insulator including a region where the insulator 424*a* and the insulator 424*b* are formed) remains under the oxide 430*c*. In the case where the insulator 424 is provided, the oxide 430*c* is formed over and in contact with the insulator 424. Thus, the oxide 430*c* is provided on the top surface of the insulator 424 including an excess-oxygen region. That is, excess oxygen contained in the insulator 424 is efficiently supplied to the oxide 430*c*, whereby the transistor 400 with high reliability can be fabricated. Note that the insulating film to be the insulator 224 and the insulator 424 can be processed into island shapes when the insulating film 272A is processed in a later step.

The oxide 230*a* and the oxide 230*b* are formed to at least partly overlap with the conductor 205. It is preferable that the side surfaces of the oxide 230*a* and the oxide 230*b* be substantially perpendicular to the insulator 222, in which case a smaller area and higher density are achieved when the plurality of transistors 200 is provided. Note that an angle formed by the top surface of the insulator 222 and each of the side surfaces of the oxide 230*a* and the oxide 230*b* may be an acute angle. In that case, the angle formed by the top surface of the insulator 222 and each of the side surfaces of the oxide 230*a* and the oxide 230*b* is preferably larger.

The oxide 230 has a curved surface between the side surface and the top surface. That is, an end portion of the side surface and an end portion of the top surface are preferably curved (hereinafter such a curved shape is also referred to as a rounded shape). The radius of curvature of the curved surface at an end portion of the oxide 230*b* is greater than or equal to 3 nm and less than or equal to 10 nm, preferably greater than or equal to 5 nm and less than or equal to 6 nm.

Furthermore, curved surfaces are provided between the side surface of the oxide 430*b*1 and the top surface of the oxide 430*b*1 and between the side surface of the oxide 430*b*2 and the top surface of the oxide 430*b*2. That is, the end portion of the side surface and the end portion of the top surface are preferably curved (hereinafter such a shape is also referred to as a rounded shape). The radius of curvature of the curved surface of each of the end portions of the oxide 430*b*1 and the oxide 430*b*2 is preferably greater than or equal to 3 nm and less than or equal to 10 nm, further preferably greater than or equal to 5 nm and less than or equal to 6 nm.

Note that when the end portions are not angular, the coverage with films formed later in the film formation process can be improved.

A lithography method may be employed for the processing of the oxide films. Alternatively, a dry etching method or a wet etching method may be used for the processing. A dry etching method is suitable for microfabrication.

In the lithography method, first, a resist is exposed to light through a mask. Next, a region exposed to light is removed or left using a developing solution, so that a resist mask is formed. Then, etching is conducted with the resist mask. As a result, a conductor, a semiconductor, an insulator, or the like can be processed into a desired shape. The resist mask is formed by, for example, exposure of the resist to light such as KrF excimer laser light, ArF excimer laser light, or extreme ultraviolet (EUV) light. A liquid immersion technique may be employed in which a portion between a substrate and a projection lens is filled with a liquid (e.g., water) to perform light exposure. An electron beam or an ion beam may be used instead of the above-mentioned light. Note that a mask is not necessary in the case of using an electron beam or an ion beam. To remove the resist mask, dry etching treatment such as ashing or wet etching treatment can be used. Alternatively, wet etching treatment can be performed after dry etching treatment. Further alternatively, dry etching treatment can be performed after wet etching treatment.

Instead of the resist mask, a hard mask formed of an insulator or a conductor may be used. In the case where a hard mask is used, a hard mask with a desired shape can be formed in the following manner: an insulating film or a conductive film that is the material of the hard mask is formed over the oxide film to be the oxide 230*b*, the oxide 430*b*1, and the oxide 430*b*2, a resist mask is formed thereover, and then the material of the hard mask is etched. The etching of the oxide film to be the oxide 230*a*, the oxide 430*a*1, and the oxide 430*a*2 and the oxide film to be the oxide 230*b*, the oxide 430*b*1, and the oxide 430*b*2 may be performed after or without removal of the resist mask. In the latter case, the resist mask may be eliminated during the etching. The hard mask may be removed by etching after the etching of the oxide films. The hard mask does not necessarily removed in the case where the material of the hard mask does not affect the following process or can be utilized in the following process.

As a dry etching apparatus, a capacitively coupled plasma (CCP) etching apparatus including parallel plate electrodes can be used. The capacitively coupled plasma etching apparatus including parallel plate electrodes may have a structure in which high-frequency power is applied to one of the parallel plate electrodes. Alternatively, different high-frequency powers are applied to one of the parallel plate electrodes. Further alternatively, high-frequency powers with the same frequency are applied to the parallel plate electrodes. Still further alternatively, high-frequency powers with different frequencies are applied to the parallel plate electrodes. Alternatively, a dry etching apparatus including a high-density plasma source can be used. As the dry etching apparatus including a high-density plasma source, an inductively coupled plasma (ICP) etching apparatus can be used, for example.

In some cases, treatment such as dry etching performed in the above process causes the attachment or diffusion of impurities due to an etching gas or the like to a surface or the inside of the oxide 230*a*, the oxide 230*b*, or the like. Examples of the impurities include fluorine and chlorine.

To remove the impurities or the like, cleaning is performed. As the cleaning, any of wet cleaning using a cleaning solution or the like, plasma treatment using plasma, cleaning by heat treatment, and the like can be performed by itself or in appropriate combination.

The wet cleaning may be performed using an aqueous solution in which oxalic acid, phosphoric acid, hydrofluoric acid, or the like is diluted with carbonated water or pure water. Alternatively, ultrasonic cleaning using pure water or carbonated water may be performed. In this embodiment, ultrasonic cleaning using pure water or carbonated water is performed.

Next, heat treatment may be performed. For the heat treatment, the conditions for the above heat treatment can be used.

Next, an oxide film to be the oxide 230*c* and the oxide 430*c* is formed over the insulator 222, the stacked-layer structure of the insulator 224, the oxide 230*a*, and the oxide 230*b*, the stacked-layer structure of the insulator 424*a*, the oxide 430*a*1, and the oxide 430*b*1, and the stacked-layer structure of the insulator 424*b*, the oxide 430*a*2, and the oxide 430*b*2. The oxide film can be formed by a sputtering method, a CVD method, an MBE method, a PLD method, an ALD method, or the like.

Note that an oxide film to be the oxide 230*c* may be formed under conditions similar to those for formation of an oxide film to be the oxide 230*a* or 230*b*. Alternatively, these conditions may be combined for formation of the oxide film to be the oxide 230*c*.

In this embodiment, the oxide film to be the oxide 230*c* is formed using a target with an atomic ratio of In:Ga:Zn=4:2:4.1 by a sputtering method. The oxide film may be formed at a proportion of oxygen of 70% or higher, preferably 80% or higher, further preferably 100%.

Note that in accordance with characteristics required for the oxide film to be the oxide 230*c* and the oxide 430*c*, the oxide film to be the oxide 230*c* and the oxide 430*c* is formed by a method similar to the method for forming the oxide film to be the oxide 230*a*, the oxide 430*a*1, and the oxide 430*a*2 or the method for forming the oxide film to be the oxide 230*b*, the oxide 430*b*1, and the oxide 430*b*2. In this embodiment, the oxide film to be the oxide 230*c* and the oxide 430*c* is formed by a sputtering method using a target with an atomic ratio of In:Ga:Zn=4:2:4.1.

Then, the oxide film to be the oxide 230*c* and the oxide 430*c* is processed into island shapes to form the oxide 230*c* and the oxide 430*c* (see FIGS. 18C and 18D). Here, the oxide 230*c* is preferably formed to cover the oxide 230*a* and the oxide 230*b*. The oxide 430*c* is preferably formed to cover the oxide 430*a*1, the oxide 430*b*1, the oxide 430*a*2, and the oxide 430*b*2. The processing can be performed by a lithography method. Alternatively, the processing can be performed by a dry etching method or a wet etching method. A dry etching method is suitable for microfabrication. In a lithography method, a hard mask may be used instead of a resist mask.

Subsequently, an insulating film to be the insulator 250 and the insulator 450, a conductive film to be conductor 260*a* and the conductor 460*a*, a conductive film to be conductor 260*b* and the conductor 460*b*, a conductive film to be the conductor 260*c* and the conductor 460*c*, and an insulator to be the insulator 270 and the insulator 470 are formed in this order.

The insulating film to be the insulator 250 and the insulator 450 can be formed by a sputtering method, a CVD method, an MBE method, a PLD method, an ALD method, or the like.

Note that oxygen is excited by microwaves to generate high-density oxygen plasma, and the insulating film to be the insulator 250 and the insulator 450 is exposed to the oxygen plasma, whereby oxygen can be supplied to the oxide 230 and the insulating film to be the insulator 250 and the insulator 450.

Furthermore, heat treatment may be performed. For the heat treatment, the conditions for the above heat treatment can be used. The heat treatment can reduce the moisture concentration and the hydrogen concentration in the insulating film to be the insulator 250 and the insulator 450.

The conductive film to be conductor 260*a* and the conductor 460*a* can be formed by a sputtering method, a CVD method, an MBE method, a PLD method, an ALD method, or the like. Here, when an oxide semiconductor that can be used as the oxide 230 is subjected to treatment for reducing resistance, for example, the oxide semiconductor becomes a conductive oxide. Accordingly, an oxide that can be used as the oxide 230 may be formed as the conductive film to be conductor 260*a* and the conductor 460*a* and the resistance of the oxide may be reduced in a later step. Note that when an oxide that can be used as the oxide 230 is formed as the conductive film to be the conductor 260*a* and the conductor 460*a* in an atmosphere containing oxygen by a sputtering method, oxygen can be added to the insulator 250. When oxygen is added to the insulator 250, the added oxygen can be supplied to the oxide 230 through the insulator 250.

The conductive film to be the conductor 260*b* and the conductor 460*b* and the conductive film to be the conductor 260*c* and the conductor 460*c* can be formed by a sputtering method, a CVD method, an MBE method, a PLD method, an ALD method, or the like. In the case where a conductive film to be the conductor 260*a* and the conductor 460*a* is formed using an oxide semiconductor that can be used for the oxide 230, the conductive film to be the conductor 260*b* and the conductor 460*b* is formed by a sputtering method, whereby the conductive film to be the conductor 260*a* and the conductor 460*a* can have reduced electric resistance and become a conductor. Such a conductor can be called an oxide conductor (OC) electrode. A conductor may be further formed over the conductor over the OC electrode by a sputtering method or the like.

Subsequently, heat treatment can be performed. For the heat treatment, the conditions for the above heat treatment can be used. Note that the heat treatment is not necessarily performed in some cases. In this embodiment, the heat treatment is performed in a nitrogen atmosphere at 400° C. for one hour.

The insulator to be the insulator 270 and the insulator 470 can be formed by a sputtering method, a CVD method, an MBE method, a PLD method, an ALD method, or the like. Here, the thickness of the insulator to be the insulator 270 and the insulator 470 is preferably larger than that of the insulating film 272A to be formed in a later step. In that case, when the insulator 272 and the insulator 472 are formed in later steps, the insulator 270 and the insulator 470 can remain easily over the conductor 260.

Next, the insulator to be the insulator 270 and the insulator 470 is etched to form the insulator 270 and the insulator 470. After that, the insulating film to be the insulator 250 and the insulator 450, the conductive film to be conductor 260*a* and the conductor 460*a*, the conductive film to be the conductor 260*b* and the conductor 460*b*, and the conductive film to be the conductor 260*c* and the conductor 460*c* are etched using the insulator 270 and the insulator 470 as a mask to form the insulator 250, the conductor 260 (the conductor 260*a*, the conductor 260*b*, and the conductor 260*c*), the insulator 450, and the conductor 460 (the conductor 460*a*, the conductor 460*b*, and the conductor 460*c*) (see FIGS. 19A and 19B). The insulator 250, the conductor 260*a*, the conductor 260*b*, the conductor 260*c*, and the insulator 270 are formed to at least partly overlap with the conductor 205 and the oxide 230.

The side surface of the insulator 250, the side surface of the conductor 260*a*, the side surface of the conductor 260*b*, a side surface of the conductor 260*c*, and the side surface of the insulator 270 preferably form the same surface. The side surface of the insulator 450, the side surface of the conductor 460*a*, the side surface of the conductor 460*b*, the side surface of the conductor 460*c*, and the side surface of the insulator 470 preferably form the same surface.

Note that in a cross section, an angle formed by the top surface of the oxide 230 and the side surfaces of the insulator 250, the conductor 260*a*, the conductor 260*b*, the conductor 260*c*, and the insulator 270 may be an acute angle. In that case, the angle formed by the top surface of the oxide 230 and the side surfaces of the insulator 250, the conductor 260*a*, the conductor 260*b*, the conductor 260*c*, and the insulator 270 is preferably larger.

Furthermore, in a cross section, an angle formed by the top surface of the oxide 430 and the side surfaces of the insulator 450, the conductor 460*a*, the conductor 460*b*, the conductor 460*c*, and the insulator 470 may be an acute angle. In that case, the angle formed by the top surface of the oxide 430 and the side surfaces of the insulator 450, the conductor 460*a*, the conductor 460*b*, the conductor 460*c*, and the insulator 470 is preferably larger.

It is preferable that the same surface formed by the side surface of the insulator 250, the side surface of the conductor 260*a*, the side surface of the conductor 260*b*, the side surface of the conductor 260*c*, and the side surface of the insulator 270 be substantially perpendicular to the substrate. That is, in a cross section, an angle between the top surface of the oxide 230 and the side surfaces of the insulator 250, the conductor 260*a*, the conductor 260*b*, the conductor 260*c*, and the insulator 270 is preferably an acute angle and larger.

Furthermore, it is preferable that the same surface formed by the side surface of the insulator 450, the side surface of the conductor 460*a*, the side surface of the conductor 460*b*, the side surface of the conductor 460*c*, and the side surface of the insulator 470 be substantially perpendicular to the substrate. That is, in a cross section, an angle between the top surface of the oxide 430 and the side surfaces of the insulator 450, the conductor 460*a*, the conductor 460*b*, the conductor 460*c*, and the insulator 470 is preferably an acute angle and larger.

Note that an upper portion of the oxide 230 in a region not overlapping with the insulator 250 may be etched by the above etching. In that case, the oxide 230 is thicker in a region overlapping with the insulator 250 than in the region not overlapping with the insulator 250.

Figures 19A, 19B, 19C, 19D:
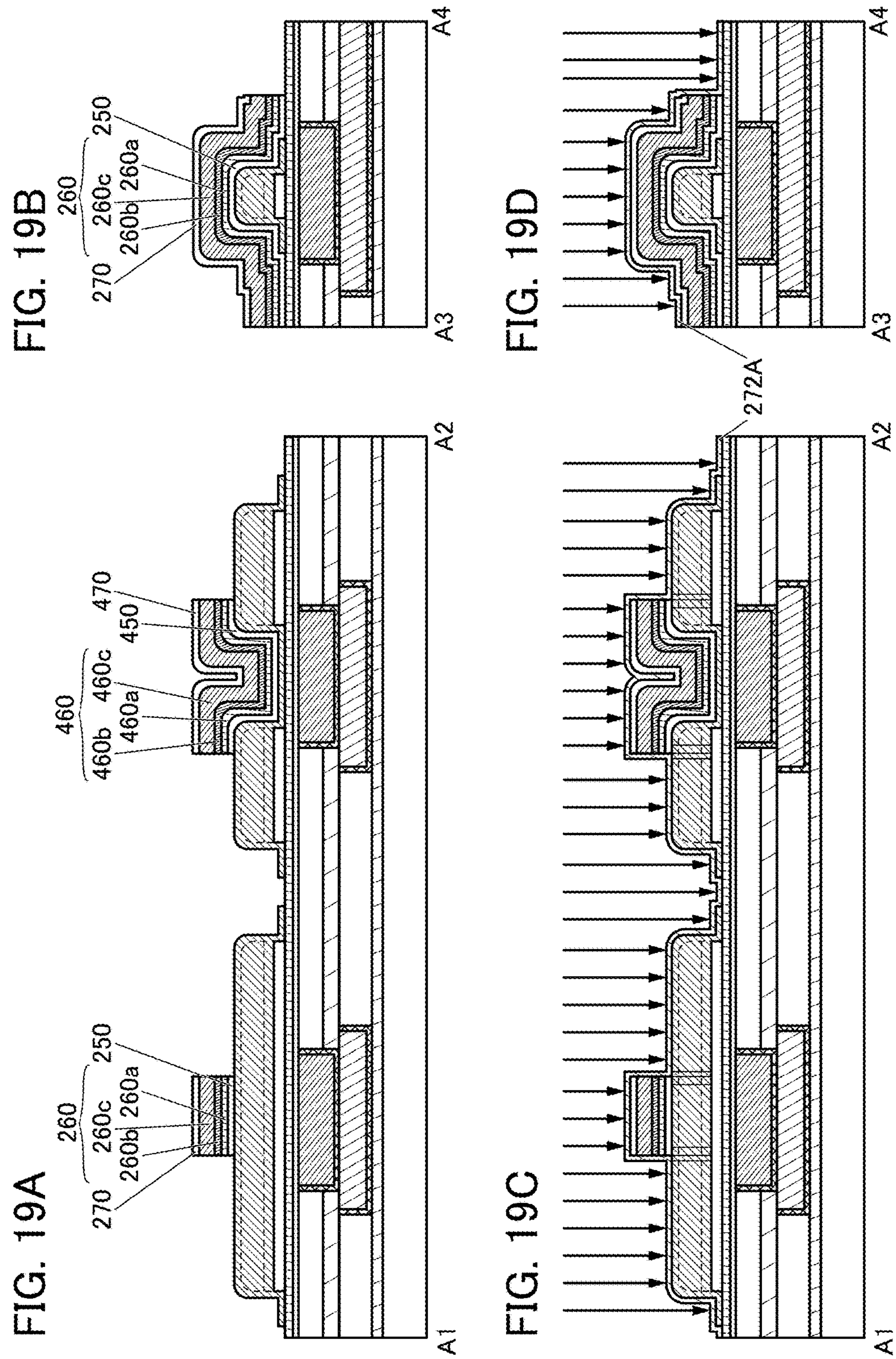
FIGS. 19A to 19D are cross-sectional views illustrating a method for manufacturing a semiconductor device of one embodiment of the present invention.

Next, the insulating film 272A is formed to cover the insulator 222, the stacked-layer structure of the insulator 224, the oxide 230, the insulator 250, the conductor 260, and the insulator 270, the stacked-layer structure of the insulator 424*a*, the insulator 424*b*, the oxide 430, the insulator 450, the conductor 460, and the insulator 470 (see FIGS. 19C and 19D). The insulating film 272A is preferably formed with a sputtering apparatus. When a sputtering method is used, an excess-oxygen region can be easily formed in each of the insulator 224 and the insulator 250 in contact with the insulating film 272.

During deposition by a sputtering method, ions and sputtered particles exist between a target and a substrate. For example, a potential $E_0$ is applied to the target, to which a power source is connected. A potential $E_1$ such as a ground potential is applied to the substrate. Note that the substrate may be electrically floating. In addition, there is a region at a potential $E_2$ between the target and the substrate. The potential relationship is $E_2>E_1>E_0$.

The ions in plasma are accelerated by a potential difference ($E_2-E_0$) and collide with the target; accordingly, the sputtered particles are ejected from the target. These sputtered particles are attached to a deposition surface and deposited thereover; as a result, a film is formed. Some ions recoil by the target and might, as recoil ions, pass through the formed film and be taken into the insulator 224 and the insulator 250 in contact with a formation surface. The ions in the plasma are accelerated by a potential difference ($E_2-E_1$) and collide with the deposition surface. At this time, some ions reach the inside of the insulators 250 and 224. When the ions are taken into the insulators 250 and 224, a region into which the ions are taken is formed in the insulators 250 and 224. That is, an excess-oxygen region is formed in the insulators 250 and 224 in the case where the ions include oxygen.

Introduction of excess oxygen into the insulators 250 and 224 can form an excess-oxygen region. The excess oxygen in the insulators 250 and 224 is supplied to the oxide 230 and can fill oxygen vacancies in the oxide 230.

Accordingly, when the insulating film 272A is formed in an oxygen gas atmosphere with a sputtering apparatus, oxygen can be introduced into the insulator 250, the insulator 224, the insulator 450, the insulator 424*a*, and the insulator 424*b* while the insulating film 272A is formed. When aluminum oxide having a barrier property is used for the insulating film 272A, for example, excess oxygen introduced into the insulators 250 and 450 can be effectively sealed therein.

Next, in the oxide 230, the regions 231, 232, 233, and 234 are formed. The regions 231, 232, and 233 are low-resistance regions which are obtained by adding a metal atom such as indium or impurities to a metal oxide formed as the oxide 230. Note that each of the regions has higher conductivity than at least the oxide 230*b* in the region 234.

In order to add impurities to the regions 231, 232, and 233, a dopant which is at least one of a metal element such as indium and impurities is added through the insulating film 272A, for example (arrows in FIGS. 19C and 19D indicate addition of a dopant).

For the addition of the dopant, an ion implantation method by which an ionized source gas is subjected to mass separation and then added, an ion doping method by which an ionized source gas is added without mass separation, a plasma immersion ion implantation method, or the like can be used. In the case of performing mass separation, ion species to be added and its concentration can be controlled properly. On the other hand, in the case of not performing mass separation, ions at a high concentration can be added in a short time. Alternatively, an ion doping method in which atomic or molecular clusters are generated and ionized may be employed. Instead of the term "dopant", the term "ion", "donor", "acceptor", "impurity", "element", or the like may be used.

When the indium content in the oxide 230 is increased, the carrier density is increased and the resistance can be decreased. Accordingly, as a dopant, a metal element that improves the carrier density of the oxide 230, such as indium, can be used.

That is, when the content of a metal atom such as indium in the regions 231, 232, and 233 of the oxide 230 is increased, the electron mobility can be increased, and the resistance can be reduced.

Accordingly, the atomic ratio of indium to the element M at least in the region 231 is larger than the atomic ratio of indium to the element Min the region 234.

As the dopant, the element that forms an oxygen vacancy, the element trapped by an oxygen vacancy, or the like is used. Typical examples of the element are hydrogen, boron, carbon, nitrogen, fluorine, phosphorus, sulfur, chlorine, titanium, and a rare gas element. Typical examples of the rare gas element are helium, neon, argon, krypton, and xenon.

Here, the insulating film 272A is provided to cover the oxide 230, the insulator 250, the conductor 260, and the insulator 270. Accordingly, in the direction perpendicular to the top surface of the oxide 230, the thickness of the insulating film 272A is different between a peripheral portion of the conductor 250, the conductor 260, and the insulator 270 and a region other than the peripheral portion. That is, the thickness of the insulating film 272A in the peripheral portion of the insulator 250, the conductor 260, and the insulator 270 is larger than that in the region other than the peripheral portion. That is, when a dopant is added through the insulating film 272A, the regions 231, 232, and 233 can be provided in a self-aligned manner, even in a minute transistor whose channel length is approximately 10 nm to 30 nm. The region 233 may be formed in such a manner that the dopants in the regions 231 and 232 are diffused in a step of heat treatment to be performed in a later step, for example.

When the regions 233 and 232 are provided in the transistor 200, high-resistance regions are not formed between the region 231 functioning as the source region and the drain region and the region 234 where a channel is formed, so that the on-state current and the carrier mobility of the transistor can be increased. Moreover, when the transistor 200 includes the region 233, the gate does not overlap with the source region and the drain region in the channel length direction, so that formation of unnecessary capacitance can be suppressed, and the leakage current in an off state can be reduced.

Thus, by appropriately selecting the areas of the region 231*a* and the region 231*b*, a transistor having electrical characteristics necessary for the circuit design can be easily provided.

Figures 20A, 20B, 20C, 20D:
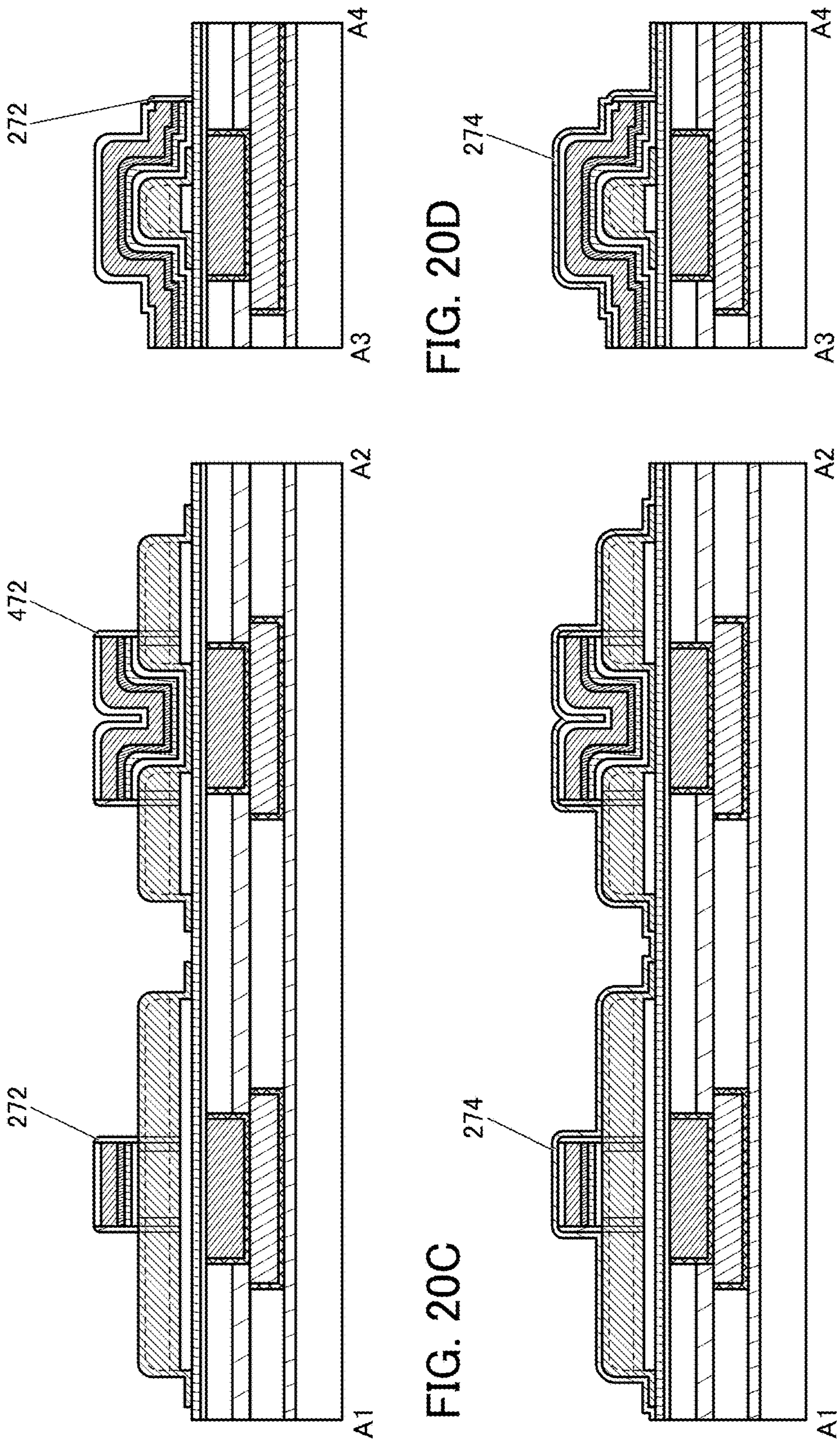
FIGS. 20A to 20D are cross-sectional views illustrating a method for manufacturing a semiconductor device of one embodiment of the present invention.

Next, the insulating film 272A is subjected to anisotropic etching, whereby the insulator 272 is formed in contact with the side surfaces of the insulator 250, the conductor 260, and the insulator 270 and the insulator 472 is formed in contact with the side surfaces of the insulator 450, the conductor 460, and the insulator 470 (see FIGS. 20A and 20B). Dry etching is preferably performed as the anisotropic etching. In this manner, the insulating film in a region on a plane substantially parallel to the substrate surface can be removed, so that the insulator 272 and the insulator 472 can be formed in a self-aligned manner.

Here, the thicknesses of the insulator 270 and the insulator 470 are each made larger than that of the insulating film 272A, so that the insulator 270, the insulator 470, the insulator 272, and the insulator 472 can be left even when portions of the insulating film 272A that are over the insulator 270 and the insulator 470 are removed. Furthermore, the height of a structure body composed of the insulator 250, the conductor 260, and the insulator 270 and the height of a structure body composed of the insulator 450, the conductor 460, and the insulator 470 are each made larger than the height of the oxide 230 and the height of the oxide 430, so that portions of the insulating film 272A that are on the side surfaces of the oxide 230 and the oxide 430 can be removed. Furthermore, when the end portions of the oxide 230 and the oxide 430 each have a rounded shape, time taken to remove the insulating film 272A formed in contact with the side surfaces of the oxide 230 and the oxide 430 can be shortened, leading to easy formation of the insulator 272 and the insulator 472.

Although not illustrated, the insulating film 272A may remain also on the side surfaces of the oxide 230 and the oxide 430. In that case, coverage with an interlayer film or the like to be formed in a later step can be improved. When the insulator remains on the side surfaces of the oxide 230 and the oxide 430, in some cases, entry of impurities such as water and hydrogen into the oxide 230 and the oxide 430 and outward diffusion of oxygen in the oxide 230 and the oxide 430 can be prevented in some cases.

When the insulator 274 containing elements serving as impurities is formed and the regions 231*a* 231*b* are formed in the oxide 230 in a later step, the remaining structure body of the insulating film 272A in contact with the side surface of the oxide 230 prevents a decrease in the resistance of an interface region between the insulator 224 and the oxide 230. Consequently, generation of leakage current can be suppressed. Moreover, even in the case where a dopant is added such that the concentration of indium has a peak in the oxide 230*a* when indium is added to the oxide 230, generation of leakage current through the oxide 230*a* can be suppressed.

Subsequently, heat treatment can be performed. For the heat treatment, the conditions for the above heat treatment can be used. The heat treatment allows diffusion of the added dopant into the region 233 in the oxide 230, resulting in an increase in on-state current.

Then, the insulator 274 is formed to cover the insulator 224, the oxide 230, insulator 272, and the insulator 270, and the insulator 424, the oxide 430, the insulator 472, and the insulator 470 (see FIGS. 20C and 20D).

For example, as the insulator 274, aluminum oxide is preferably formed by an ALD method. Aluminum oxide formed by an ALD method has good coverage and is a dense film. In addition, the insulator 274 preferably has a barrier property against oxygen, hydrogen, and water. When the insulator 274 has a barrier property against hydrogen and water, hydrogen and water contained in the structure body provided around the transistor 200 are not diffused into the transistor 200, and generation of oxygen vacancies in the oxide 230 can be inhibited.

Here, the insulator 274 is preferably in contact with the insulator 222 at an outer edge of the transistor 200. Furthermore, the insulator 274 is preferably in contact with the insulator 222 at an outer edge of the transistor 400. With this structure, the transistor 200 and the transistor 400 can be surrounded with the insulator having a barrier property. With this structure, impurities such as hydrogen and water can be prevented from entering the transistor 200 and the transistor 400. In addition, oxygen contained in the insulators 224 and 250 can be prevented from diffusing into the interlayer film from the transistor 200. Moreover, oxygen contained in the insulators 444 and 450 can be prevented from diffusing into the interlayer film from the transistor 400.

When such an insulator 274 is provided over the regions 231*a* and 231*b*, the carrier density can be prevented from being changed by entry of oxygen or impurities such as excess water and hydrogen into the regions 231*a* and 231*b*.

When the insulator 274 containing elements serving as impurities is formed in contact with the oxide 230, impurities can be added to the regions 231, 232, and 233.

In the case where the insulator 274 containing elements serving as impurities is formed in contact with the oxide 230, impurity elements such as hydrogen and nitrogen, which are contained in a film formation atmosphere of the insulator 274, are added to the regions 231*a* and 231*b*. Oxygen vacancies are formed because of the added impurity elements, and the impurity elements enter the oxygen vacancies, thereby increasing the carrier density and reducing resistance mainly in a region of the oxide 230 which is in contact with the insulator 274. The impurities are diffused also into the regions 232 and 233 that are not in contact with the insulator 274 at this time, whereby the resistances are reduced.

Therefore, the region 231*a* and the region 231*b* preferably have a higher concentration of at least one of hydrogen and nitrogen than the region 234. The concentration of hydrogen or nitrogen can be measured by secondary ion mass spectrometry (SIMS) or the like. Here, the concentration of hydrogen or nitrogen in the middle of the region of the oxide 230*b* that overlaps with the insulator 250 (e.g., a portion in the oxide 230*b* which is located substantially equidistant from both side surfaces in the channel length direction of the insulator 250) is measured as the concentration of hydrogen or nitrogen in the region 234.

Note that when an element that forms an oxygen vacancy or an element trapped by an oxygen vacancy is added to the regions 231, 232, and 233, the resistances of the regions 231, 232, and 233 are reduced. Typical examples of the element are hydrogen, boron, carbon, nitrogen, fluorine, phosphorus, sulfur, chlorine, titanium, and a rare gas. Typical examples of a rare gas element are helium, neon, argon, krypton, and xenon. Accordingly, the regions 231, 232, and 233 are made to include one or more of the above elements.

The insulator 274 containing elements serving as impurities can be formed by a sputtering method, a CVD method, an MBE method, a PLD method, an ALD method, or the like.

The insulator 274 containing elements serving as impurities is preferably formed in an atmosphere containing at least one of nitrogen and hydrogen. In that case, oxygen vacancies are formed mainly in the regions of the oxide 230*b* and the oxide 230*c* that do not overlap with the insulator 250 and the oxygen vacancies and impurity elements such as nitrogen or hydrogen are bonded to each other, leading to an increase in carrier density. In this manner, the regions 231*a* and 231*b* with reduced resistance can be formed. For the insulator 274, for example, silicon nitride, silicon nitride oxide, or silicon oxynitride can be formed by a CVD method. In this embodiment, silicon nitride oxide is used for the insulator 274.

Thus, in the method for manufacturing a semiconductor device described in this embodiment, a source region and a drain region can be formed in a self-aligned manner owing to the formation of the insulator 274, even in a minute transistor whose channel length is approximately 10 nm to 30 nm. Thus, minute or highly integrated semiconductor devices can be manufactured with high yield.

Here, when the top surface of the conductor 260 is covered with the insulator 270 and the side surfaces of the conductor 260 and the insulator 250 are covered with the insulator 272, impurity elements such as nitrogen and hydrogen can be prevented from entering the conductor 260 and the insulator 250. Thus, impurity elements such as nitrogen and hydrogen can be prevented from entering the region 234 functioning as the channel formation region of the transistor 200 through the conductor 260 and the insulator 250. Accordingly, the transistor 200 having favorable electrical characteristics can be provided.

Here, when the top surface of the conductor 460 is covered with the insulator 470 and the side surfaces of the conductor 460 and the insulator 450 are covered with the insulator 472, impurity elements such as nitrogen and hydrogen can be prevented from entering the conductor 460 and the insulator 450. Thus, impurity elements such as nitrogen and hydrogen can be prevented from entering the channel formation region of the transistor 400 through the conductor 460 and the insulator 450. Accordingly, the transistor 400 having favorable electrical characteristics can be provided.

Note that although the regions 231, 232, 233, and 234 are formed by the addition of a dopant or the reduction in the resistance by the formation of the insulator 274 in the above, this embodiment is not limited thereto. For example, the regions may be formed through both of the addition of a dopant and the reduction in the resistance by the formation of the insulator 274. Alternatively, plasma treatment may be performed.

For example, plasma treatment may be performed on the oxide 230 using the insulator 250, the conductor 260, the insulator 272, and the insulator 270 as a mask. The plasma treatment is performed in an atmosphere containing the above-described element that forms oxygen vacancies or an element trapped by oxygen vacancies, for example. The plasma treatment may be performed using an argon gas and a nitrogen gas, for example.

Then, an insulating film to be the insulator 280 is formed over the insulator 274. The insulating film to be the insulator 280 can be formed by a sputtering method, a CVD method, an MBE method, a PLD method, an ALD method, or the like. Alternatively, the insulating film to be the insulator 280 can be formed by a spin coating method, a dipping method, a droplet discharging method (such as an ink-jet method), a printing method (such as screen printing or offset printing), a doctor knife method, a roll coater method, a curtain coater method, or the like. In this embodiment, silicon oxynitride is used as the insulating film.

Figure 25:
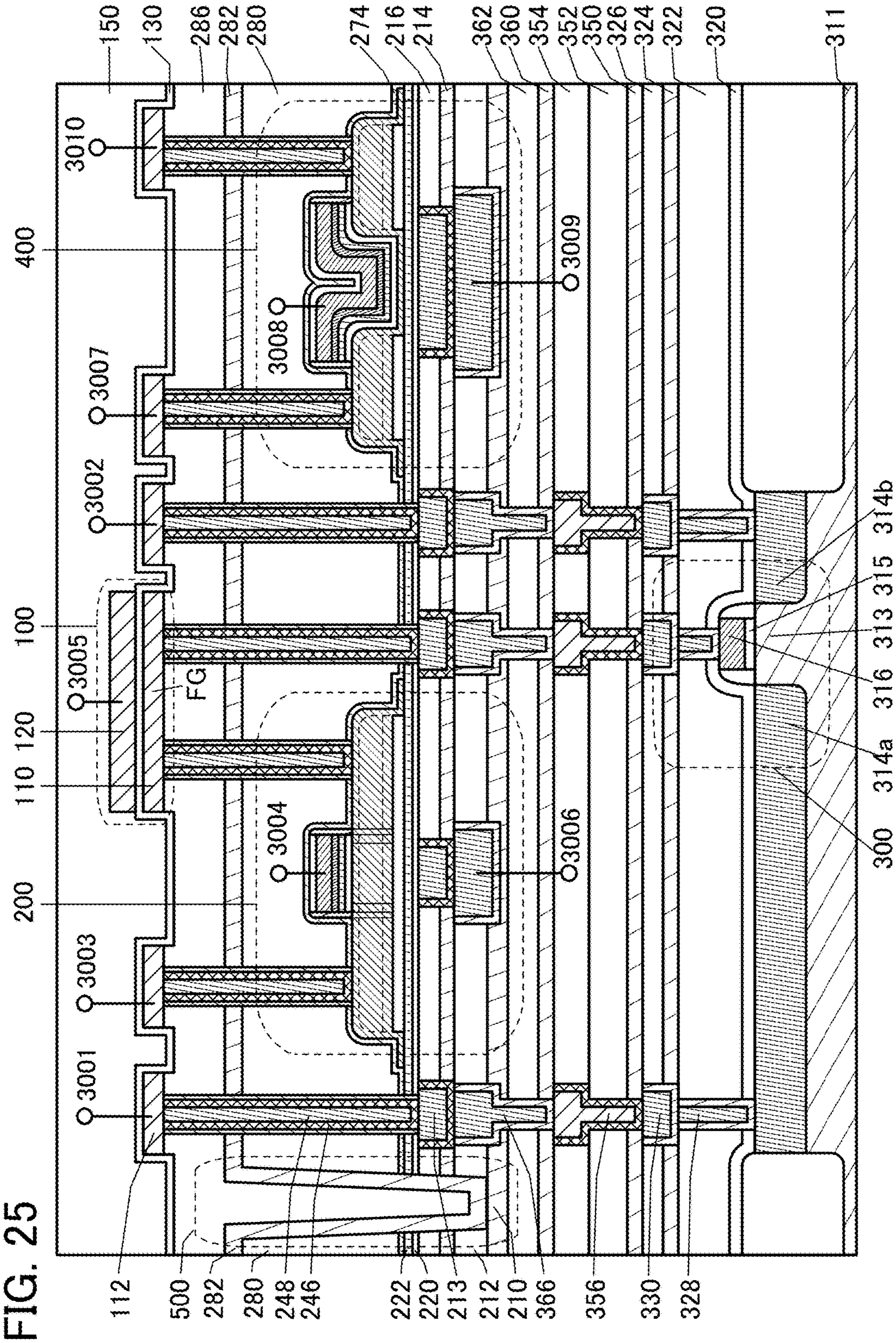
FIG. 25 is a cross-sectional view illustrating a structure of a memory device of one embodiment of the present invention.

Next, the insulating film to be the insulator 280 is partly removed to form the insulator 280 (see FIG. 25). The insulator 280 is preferably formed to have a flat top surface. For example, the insulator 280 may have a flat top surface right after the formation of the insulating film to be the insulator 280. Alternatively, the insulator 280 may be planarized by removing the insulator or the like from the top surface after the deposition so that the top surface becomes parallel to a reference surface such as a rear surface of the substrate. Such treatment is referred to as planarization treatment. As the planarization treatment, for example, CMP treatment, dry etching treatment, or the like can be performed. In this embodiment, CMP treatment is used as planarization treatment. Note that the top surface of the insulator 280 does not necessarily have planarity.

Then, the insulator 282 is formed over the insulator 280. The insulator 282 is preferably formed with a sputtering apparatus. When aluminum oxide having a barrier property is used for the insulator 282, for example, impurity diffusion from structure bodies above the insulator 282 into the transistor 200 and the transistor 400 can be inhibited.

Then, the insulator 286 is formed over the insulator 282. As the insulator 286, an insulator containing oxygen, such as a silicon oxide film or a silicon oxynitride film, is formed by a CVD method, for example. The insulator 286 preferably has a lower permittivity than the insulator 282. In the case where a material with a low permittivity is used for an interlayer film, the parasitic capacitance between wirings can be reduced (FIGS. 21A and 21B).

Figures 21A, 21B, 21C, 21D:
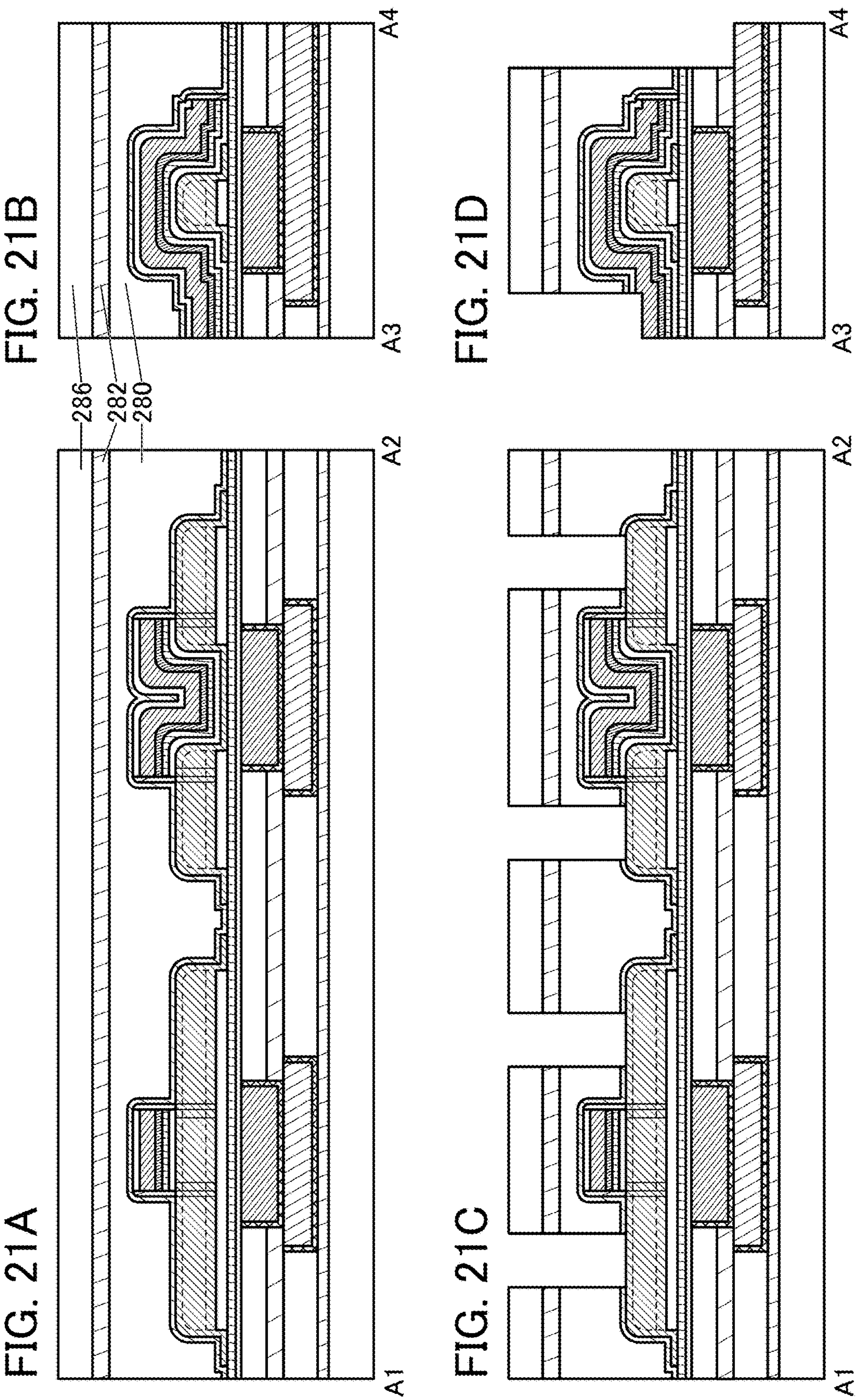
FIGS. 21A to 21D are cross-sectional views illustrating a method of manufacturing a semiconductor device of one embodiment of the present invention.
Figures 22A, 22B, 22C, 22D:
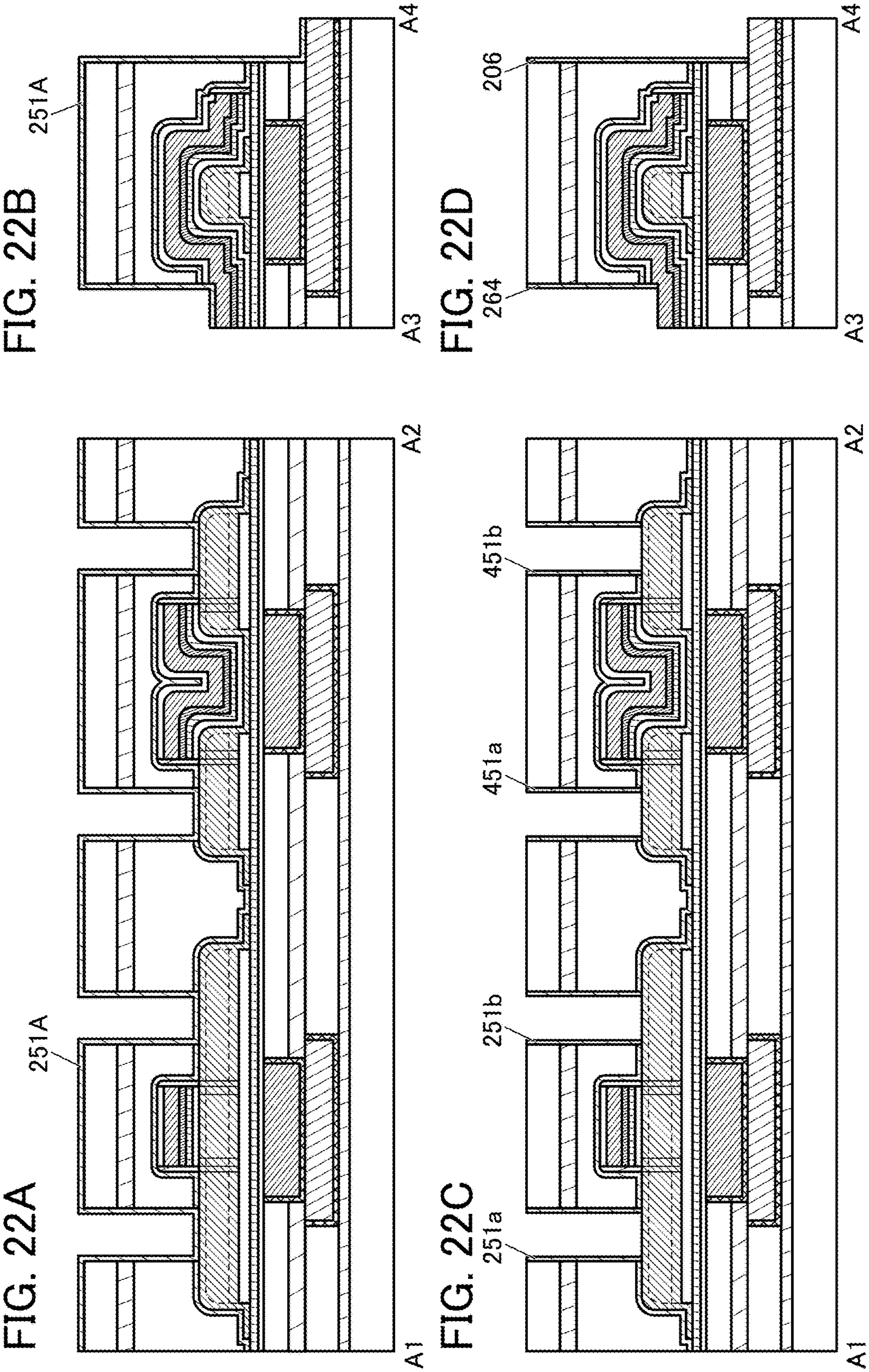
FIGS. 22A to 22D are cross-sectional views illustrating a method for manufacturing a semiconductor device of one embodiment of the present invention.

Then, openings are formed in the insulator 286, the insulator 282, and the insulator 280 to reach the transistor 200, the transistor 400, the wirings, and the like (FIGS. 21C and 21D). After that, an insulating film 251A is formed in the openings. As the insulating film 251A, aluminum oxide is formed by an ALD method, for example (FIGS. 22A and 22B).

Subsequently, portions of the insulating film 251A that are in contact with the transistor 200 and the transistor 400 are partly removed. For the processing, etch-back processing is performed until the structure bodies of the transistor 200 and the transistor 400 are exposed, so that an insulator 251*a*, an insulator 251*b*, an insulator 451*a*, and an insulator 451*b* can be formed (FIGS. 22C and 22D).

At this time, the insulator 251*a*, the insulator 251*b*, the insulator 451*a*, and the insulator 451*b* preferably cover at least the side surfaces of the openings in the insulators 280 and 282. In that case, the diffusion of hydrogen, which is an impurity, to the transistor 200 and the transistor 400 through the conductor 246, the conductor 252, and the conductor 452 can be inhibited.

With the insulator 251*a*, the insulator 251*b*, the insulator 451*a*, and the insulator 451*b*, the oxides where the channels are formed in the transistor 200 and the transistor 400 can each be an oxide semiconductor with a low density of defect states and stable characteristics. That is, changes in the electrical characteristics of the transistor 200 and the transistor 400 can be reduced and the reliability can be improved.

Next, a conductive film to be the conductor 252, the conductor 452, a conductor 265, and a conductor 207 is formed. For example, the conductive film to be the conductor 252, the conductor 452, the conductor 265, and the conductor 207 can be formed by a sputtering method, a CVD method, an MBE method, a PLD method, an ALD method, or the like. Note that the conductive film to be the conductor 252, the conductor 452, the conductor 265, and the conductor 207 is formed to be embedded in openings formed in the insulator 280 and the like. Thus, it is preferable to employ a CVD method (in particular, an MOCVD method). In order to increase the adhesion of the conductor formed by an MOCVD method, a multilayer film of a conductor formed by an ALD method or the like and a conductor formed by a CVD method is preferably formed in some cases. The conductive film to be the conductor 252, the conductor 452, the conductor 265, and the conductor 207 preferably has a stacked-layer structure of titanium nitride and tungsten, for example.

Figures 23A, 23B, 23C, 23D:
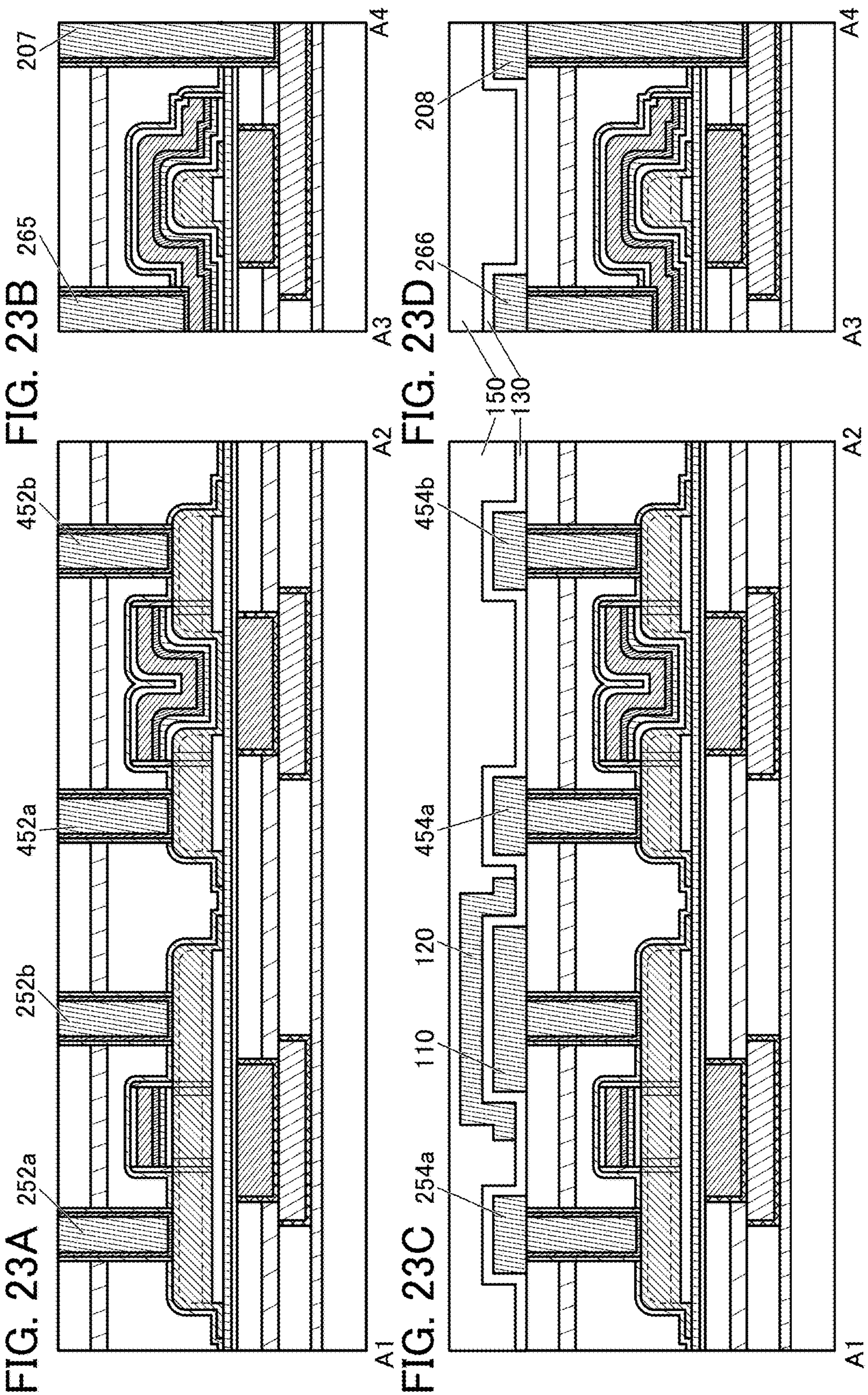
FIGS. 23A to 23D are cross-sectional views illustrating a method for manufacturing a semiconductor device of one embodiment of the present invention.

Then, unnecessary portions of the conductive film to be the conductor 252, the conductor 452, the conductor 265, and the conductor 207 are removed. For example, part of the conductive film to be the conductor 252, the conductor 452, the conductor 265, and the conductor 207 is removed by etch-back processing, CMP treatment, or the like until the insulator 286 is exposed, whereby the conductor 252, the conductor 452, the conductor 265, and the conductor 207 are formed (FIGS. 23A and 23B). At this time, the insulator 280 can be used as a stopper layer, and the thickness of the insulator 280 is reduced in some cases.

After that, a conductive film to be the conductor 254, the conductor 110, the conductor 454, a conductor 266, and a conductor 208 is formed over the insulator 286. Note that the conductive film to be the conductor 254, the conductor 110, the conductor 454, the conductor 266, and the conductor 208 can be formed using, for example, a metal selected from aluminum, chromium, copper, tantalum, titanium, molybdenum, and tungsten; an alloy containing any of these metals as a component; an alloy containing any of these metals in combination; or the like. Alternatively, one or both of manganese and zirconium may be used. Alternatively, a semiconductor typified by polycrystalline silicon doped with an impurity element such as phosphorus, or a silicide such as nickel silicide may be used. For example, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, an alloy film or a nitride film that contains aluminum and one or more metals selected from titanium, tantalum, tungsten, molybdenum, chromium, neodymium, and scandium may be used.

Subsequently, the conductive film to be the conductor 254, the conductor 110, the conductor 454, the conductor 266, and the conductor 208 is etched to form the conductor 254, the conductor 110, the conductor 454, the conductor 266, and the conductor 208. Over-etching treatment may be performed as this etching treatment so that part of the insulator 286 is also removed at the same time.

Then, the insulator 130 covering the top and side surfaces of the conductor 110 is formed. The insulator 130 can have a single-layer structure or a stacked-layer structure using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or the like.

For example, a stacked-layer structure of a high-k material such as aluminum oxide and a material with high dielectric strength such as silicon oxynitride is preferably used. Such a structure enables the capacitor 100 to have sufficient capacitance due to the high-k material and increased dielectric strength due to the material with high dielectric strength. Thus, the electrostatic breakdown of the capacitor 100 can be suppressed, which leads to improvement in the reliability of the capacitor 100.

Subsequently, a film to be the conductor 120 is formed over the insulator 130. The film to be the conductor 120 can be formed using a material and a method similar to those for the conductor 110. Then, unnecessary portions of the film to be the conductor 120 are removed by etching. After that, a resist mask is removed, whereby the conductor 120 is formed.

The conductor 120 is preferably provided to cover the top and side surfaces of the conductor 110 with the insulator 130 therebetween. With this structure, the side surfaces of the conductor 110 face the conductor 120 with the insulator 130 therebetween. Accordingly, in the capacitor 100, a capacitor having large capacitance per projected area can be formed because the sum of the area of the top and side surfaces of the conductor 110 functions as a capacitor.

Subsequently, the insulator 150 covering the capacitor 100 is formed (see FIGS. 23A and 23B). An insulator to be the insulator 150 can be formed using a material and a method similar to those for the insulator 286 and the like.

Through the above process, the semiconductor device including the capacitor 100, the transistor 200, and the transistor 400 can be manufactured. As illustrated in FIGS. 18A to 18D to FIGS. 23A to 23D, the method for manufacturing a semiconductor device in this embodiment allows fabrication of the capacitor 100, the transistor 200, and the transistor 400.

According to one embodiment of the present invention, a semiconductor device that can be miniaturized or highly integrated, a semiconductor device having good electrical characteristics, a semiconductor device with a low off-state current, a transistor with a high on-state current, a highly reliable semiconductor device, a semiconductor device with low power consumption, or a semiconductor device that can be manufactured with high productivity can be provided.

The structures, methods, and the like described in this embodiment can be combined with any of the structures, methods, and the like described in the other embodiments as appropriate.

Embodiment 4

In this embodiment, one embodiment of a semiconductor device is described with reference to FIGS. 25 and 26.

<Memory Device>

A semiconductor device illustrated in FIG. 25 is a memory device including the transistor 300, the transistor 200, and the capacitor 100. One embodiment of the memory device is described below with reference to FIG. 25.

The transistor 200 is a transistor in which a channel is formed in a semiconductor layer containing an oxide semiconductor, and can be the transistor described in the above embodiment. Since the transistor described in the above embodiment can be formed with high yield even when it is miniaturized, the transistor 200 can be miniaturized. The use of such a transistor in a memory device allows miniaturization or high integration of the memory device. Since the off-state current of the transistor described in the above embodiment is low, a memory device including the transistor can retain stored data for a long time. In other words, such a memory device does not require refresh operation or has an extremely low frequency of the refresh operation, which leads to a sufficient reduction in power consumption of the memory device.

In FIG. 25, the wiring 3001 is electrically connected to a source of the transistor 300. The wiring 3002 is electrically connected to a drain of the transistor 300. The wiring 3003 is electrically connected to one of a source and a drain of the transistor 200. The wiring 3004 is electrically connected to a first gate of the transistor 200. The wiring 3006 is electrically connected to a second gate of the transistor 200. A gate of the transistor 300 and the other of the source and the drain of the transistor 200 are electrically connected to one electrode of the capacitor 100. The wiring 3005 is electrically connected to the other electrode of the capacitor 100.

In FIG. 25, the wiring 3007 is electrically connected to a source of the transistor 400. The wiring 3008 is electrically connected to a gate of the transistor 400. The wiring 3009 is electrically connected to a back gate of the transistor 400. The wiring 3010 is electrically connected to a drain of the transistor 400. The wiring 3006, the wiring 3007, the wiring 3008, and the wiring 3009 are electrically connected to one another.

The semiconductor device illustrated in FIG. 25 has a feature that the potential of the gate of the transistor 300 can be retained and thus enables writing, retaining, and reading of data as follows.

Writing and retaining of data are described. First, the potential of the wiring 3004 is set to a potential at which the transistor 200 is turned on, so that the transistor 200 is turned on. Accordingly, the potential of the wiring 3003 is applied to a node FG where the gate of the transistor 300 and the one electrode of the capacitor 100 are electrically connected to each other. That is, a predetermined charge is supplied to the gate of the transistor 300 (writing). Here, one of two kinds of charges providing different potential levels (hereinafter referred to as a low-level charge and a high-level charge) is supplied. After that, the potential of the wiring 3004 is set to a potential at which the transistor 200 is turned off, so that the transistor 200 is turned off. Thus, the charge is retained in the node FG (retaining).

In the case where the off-state current of the transistor 200 is low, the charge of the node FG is retained for a long time.

Next, reading of data is described. An appropriate potential (reading potential) is applied to the wiring 3005 while a predetermined potential (constant potential) is applied to the wiring 3001, whereby the potential of the wiring 3002 varies depending on the amount of charge retained in the node FG. This is because in the case of using an n-channel transistor as the transistor 300, an apparent threshold voltage $V_{th\_H}$ at the time when a high-level charge is given to the gate of the transistor 300 is lower than an apparent threshold voltage $V_{th\_L}$ at the time when a low-level charge is given to the gate of the transistor 300. Here, an apparent threshold voltage refers to the potential of the wiring 3005 which is needed to turn on the transistor 300. Thus, the potential of the wiring 3005 is set to a potential $V_0$ which is between $V_{th\_H}$ and $V_{th\_L}$, whereby the charge supplied to the node FG can be determined. For example, in the case where a high-level charge is supplied to the node FG in writing and the potential of the wiring 3005 is $V_0$ ($>V_{th\_H}$), the transistor 300 is turned on. Meanwhile, in the case where a low-level charge is supplied to the node FG in writing, even when the potential of the wiring 3005 is $V_0$ ($<V_{th\_L}$), the transistor 300 remains off. Thus, the data retained in the node FG can be read by determining the potential of the wiring 3002.

<Structure of Memory Device>

The semiconductor device of one embodiment of the present invention includes the transistor 300, the transistor 200, the transistor 400, and the capacitor 100 as illustrated in FIG. 25. The transistor 200 and the transistor 400 are provided above the transistor 300, and the capacitor 100 is provided above the transistor 300, the transistor 200, and the transistor 400.

The transistor 300 is provided in and on a substrate 311 and includes a conductor 316, an insulator 315, a semiconductor region 313, which is part of the substrate 311, and low-resistance regions 314*a* and 314*b* functioning as a source region and a drain region.

The transistor 300 is either a p-channel transistor or an n-channel transistor.

It is preferable that a region of the semiconductor region 313 where a channel is formed, a region in the vicinity thereof, the low-resistance regions 314*a* and 314*b* functioning as a source region and a drain region, and the like contain a semiconductor such as a silicon-based semiconductor, further preferably single crystal silicon. Alternatively, a material including germanium (Ge), silicon germanium (SiGe), gallium arsenide (GaAs), gallium aluminum arsenide (GaAlAs), or the like may be contained. Silicon whose effective mass is controlled by applying stress to the crystal lattice and thereby changing the lattice spacing may be contained. Alternatively, the transistor 300 may be a high-electron-mobility transistor (HEMT) with GaAs and GaAlAs, or the like.

The low-resistance regions 314*a* and 314*b* contain an element which imparts n-type conductivity, such as arsenic or phosphorus, or an element which imparts p-type conductivity, such as boron, in addition to a semiconductor material used for the semiconductor region 313.

The conductor 316 functioning as a gate electrode can be formed using a semiconductor material such as silicon containing the element which imparts n-type conductivity, such as arsenic or phosphorus, or the element which imparts p-type conductivity, such as boron, or a conductive material such as a metal material, an alloy material, or a metal oxide material.

Note that a work function of a conductor is determined by a material of the conductor, whereby the threshold voltage can be adjusted. Specifically, it is preferable to use titanium nitride, tantalum nitride, or the like as the conductor. Furthermore, in order to ensure the conductivity and embeddability of the conductor, it is preferable to use a stacked layer of metal materials such as tungsten and aluminum as the conductor. In particular, tungsten is preferable in terms of heat resistance.

Note that the transistor 300 illustrated in FIG. 25 is only an example and the structure of the transistor 300 is not limited to that illustrated therein; an appropriate transistor may be used in accordance with a circuit configuration or a driving method.

An insulator 320, an insulator 322, an insulator 324, and an insulator 326 are stacked in this order to cover the transistor 300.

The insulator 320, the insulator 322, the insulator 324, and the insulator 326 can be formed using, for example, silicon oxide, silicon oxynitride, silicon nitride oxide, silicon nitride, aluminum oxide, aluminum oxynitride, aluminum nitride oxide, aluminum nitride, or the like.

The insulator 322 may function as a planarization film for eliminating a level difference caused by the transistor 300 or the like underlying the insulator 322. For example, the top surface of the insulator 322 may be planarized by planarization treatment using a CMP method or the like to increase the level of planarity.

The insulator 324 is preferably formed using a film having a barrier property that prevents impurities and hydrogen from diffusing from the substrate 311, the transistor 300, or the like into a region where the transistor 200 is formed.

As an example of the film having a hydrogen barrier property, silicon nitride formed by a CVD method can be given. The diffusion of hydrogen to a semiconductor element including an oxide semiconductor, such as the transistor 200, degrades the characteristics of the semiconductor element in some cases. Therefore, a film that prevents hydrogen diffusion is preferably provided between the transistor 200 and the transistor 300 and between the transistor 200 and the transistor 400. Specifically, the film that prevents hydrogen diffusion is a film from which hydrogen is less likely to be released.

The amount of released hydrogen can be measured by thermal desorption spectroscopy (TDS), for example. The amount of hydrogen released from the insulator 324 that is converted into hydrogen molecules per unit area of the insulator 324 is less than or equal to $10\times10^{15}$ atoms/cm$^2$, preferably less than or equal to $5\times10^{15}$ atoms/cm$^2$ in the TDS analysis in the range of 50° C. to 500° C., for example.

Note that the permittivity of the insulator 326 is preferably lower than that of the insulator 324. For example, the relative permittivity of the insulator 326 is preferably lower than 4, further preferably lower than 3. For example, the relative permittivity of the insulator 326 is preferably 0.7 times or less that of the insulator 324, further preferably 0.6 times or less that of the insulator 324. In the case where a material with a low permittivity is used as an interlayer film, the parasitic capacitance between wirings can be reduced.

A conductor 328, a conductor 330, and the like that are electrically connected to the capacitor 100 or the transistor 200 are provided in the insulator 320, the insulator 322, the insulator 324, and the insulator 326. Note that the conductor 328 and the conductor 330 each function as a plug or a wiring. A plurality of structures of conductors functioning as plugs or wirings are collectively denoted by the same reference numeral in some cases. Furthermore, in this specification and the like, a wiring and a plug electrically connected to the wiring may be a single component. That is, part of a conductor functions as a wiring and part of the conductor functions as a plug in some cases.

As a material of each of plugs and wirings (e.g., the conductor 328 and the conductor 330), a conductive material such as a metal material, an alloy material, a metal nitride material, or a metal oxide material can be used in a single-layer structure or a stacked-layer structure. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, in FIG. 25, an insulator 350, an insulator 352, and an insulator 354 are stacked in this order. Furthermore, a conductor 356 is formed in the insulator 350, the insulator 352, and the insulator 354. The conductor 356 functions as a plug or a wiring. Note that the conductor 356 can be formed using a material similar to those for the conductor 328 and the conductor 330.

Note that for example, the insulator 350 is preferably formed using an insulator having a hydrogen barrier property, like the insulator 324. Furthermore, the conductor 356 preferably includes a conductor having a hydrogen barrier property. The conductor having a hydrogen barrier property is formed particularly in an opening of the insulator 350 having a hydrogen barrier property. In such a structure, the transistor 300 and each of the transistor 200 and the transistor 400 can be separated by a barrier layer, so that the diffusion of hydrogen from the transistor 300 to the transistor 200 and the transistor 400 can be prevented.

Note that as the conductor having a hydrogen barrier property, tantalum nitride is preferably used, for example. By stacking tantalum nitride and tungsten, which has high conductivity, the diffusion of hydrogen from the transistor 300 can be prevented while the conductivity of a wiring is ensured. In this case, a tantalum nitride layer having a hydrogen barrier property is preferably in contact with the insulator 350 having a hydrogen barrier property.

A wiring layer may be provided over the insulator 354 and the conductor 356. For example, in FIG. 25, an insulator 360, an insulator 362, an insulator 210, and an insulator 212 are stacked in this order over the insulator 354. A material having a barrier property against oxygen and hydrogen is preferably used for any of the insulator 360, the insulator 362, the insulator 210, and the insulator 212.

The insulators 360 and 210 are preferably formed using, for example, a film having a barrier property that prevents hydrogen and impurities from diffusing from the substrate 311, a region where the transistor 300 is formed, or the like to a region where the transistor 200 or the transistor 400 is formed. Therefore, the insulators 360 and 210 can be formed using a material similar to that for the insulator 324.

As an example of the film having a hydrogen barrier property, silicon nitride formed by a CVD method can be given. The diffusion of hydrogen to a semiconductor element including an oxide semiconductor, such as the transistor 200, degrades the characteristics of the semiconductor element in some cases. Therefore, a film that prevents hydrogen diffusion is preferably provided between the transistor 200 and the transistor 300 and between the transistor 200 and the transistor 400. Specifically, the film that prevents hydrogen diffusion is a film from which hydrogen is less likely to be released.

As the film having a hydrogen barrier property, for example, as each of the insulators 360 and 210, a metal oxide such as aluminum oxide, hafnium oxide, or tantalum oxide is preferably used.

In particular, aluminum oxide has an excellent blocking effect that prevents permeation of oxygen and impurities such as hydrogen and moisture which cause a change in the electrical characteristics of the transistor. Accordingly, the use of aluminum oxide can prevent entry of impurities such as hydrogen and moisture into the transistor 200 and the transistor 400 in and after a manufacturing process of the transistor. In addition, release of oxygen from the oxide in the transistor 200 and the transistor 400 can be prevented. Therefore, aluminum oxide is suitably used as a protective film for the transistor 200 and the transistor 400.

For example, the insulators 362 and 212 can be formed using a material similar to that for the insulator 320. In the case where interlayer films are formed of a material with a relatively low permittivity, the parasitic capacitance between wirings can be reduced. For example, a silicon oxide film, a silicon oxynitride film, or the like can be used for the insulators 362 and 212.

A conductor 366, the conductor 203 electrically connected to the transistor 200, the conductor 403 electrically connected to the transistor 400, and the like are provided in the insulators 360, 362, 210, and 212. Note that the conductor 366 functions as a plug or a wiring that is electrically connected to the capacitor 100 or the transistor 300. The conductor 366 can be formed using a material similar to those for the conductors 328 and 330.

In particular, part of the conductor 366 which is in contact with the insulators 360 and 210 is preferably a conductor with a barrier property against oxygen, hydrogen, and water. In such a structure, the transistor 300 and each of the transistors 200 and 400 can be completely separated by the layer with a barrier property against oxygen, hydrogen, and water. As a result, the diffusion of hydrogen from the transistor 300 to the transistor 200 and the transistor 400 can be prevented.

The transistor 200 and the transistor 400 are provided over the insulator 212. Note that the transistor included in the semiconductor device described in the above embodiment may be used as the transistor 200 and the transistor 400. Note that the transistor 200 and the transistor 400 in FIG. 25 are only examples and the transistor 200 and the transistor 400 are not limited to the structures illustrated therein, and an appropriate transistor may be used in accordance with a circuit configuration or a driving method.

An insulator 214 and an insulator 216 are stacked in this order over the insulator 212 and the conductor 366. A material having a barrier property against oxygen and hydrogen is preferably used for at least one of the insulator 214 and the insulator 216.

The insulators 214 and 216 are preferably formed using, for example, a film having a barrier property that prevents hydrogen and impurities from diffusing from the substrate 311, a region where the transistor 300 is formed, or the like to a region where the transistor 200 or the transistor 400 is formed. Therefore, the insulators 214 and 216 can be formed using a material similar to that for the insulator 324.

As an example of the film having a hydrogen barrier property, silicon nitride formed by a CVD method can be given. The diffusion of hydrogen to a semiconductor element including an oxide semiconductor, such as the transistor 200, degrades the characteristics of the semiconductor element in some cases. Therefore, a film that prevents hydrogen diffusion is preferably provided between the transistor 200 and the transistor 300 and between the transistor 200 and the transistor 400. Specifically, the film that prevents hydrogen diffusion is a film from which hydrogen is less likely to be released.

A conductor 213, the conductor 205, and the conductor 405 are embedded in the insulator 214 and the insulator 216. Note that the conductor 205 and the conductor 405 serve as plugs electrically connected to a back gate electrode of the transistor 200 and a back gate electrode of the transistor 400, respectively, and serve as plugs or wirings electrically connected to the capacitor 100 and the transistor 300. The conductor 213, the conductor 205, and the conductor 405 can be formed with a material similar to those for the conductor 328 and the conductor 330.

The insulator 214 and the insulator 216 are provided between second gate electrodes of the transistor 200 and the transistor 400 and first gate electrodes of the transistor 200 and the transistor 400, whereby parasitic capacitance between the first gate electrode of the transistor 200 and the first gate electrode of the transistor 400 can be reduced.

The insulator 280 is provided over the transistor 200 and the transistor 400. In the insulator 280, an excess-oxygen region is preferably formed. In particular, in the case of using an oxide semiconductor in the transistor 200 and the transistor 400, when an insulator including an excess-oxygen region is provided in an interlayer film or the like in the vicinity of the transistor 200 and the transistor 400, oxygen vacancies in the oxide included in the transistor 200 and the transistor 400 are reduced, whereby the reliability can be improved. The insulator 280 that covers the transistor 200 and the transistor 400 may function as a planarization film that covers a roughness thereunder.

As the insulator including the excess-oxygen region, specifically, an oxide material that releases part of oxygen by heating is preferably used. An oxide that releases part of oxygen by heating is an oxide film in which the amount of released oxygen converted into oxygen molecules is greater than or equal to $1.0\times10^{18}$ atoms/cm$^3$, preferably greater than or equal to $3.0\times10^{20}$ atoms/cm$^3$ in TDS analysis. Note that the temperature of the film surface in the TDS analysis is preferably higher than or equal to 100° C. and lower than or equal to 700° C., or higher than or equal to 100° C. and lower than or equal to 500° C.

For example, as such a material, a material containing silicon oxide or silicon oxynitride is preferably used. Alternatively, a metal oxide can be used. Note that in this specification, "silicon oxynitride" refers to a material that contains oxygen at a higher proportion than nitrogen, and "silicon nitride oxide" refers to a material that contains nitrogen at a higher proportion than oxygen.

The insulator 282 is provided over the insulator 280. A material having a barrier property against oxygen and hydrogen is preferably used for the insulator 282. Thus, the insulator 282 can be formed using a material similar to that for the insulator 214. As the insulator 282, a metal oxide such as aluminum oxide, hafnium oxide, or tantalum oxide is preferably used, for example.

In particular, aluminum oxide has an excellent blocking effect that prevents permeation of oxygen and impurities such as hydrogen and moisture which cause a change in the electrical characteristics of the transistor. Accordingly, the use of aluminum oxide can prevent entry of impurities such as hydrogen and moisture into the transistor 200 and the transistor 400 in and after a manufacturing process of the transistor. In addition, release of oxygen from the oxide in the transistor 200 and the transistor 400 can be prevented. Therefore, aluminum oxide is suitably used as a protective film for the transistor 200 and the transistor 400.

The insulator 286 is provided over the insulator 282. The insulator 286 can be formed using a material similar to that of the insulator 320. In the case where a material with a relatively low permittivity is used for an interlayer film, the parasitic capacitance between wirings can be reduced. For example, a silicon oxide film, a silicon oxynitride film, or the like can be used for the insulator 286.

The conductors 246, the conductors 248, and the like are provided in the insulators 220, 222, 280, 282, and 286.

The conductors 246 and 248 function as plugs or wirings that are electrically connected to the capacitor 100, the transistor 200, the transistor 400, and the transistor 300. The conductors 246 and 248 can be formed using a material similar to those for the conductors 328 and 330.

The capacitor 100 is provided above the transistor 200 and the transistor 400. The capacitor 100 includes a conductor 110, a conductor 120, and an insulator 130.

An insulator 150 is provided over the conductor 120 and the insulator 130. The insulator 150 can be formed using a material similar to that for the insulator 320. The insulator 150 may function as a planarization film that covers a roughness thereunder.

Description is made on a dicing line (also referred to as a scribe line, a dividing line, or a cutting line) that is provided when a large-sized substrate is divided into semiconductor elements so that a plurality of semiconductor devices are each formed in a chip form. In an example of a dividing method, for example, a groove (dicing line) for separating the semiconductor elements is formed on the substrate, and then the substrate is cut along the dicing line so that a plurality of semiconductor devices that are separated are obtained. For example, FIG. 25 is a cross-sectional view of a structure 500 around the dicing line.

As in the structure 500, for example, openings are provided in the insulators 280, 274, 224, 222, 220, 216, 214, and 210 around a region overlapping with the dicing line formed in an end portion of the memory cell including the transistor 200 or the transistor 400. Furthermore, the insulator 282 is provided to cover the side surfaces of the insulator 280, the insulator 274, the insulator 224, the insulator 222, the insulator 220, the insulator 216, the insulator 214, and the insulator 210.

Thus, in the openings, the insulator 210 is in contact with the insulator 282. At that time, the insulator 210 is formed using the same material and method as those for the insulator 282, whereby the adhesion therebetween can be improved. Aluminum oxide can be used, for example.

With such a structure, the insulator 280, the transistor 200, and the transistor 400 can be enclosed with the insulator 210 and the insulator 282. Since the insulators 360, 222, and 282 have functions of preventing the diffusion of oxygen, hydrogen, and water, even when the substrate is divided into circuit regions each of which is provided with the semiconductor elements in this embodiment to form a plurality of chips, the entry and diffusion of impurities such as hydrogen and water from the direction of a side surface of the divided substrate to the transistor 200 or the transistor 400 can be prevented.

Furthermore, in the structure, excess oxygen in the insulator 280 can be prevented from diffusing to the outside of the insulators 282 and 222. Accordingly, excess oxygen in the insulator 280 is efficiently supplied to the oxide where the channel is formed in the transistor 200 or the transistor 400. The oxygen can reduce oxygen vacancies in the oxide where the channel is formed in the transistor 200 or the transistor 400. Thus, the oxide where the channel is formed in the transistor 200 or the transistor 400 can be an oxide semiconductor with a low density of defect states and stable characteristics. That is, a change in the electrical characteristics of the transistor 200 or the transistor 400 can be prevented and the reliability can be improved.

The above is the description of the structural example. With the use of the structure, a change in electrical characteristics can be prevented and reliability can be improved in a semiconductor device including a transistor including an oxide semiconductor. The power consumption of a semiconductor device including a transistor including an oxide semiconductor can be reduced. Miniaturization or high integration of a semiconductor device including a transistor including an oxide semiconductor can be achieved. A miniaturized or highly integrated semiconductor device can be provided with high productivity.

<Structure of Memory Cell Array>

Figure 26:
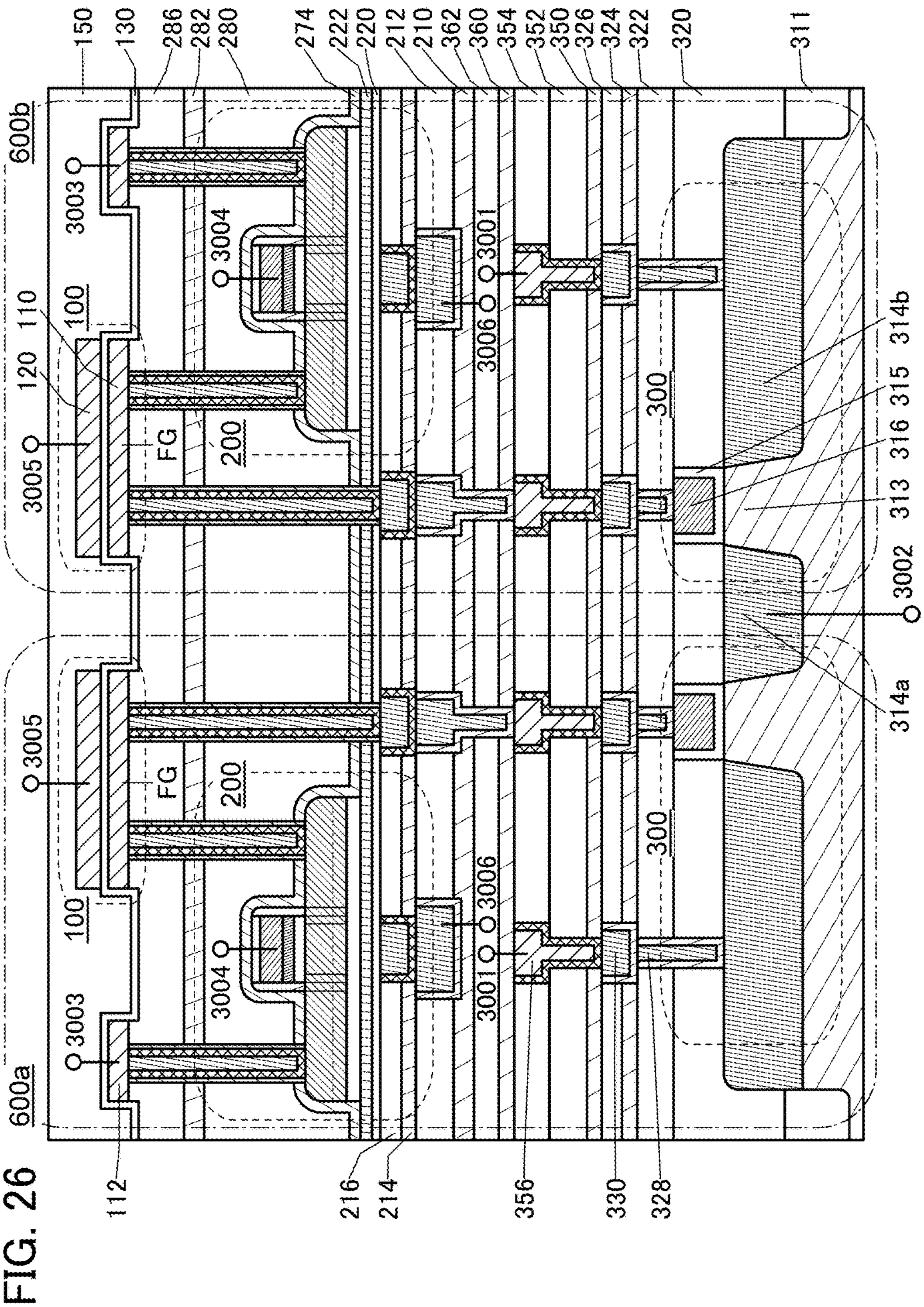
FIG. 26 is a cross-sectional view illustrating a structure of a memory device of one embodiment of the present invention.

FIG. 26 illustrates an example of a memory cell array of this embodiment. When the transistors 200 are arranged as memory cells in a matrix, a memory cell array can be formed.

The memory device in FIG. 26 is a semiconductor device constituting a memory cell array in which the memory devices each of which is illustrated in FIG. 25 are arranged in a matrix. Note that one transistor 400 can control the back-gate voltages of the plurality of transistors 200. For this reason, the number of transistors 400 is preferably smaller than the number of transistors 200.

Note that in FIG. 26, the transistor 400 illustrated in FIG. 25 is omitted. FIG. 26 is a cross-sectional view that illustrates part of a row in which the memory devices each of which is illustrated in FIG. 25 are arranged in a matrix.

The structure of the transistor 300 in FIG. 26 is different from that of the transistor 300 in FIG. 25. In the transistor 300 illustrated in FIG. 26, the semiconductor region 313 (part of the substrate 311) in which a channel is formed has a protruding portion. Furthermore, the conductor 316 is provided to cover the top and side surfaces of the semiconductor region 313 with the insulator 315 positioned therebetween. Note that the conductor 316 may be formed using a material for adjusting the work function. The transistor 300 having such a structure is also referred to as a FIN transistor because the protruding portion of the semiconductor substrate is utilized. An insulator functioning as a mask for forming the protruding portion may be provided in contact with the top surface of the protruding portion. Although the case where the protruding portion is formed by processing part of the semiconductor substrate is described here, a semiconductor film having a protruding shape may be formed by processing an SOI substrate.

In the memory device illustrated in FIG. 26, a memory cell 600*a* and a memory cell 600*b* are arranged adjacent to each other. The transistors 300 and 200 and the capacitor 100 are included and electrically connected to the wirings 3001, 3002, 3003, 3004, 3005, and 3006 in each of the memory cells 600*a* and 600*b*. Also in the memory cells 600*a* and 600*b*, a node where a gate of the transistor 300 and one electrode of the capacitor 100 are electrically connected to each other is referred to as the node FG. Note that the wiring 3002 is shared by the memory cells 600*a* and 600*b* adjacent to each other.

Note that in the case where memory cells are arrayed, it is necessary that data of a desired memory cell be read in read operation. For example, in the case of a NOR-type memory cell array, only data of a desired memory cell can be read by turning off the transistors 300 of memory cells from which data is not read. In this case, a potential at which the transistor 300 is turned off regardless of the charge supplied to the node FG, that is, a potential lower than $V_{th\_H}$, is applied to the wiring 3005 connected to the memory cells from which data is not read. Alternatively, in the case of a NAND-type memory cell array, for example, only data of a desired memory cell can be read by turning on the transistors 300 of memory cells from which data is not read. In this case, a potential at which the transistor 300 is turned on regardless of the charge supplied to the node FG, that is, a potential higher than $V_{th\_L}$, is applied to the wiring 3005 connected to the memory cells from which data is not read.

With the use of the structure, a change in electrical characteristics can be prevented and reliability can be improved in a semiconductor device including a transistor including an oxide semiconductor. The power consumption of a semiconductor device including a transistor including an oxide semiconductor can be reduced. Miniaturization or high integration of a semiconductor device including a transistor including an oxide semiconductor can be achieved. A miniaturized or highly integrated semiconductor device can be provided with high productivity.

The structures, the methods, and the like described in this embodiment can be combined as appropriate with any of the structures, the methods, and the like described in the other embodiments.

Embodiment 5

In this embodiment, a frame memory including a semiconductor device of one embodiment of the present invention, which can be used in a display controller IC, a source driver IC, or the like, is described.

Figure 27:
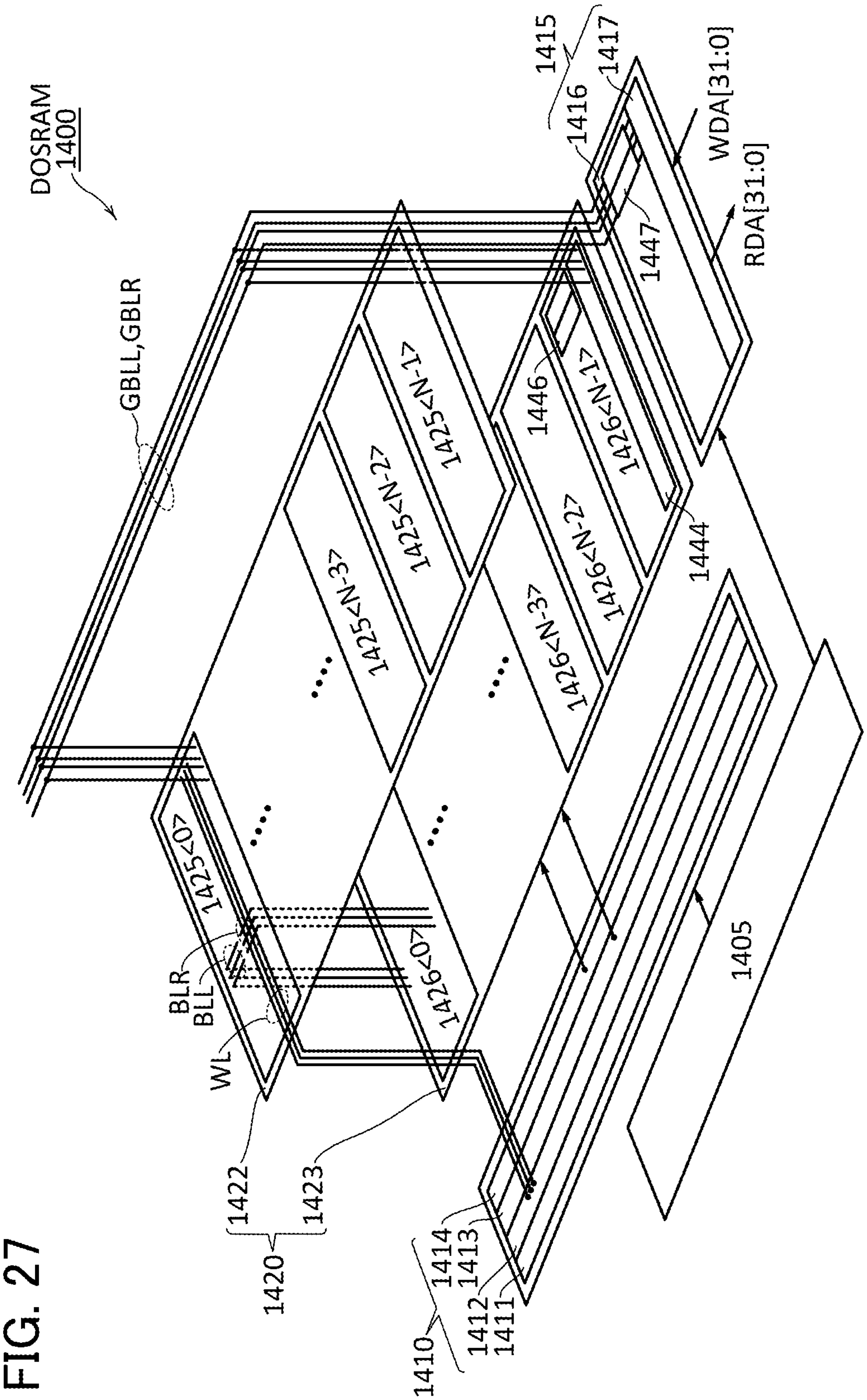
FIG. 27 is a block diagram showing a configuration example of a memory device of one embodiment of the present invention.

A dynamic random access memory (DRAM) including memory cells of 1T1C (one transistor, one capacitor) type can be used as the frame memory, for example. A memory device in which OS transistors are used in memory cells (the memory device is hereinafter referred to as an OS memory) can also be used. Here, a RAM including memory cells of 1T1C type is described as an example of the OS memory. Such a RAM is herein referred to as a dynamic oxide semiconductor RAM (DOSRAM). FIG. 27 illustrates a configuration example of a DOSRAM.

<<DOSRAM 1400>>

The DOSRAM 1400 includes a controller 1405, a row circuit 1410, a column circuit 1415, and a memory cell and sense amplifier array 1420 (hereinafter referred to as MC-SA array 1420).

The row circuit 1410 includes a decoder 1411, a word line driver circuit 1412, a column selector 1413, and a sense amplifier driver circuit 1414. The column circuit 1415 includes a global sense amplifier array 1416 and an input/output circuit 1417. The global sense amplifier array 1416 includes a plurality of global sense amplifiers 1447. The MC-SA array 1420 includes a memory cell array 1422, a sense amplifier array 1423, and global bit lines GBLL and GBLR.

(MC-SA Array 1420)

The MC-SA array 1420 has a stacked-layer structure where the memory cell array 1422 is stacked over the sense amplifier array 1423. The global bit lines GBLL and GBLR are stacked over the memory cell array 1422. The DOSRAM 1400 adopts a hierarchical bit line structure, where the bit lines are layered into local and global bit lines.

Figure 28A:
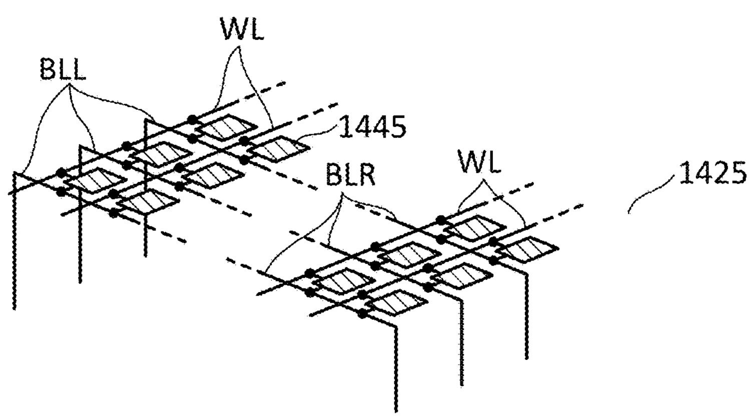
FIGS. 28A and 28B are a block diagram and a circuit diagram showing a configuration example of a memory device of one embodiment of the present invention.

The memory cell array 1422 includes N local memory cell arrays 1425<0> to 1425<N−1>, where N is an integer greater than or equal to 2. FIG. 28A illustrates a configuration example of the local memory cell array 1425. The local memory cell array 1425 includes a plurality of memory cells 1445, a plurality of word lines WL, and a plurality of bit lines BLL and BLR. In the example in FIG. 28A, the local memory cell array 1425 has an open bit-line architecture but may have a folded bit-line architecture.

Figure 28B:
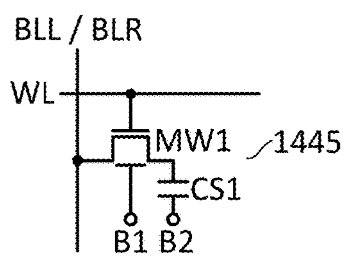

FIG. 28B illustrates a circuit configuration example of the memory cell 1445. The memory cell 1445 includes a transistor MW1, a capacitor CS1, and terminals B1 and B2. The transistor MW1 has a function of controlling the charging and discharging of the capacitor CS1. A gate of the transistor MW1 is electrically connected to the word line, a first terminal of the transistor MW1 is electrically connected to the bit line, and a second terminal of the transistor MW1 is electrically connected to a first terminal of the capacitor CS1. A second terminal of the capacitor CS1 is electrically connected to the terminal B2. A constant voltage (e.g., low power supply voltage) is applied to the terminal B2.

The transistor MW1 includes a back gate, and the back gate is electrically connected to the terminal B1. This makes it possible to change the threshold voltage of the transistor MW1 with a voltage applied to the terminal B1. For example, a fixed voltage (e.g., negative constant voltage) may be applied to the terminal B1; alternatively, the voltage applied to the terminal B1 may be changed in response to the operation of the DOSRAM 1400.

The back gate of the transistor MW1 may be electrically connected to the gate, the source, or the drain of the transistor MW1. Alternatively, the transistor MW1 does not necessarily include the back gate.

The sense amplifier array 1423 includes N local sense amplifier arrays 1426<0> to 1426<N−1>. The local sense amplifier array 1426 includes one switch array 1444 and a plurality of sense amplifiers 1446. A bit line pair is electrically connected to the sense amplifier 1446. The sense amplifier 1446 has a function of precharging the bit line pair, a function of amplifying a voltage difference of the bit line pair, and a function of retaining the voltage difference. The switch array 1444 has a function of selecting a bit line pair and electrically connecting the selected bit line pair and a global bit line pair to each other.

Here, two bit lines that are compared simultaneously by the sense amplifier are collectively referred to as the bit line pair. Two global bit lines that are compared simultaneously by the global sense amplifier are collectively referred to as the global bit line pair. The bit line pair can be referred to as a pair of bit lines, and the global bit line pair can be referred to as a pair of global bit lines. Here, a bit line BLL and a bit line BLR form one bit line pair. A global bit line GBLL and a global bit line GBLR form one global bit line pair. In the following description, the expressions "bit line pair (BLL, BLR)" and "global bit line pair (GBLL, GBLR)" are also used.

(Controller 1405)

The controller 1405 has a function of controlling the overall operation of the DOSRAM 1400. The controller 1405 has a function of performing logic operation on a command signal that is input from the outside and determining an operation mode, a function of generating control signals for the row circuit 1410 and the column circuit 1415 so that the determined operation mode is executed, a function of retaining an address signal that is input from the outside, and a function of generating an internal address signal.

(Row Circuit 1410)

The row circuit 1410 has a function of driving the MC-SA array 1420. The decoder 1411 has a function of decoding an address signal. The word line driver circuit 1412 generates a selection signal for selecting the word line WL of a row that is to be accessed.

The column selector 1413 and the sense amplifier driver circuit 1414 are circuits for driving the sense amplifier array 1423. The column selector 1413 has a function of generating a selection signal for selecting the bit line of a column that is to be accessed. The selection signal from the column selector 1413 controls the switch array 1444 of each local sense amplifier array 1426. The control signal from the sense amplifier driver circuit 1414 drives each of the plurality of local sense amplifier arrays 1426 independently.

(Column Circuit 1415)

The column circuit 1415 has a function of controlling the input of data signals WDA[31:0], and a function of controlling the output of data signals RDA[31:0]. The data signals WDA[31:0] are write data signals, and the data signals RDA[31:0] are read data signals.

The global sense amplifier 1447 is electrically connected to the global bit line pair (GBLL, GBLR). The global sense amplifier 1447 has a function of amplifying a voltage difference of the global bit line pair (GBLL, GBLR), and a function of retaining the voltage difference. Data are written to and read from the global bit line pair (GBLL, GBLR) by the input/output circuit 1417.

The write operation of the DOSRAM 1400 is briefly described. Data are written to the global bit line pair by the input/output circuit 1417. The data of the global bit line pair are retained by the global sense amplifier array 1416. By the switch array 1444 of the local sense amplifier array 1426 specified by the address signal, the data of the global bit line pair are written to the bit line pair of the column where data are to be written. The local sense amplifier array 1426 amplifies the written data, and then retains the amplified data. In the specified local memory cell array 1425, the word line WL of the row where data are to be written is selected by the row circuit 1410, and the data retained at the local sense amplifier array 1426 are written to the memory cell 1445 of the selected row.

The read operation of the DOSRAM 1400 is briefly described. One row of the local memory cell array 1425 is specified with the address signal. In the specified local memory cell array 1425, the word line WL of the row where data are to be read is selected, and data of the memory cell 1445 are written to the bit line. The local sense amplifier array 1426 detects a voltage difference between the bit line pair of each column as data, and retains the data. The switch array 1444 writes the data of a column specified by the address signal to the global bit line pair; the data are chosen from the data retained at the local sense amplifier array 1426. The global sense amplifier array 1416 determines and retains the data of the global bit line pair. The data retained at the global sense amplifier array 1416 are output to the input/output circuit 1417. Thus, the read operation is completed.

The DOSRAM 1400 has no limitations on the number of rewrites in principle and data can be read and written with low energy consumption, because data are rewritten by charging and discharging the capacitor CS1. Simple circuit configuration of the memory cell 1445 allows a high memory capacity.

The transistor MW1 is an OS transistor. The extremely low off-state current of the OS transistor can inhibit leakage of charge from the capacitor CS1. Therefore, the retention time of the DOSRAM 1400 is considerably longer than that of DRAM. This allows less frequent refresh, which can reduce power needed for refresh operations. For this reason, the DOSRAM 1400 used as the frame memory can reduce the power consumption of the display controller IC and the source driver IC.

Since the MC-SA array 1420 has a stacked-layer structure, the bit line can be shortened to a length that is close to the length of the local sense amplifier array 1426. A shorter bit line results in smaller bit line capacitance, which allows the storage capacitance of the memory cell 1445 to be reduced. In addition, providing the switch array 1444 in the local sense amplifier array 1426 allows the number of long bit lines to be reduced. For the reasons described above, a load to be driven during access to the DOSRAM 1400 is reduced, enabling a reduction in the energy consumption of the display controller IC and the source driver IC.

The structure described in this embodiment can be used in appropriate combination with any of the structures described in the other embodiments.

Embodiment 6

In this embodiment, a field-programmable gate array (FPGA) is described as an example of a semiconductor device in which a transistor whose semiconductor includes an oxide (OS transistor) of one embodiment of the present invention is used. In an FPGA of this embodiment, an OS memory is used for a configuration memory and a register. Here, such an FPGA is referred to as an "OS-FPGA".

The OS memory is a memory including at least a capacitor and an OS transistor that controls charge and discharge of the capacitor. The OS memory has excellent retention characteristics because the OS transistor has an extremely low off-state current and thus can function as a nonvolatile memory.

Figure 29A:
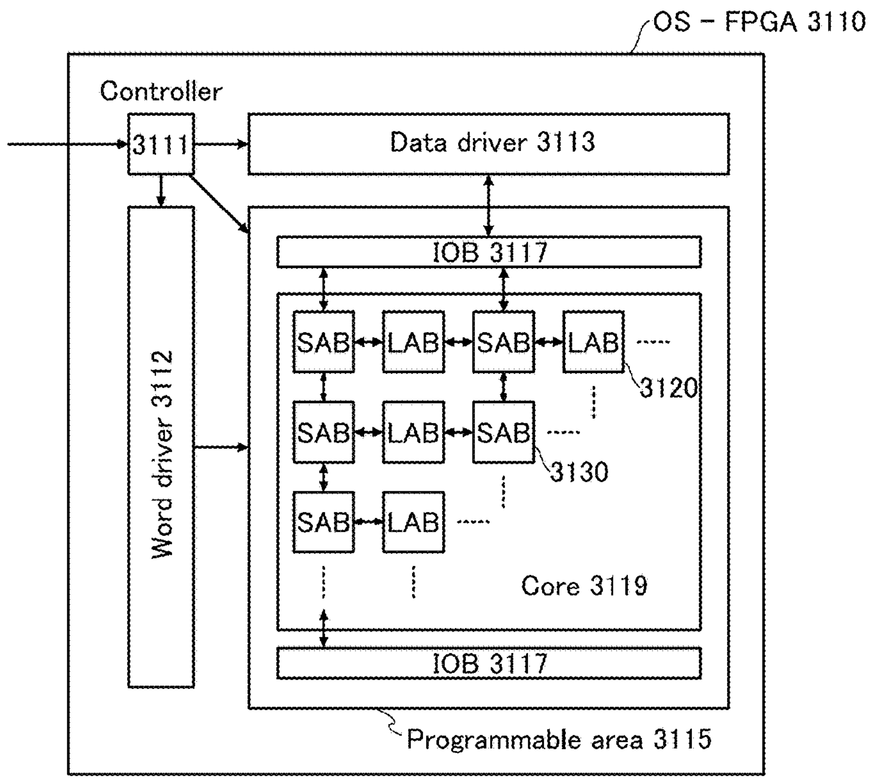
FIGS. 29A to 29C are block diagrams illustrating a structure example of a semiconductor device of one embodiment of the present invention.

FIG. 29A illustrates a configuration example of an OS-FPGA. An OS-FPGA 3110 illustrated in FIG. 29A is capable of normally-off computing for context switching by a multi-context configuration and fine-grained power gating in each PLE. The OS-FPGA 3110 includes a controller 3111, a word driver 3112, a data driver 3113, and a programmable area 3115.

Figure 29B:
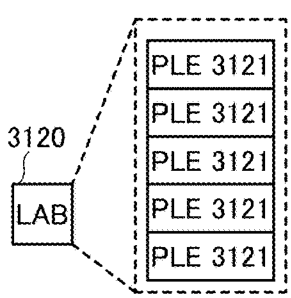
Figure 29C:
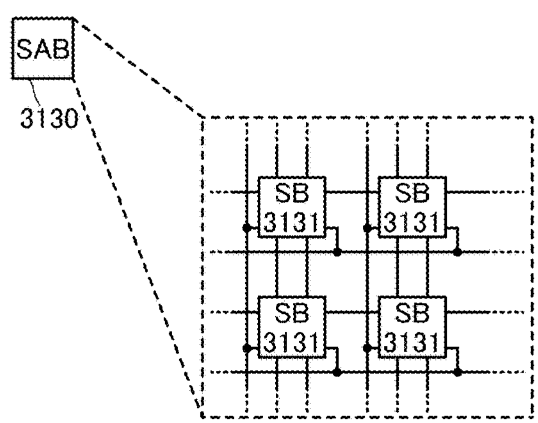

The programmable area 3115 includes two input/output blocks (IOBs) 3117 and a core 3119. The IOB 3117 includes a plurality of programmable input/output circuits. The core 3119 includes a plurality of logic array blocks (LABs) 3120 and a plurality of switch array blocks (SABs) 3130. The LAB 3120 includes a plurality of PLEs 3121. FIG. 29B illustrates an example in which the LAB 3120 includes five PLEs 3121. As illustrated in FIG. 29C, the SAB 3130 includes a plurality of switch blocks (SBs) 3131 arranged in array. The LAB 3120 is connected to the LABs 3120 in four directions (on the left, right, top, and bottom sides) through its input terminals and the SABs 3130.

Figure 30A:
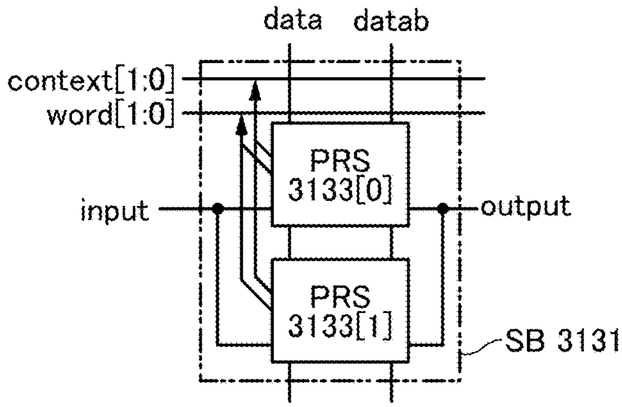
FIG. 30A is a block diagram illustrating a structure example of a semiconductor device of one embodiment of the present invention.

The SB 3131 is described with reference to FIGS. 30A to 30C. To the SB 3131 in FIG. 30A, data, datab, signals context[1:0], and signals word[1:0] are input. The data and the datab are configuration data, and the logics of the data and the datab are complementary to each other. The number of contexts in the OS-FPGA 3110 is two, and the signals context[1:0] are context selection signals. The signals word [1:0] are word line selection signals, and wirings to which the signals word[1:0] are input are each a word line.

The SB 3131 includes a programmable routing switch (PRS) 3133[0] and a PRS 3133[1]. The PRS 3133[0] and the PRS 3133[1] each include a configuration memory (CM) that can store complementary data. Note that in the case where the PRS 3133[0] and the PRS 3133[1] are not distinguished from each other, they are each referred to as a PRS 3133. The same applies to other elements.

Figure 30B:
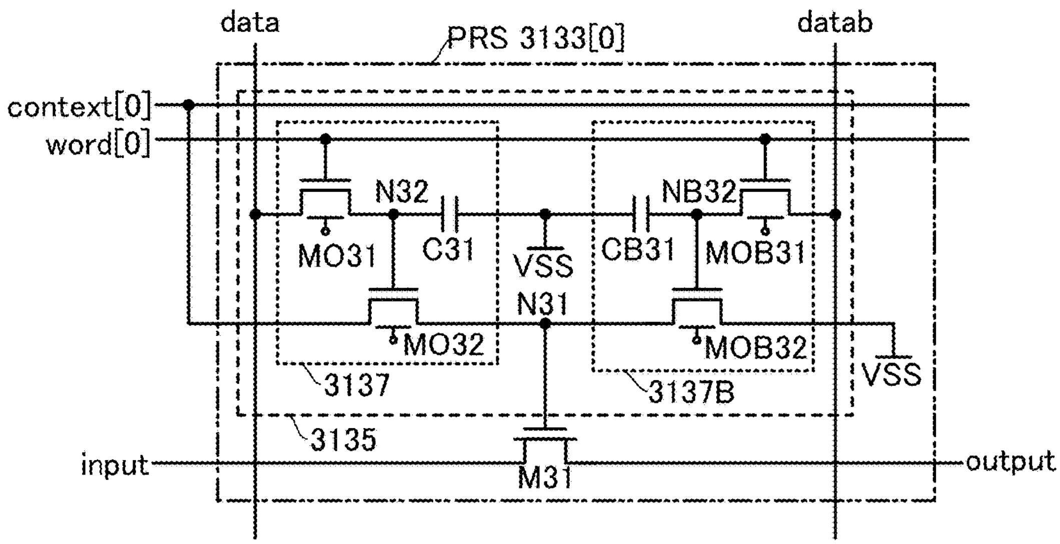
FIG. 30B is a circuit diagram of the semiconductor device.
Figure 30C:
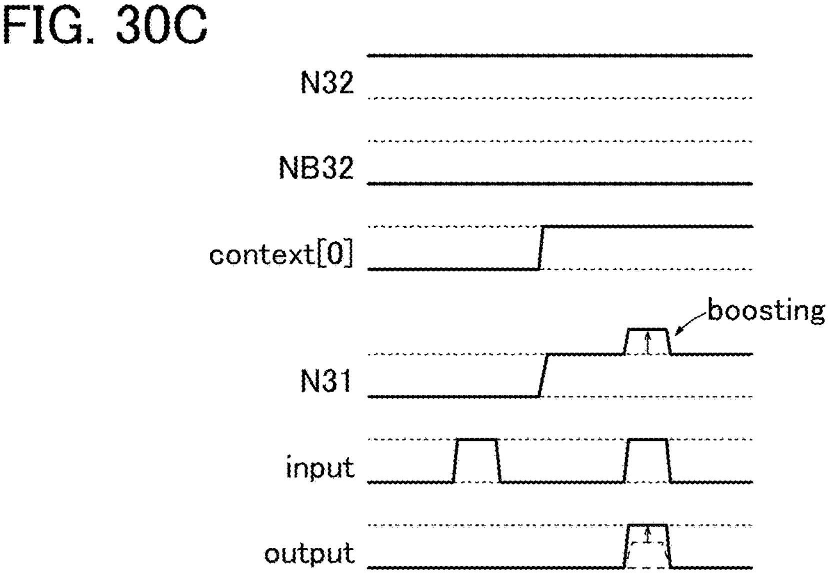
FIG. 30C is a timing chart showing an operation example of the semiconductor device.

FIG. 30B illustrates a circuit configuration example of the PRS 3133[0]. The PRS 3133[0] and the PRS 3133[1] have the same circuit configuration. The PRS 3133[0] and the PRS 3133[1] are different from each other in a context selection signal and a word line selection signal which are input. The signal context[0] and the signal word[0] are input to the PRS 3133[0], and the signal context[1] and the signal word[1] are input to the PRS 3133[1]. For example, in the SB 3131, when the signal context[0] is set to "H", the PRS 3133[0] is activated.

The PRS 3133[0] includes a CM 3135 and a Si transistor M31. The Si transistor M31 is a pass transistor that is controlled by the CM 3135. The CM 3135 includes a memory circuit 3137 and a memory circuit 3137B. The memory circuit 3137 and the memory circuit 3137B have the same circuit configuration. The memory circuit 3137 includes a capacitor C31, an OS transistor MO31, and an OS transistor MO32. The memory circuit 3137B includes a capacitor CB31, an OS transistor MOB31, and an OS transistor MOB32.

The OS transistors MO31, MO32, MOB31, and MOB32 each include a back gate, and these back gates are electrically connected to power supply lines that each apply a fixed voltage.

A gate of the Si transistor M31, a gate of the OS transistor MO32, and a gate of the OS transistor MOB32 correspond to a node N31, a node N32, and a node NB32, respectively. The node 32 and the node NB32 are each a charge retention node of the CM 3135. The OS transistor MO32 controls the conduction state between the node N31 and a signal line for the signal context[0]. The OS transistor MOB32 controls the conduction state between the node N31 and a low-potential power supply line VSS.

Data retained in the memory circuit 3137 and data retained in the memory circuit 3137B are complementary to each other. Thus, either the OS transistor MO32 or the OS transistor MOB32 is turned on.

The operation example of the PRS 3133[0] is described with reference to FIG. 30C. In the PRS 3133[0], in which configuration data has already been written, the node N32 of the PRS 3133[0] is at "H", whereas the node NB32 is at "L".

The PRS 3133[0] is inactivated while the signal context [0] is at "L". During this period, even when an input terminal of the PRS 3133[0] is transferred to "H", the gate of the Si transistor M31 is kept at "L" and an output terminal of the PRS 3133[0] is also kept at "L".

The PRS 3133[0] is activated while the signal context[0] is at "H". When the signal context[0] is transferred to "H", the gate of the Si transistor M31 is transferred to "H" by the configuration data stored in the CM 3135.

While the PRS 3133[0] is active, when the potential of the input terminal is changed to "H", the gate voltage of the Si transistor M31 is increased by boosting because the OS transistor MO32 of the memory circuit 3137 is a source follower. As a result, the OS transistor MO32 of the memory circuit 3137 loses the driving capability, and the gate of the Si transistor M31 is brought into a floating state.

In the PRS 3133 with a multi-context function, the CM 3135 also functions as a multiplexer.

Figure 31:
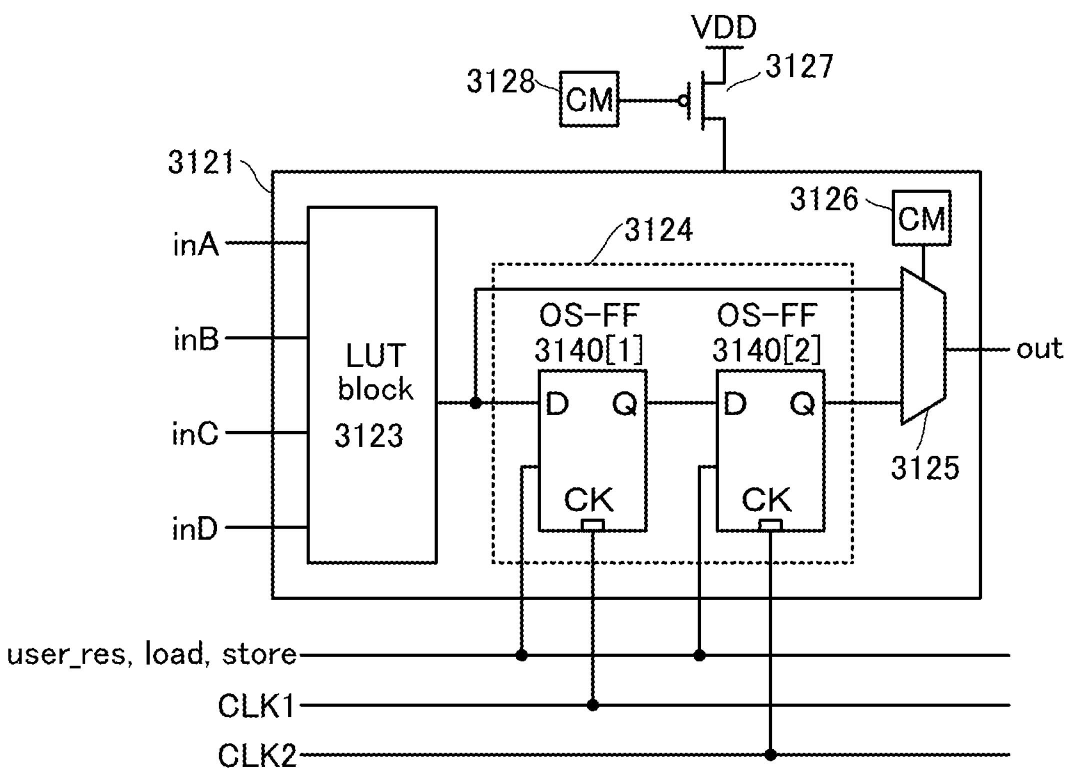
FIG. 31 is a block diagram illustrating a structure example of a semiconductor device of one embodiment of the present invention.

FIG. 31 illustrates a configuration example of the PLE 3121. The PLE 3121 includes a lookup table (LUT) block 3123, a register block 3124, a selector 3125, and a CM 3126. The LUT block 3123 is configured to multiplex an output of a pair of 16-bit CMs therein in accordance with inputs inA to inD. The selector 3125 selects an output of the LUT block 3123 or an output of the register block 3124 in accordance with the configuration stored in the CM 3126.

The PLE 3121 is electrically connected to a power supply line for a voltage VDD through a power switch 3127. Whether the power switch 3127 is turned on or off is determined in accordance with configuration data stored in a CM 3128. Fine-grained power gating can be performed by providing the power switch 3127 for each PLE 3121. The PLE 3121 which is not used after context switching can be power gated owing to the fine-grained power gating function; thus, standby power can be effectively reduced.

The register block 3124 is formed by nonvolatile registers to achieve normally-off computing. The nonvolatile registers in the PLE 3121 are each a flip-flop provided with an OS memory (hereinafter referred to as OS-FF).

Figure 32A:
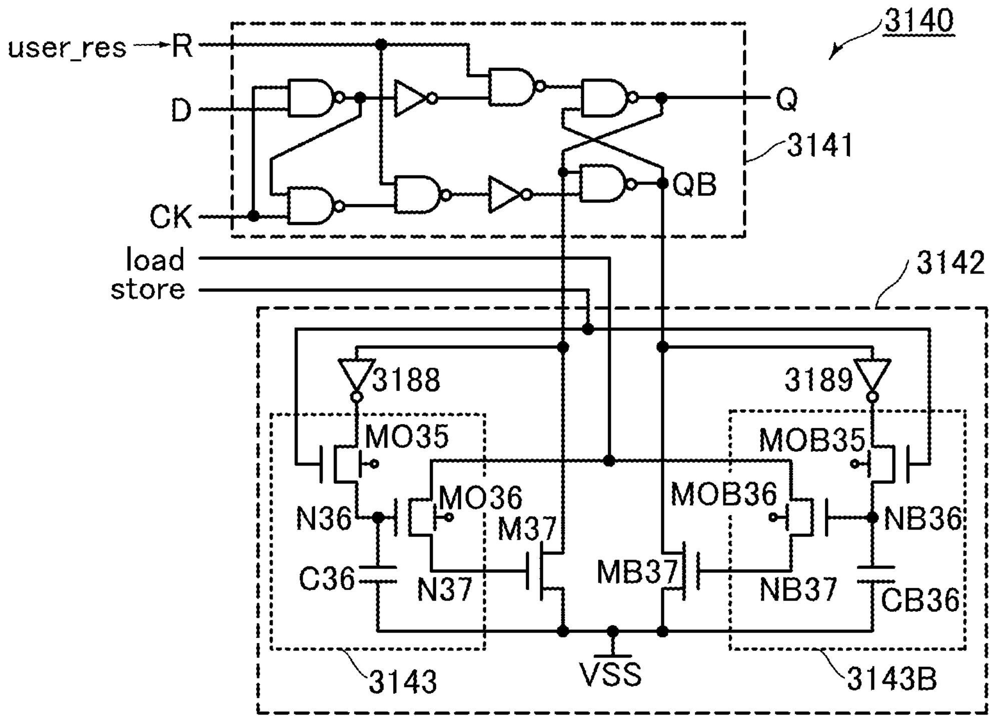
FIG. 32A is a circuit diagram illustrating a structure example of a semiconductor device of one embodiment of the present invention.

The register block 3124 includes an OS-FF 3140[1] and an OS-FF 3140[2]. A signal user_res, a signal load, and a signal store are input to the OS-FF 3140[1] and the OS-FF 3140[2]. A clock signal CLK1 is input to the OS-FF 3140[1] and a clock signal CLK2 is input to the OS-FF 3140[2]. FIG. 32A illustrates a configuration example of the OS-FF 3140.

The OS-FF 3140 includes a FF 3141 and a shadow register 3142. The FF 3141 includes a node CK, a node R, a node D, a node Q, and a node QB. A clock signal is input to the node CK. The signal user_res is input to the node R. The signal user_res is a reset signal. The node D is a data input node, and the node Q is a data output node. The logics of the node Q and the node QB are complementary to each other.

The shadow register 3142 can function as a backup circuit of the FF 3141. The shadow register 3142 backs up data of the node Q and data of the node QB in response to the signal store and writes back the backed-up data to the node Q and the node QB in response to the signal load.

The shadow register 3142 includes an inverter circuit 3188, an inverter circuit 3189, a Si transistor M37, a Si transistor MB37, a memory circuit 3143, and a memory circuit 3143B. The memory circuit 3143 and the memory circuit 3143B each have the same circuit configuration as the memory circuit 3137 of the PRS 3133. The memory circuit 3143 includes a capacitor C36, an OS transistor MO35, and an OS transistor MO36. The memory circuit 3143B includes a capacitor CB36, an OS transistor MOB35, and an OS transistor MOB36. A node N36 and a node NB36 correspond to a gate of the OS transistor MO36 and a gate of the OS transistor MOB36, respectively, and are each a charge retention node. A node N37 and a node NB37 correspond to a gate of the Si transistor M37 and a gate of the Si transistor MB37, respectively.

The OS transistors MO35, MO36, MOB35, and MOB36 each include a back gate, and these back gates are electrically connected to power supply lines that each apply a fixed voltage.

Figure 32B:
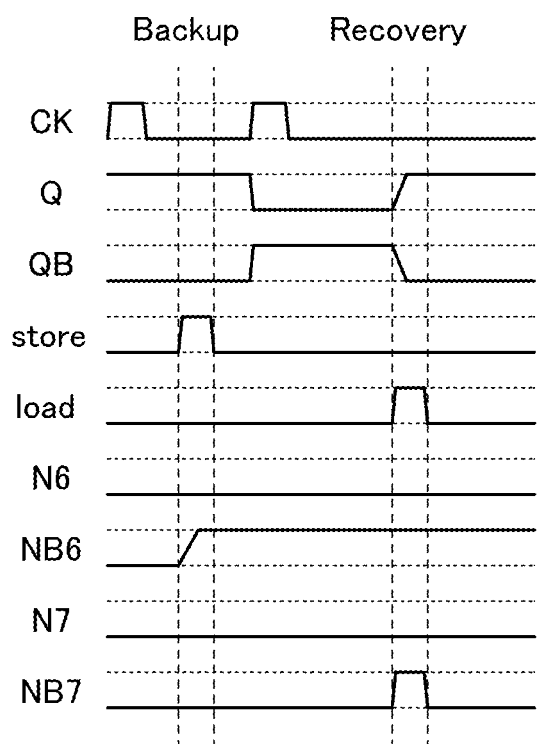
FIG. 32B is a timing chart showing an operation example of the semiconductor device.

An example of an operation method of the OS-FF 3140 is described with reference to FIG. 32B.

(Backup)

When the signal store at "H" is input to the OS-FF 3140, the shadow register 3142 backs up data of the FF 3141. The node N36 shifts to "L" when the data of the node Q is written thereto, and the node NB36 shifts to "H" when the data of the node QB is written thereto. After that, power gating is performed and the power switch 3127 is turned off. Although the data of the node Q and the data of the node QB of the FF 3141 are lost, the shadow register 3142 retains the backed-up data even when power supply is stopped.

(Recovery)

The power switch 3127 is turned on to supply power to the PLE 3121. After that, when the signal load at "H" is input to the OS-FF 3140, the shadow register 3142 writes back the backed-up data to the FF 3141. The node N37 is kept at "L" because the node N36 is at "L", and the node NB37 shifts to "H" because the node NB36 is at "H". Thus, the node Q shifts to "H" and the node QB shifts to "L". That is, the OS-FF 3140 is restored to a state at the backup operation.

A combination of the fine-grained power gating and backup/recovery operation of the OS-FF 3140 allows power consumption of the OS-FPGA 3110 to be effectively reduced.

A possible error in a memory circuit is a soft error due to the entry of radiation. The soft error is a phenomenon in which a malfunction such as inversion of data stored in a memory is caused by electron-hole pair generation when a transistor is irradiated with at rays emitted from a material of a memory or a package or the like, secondary cosmic ray neutrons generated by nuclear reaction of primary cosmic rays entering the Earth's atmosphere from outer space with nuclei of atoms existing in the atmosphere, or the like. An OS memory including an OS transistor has a high soft-error tolerance. Therefore, the OS-FPGA 3110 including an OS memory can have high reliability.

The structure described in this embodiment can be used in appropriate combination with any of the structures described in the other embodiments.

Embodiment 7

In this embodiment, an example of a CPU including the semiconductor device of one embodiment of the present invention, such as the above-described memory device, is described.

<Configuration of CPU>

Figure 33:
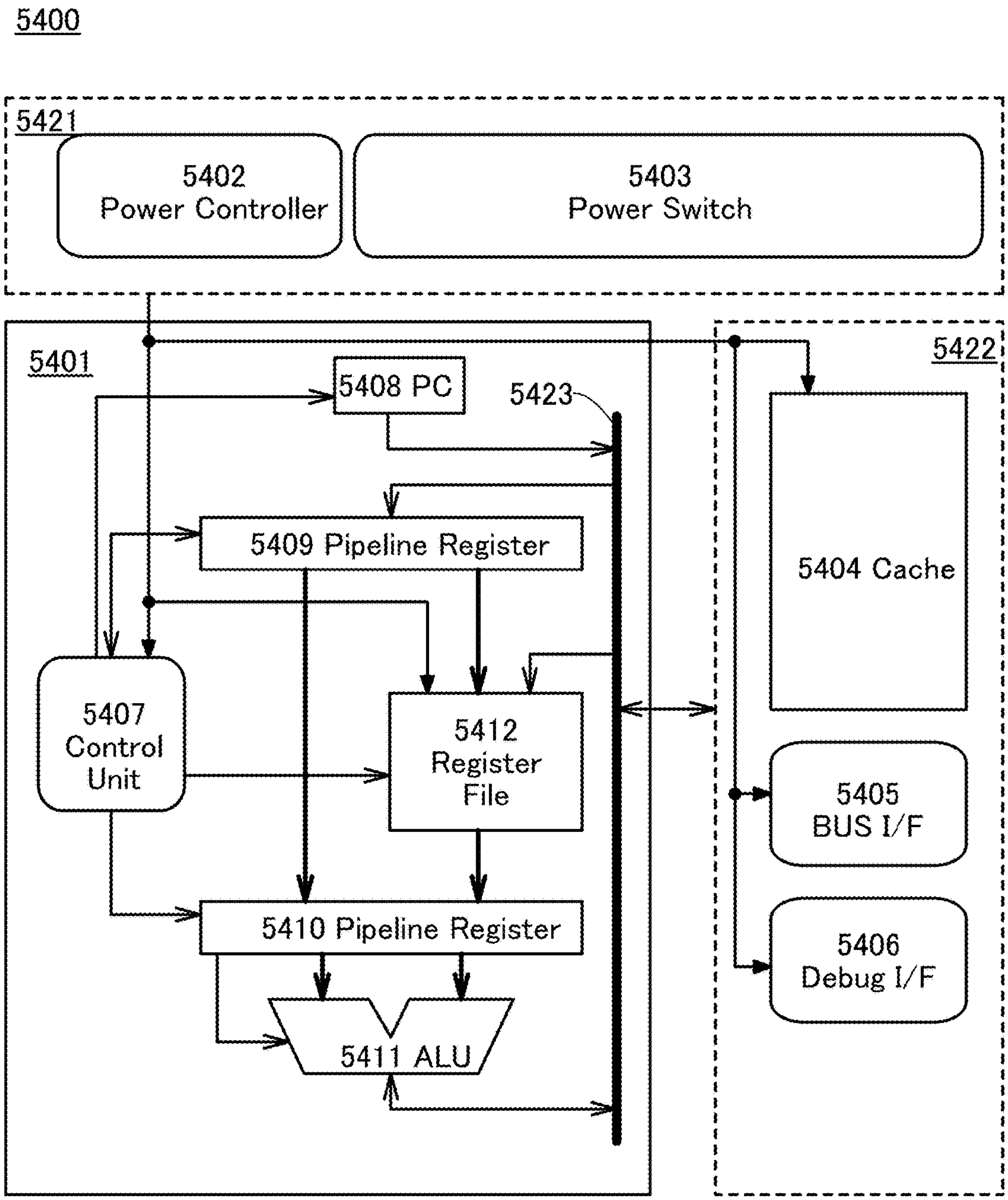
FIG. 33 is a block diagram illustrating a semiconductor device of one embodiment of the present invention.

A semiconductor device 5400 shown in FIG. 33 includes a CPU core 5401, a power management unit 5421, and a peripheral circuit 5422. The power management unit 5421 includes a power controller 5402 and a power switch 5403. The peripheral circuit 5422 includes a cache 5404 including a cache memory, a bus interface (BUS I/F) 5405, and a debug interface (Debug I/F) 5406. The CPU core 5401 includes a data bus 5423, a control unit 5407, a PC (program counter) 5408, a pipeline register 5409, a pipeline register 5410, an ALU (arithmetic logic unit) 5411, and a register file 5412. Data is transmitted between the CPU core 5401 and the peripheral circuit 5422 such as the cache 5404 via the data bus 5423.

The semiconductor device (cell) can be used for many logic circuits typified by the power controller 5402 and the control unit 5407, particularly for all logic circuits that can be constituted using standard cells. Accordingly, the semiconductor device 5400 can be small. The semiconductor device 5400 can have reduced power consumption. The semiconductor device 5400 can have a higher operating speed. The semiconductor device 5400 can have a smaller power supply voltage variation.

When p-channel Si transistors and the transistor described in the above embodiment which includes an oxide semiconductor (preferably an oxide containing In, Ga, and Zn) in a channel formation region are used in the semiconductor device (cell) and the semiconductor device (cell) is used in the semiconductor device 5400, the semiconductor device 5400 can be small. The semiconductor device 5400 can have reduced power consumption. The semiconductor device 5400 can have a higher operating speed. Particularly when the Si transistors are only p-channel ones, the manufacturing cost can be reduced.

The control unit 5407 has functions of decoding and executing instructions contained in a program such as input applications by controlling the overall operations of the PC 5408, the pipeline registers 5409 and 5410, the ALU 5411, the register file 5412, the cache 5404, the bus interface 5405, the debug interface 5406, and the power controller 5402.

The ALU 5411 has a function of performing a variety of arithmetic operations such as four arithmetic operations and logic operations.

The cache 5404 has a function of temporarily storing frequently used data. The PC 5408 is a register having a function of storing an address of an instruction to be executed next. Note that although not shown in FIG. 33, the cache 5404 is provided with a cache controller for controlling the operation of the cache memory.

The pipeline register 5409 has a function of temporarily storing instruction data.

The register file 5412 includes a plurality of registers including a general purpose register and can store data that is read from the main memory, data obtained as a result of arithmetic operations in the ALU 5411, or the like.

The pipeline register 5410 has a function of temporarily storing data used for arithmetic operations of the ALU 5411, data obtained as a result of arithmetic operations of the ALU 5411, or the like.

The bus interface 5405 has a function of a path for data between the semiconductor device 5400 and various devices outside the semiconductor device 5400. The debug interface 5406 has a function of a path of a signal for inputting an instruction to control debugging to the semiconductor device 5400.

The power switch 5403 has a function of controlling application of a power supply voltage to various circuits included in the semiconductor device 5400 other than the power controller 5402. The above various circuits belong to several different power domains. The power switch 5403 controls whether the power supply voltage is applied to the various circuits in the same power domain. In addition, the power controller 5402 has a function of controlling the operation of the power switch 5403.

The semiconductor device 5400 having the above structure is capable of performing power gating. A description is given of an example of the power gating operation sequence.

First, by the CPU core 5401, timing for stopping the application of the power supply voltage is set in a register of the power controller 5402. Then, an instruction to start power gating is sent from the CPU core 5401 to the power controller 5402. Then, various registers and the cache 5404 included in the semiconductor device 5400 start data saving. Then, the power switch 5403 stops the application of a power supply voltage to the various circuits included in the semiconductor device 5400 other than the power controller 5402. Then, an interrupt signal is input to the power controller 5402, whereby the application of the power supply voltage to the various circuits included in the semiconductor device 5400 is started. Note that a counter may be provided in the power controller 5402 to be used to determine the timing of starting the application of the power supply voltage regardless of input of an interrupt signal. Next, the various registers and the cache 5404 start data restoration. Then, execution of an instruction is resumed in the control unit 5407.

Such power gating can be performed in the whole processor or one or a plurality of logic circuits included in the processor. Furthermore, power supply can be stopped even for a short time. Consequently, power consumption can be reduced at a fine spatial or temporal granularity.

In performing power gating, data held by the CPU core 5401 or the peripheral circuit 5422 is preferably saved in a short time. In that case, the power can be turned on or off in a short time, and an effect of saving power becomes significant.

In order that the data held by the CPU core 5401 or the peripheral circuit 5422 be saved in a short time, the data is preferably saved in a flip-flop circuit itself (referred to as a flip-flop circuit capable of backup operation). Furthermore, the data is preferably saved in an SRAM cell itself (referred to as an SRAM cell capable of backup operation). The flip-flop circuit and SRAM cell which are capable of backup operation preferably include transistors including an oxide semiconductor (preferably an oxide containing In, Ga, and Zn) in a channel formation region. Consequently, the transistor has a low off-state current; thus, the flip-flop circuit and SRAM cell which are capable of backup operation can retain data for a long time without power supply. When the transistor has a high switching speed, the flip-flop circuit and SRAM cell which are capable of backup operation can save and restore data in a short time in some cases.

An example of the flip-flop circuit capable of backup operation is described with reference to FIG. 34.

Figure 34:
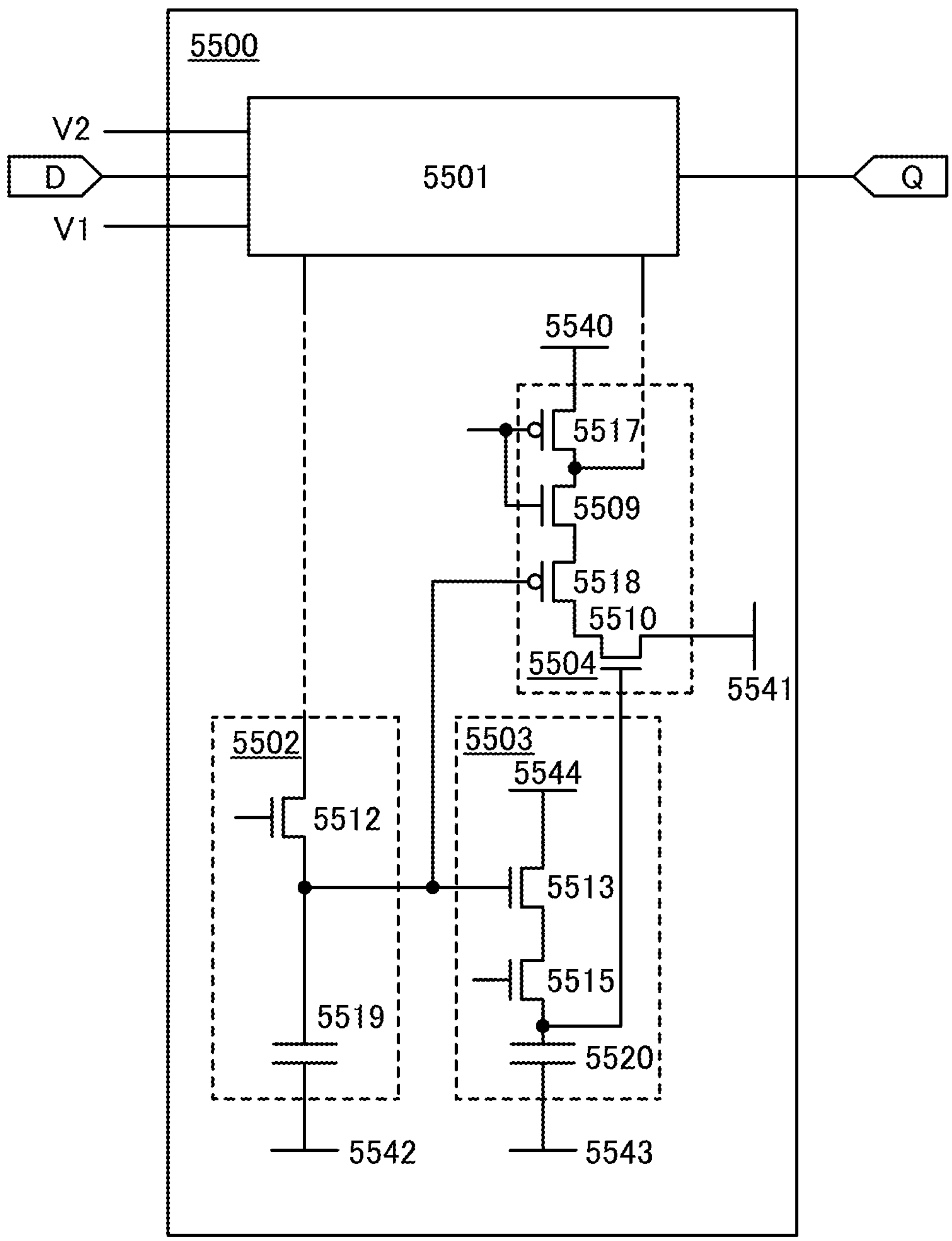
FIG. 34 is a circuit diagram illustrating a semiconductor device of one embodiment of the present invention.

A semiconductor device 5500 shown in FIG. 34 is an example of the flip-flop circuit capable of backup operation. The semiconductor device 5500 includes a first memory circuit 5501, a second memory circuit 5502, a third memory circuit 5503, and a read circuit 5504. As a power supply voltage, a potential difference between a potential V1 and a potential V2 is applied to the semiconductor device 5500. One of the potential V1 and the potential V2 is at a high level, and the other is at a low level. An example of the configuration of the semiconductor device 5500 when the potential V1 is at a low level and the potential V2 is at a high level is described below.

The first memory circuit 5501 has a function of retaining data when a signal D including the data is input in a period during which the power supply voltage is applied to the semiconductor device 5500. Furthermore, the first memory circuit 5501 outputs a signal Q including the retained data in the period during which the power supply voltage is applied to the semiconductor device 5500. On the other hand, the first memory circuit 5501 cannot retain data in a period during which the power supply voltage is not applied to the semiconductor device 5500. That is, the first memory circuit 5501 can be referred to as a volatile memory circuit.

The second memory circuit 5502 has a function of reading the data held in the first memory circuit 5501 to store (or save) it. The third memory circuit 5503 has a function of reading the data held in the second memory circuit 5502 to store (or save) it. The read circuit 5504 has a function of reading the data held in the second memory circuit 5502 or the third memory circuit 5503 to store (or restore) it in the first memory circuit 5501.

In particular, the third memory circuit 5503 has a function of reading the data held in the second memory circuit 5502 to store (or save) it even in the period during which the power supply voltage is not applied to the semiconductor device 5500.

As shown in FIG. 34, the second memory circuit 5502 includes a transistor 5512 and a capacitor 5519. The third memory circuit 5503 includes a transistor 5513, a transistor 5515, and a capacitor 5520. The read circuit 5504 includes a transistor 5510, a transistor 5518, a transistor 5509, and a transistor 5517.

The transistor 5512 has a function of charging and discharging the capacitor 5519 in accordance with data held in the first memory circuit 5501. The transistor 5512 is desirably capable of charging and discharging the capacitor 5519 at a high speed in accordance with data held in the first memory circuit 5501. Specifically, the transistor 5512 desirably contains crystalline silicon (preferably polycrystalline silicon, further preferably single crystal silicon) in a channel formation region.

The conduction state or the non-conduction state of the transistor 5513 is determined in accordance with the charge held in the capacitor 5519. The transistor 5515 has a function of charging and discharging the capacitor 5520 in accordance with the potential of a wiring 5544 when the transistor 5513 is in a conduction state. It is desirable that the off-state current of the transistor 5515 be extremely low. Specifically, the transistor 5515 desirably contains an oxide semiconductor (preferably an oxide containing In, Ga, and Zn) in a channel formation region.

Specific connection relations between the elements are described. One of a source and a drain of the transistor 5512 is connected to the first memory circuit 5501. The other of the source and the drain of the transistor 5512 is connected to one electrode of the capacitor 5519, a gate of the transistor 5513, and a gate of the transistor 5518. The other electrode of the capacitor 5519 is connected to a wiring 5542. One of a source and a drain of the transistor 5513 is connected to the wiring 5544. The other of the source and the drain of the transistor 5513 is connected to one of a source and a drain of the transistor 5515. The other of the source and the drain of the transistor 5515 is connected to one electrode of the capacitor 5520 and a gate of the transistor 5510. The other electrode of the capacitor 5520 is connected to a wiring 5543. One of a source and a drain of the transistor 5510 is connected to a wiring 5541. The other of the source and the drain of the transistor 5510 is connected to one of a source and a drain of the transistor 5518. The other of the source and the drain of the transistor 5518 is connected to one of a source and a drain of the transistor 5509. The other of the source and the drain of the transistor 5509 is connected to one of a source and a drain of the transistor 5517 and the first memory circuit 5501. The other of the source and the drain of the transistor 5517 is connected to a wiring 5540. Although a gate of the transistor 5509 is connected to a gate of the transistor 5517 in FIG. 34, the gate of the transistor 5509 is not necessarily connected to the gate of the transistor 5517.

The transistor described in the above embodiment as an example can be used as the transistor 5515. Because of the low off-state current of the transistor 5515, the semiconductor device 5500 can retain data for a long time without power supply. The favorable switching characteristics of the transistor 5515 allow the semiconductor device 5500 to perform high-speed backup and recovery.

The structure described in this embodiment can be used in appropriate combination with any of the structures described in the other embodiments.

Embodiment 8

In this embodiment, one mode of a semiconductor device of one embodiment of the present invention is described with reference to FIGS. 35A and 35B and FIGS. 36A and 36B.

<Semiconductor Wafer and Chip>

Figure 35A:
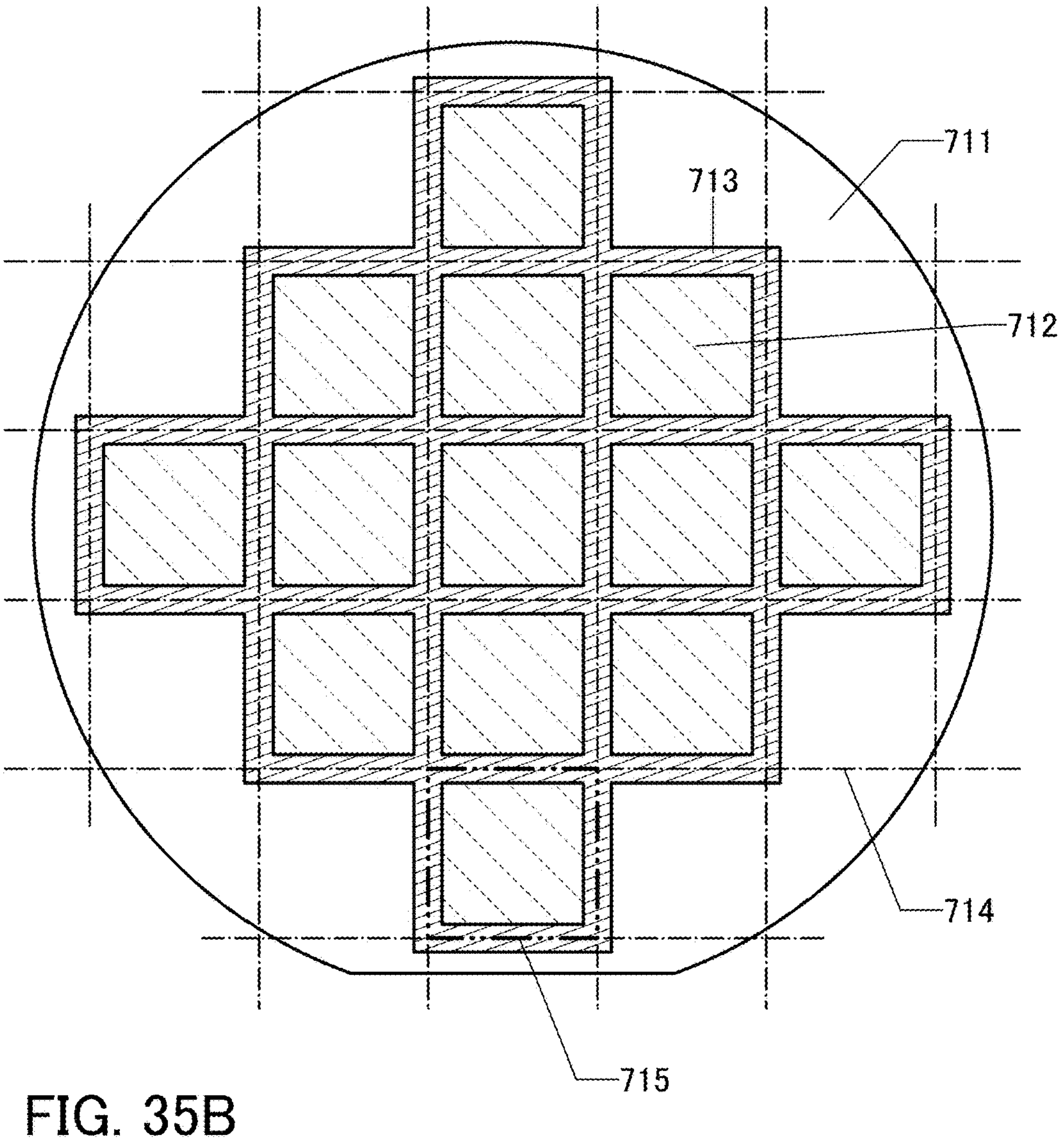
FIGS. 35A and 35B are top views of a semiconductor wafer of one embodiment of the present invention.

FIG. 35A is a top view of a substrate 711 before dicing treatment. As the substrate 711, a semiconductor substrate (also referred to as a "semiconductor wafer") can be used, for example. A plurality of circuit regions 712 are provided over the substrate 711. A semiconductor device of one embodiment of the present invention or the like can be provided in the circuit region 712.

Figure 35B:
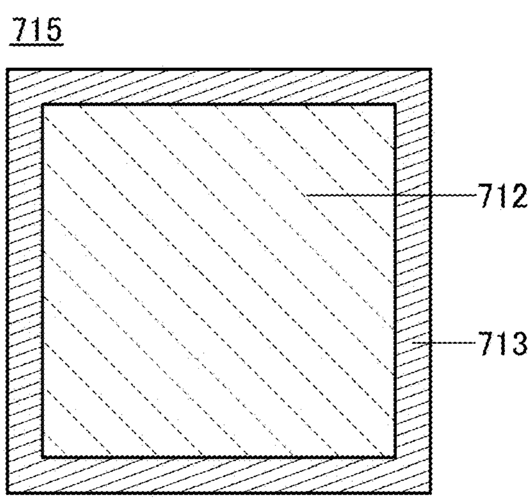

Each of the circuit regions 712 is surrounded by a separation region 713. Separation lines (also referred to as "dicing lines") 714 are set at a position overlapping with the separation regions 713. The substrate 711 can be cut along the separation lines 714 into chips 715 including the circuit regions 712. FIG. 35B is an enlarged view of the chip 715.

A conductive layer, a semiconductor layer, or the like may be provided in the separation regions 713. Providing a conductive layer, a semiconductor layer, or the like in the separation regions 713 relieves ESD that might be caused in a dicing step, preventing a decrease in the yield of the dicing step. A dicing step is generally performed while pure water whose specific resistance is decreased by dissolution of a carbonic acid gas or the like is supplied to a cut portion, in order to cool down the substrate, remove swarf, and prevent electrification, for example. Providing a conductive layer, a semiconductor layer, or the like in the separation regions 713 allows a reduction in the usage of the pure water. Thus, the cost of manufacturing semiconductor devices can be reduced. In addition, semiconductor devices can be manufactured with improved productivity.

<Electronic Component>

Figure 36A:
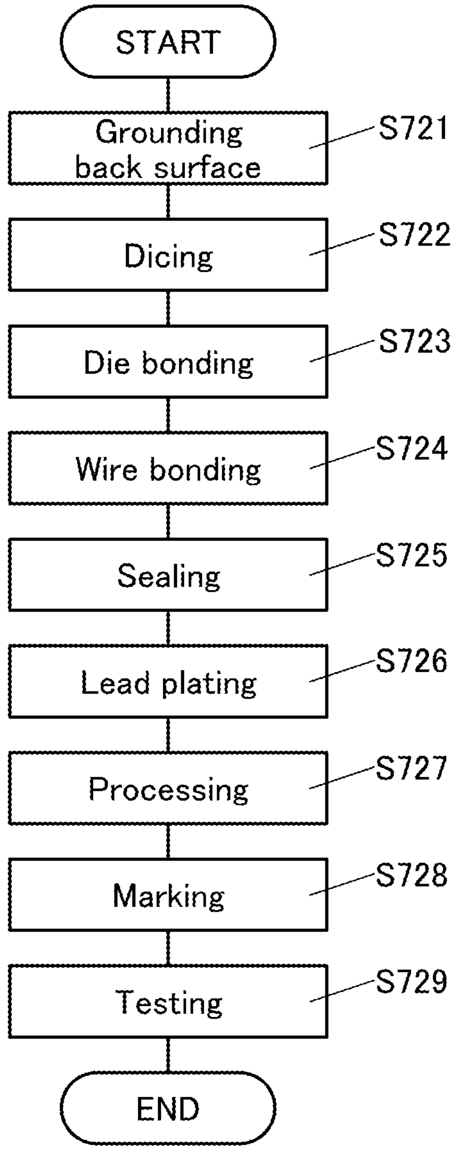
FIGS. 36A and 36B are a flow chart showing an example of steps for manufacturing electronic components and a schematic perspective view thereof.

An example of an electronic component using the chip 715 is described with reference to FIGS. 36A and 36B. Note that an electronic component is also referred to as a semiconductor package or an IC package. For electronic components, there are various standards, names, and the like in accordance with the direction in which terminals are extracted, the shapes of terminals, and the like.

The electronic component is completed when the semiconductor device described in any of the above embodiments is combined with components other than the semiconductor device in an assembly process (post-process).

The post-process is described with reference to a flow chart in FIG. 36A. After the semiconductor device of one embodiment of the present invention and the like are formed over the substrate 711 in a pre-process, a back surface grinding step in which the back surface (the surface where a semiconductor device and the like are not formed) of the substrate 711 is ground is performed (Step S721). When the substrate 711 is thinned by grinding, the size of the electronic component can be reduced.

Next, the substrate 711 is divided into a plurality of chips 715 in a dicing step (Step S722). Then, the divided chips 715 are individually bonded to a lead frame in a die bonding step (Step S723). To bond the chip 715 and a lead frame in the die bonding step, a method such as resin bonding or tape-automated bonding is selected as appropriate depending on products. Note that the chip 715 may be bonded to an interposer substrate instead of the lead frame.

Next, a wire bonding step for electrically connecting a lead of the lead frame and an electrode on the chip 715 through a metal wire is performed (Step S724). As the metal wire, a silver wire, a gold wire, or the like can be used. For example, ball bonding or wedge bonding can be used as the wire bonding.

The wire-bonded chip 715 is subjected to a sealing step (molding step) of sealing the chip with an epoxy resin or the like (Step S725). Through the sealing step, the inside of the electronic component is filled with a resin, so that a wire for connecting the chip 715 to the lead can be protected from external mechanical force, and deterioration of characteristics (decrease in reliability) due to moisture or dust can be reduced.

Subsequently, the lead of the lead frame is plated in a lead plating step (Step S726). Through the plating process, corrosion of the lead can be prevented, and soldering for mounting the electronic component on a printed circuit board in a later step can be performed with higher reliability. Then, the lead is cut and processed in a formation step (Step S727).

Next, a printing (marking) step is performed on a surface of the package (Step S728). After a testing step (Step S729) for checking whether an external shape is good and whether there is malfunction, for example, the electronic component is completed.

Figure 36B:
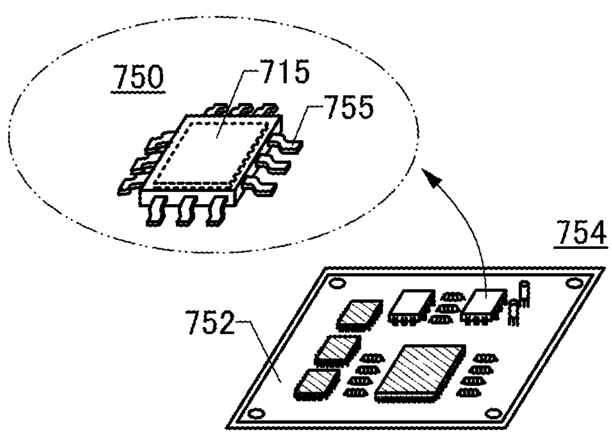

FIG. 36B is a perspective schematic diagram of a completed electronic component. FIG. 36B shows a perspective schematic diagram of a quad flat package (QFP) as an example of an electronic component. An electronic component 750 in FIG. 36B includes a lead 755 and the chip 715. The electronic component 750 may include multiple chips 715.

The electronic component 750 in FIG. 36B is mounted on a printed circuit board 752, for example. A plurality of electronic components 750 are combined and electrically connected to each other over the printed circuit board 752; thus, a circuit board on which the electronic components are mounted (a circuit board 754) is completed. The completed circuit board 754 is provided in an electronic device or the like.

Embodiment 9

<Electronic Device>

A semiconductor device of one embodiment of the present invention can be used for a variety of electronic devices. FIGS. 37A to 37F each illustrate a specific example of an electronic device including the semiconductor device of one embodiment of the present invention.

Figure 37A:
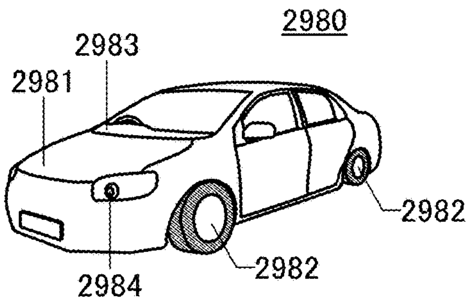
FIGS. 37A to 37F are diagrams each illustrating an electronic device of one embodiment of the present invention.

FIG. 37A is an external view illustrating an example of a car. A car 2980 includes a car body 2981, wheels 2982, a dashboard 2983, lights 2984, and the like. The car 2980 also includes an antenna, a battery, and the like.

Figure 37B:
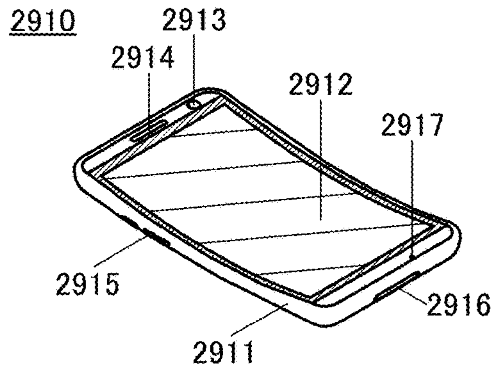

An information terminal 2910 illustrated in FIG. 37B includes a housing 2911, a display portion 2912, a microphone 2917, a speaker portion 2914, a camera 2913, an external connection portion 2916, an operation switch 2915, and the like. A display panel and a touch screen that use a flexible substrate are provided in the display portion 2912. The information terminal 2910 also includes an antenna, a battery, and the like inside the housing 2911. The information terminal 2910 can be used as, for example, a smartphone, a mobile phone, a tablet information terminal, a tablet personal computer, or an e-book reader.

Figure 37C:
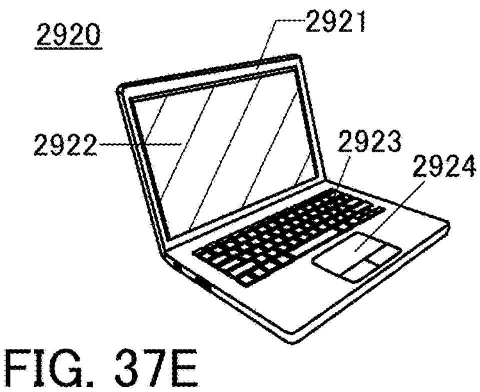

A notebook personal computer 2920 illustrated in FIG. 37C includes a housing 2921, a display portion 2922, a keyboard 2923, a pointing device 2924, and the like. The notebook personal computer 2920 also includes an antenna, a battery, and the like inside the housing 2921.

Figure 37D:
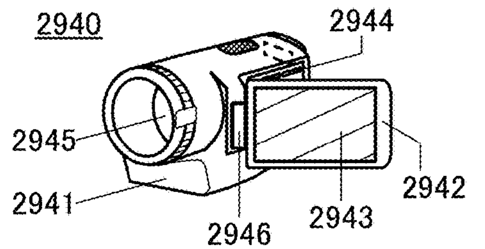

A video camera 2940 illustrated in FIG. 37D includes a housing 2941, a housing 2942, a display portion 2943, operation switches 2944, a lens 2945, a joint 2946, and the like. The operation switches 2944 and the lens 2945 are provided on the housing 2941, and the display portion 2943 is provided on the housing 2942. The video camera 2940 also includes an antenna, a battery, and the like inside the housing 2941. The housing 2941 and the housing 2942 are connected to each other with the joint 2946, and the angle between the housing 2941 and the housing 2942 can be changed with the joint 2946. By changing the angle between the housings 2941 and 2942, the orientation of an image displayed on the display portion 2943 can be changed or display and non-display of an image can be switched.

Figure 37E:
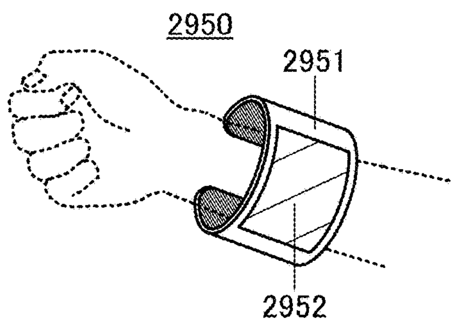

FIG. 37E illustrates an example of a bangle-type information terminal. An information terminal 2950 includes a housing 2951, a display portion 2952, and the like. The information terminal 2950 also includes an antenna, a battery, and the like inside the housing 2951. The display portion 2952 is supported by the housing 2951 having a curved surface. A display panel with a flexible substrate is provided in the display portion 2952, so that the information terminal 2950 can be a user-friendly information terminal that is flexible and lightweight.

Figure 37F:
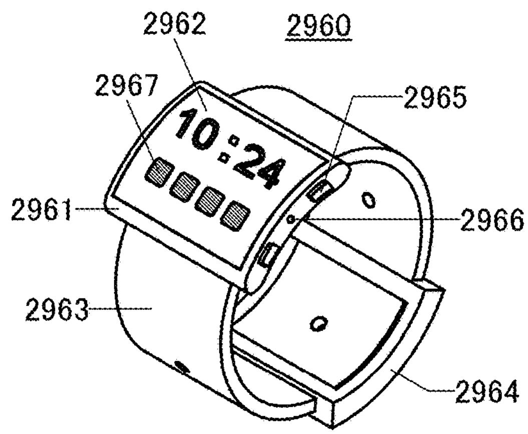

FIG. 37F illustrates an example of a watch-type information terminal. An information terminal 2960 includes a housing 2961, a display portion 2962, a band 2963, a buckle 2964, an operation switch 2965, an input/output terminal 2966, and the like. The information terminal 2960 also includes an antenna, a battery, and the like inside the housing 2961. The information terminal 2960 is capable of executing a variety of applications such as mobile phone calls, e-mailing, text viewing and editing, music reproduction, Internet communication, and computer games.

The display surface of the display portion 2962 is curved, and images can be displayed on the curved display surface. Furthermore, the display portion 2962 includes a touch sensor, and operation can be performed by touching the screen with a finger, a stylus, or the like. For example, an application can be started by touching an icon 2967 displayed on the display portion 2962. With the operation switch 2965, a variety of functions such as time setting, ON/OFF of the power, ON/OFF of wireless communication, setting and cancellation of a silent mode, and setting and cancellation of a power saving mode can be performed. The functions of the operation switch 2965 can be set by setting the operating system incorporated in the information terminal 2960, for example.

The information terminal 2960 can employ near field communication that is a communication method based on an existing communication standard. In that case, for example, mutual communication between the information terminal 2960 and a headset capable of wireless communication can be performed, and thus hands-free calling is possible. Moreover, the information terminal 2960 includes the input/output terminal 2966, and data can be directly transmitted to and received from another information terminal via a connector. Power charging through the input/output terminal 2966 is also possible. The charging operation may be performed by wireless power feeding without using the input/output terminal 2966.

A memory device including the semiconductor device of one embodiment of the present invention, for example, can hold control data, a control program, or the like of the above electronic device for a long time. With the use of the semiconductor device of one embodiment of the present invention, a highly reliable electronic device can be provided.

This embodiment can be implemented in an appropriate combination with any of the structures described in the other embodiments and Examples.

Example 1

Figure 38A:
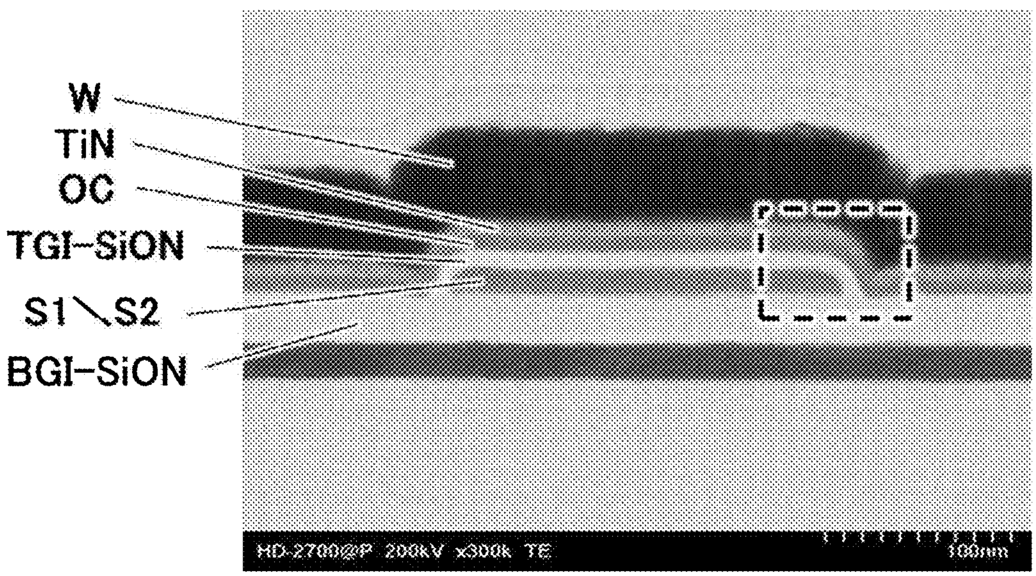
FIGS. 38A and 38B are cross-sectional STEM images of a transistor in Example.
Figure 38B:
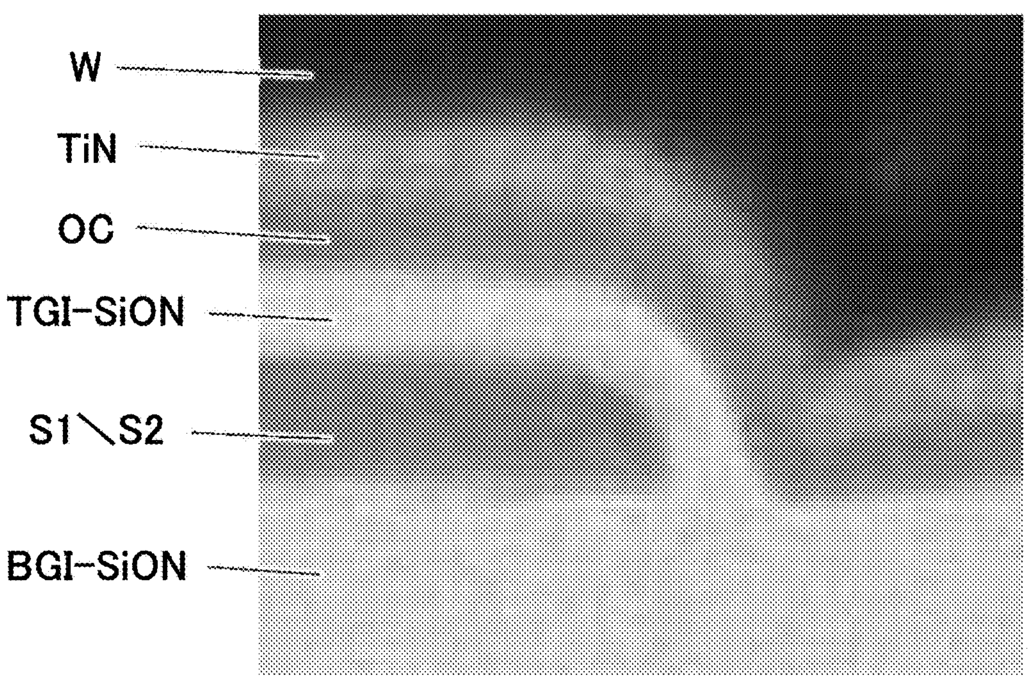

In this example, a transistor including an oxide that has the same structure as the transistor of one embodiment of the present invention was fabricated and observed with a scanning transmission electron microscope (STEM), and a cross-sectional STEM image of the transistor shown in FIGS. 38A and 38B was taken. The transistor fabricated in this example has a channel length of 0.29 μm and a channel width of 0.23 μm. The structure of the transistor is described in detail below.

In the transistor fabricated in this example, a p-type single crystal silicon wafer was used as a substrate. A 400-nm-thick thermal oxide film was formed over the substrate, a 40-nm-thick aluminum oxide film was formed over the thermal oxide film, and a 160-nm-thick silicon oxynitride film was formed over the aluminum oxide film. An opening was formed in the silicon oxynitride film, and a 40-nm-thick tantalum nitride film, a 5-nm-thick titanium nitride film, and a 105-nm-thick tungsten film were stacked in this order to be embedded in the opening. The stacked films function as a back gate of the transistor.

A 10-nm-thick silicon oxynitride film, a 20-nm-thick hafnium oxide film, and a 30-nm-thick silicon oxynitride film (denoted by BGI-SiON in FIGS. 38A and 38B) were stacked in this order over the tungsten film. The stacked films function as a gate insulating film for the back gate of the transistor.

A 5-nm-thick In—Ga—Zn oxide film (hereinafter referred to as a first oxide film) was formed over the 30-nm-thick silicon oxynitride film. The first oxide film was formed by a DC sputtering method using a target having an atomic ratio of In:Ga:Zn=1:3:4 under the following conditions: the oxygen gas flow rate was 45 sccm, the pressure was 0.7 Pa, the electric power was 0.5 kW, and the substrate temperature was 200° C.

A 15-nm-thick In—Ga—Zn oxide film (hereinafter referred to as a second oxide film) was formed over the first oxide film. The second oxide film was formed by a DC sputtering method using a target having an atomic ratio of In:Ga:Zn=4:2:4.1 under the following conditions: the argon gas flow rate was 40 sccm, the oxygen gas flow rate was 5 sccm, the pressure was 0.7 Pa, the electric power was 0.5 kW, and the substrate temperature was 130° C. The second oxide film includes at least a channel formation region. In FIGS. 38A and 38B, the stack of the first oxide film and the second oxide film is denoted by S1S2.

A 10-nm-thick silicon oxynitride film (denoted by TGI-SiON in FIGS. 38A and 38B) was formed over the second oxide film. The silicon oxynitride film functions as a gate insulating film for a top gate of the transistor.

A 10-nm-thick In—Ga—Zn oxide film (hereinafter referred to as a conductive oxide film and denoted by OC in FIGS. 38A and 38B) was formed over the silicon oxynitride film. The conductive oxide film was formed by a DC sputtering method using a target having an atomic ratio of In:Ga:Zn=4:2:4.1 under the following conditions: the oxygen gas flow rate was 45 sccm, the pressure was 0.7 Pa, the electric power was 0.5 kW, and the substrate temperature was 200° C.

A 10-nm-thick titanium nitride film (denoted by TiN in FIGS. 38A and 38B) and a 50-nm-thick tungsten film (denoted by W in FIGS. 38A and 38B) were stacked in this order over the conductive oxide film. The stacked films function as the top gate of the transistor.

A cross-sectional STEM image of the transistor having the above structure was taken with "HD-2700" manufactured by Hitachi, Ltd. at an acceleration voltage of 200 kV and a magnification of 300,000 times. FIG. 38A is a cross-sectional STEM image taken by the above method, and FIG. 38B is an enlarged cross-sectional STEM image showing a region surrounded by broken lines in FIG. 38A.

As shown in FIGS. 38A and 38B, the transistor fabricated in this example has a rounded end portion at the intersection of the side surface and the top surface of the second oxide film. When the end portion of the second oxide film is not angular, coverage with a film to be formed over the end portion, for example, the gate insulating film for the top gate can be improved.

At least part of the structure, method, and the like described in this example can be implemented in appropriate combination with any of those in the embodiments and the other example described in this specification.

Example 2

In this example, the electrical characteristics of transistors of embodiments of the present invention are described.

(Sample 1)

For a transistor of Sample 1, in a fabrication method described in the above example, after formation of the stacked films functioning as a top gate, heat treatment was performed at 400° C. in a nitrogen atmosphere for an hour. After the heat treatment, an insulating film made of first aluminum oxide was formed to a thickness of 7 nm by an ALD method. Subsequently, the insulating film made of the first aluminum oxide, a tungsten film, a titanium nitride film, and a conductive oxide film were etched to form the top gate and an insulator made of the first aluminum oxide.

The insulating film made of the first aluminum oxide, the tungsten film, and the titanium nitride film were subjected to dry etching using a resist mask, the resist mask was removed, and then the conductive oxide film was subjected to wet etching.

Next, the silicon oxynitride film was etched using the top gate and the insulator made of the first aluminum oxide as a mask, so that a gate insulating film for the top gate was formed. For the etching of the silicon oxynitride film, dry etching was employed.

Then, an insulating film made of second aluminum oxide was formed to a thickness of 3 nm by an ALD method to cover the gate insulating film for the top gate, the top gate, and the insulator made of the first aluminum oxide. The insulating film was subjected to anisotropic etching to form an insulator made of the second aluminum oxide in contact with the side surfaces of the gate insulating film for the top gate, the top gate, and the insulator made of the first aluminum oxide.

After that, plasma treatment was performed to form a low-resistance region in an oxide film composed of the first oxide film and the second oxide film. For the plasma treatment, high-frequency power was applied to a mixed gas of argon and nitrogen with the use of a plasma CVD apparatus.

Subsequently, a silicon nitride film was formed to a thickness of 20 nm by a plasma CVD method to cover the oxide film, the gate insulating film for the top gate, the top gate, the insulator made of the first aluminum oxide, and the insulator made of the second aluminum oxide. For the transistor of Sample 1, the low-resistance region was provided in the oxide film by the plasma treatment and the formation of the silicon nitride film.

Furthermore, an interlayer insulating film was formed over the silicon nitride film and subjected to planarization treatment, contact holes reaching the oxide film, the top gate, and the back gate were formed, and then plugs and wirings were formed therein, so that the transistor of Sample 1 was fabricated.

For the fabrication method other than the above description, the embodiments and the other example can be referred to.

(Sample 2)

For a transistor of Sample 2, a low-resistance region was formed in an oxide film only by formation of a silicon nitride film. That is, a plasma treatment was not performed.

For the fabrication method other than the above description, the fabrication method of the transistor of Sample 1, the embodiments, and the other example can be referred to.

(Sample 3)

For the transistor of Sample 3, a third oxide film was provided as an oxide film to cover the stack composed of the first oxide film and the second oxide film. The side surfaces of the first oxide film and the second oxide film were covered with the third oxide film, and the side end portion of the third oxide film surrounded the first oxide film and the second oxide film.

Note that heat treatment for Sample 1 in a nitrogen atmosphere after formation of the stacked films functioning as the top gate was not performed. After the formation of the stacked films functioning as the top gate, an insulating film made of the first aluminum oxide was formed to a thickness of 7 nm by an ALD method.

Then, a silicon oxynitride film was formed to a thickness of 100 nm over the insulating film made of the first aluminum oxide by a plasma CVD method. After that, the silicon oxynitride film, the insulating film made of the first aluminum oxide, the tungsten film, the titanium nitride film, and the conductive oxide film were etched to form an insulator made of the silicon oxynitride, an insulator made of the first aluminum oxide, and the top gate. The insulator made of the silicon oxynitride can function as a hard mask in etching the insulating film made of the first aluminum oxide, the tungsten film, the titanium nitride film, and the conductive oxide film.

Then, the silicon oxynitride film was etched using the insulator made of the silicon oxynitride, the insulator made of the first aluminum oxide, and the top gate as a mask to form a gate insulating film for the top gate. For the etching of the silicon oxynitride film, dry etching was employed.

Then, an insulating film made of the second aluminum oxide was formed to a thickness of 3 nm by an ALD method to cover the gate insulating film for the top gate, the top gate, the insulator made of the first aluminum oxide, and the insulator made of the silicon oxynitride. The insulating film was subjected to anisotropic etching to form an insulator made of the second aluminum oxide in contact with the side surfaces of the gate insulating film for the top gate, the top gate, the insulator made of the first aluminum oxide, and the insulator made of the silicon oxynitride.

After that, plasma treatment like that performed in fabrication of Sample 1 was not performed, and a silicon nitride film was formed to a thickness of 20 nm by a plasma CVD method to cover the oxide film, the gate insulating film for the top gate, the top gate, the insulator made of the first aluminum oxide, the insulator made of the silicon oxynitride, and the insulator made of the second aluminum oxide. For the transistor of Sample 3, a low-resistance region was provided in the oxide film by the formation of the silicon nitride film.

Furthermore, an interlayer insulating film was formed over the silicon nitride film and subjected to planarization treatment, contact holes reaching the oxide film, the top gate, and the back gate were formed, and then plugs and wirings were formed therein, so that the transistor of Sample 3 was fabricated.

For the fabrication method other than the above description, the fabrication methods of the transistors of Sample 1 and Sample 2, the embodiments, and the other example can be referred to.

(Electrical Characteristics)

Figure 39:
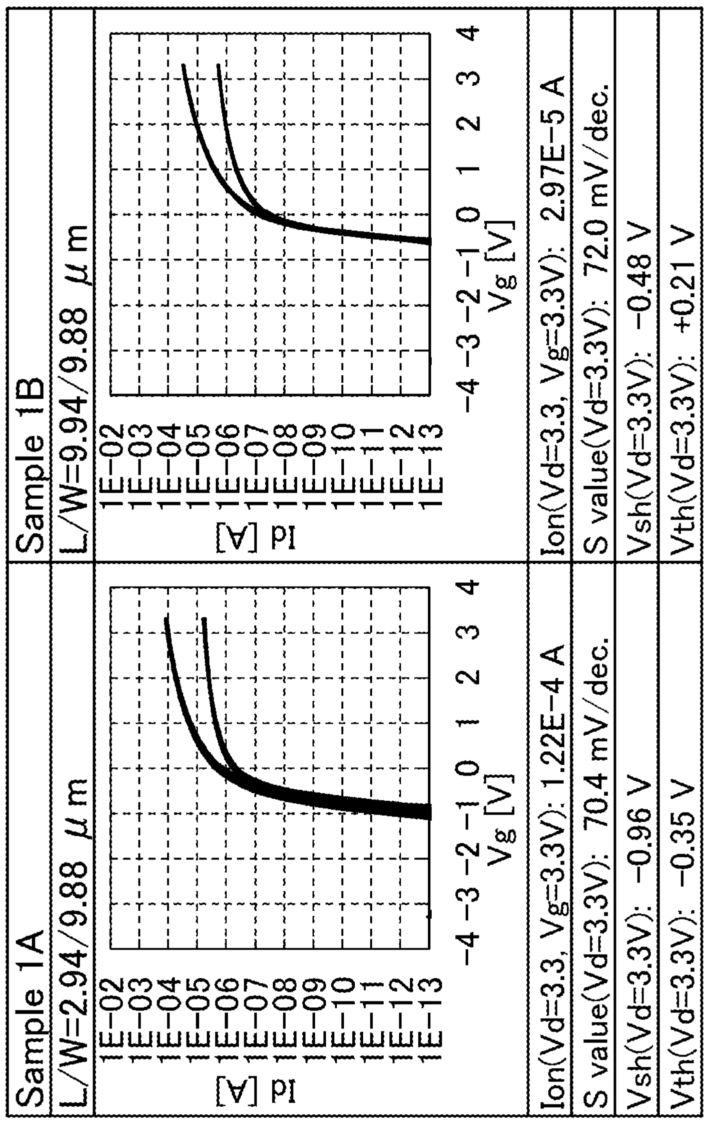
FIG. 39 shows initial characteristics of transistors in Example.
Figure 40:
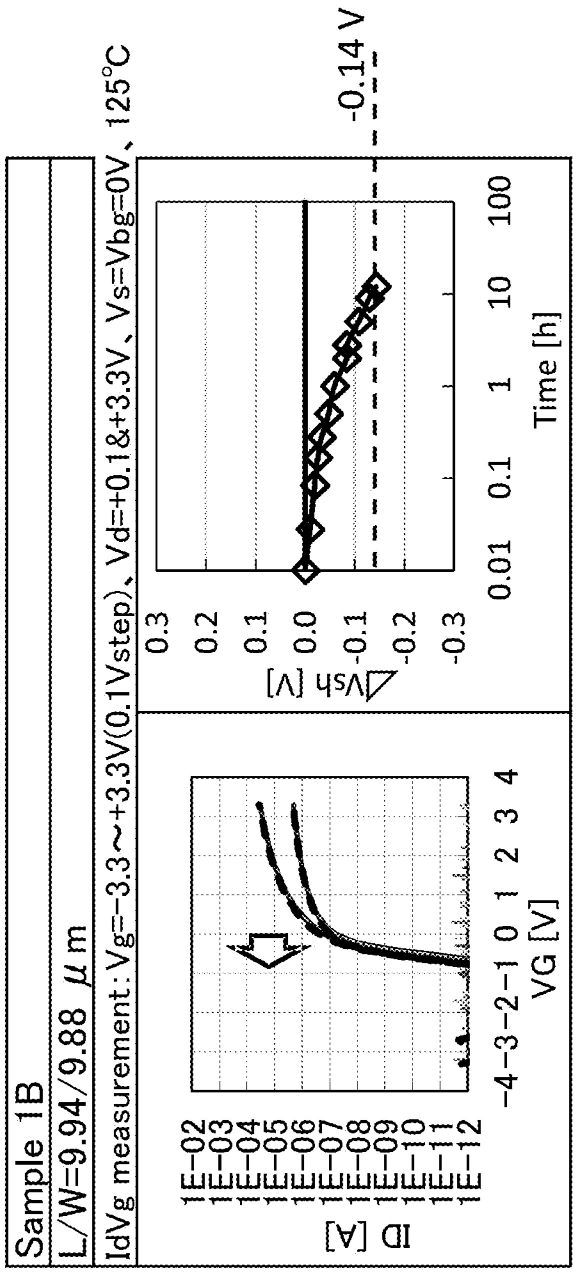
FIG. 40 shows results of reliability tests performed on transistors in Example.

FIG. 39 shows the initial characteristics of Sample 1 as the electrical characteristics thereof, and FIG. 40 shows the results of a reliability test until after 12 hours.

For the transistor of Sample 1, the initial characteristics of Sample 1A with a channel length (L) of 2.94 μm and a channel width (W) of 9.88 μm (hereinafter the channel length and the channel width of the sample are expressed as follows: L/W=2.94/9.88 μm) and Sample 1B with L/W=9.94/9.88 μm were measured.

For Sample 1A (L/W=2.94/9.88 μm), the drain voltage was 3.3 V and the on-state current when the gate voltage was 3.3 V was $1.22\times10^{-4}$ A. The subthreshold swing (hereinafter referred to as an S value) when the drain voltage was 3.3 V was 70.4 mV/dec. The shift voltage (hereinafter denoted as $V_{sh}$) when the drain voltage was 3.3 V was −0.96 V. The threshold voltage (hereinafter denoted as $V_{th}$) when the drain voltage was 3.3 V was −0.35 V.

Here, threshold voltage ($V_{th}$) and shift voltage ($V_{sh}$) in this specification are described. The threshold voltage $V_{th}$ is defined as, in the $V_g$–$I_d$ curve where the horizontal axis represents gate voltage ($V_g$ [V]) and the vertical axis represents the square root of drain current ($I_d^{1/2}$ [A]), a gate voltage at the intersection of the line of $I_d^{1/2}=0$ ($V_g$ axis) and the tangent to the curve at a point where the slope of the curve is the steepest. Note that here, $V_{th}$ was calculated with a drain voltage $V_d$ of 3.3 V.

Note that the gate voltage at the rising of drain current in $I_d$–$V_g$ characteristics is referred to as $V_{sh}$. Furthermore, $V_{sh}$ in this specification is defined as, in the $V_g$–$I_d$ curve where the horizontal axis represents the gate voltage $V_g$ [V] and the vertical axis represents the logarithm of the drain current $I_d$ [A], a gate voltage at the intersection of the line of d=$1.0\times10^{-12}$ [A] and the tangent to the curve at a point where the slope of the curve is the steepest. Note that here, $V_{sh}$ was calculated with a drain voltage $V_d$ of 3.3 V.

For Sample 1B (L/W=9.94/9.88 m), the drain voltage was 3.3 V and the on-state current when the gate voltage was 3.3 V was $2.97\times10^{-5}$ A. The S value when the drain voltage was 3.3 V was 72.0 mV/dec. The $V_{sh}$ when the drain voltage was 3.3 V was −0.48 V. The $V_{th}$ when the drain voltage was 3.3 V was +0.21 V.

FIG. 40 shows results of a positive gate bias-temperature (BT) stress test performed on Sample 1B (L/W=9.94/9.88 μm). In the graphs, changes in $I_d$–$V_g$ characteristics and $V_{sh}$ variations ($\Delta V_{sh}$) in the positive gate BT stress test are shown. Note that the stress test described below was performed at a substrate temperature of 125° C. In the positive gate BT stress test, first, $I_d$–$V_g$ characteristics before the stress test were measured. In the measurement, the back gate voltage was 0 V, the drain voltage was 0.1 V or 3.3 V, and the gate voltage was swept from −3.3 V to +3.3 V in increments of 0.1 V. Next, $I_d$–$V_g$ characteristics after the stress test were measured. In the measurement, the drain voltage was 0 V, the back gate voltage was 0 V, and a gate voltage of 3.63 V was applied. Note that the measurement was performed at the following timings: after stress application, after 100 seconds, after 300 seconds, after 600 seconds, after 1000 seconds, after 30 minutes, after 1 hour, after 2 hours, after 10000 seconds (2.78 hours), after 5 hours, after 9 hours, and after 12 hours. The arrow in FIG. 40 indicates that the characteristics of Sample 1B shift in the negative direction in the positive gate BT stress test. As shown in FIG. 40, $\Delta V_{sh}$ between before and after the positive gate BT stress test for 12 hours was −0.14 V.

Figure 41:
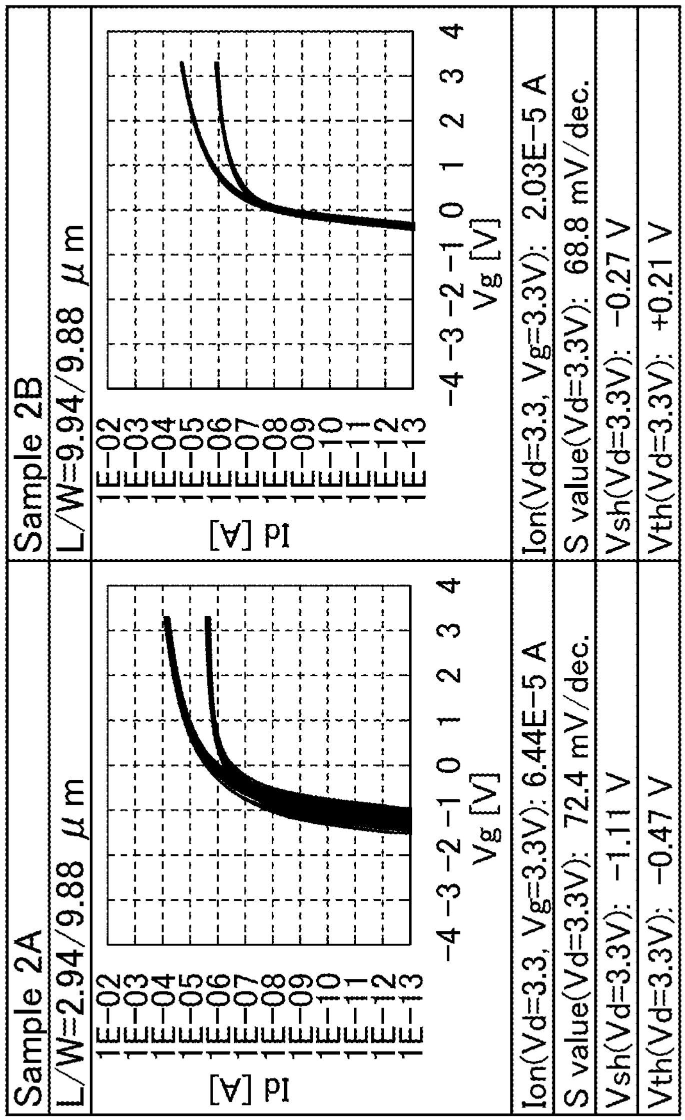
FIG. 41 shows initial characteristics of transistors in Example.
Figure 42:
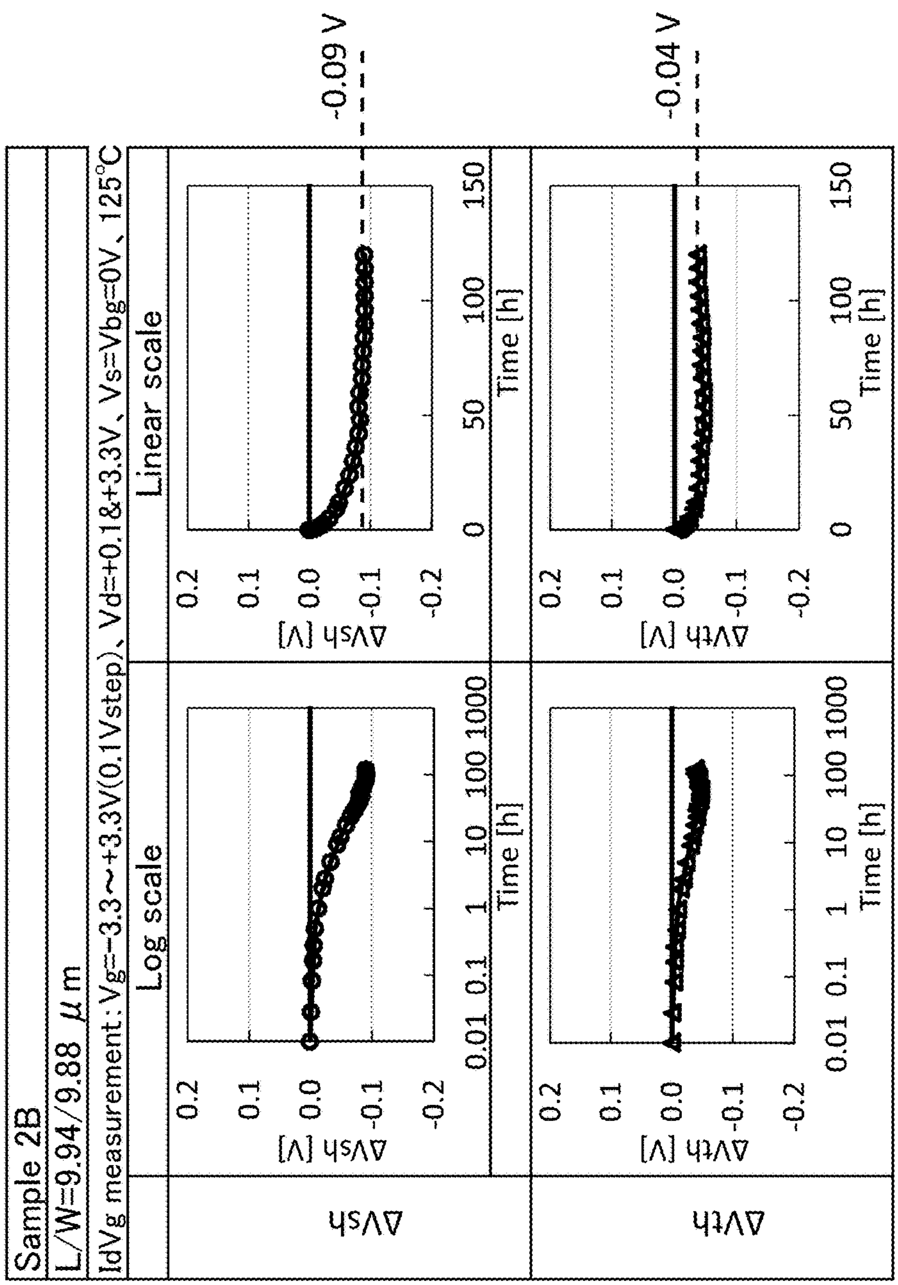
FIG. 42 shows results of reliability tests performed on transistors in Example.

FIG. 41 shows the initial characteristics of Sample 2 as the electrical characteristics thereof, and FIG. 42 shows the results of a reliability test until after 120 hours.

For the transistor of Sample 2, the initial characteristics of Sample 2A with L/W=2.94/9.88 μm and Sample 2B with L/W=9.94/9.88 μm were measured.

For Sample 2A (L/W=2.94/9.88 μm), the drain voltage was 3.3 V and the on-state current when the gate voltage was 3.3 V was $6.44\times10^{-5}$ A. The S value when the drain voltage was 3.3 V was 72.4 mV/dec. The $V_{sh}$ when the drain voltage was 3.3 V was −1.11 V. The $V_{th}$ when the drain voltage was 3.3 V was −0.47 V.

For Sample 2B (L/W=9.94/9.88 μm), the drain voltage was 3.3 V and the on-state current when the gate voltage was 3.3 V was $2.03\times10^{-5}$ A. The S value when the drain voltage was 3.3 V was 68.8 mV/dec. The $V_{sh}$ when the drain voltage was 3.3 V was −0.27 V. The $V_{th}$ when the drain voltage was 3.3 V was +0.21 V.

FIG. 42 shows results of a positive gate BT stress test performed on Sample 2B (L/W=9.94/9.88 μm). The measurement was performed at the following timings: after stress application, after 100 seconds, after 300 seconds, after 600 seconds, after 1000 seconds, after 30 minutes, after 1 hour, after 2 hours, after 10000 seconds (2.78 hours), after 5 hours, after 9 hours, and after 12 hours. The measurement was further performed every 6 hours, and the test was continued until after 120 hours. As shown in FIG. 42, $\Delta V_{sh}$ and $\Delta V_{th}$ between before and after the positive gate BT stress test for 120 hours were −0.09 V and −0.04 V, respectively. Through the test for 120 hours, neither $V_{sh}$ nor $V_{th}$ varied by 0.1 V or more.

Figure 43:
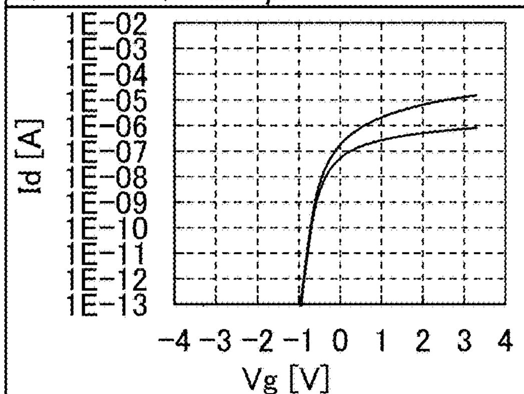
FIG. 43 shows initial characteristics of transistors in Example.
Figure 43:
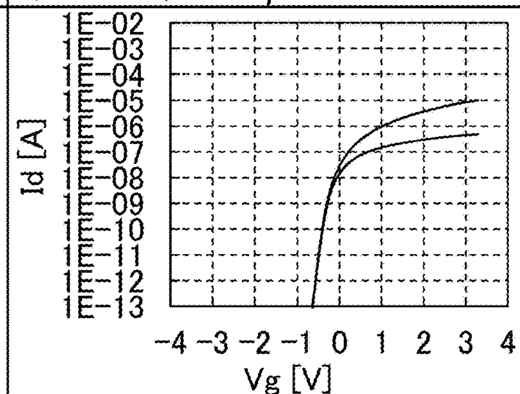
Figure 43:
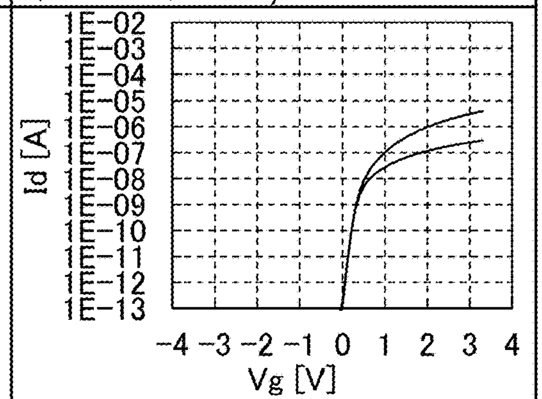

FIG. 43 shows the initial characteristics of Sample 3 as the electrical characteristics thereof.

For the transistor of Sample 3, the initial characteristics of Sample 3A with L/W=0.34/0.22 μm, Sample 3B with L/W=0.44/0.22 μm, and Sample 3C with L/W=1.49/0.22 μm were measured.

For Sample 3A (L/W=0.34/0.22 μm), the drain voltage was 3.3 V and the on-state current when the gate voltage was 3.3 V was $1.55\times10^{-5}$ A. The S value when the drain voltage was 3.3 V was 88.2 mV/dec. The $V_{sh}$ when the drain voltage was 3.3 V was −0.90 V. The $V_{th}$ when the drain voltage was 3.3 V was −0.28 V.

For Sample 3B (L/W=0.44/0.22 μm), the drain voltage was 3.3 V and the on-state current when the gate voltage was 3.3 V was $1.04\times10^{-5}$ A. The S value when the drain voltage was 3.3 V was 86.7 mV/dec. The $V_{sh}$ when the drain voltage was 3.3 V was −0.58 V. The $V_{th}$ when the drain voltage was 3.3 V was +0.37 V.

For Sample 3C (L/W=1.49/0.22 μm), the drain voltage was 3.3 V and the on-state current when the gate voltage was 3.3 V was $4.05\times10^{-6}$ A. The S value when the drain voltage was 3.3 V was 76.6 mV/dec. The $V_{sh}$ when the drain voltage was 3.3 V was +0.05 V. The $V_{th}$ when the drain voltage was 3.3 V was +0.84 V.

At least part of the structure, method, and the like described in this example can be implemented in appropriate combination with any of those in the embodiments and the other example described in this specification.

This application is based on Japanese Patent Application Serial No. 2016-239748 filed with Japan Patent Office on Dec. 9, 2016, Japanese Patent Application Serial No. 2016-239749 filed with Japan Patent Office on Dec. 9, 2016, Japanese Patent Application Serial No. 2016-251633 filed with Japan Patent Office on Dec. 26, 2016, and Japanese Patent Application Serial No. 2017-021880 filed with Japan Patent Office on Feb. 9, 2017, the entire contents of which are hereby incorporated by reference.

What is claimed is:

1. A semiconductor device comprising:

a first transistor and a second transistor over a substrate, wherein the first transistor comprises:

a first conductor;

a first insulator over the first conductor;

a first oxide over the first insulator;

a second insulator over the first oxide;

a second conductor over the second insulator; and a third insulator in contact with a side surface of the second insulator and a side surface of the second conductor, wherein the second transistor comprises:

a third conductor;

the first insulator over the third conductor;

a second oxide and a third oxide which are over the first insulator;

a fourth oxide over the second oxide and the third oxide;

a fourth insulator over the fourth oxide;

a fourth conductor over the fourth insulator;

a fifth insulator in contact with a side surface of the fourth insulator and a side surface of the fourth conductor; and a sixth insulator in contact with the first insulator, the first oxide, the fourth oxide, the third insulator, and the fifth insulator, wherein the first insulator and the sixth insulator are in contact with each other in a region on a periphery of a side of the first oxide and in a region on a periphery of a side of the fourth oxide, and wherein the first oxide, the second oxide, and the third oxide each have a surface with a curvature between a side surface and a top surface thereof.

2. The semiconductor device according to claim 1, wherein the first oxide comprises a first region where a channel is formed; a second region adjacent to the first region; a third region adjacent to the second region; and a fourth region adjacent to the third region, wherein the first region has higher resistance than the second region, the third region, and the fourth region and overlaps with the second conductor, wherein the second region has higher resistance than the third region and the fourth region and overlaps with the second conductor, and wherein the third region has higher resistance than the fourth region and overlaps with the fourth insulator.

3. The semiconductor device according to claim 1, wherein a radius of curvature of a curved surface between the side surface and the top surface of each of the first oxide, the second oxide, and the third oxide is greater than or equal to 3 nm and less than or equal to 10 nm.

4. The semiconductor device according to claim 1,
wherein the first insulator is hafnium oxide formed by an ALD method,
wherein each of the fourth insulator and the fifth insulator is aluminum oxide formed by a sputtering method, and
wherein the sixth insulator is aluminum oxide formed by an ALD method.

5. The semiconductor device according to claim 1,
wherein the first oxide, the second oxide, and the third oxide each include In, an element M, and Zn, and
wherein M is Al, Ga, Y, or Sn.

6. A semiconductor device comprising:
a first transistor and a second transistor over a substrate,
wherein the first transistor comprises:
a first conductor;
a first insulator over the first conductor;
a seventh insulator over the first insulator;
a first oxide over the seventh insulator;
a second insulator over the first oxide;
a second conductor over the second insulator; and
a third insulator in contact with a side surface of the second insulator and a side surface of the second conductor,
wherein the second transistor comprises:
a third conductor;
the first insulator over the third conductor;
an eighth insulator and a ninth insulator which are over the first insulator;
a second oxide over the eighth insulator;
a third oxide over the ninth insulator;
a fourth oxide over the first insulator, the second oxide, and the third oxide;
a fourth insulator over the fourth oxide;
a fourth conductor over the fourth insulator;
a fifth insulator in contact with a side surface of the fourth insulator and a side surface of the fourth conductor; and
a sixth insulator in contact with the first insulator, the first oxide, the fourth oxide, the third insulator, and the fifth insulator,
wherein the first insulator and the sixth insulator are in contact with each other in a region on a periphery of a side of the first oxide and in a region on a periphery of a side of the fourth oxide, and
wherein the first oxide, the second oxide, and the third oxide each have a surface with a curvature between a side surface and a top surface thereof.

7. The semiconductor device according to claim 6,
wherein the first oxide comprises a first region where a channel is formed; a second region adjacent to the first region; a third region adjacent to the second region; and a fourth region adjacent to the third region,
wherein the first region has higher resistance than the second region, the third region, and the fourth region and overlaps with the second conductor,
wherein the second region has higher resistance than the third region and the fourth region and overlaps with the second conductor, and
wherein the third region has higher resistance than the fourth region and overlaps with the fourth insulator.

8. The semiconductor device according to claim 6, wherein a radius of curvature of a curved surface between the side surface and the top surface of each of the first oxide, the second oxide, and the third oxide is greater than or equal to 3 nm and less than or equal to 10 nm.

9. The semiconductor device according to claim 6,
wherein the first insulator is hafnium oxide formed by an ALD method,
wherein each of the fourth insulator and the fifth insulator is aluminum oxide formed by a sputtering method, and
wherein the sixth insulator is aluminum oxide formed by an ALD method.

10. The semiconductor device according to claim 6,
wherein the first oxide, the second oxide, and the third oxide each include In, an element M, and Zn, and
wherein M is Al, Ga, Y, or Sn.

* * * * *